US011676954B2

(12) United States Patent
Rabkin et al.

(10) Patent No.: US 11,676,954 B2
(45) Date of Patent: Jun. 13, 2023

(54) BONDED THREE-DIMENSIONAL MEMORY DEVICES WITH BACKSIDE SOURCE POWER SUPPLY MESH AND METHODS OF MAKING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US); Kwang-ho Kim, Pleasanton, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 87 days.

(21) Appl. No.: 17/134,997

(22) Filed: Dec. 28, 2020

(65) Prior Publication Data

US 2022/0208748 A1 Jun. 30, 2022

(51) Int. Cl.
*H01L 25/065* (2023.01)
*H01L 23/528* (2006.01)
(Continued)

(52) U.S. Cl.
CPC .......... *H01L 25/18* (2013.01); *H01L 23/5286* (2013.01); *H01L 24/08* (2013.01);
(Continued)

(58) Field of Classification Search
CPC ..... H01L 23/5286; H01L 25/18; H01L 24/08; H01L 24/80; H01L 25/0657; H01L 25/50;
(Continued)

(56) References Cited

U.S. PATENT DOCUMENTS 5,915,167 A 6/1999 Leedy
9,530,790 B1 12/2016 Lu et al.
(Continued)

FOREIGN PATENT DOCUMENTS

KR 10-2019-0026418 3/2019
KR 10-2019-0118751 10/2019
WO WO 2019-143400 7/2019

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Thanh Y. Tran
(74) *Attorney, Agent, or Firm* — The Marbury Law Group PLLC

(57) ABSTRACT

A semiconductor structure includes a memory die bonded to a logic die. The memory die includes an alternating stack of insulating layers and electrically conductive layers; memory openings extending through the alternating stack, memory opening fill structures located in the memory openings and comprising a respective vertical semiconductor channel and a respective memory film, a source layer contacting the vertical semiconductor channels, a backside isolation dielectric layer contacting a backside surface of the source layer, and a source power supply mesh including a planar portion of a source-side electrically conductive layer that is located on a backside of the backside isolation dielectric layer and electrically connected to the source layer by conductive material portions that extend through the backside isolation dielectric layer.

20 Claims, 91 Drawing Sheets

(51) Int. Cl.

| | |
|---|---|
| ***H01L 25/18*** | (2023.01) |
| ***H01L 23/00*** | (2006.01) |
| ***H01L 25/00*** | (2006.01) |
| ***H10B 41/27*** | (2023.01) |
| ***H10B 43/27*** | (2023.01) |

(52) U.S. Cl.

CPC .......... *H01L 24/80* (2013.01); *H01L 25/0657* (2013.01); *H01L 25/50* (2013.01); *H10B 41/27* (2023.02); *H10B 43/27* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search

CPC ......... H01L 27/11556; H01L 27/11582; H01L 2224/08145; H01L 2224/80895; H01L 2224/80896; H01L 2924/1431; H01L 2924/14511

See application file for complete search history.

(56) References Cited

U.S. PATENT DOCUMENTS

| | | | |
|---|---|---|---|
| 9,935,050 B2 | 4/2018 | Dunga et al. | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,629,616 B1 | 4/2020 | Kai et al. | |
| 10,700,028 B2 | 6/2020 | Nishida | |
| 10,734,080 B2 | 8/2020 | Chibvongodze et al. | |
| 10,854,619 B2 | 12/2020 | Chibvongodze et al. | |
| 2014/0061750 A1 | 3/2014 | Kwon et al. | |
| 2016/0079164 A1 | 3/2016 | Fukuzumi et al. | |
| 2017/0040338 A1 | 2/2017 | Lee et al. | |
| 2017/0294377 A1 | 10/2017 | Dunga et al. | |
| 2018/0261613 A1 | 9/2018 | Ariyoshi | |
| 2018/0350879 A1 | 12/2018 | Sei et al. | |
| 2019/0252361 A1 | 8/2019 | Nishida | |
| 2019/0280002 A1 | 9/2019 | Kai et al. | |
| 2021/0035965 A1* | 2/2021 | Mizutani | H01L 27/11556 |

OTHER PUBLICATIONS

Notification of Transmittal of the International Search Report and Written Opinion of the International Search Authority for International Patent Application No. PCT/US2019/062739, dated Apr. 16, 2020, 10 pages.

Notification of Transmittal of the International Search Report and Written Opinion of the International Search Authority for International Patent Application No. PCT/US2020/039105, dated Dec. 18, 2020, 11 pages.

U.S. Appl. No. 16/231,752, filed Dec. 24, 2018, SanDisk Technologies LLC.

U.S. Appl. No. 16/248,923, filed Jan. 16, 2019, SanDisk Technologies LLC.

U.S. Appl. No. 16/816,691, filed Mar. 12, 2020, SanDisk Technologies LLC.

U.S. Appl. No. 16/829,591, filed Mar. 25, 2020, SanDisk Technologies LLC.

U.S. Appl. No. 16/829,667, filed Mar. 25, 2020, SanDisk Technologies LLC.

U.S. Appl. No. 17/062,988, filed Oct. 5, 2020, SanDisk Technologies LLC.

* cited by examiner

BONDED THREE-DIMENSIONAL MEMORY DEVICES WITH BACKSIDE SOURCE POWER SUPPLY MESH AND METHODS OF MAKING THE SAME

FIELD

The present disclosure relates generally to the field of semiconductor devices, and particularly to bonded three-dimensional memory devices having a backside source power supply mesh and methods of making the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36. Support circuitry for performing write, read, and erase operations of the memory cells in the vertical NAND strings typically are provided by complementary metal oxide semiconductor (CMOS) devices formed on a same substrate as the three-dimensional memory device.

SUMMARY

According to an aspect of the present disclosure, a semiconductor structure comprising a memory die bonded to a logic die is provided. The memory die comprises: an alternating stack of insulating layers and electrically conductive layers; memory openings extending through the alternating stack; memory opening fill structures located in the memory openings and comprising a respective vertical semiconductor channel and a respective memory film; a source layer contacting the vertical semiconductor channels; a backside isolation dielectric layer contacting a backside surface of the source layer; and a source power supply mesh comprising a planar portion of a source-side electrically conductive layer that is located over a backside of the backside isolation dielectric layer and electrically connected to the source layer by conductive material portions that extend through the backside isolation dielectric layer.

According to another aspect of the present disclosure, a method of forming a semiconductor structure is provided, which comprises: forming a memory die, wherein the memory die comprises an alternating stack of insulating layers and electrically conductive layers located over a source layer, and memory opening fill structures located in memory openings extending through the alternating stack and comprising a respective vertical semiconductor channel and a respective memory film; and forming a source power supply mesh comprising a planar portion of a source-side electrically conductive layer on a backside of the source layer, wherein the source power supply mesh is electrically connected to the source layer at multiple locations.

DETAILED DESCRIPTION

Figure 1:
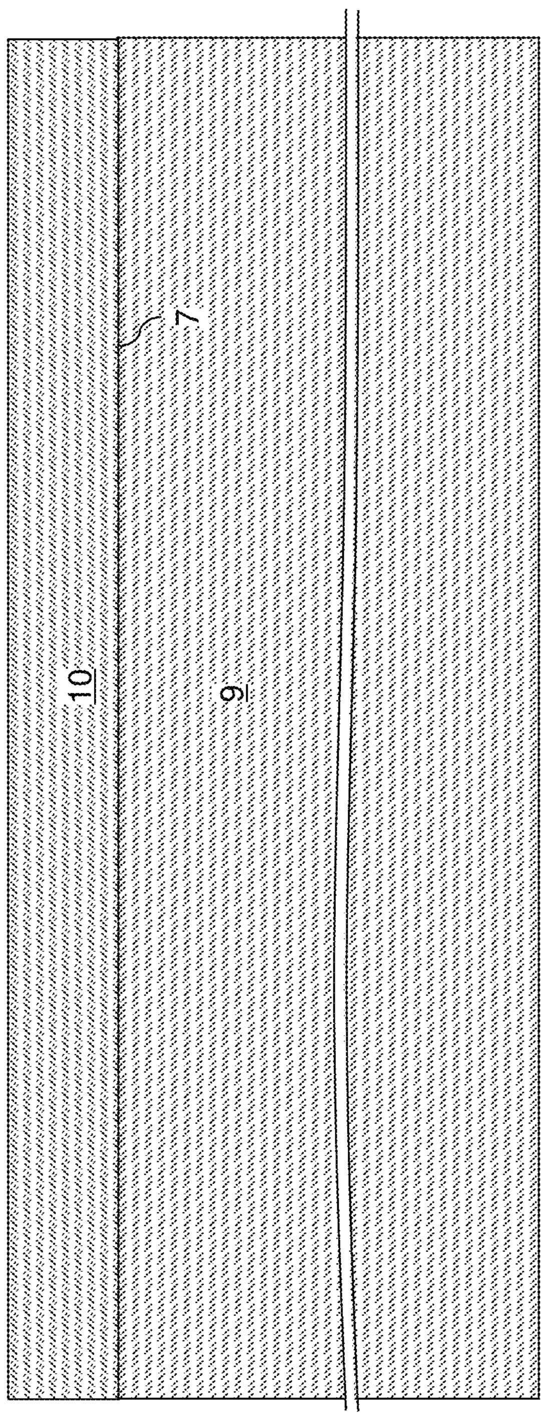
FIG. 1 is a schematic vertical cross-sectional view of an exemplary including a carrier substrate according to the first embodiment of the present disclosure.

As discussed above, the embodiments of the present disclosure are directed to three-dimensional memory devices having a backside source power supply mesh and methods of forming bonded three-dimensional memory devices, the various aspects of which are described below. The embodiments of the present disclosure can be used to form various structures including a multilevel memory structure, non-limiting examples of which include semiconductor devices such as three-dimensional memory array devices comprising a plurality of NAND memory strings. The embodiments of the present disclosure can be used to form a bonded assembly of multiple semiconductor dies including a memory die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to a first embodiment of the present disclosure is illustrated, which can be used, for example, to fabricate a device structure containing vertical NAND memory devices. The exemplary structure includes a carrier substrate 9 and a semiconductor material layer 10 located on a top surface of the carrier substrate 9. In one embodiment, the carrier substrate 9 and the semiconductor material layer 10 may be provided as a commercially available single crystalline semiconductor wafer. A surface portion of the single crystalline semiconductor wafer can include the semiconductor material layer 10, and a bulk portion of the single crystalline semiconductor wafer can include the carrier substrate 9 that is subsequently removed, for example, by backside grinding. An interface 7 between the carrier substrate 9 and the semiconductor material layer 10 can be located at a depth that corresponds to a target stopping plane for the backside grinding process. Alternatively, the semiconductor material layer 10 can include a single crystalline or polycrystalline semiconductor material layer provided on the carrier substrate 9 including a material different from the material of the semiconductor material layer 10. In this case, the carrier substrate 9 can include an insulating material (such as sapphire or silicon oxide), a conductive material, or a semiconductor material different from the material of the semiconductor material layer 10. The thickness of the carrier substrate 9 can be thick enough to mechanically support the semiconductor material layer 10 and structures to be subsequently formed thereupon. For example, the carrier substrate 9 can have a thickness in a range from 60 microns to 1,000 microns. The thickness of the semiconductor material layer 10 may be in a range from 100 nm to 5,000 nm, although lesser and greater thicknesses can also be used. The semiconductor material layer 10 includes at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
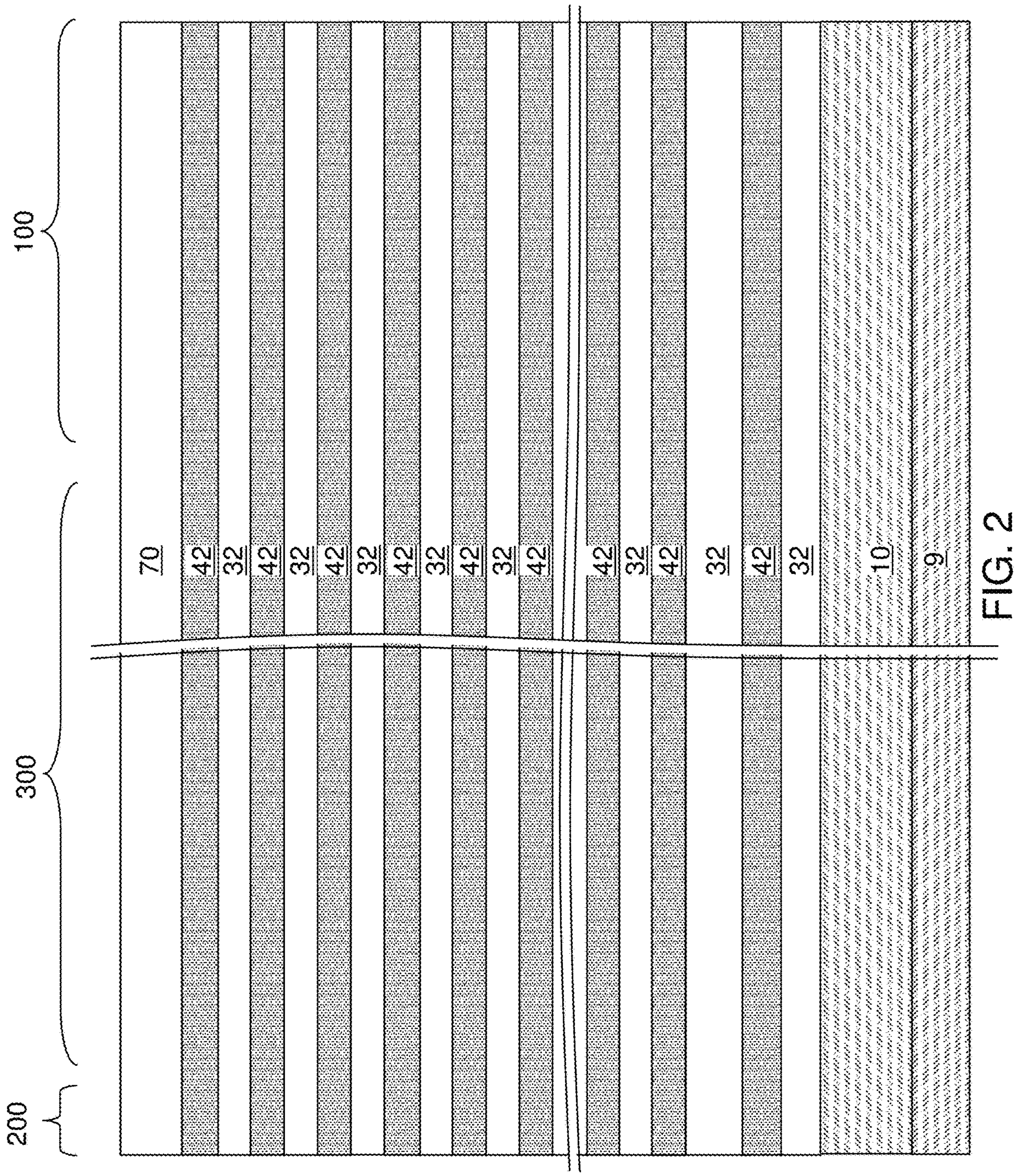
FIG. 2 is a schematic vertical cross-sectional view of the exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface (such as the interface 7) of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

Figure 3:
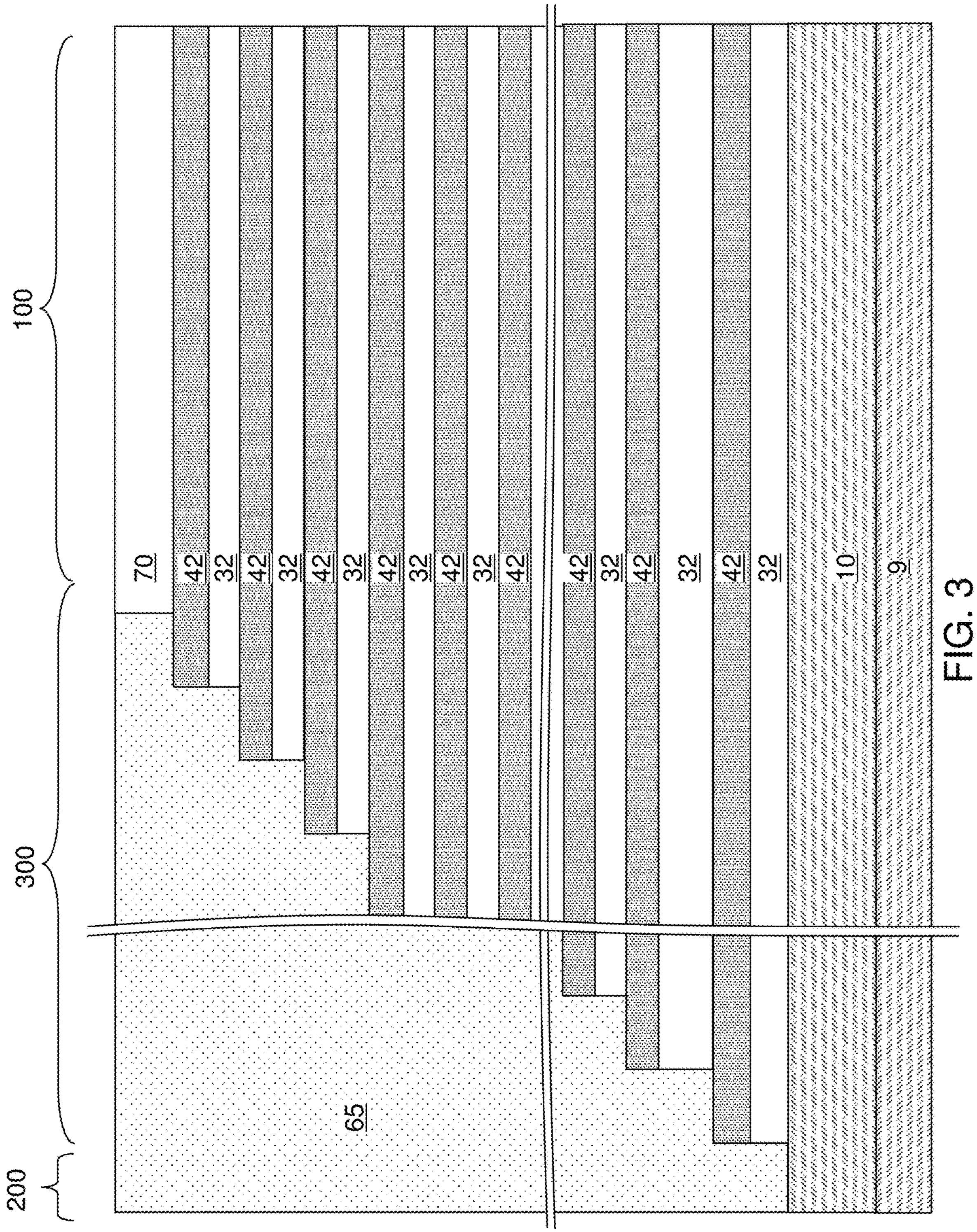
FIG. 3 is a schematic vertical cross-sectional view of the exemplary structure after formation of stepped surfaces and a stepped dielectric material portion according to the first embodiment of the present disclosure.

Referring to FIG. 3, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
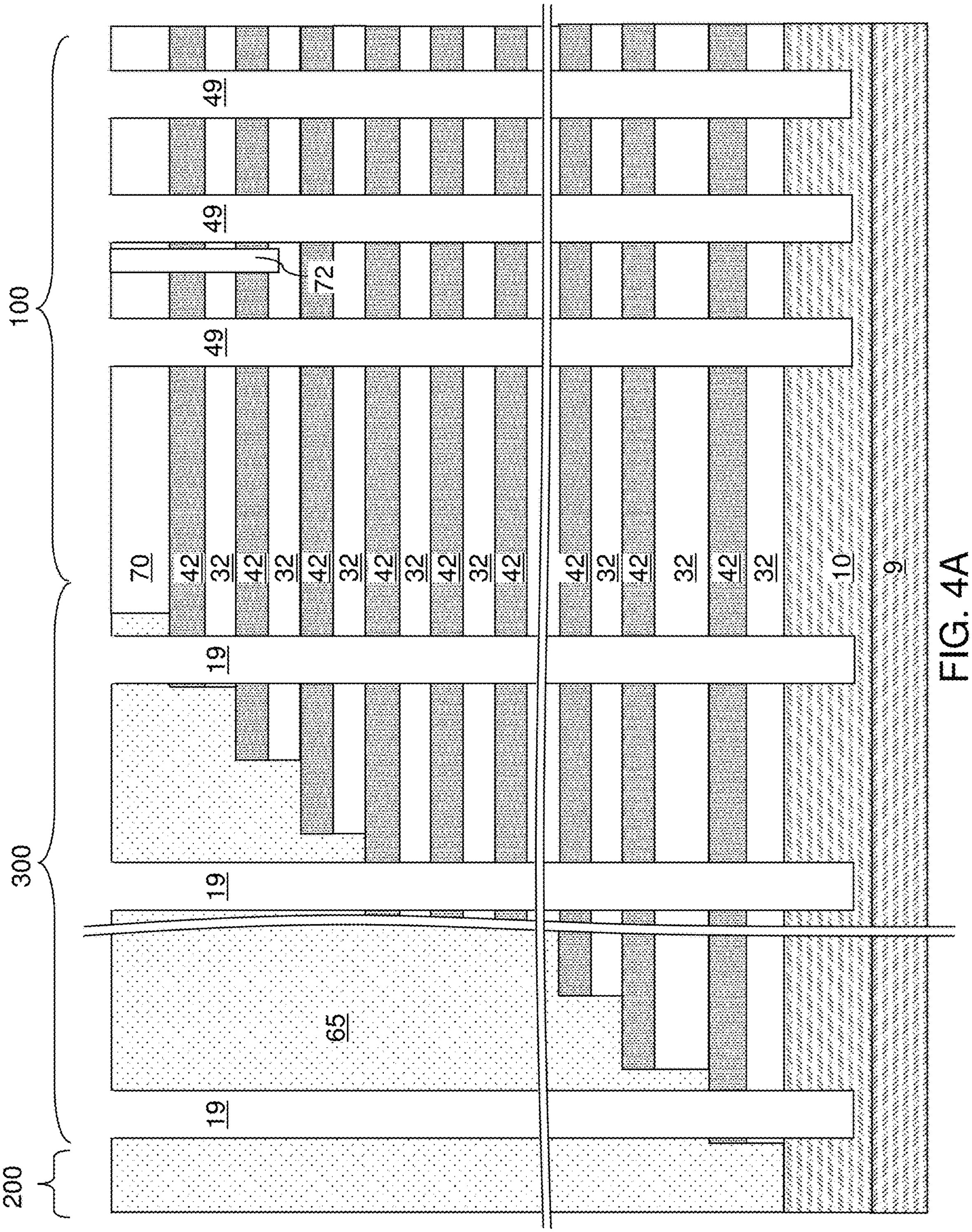
FIG. 4A is a schematic vertical cross-sectional view of the exemplary structure after formation of memory openings and support openings according to the first embodiment of the present disclosure.
Figure 4B:
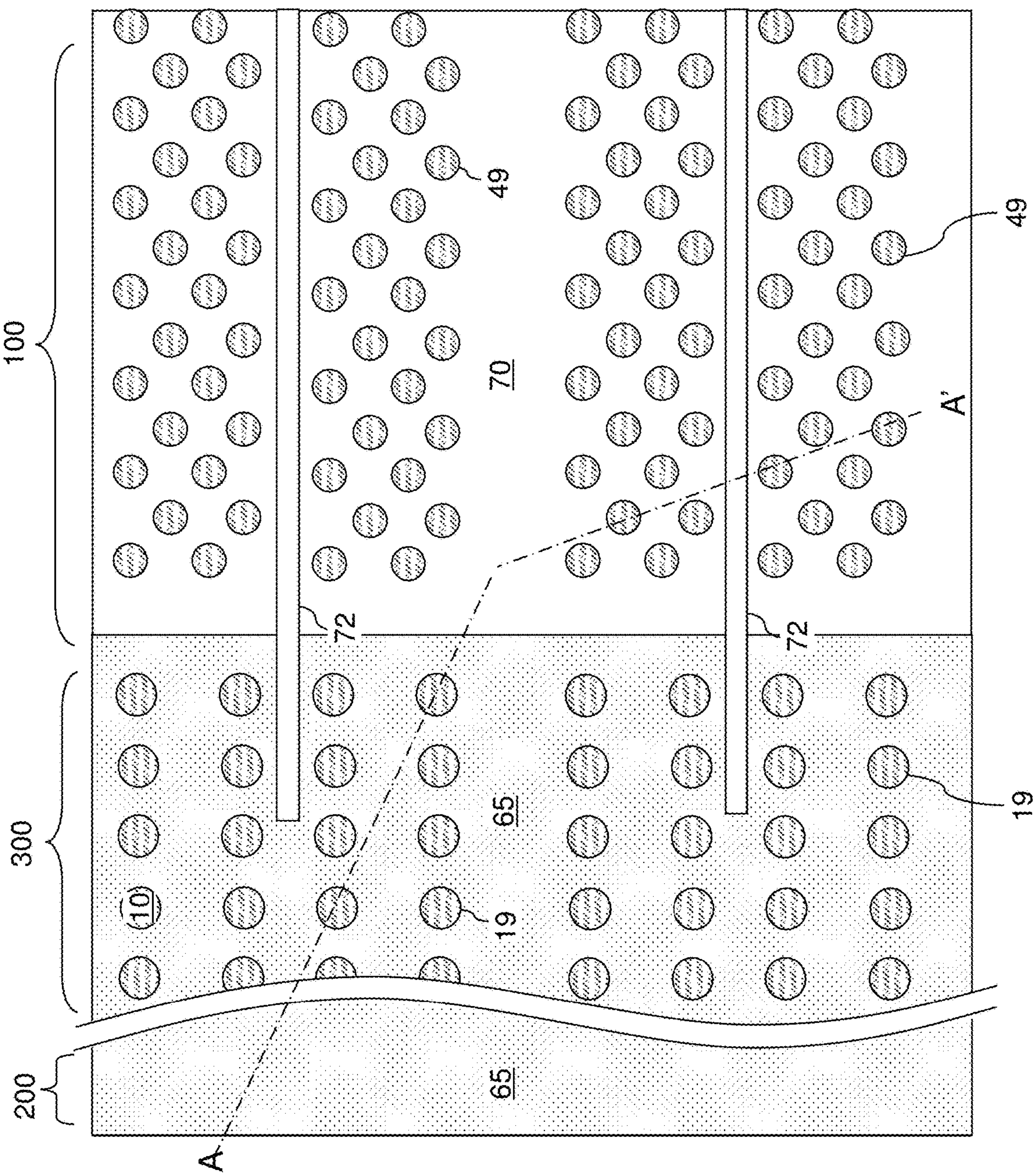
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 5A-5F illustrate structural changes in a memory opening 49, which is one of the memory openings 49 in the exemplary structure of FIGS. 4A and 4B. The same structural change occurs simultaneously in each of the other memory openings 49 and in each support opening 19.

Figure 5B:
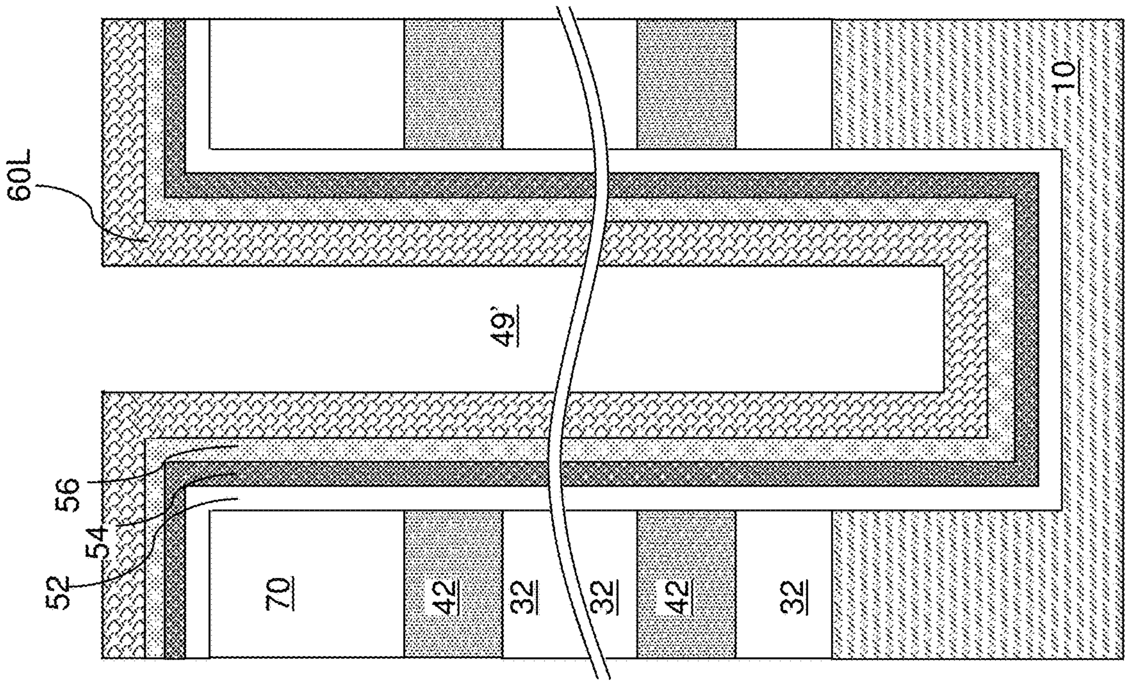
FIGS. 5A-5F are sequential schematic vertical cross-sectional views of a memory opening within the exemplary structure during formation of a memory stack structure, an optional dielectric core, and a drain region therein according to the first embodiment of the present disclosure.
Figure 5A:
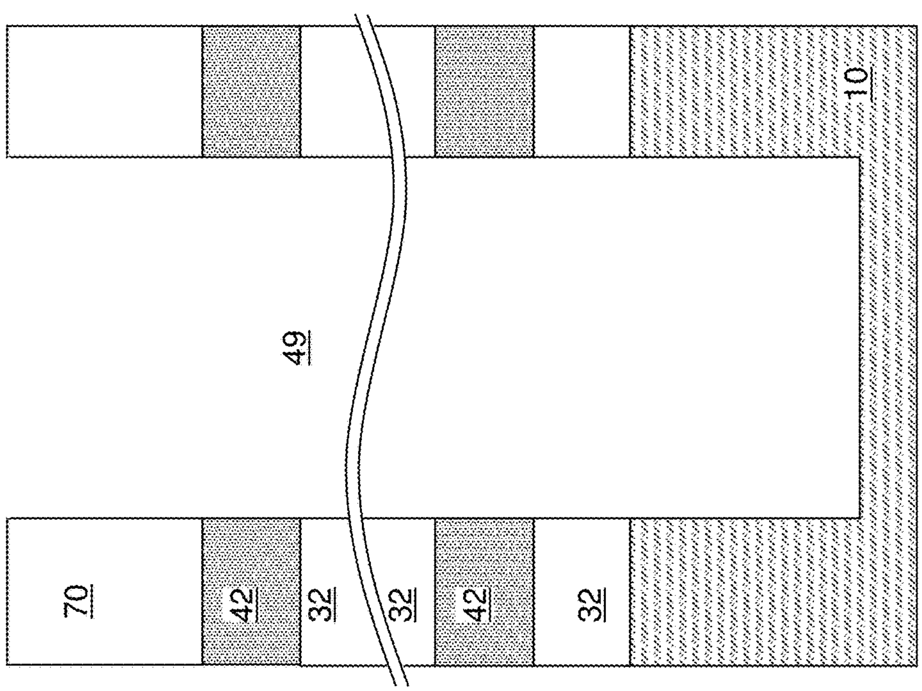

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, a stack of layers including a blocking dielectric layer 52, a charge storage layer 54, a tunneling dielectric layer 56, and a semiconductor channel layer 60L can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

Figure 5C:
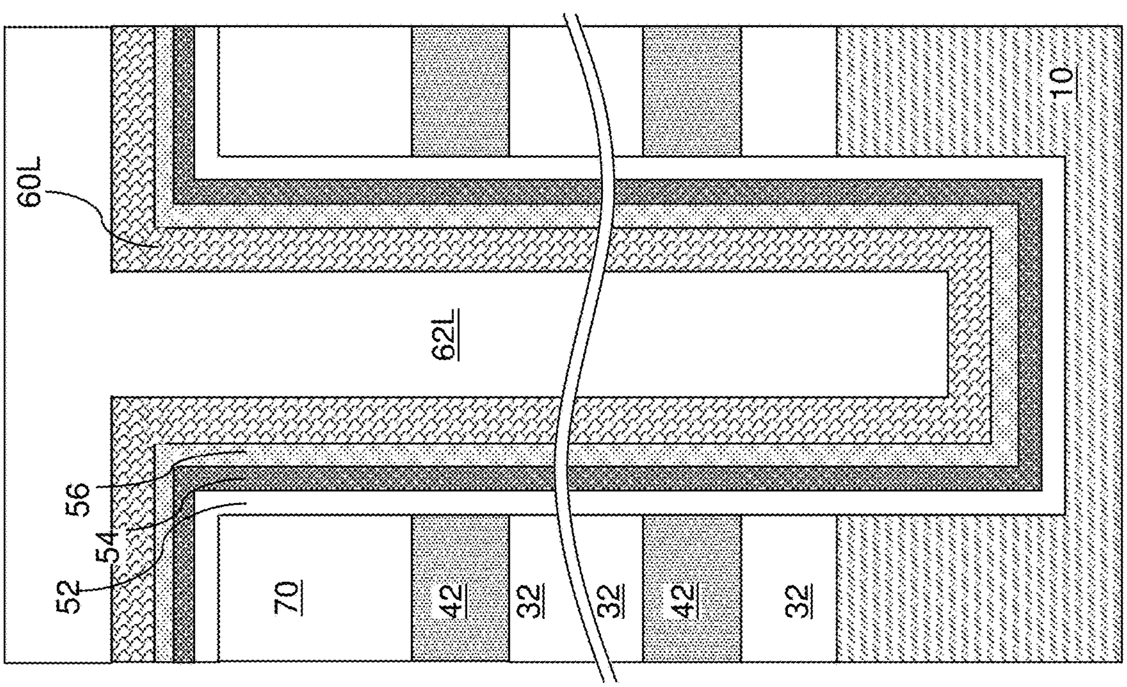

Referring to FIG. 5C, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5D:
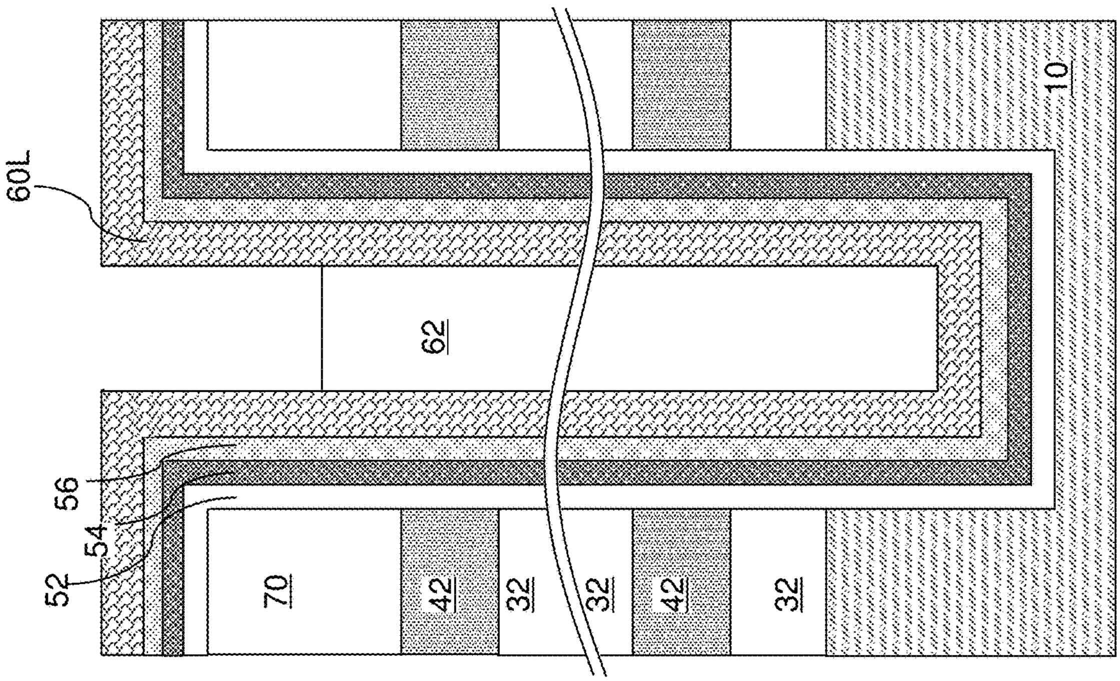

Referring to FIG. 5D, the dielectric core layer 62L can be recessed selective to the material of the semiconductor channel layer 60L, for example, by a recess etch. The material of the dielectric core layer 62L is vertically recessed below the horizontal plane including the top surface of the insulating cap layer 70. Each remaining portion of the dielectric core layer 62L constitutes a dielectric core 62.

Figure 5F:
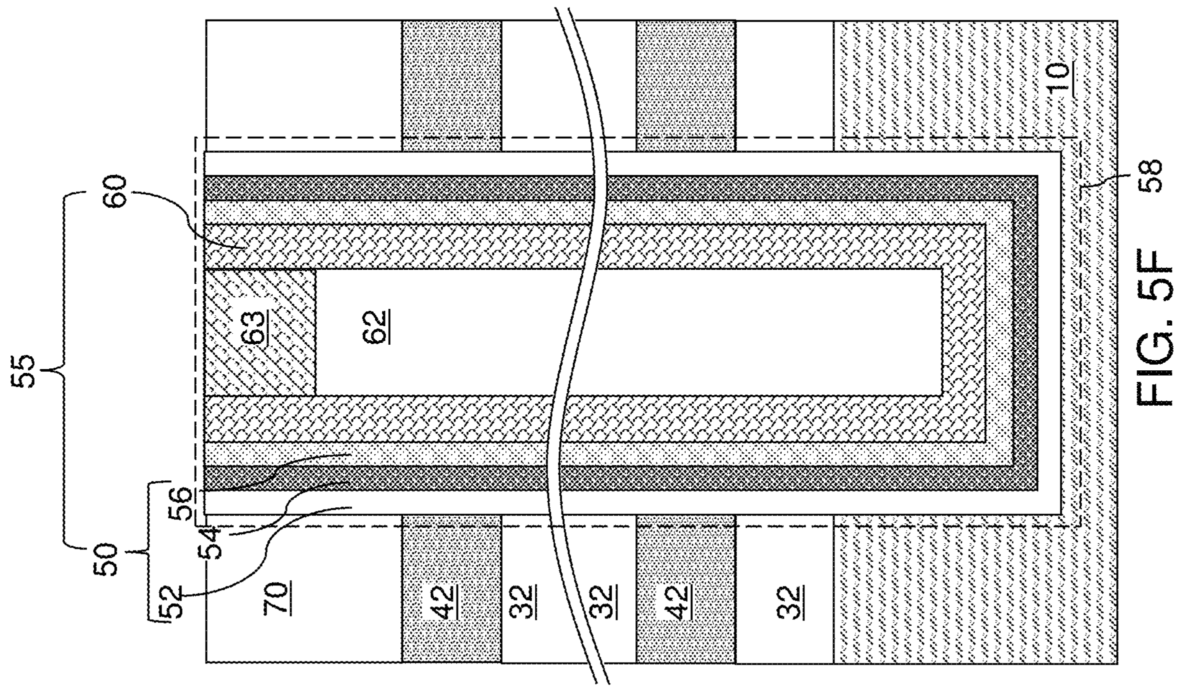
Figure 5E:
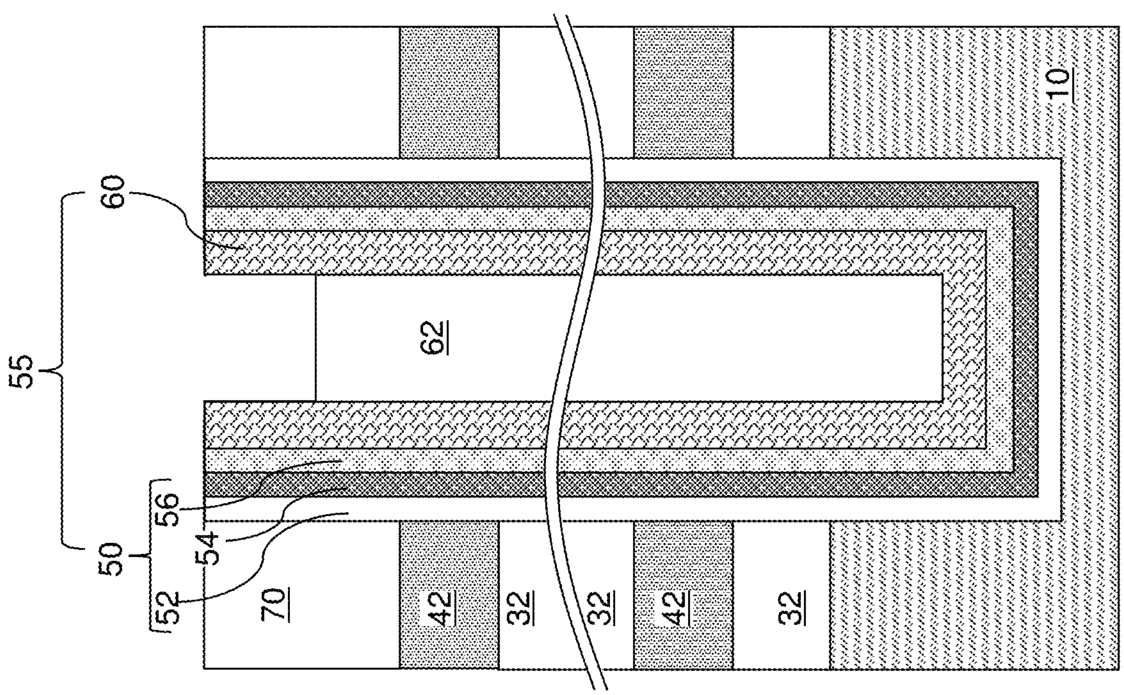

Referring to FIG. 5E, the horizontal portions of the semiconductor channel layer 60L, the tunneling dielectric layer 56, the charge storage layer 54, and the blocking dielectric layer 52 can be removed from above the top surface of the insulating cap layer 70 by a planarization process. A series of recess etch processes can be used, which may include at least one anisotropic etch step and/or at least one isotropic etch step. Each remaining portion of the semiconductor channel layer 60L can be located entirety within a memory opening 49 or entirely within a support opening 19.

Each remaining portion of the semiconductor channel layer 60L constitutes a vertical semiconductor channel 60. Electrical current can flow through each vertical semiconductor channel 60 when a vertical NAND device including the vertical semiconductor channel 60 is turned on. Within each memory opening 49, a tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 constitutes a memory stack structure 55.

Referring to FIG. 5F, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each memory stack structure 55 is a combination of a semiconductor channel, a tunneling dielectric layer, a plurality of memory elements comprising portions of the charge storage layer 54, and an optional blocking dielectric layer 52. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 constitutes a support pillar structure.

Figure 6:
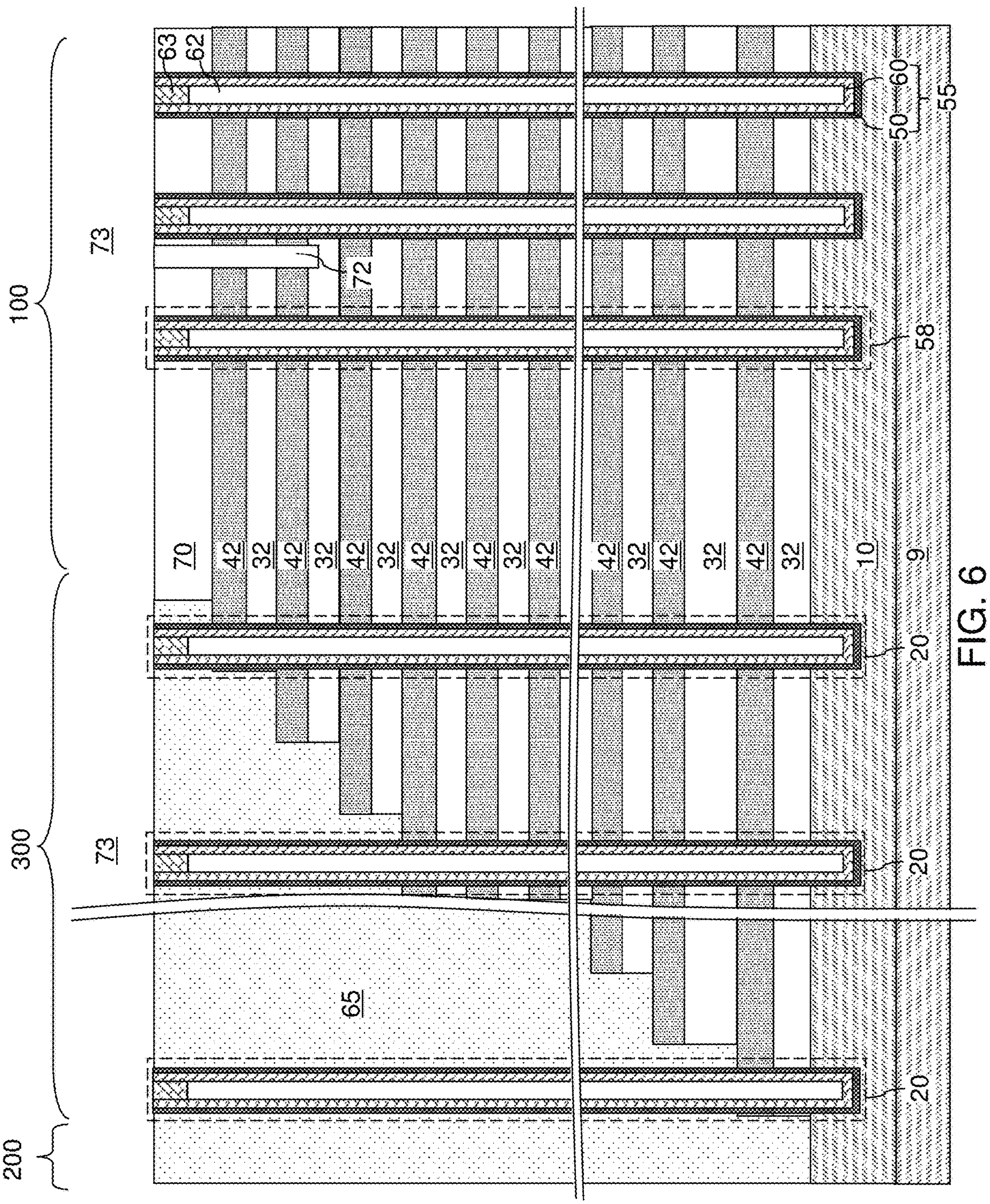
FIG. 6 is a schematic vertical cross-sectional view of the exemplary structure after formation of memory stack structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50 and/or for the vertical semiconductor channel 60.

Figure 7A:
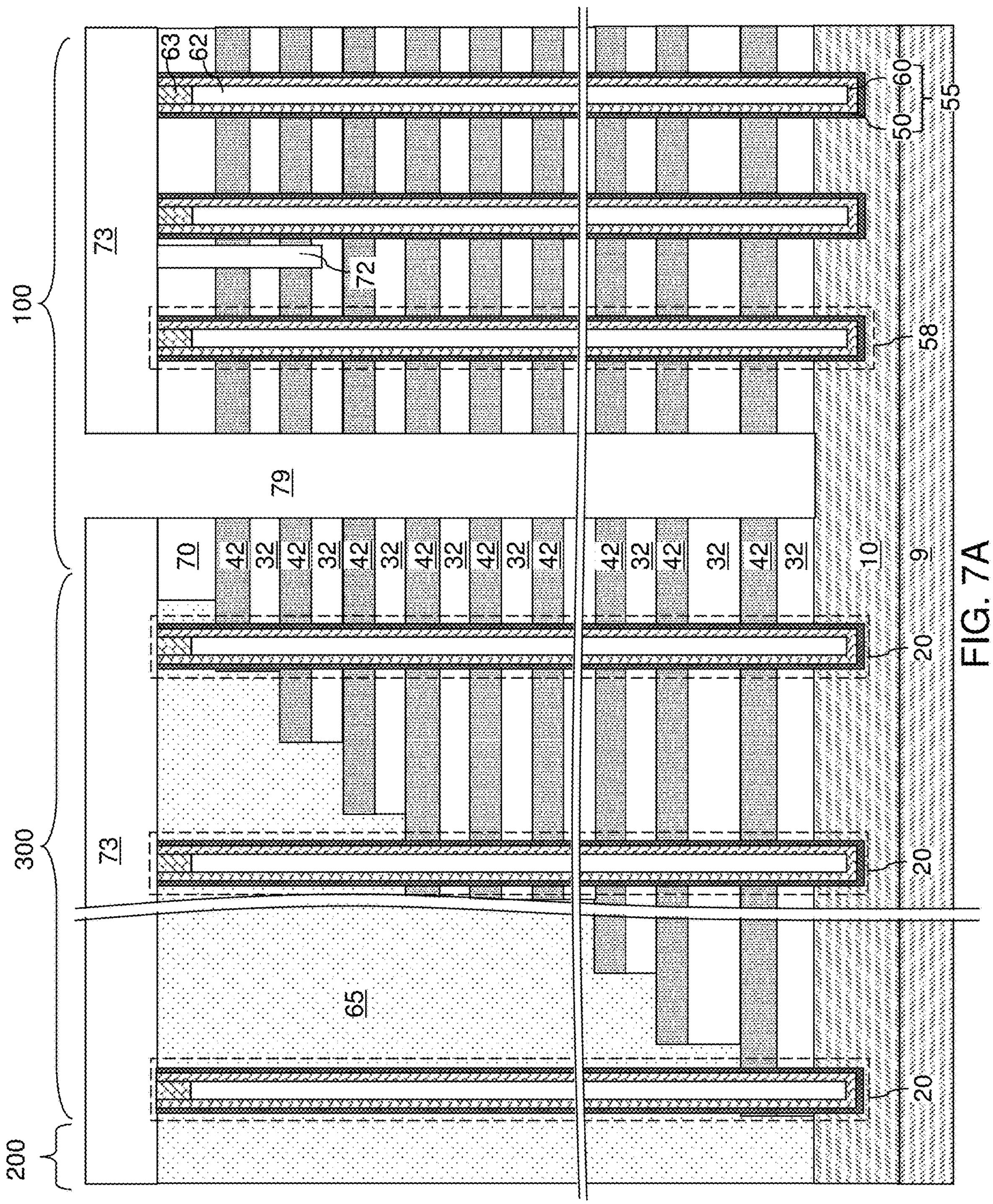
FIG. 7A is a schematic vertical cross-sectional view of the exemplary structure after formation of backside trenches according to the first embodiment of the present disclosure.
Figure 7B:
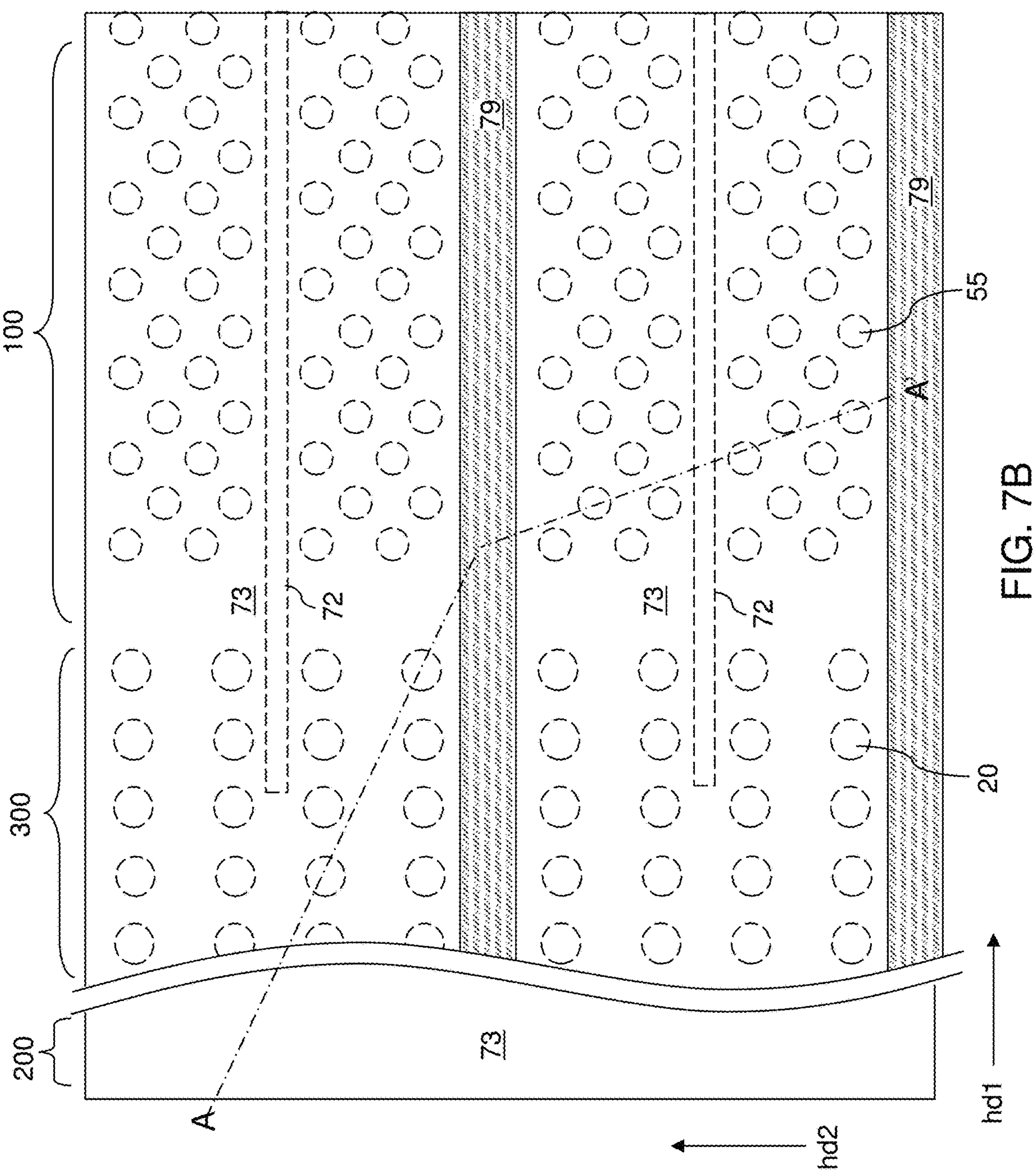
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the stepped dielectric material portion 65 using an anisotropic etch to form backside trenches 79, which vertically extend from the top surface of the contact level dielectric layer 73 at least to the top surface of the substrate semiconductor material layer 10, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
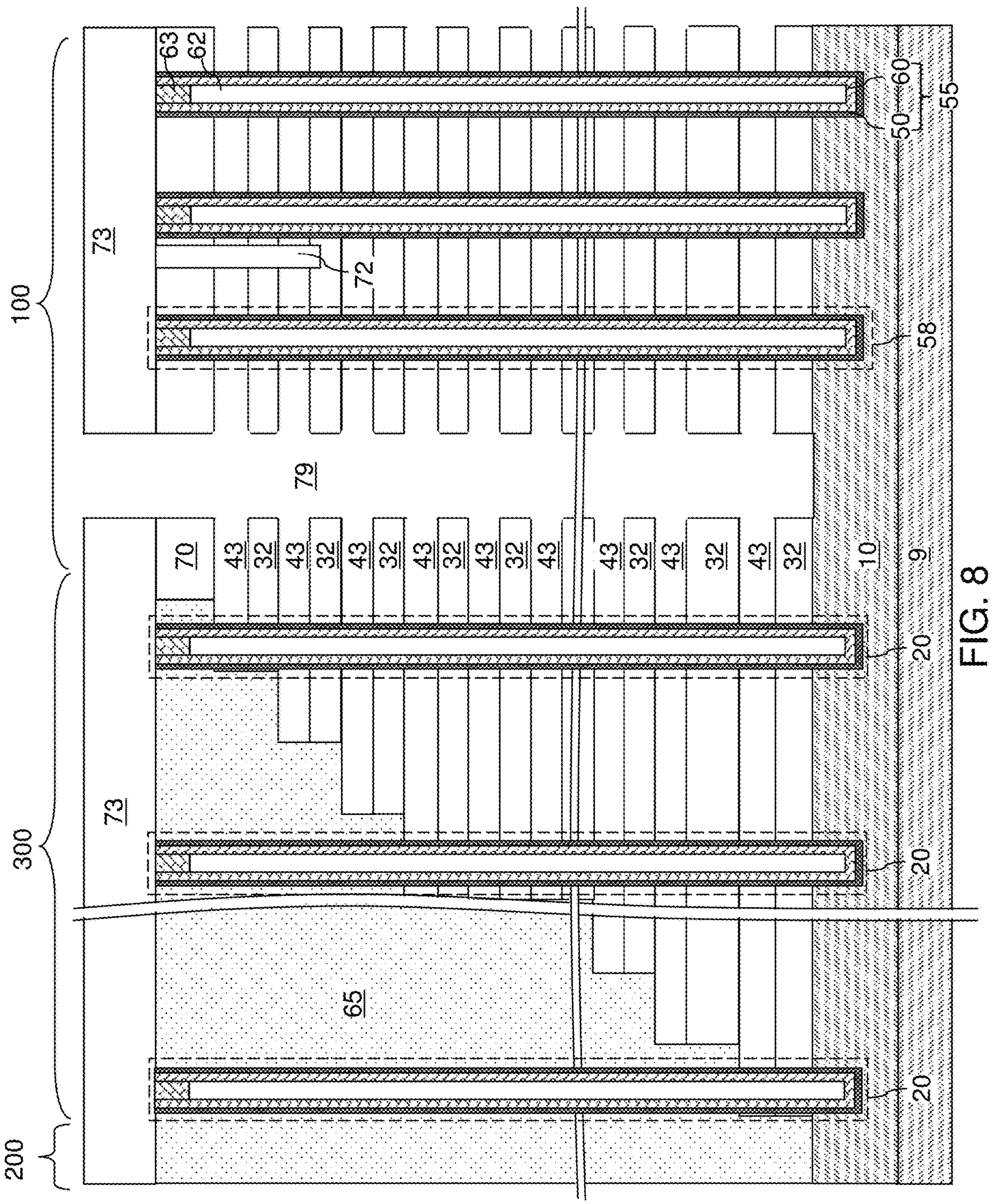
FIG. 8 is a schematic vertical cross-sectional view of the exemplary structure after formation of backside recesses according to the first embodiment of the present disclosure.

Referring to FIG. 8, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate semiconductor material layer 10. In this case, each backside recess 43 can define a space for receiving a respective word line of the array of monolithic three-dimensional NAND strings.

Each of the plurality of backside recesses 43 can extend substantially parallel to the top surface of the substrate semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 9:
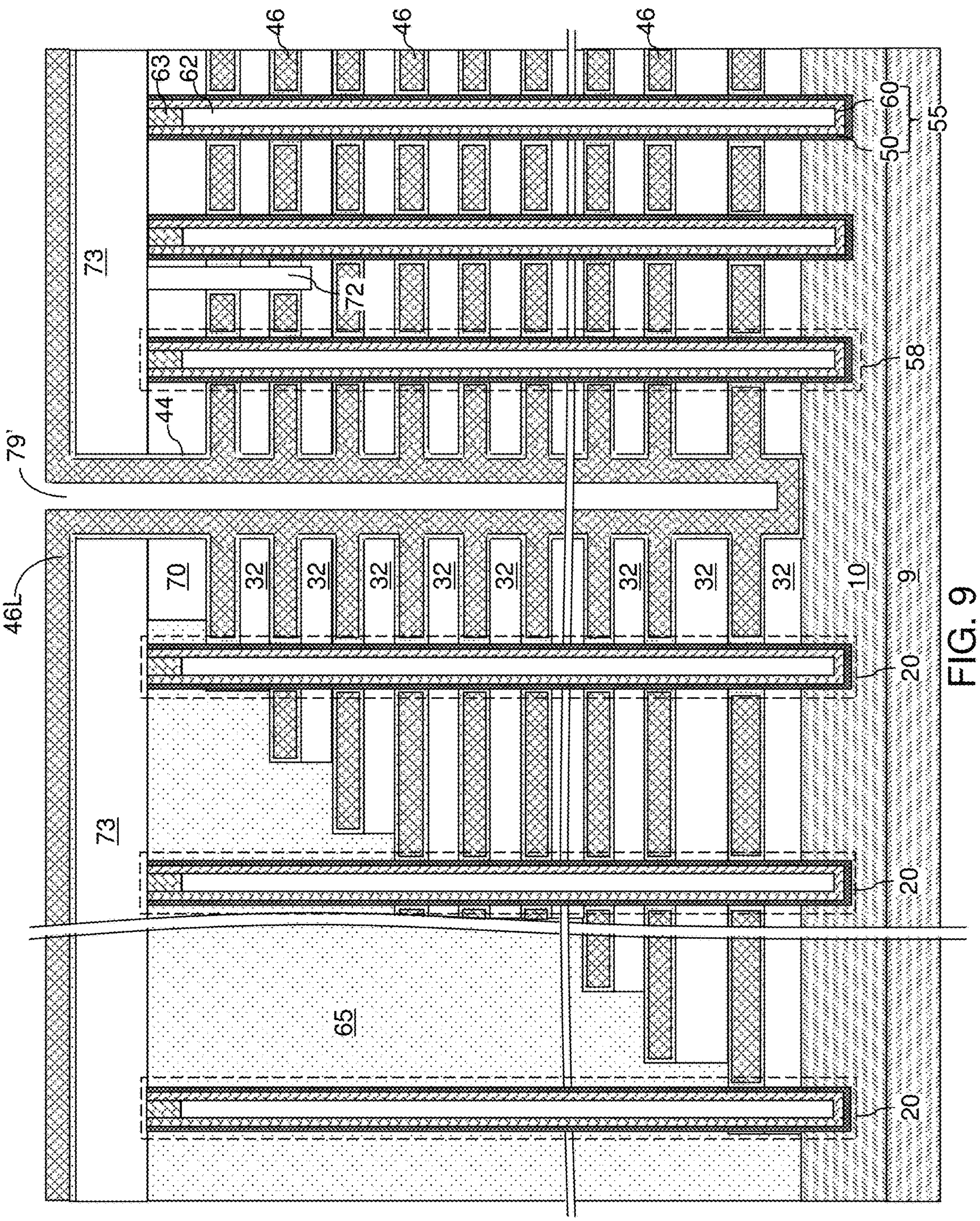
FIG. 9 is a schematic vertical cross-sectional view of the exemplary structure after formation of electrically conductive layers according to the first embodiment of the present disclosure.

Referring to FIG. 9, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

At least one metallic material is deposited in the plurality of backside recesses 43, on the sidewalls of the at least one the backside trench 79, and over the top surface of the contact level dielectric layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 10A:
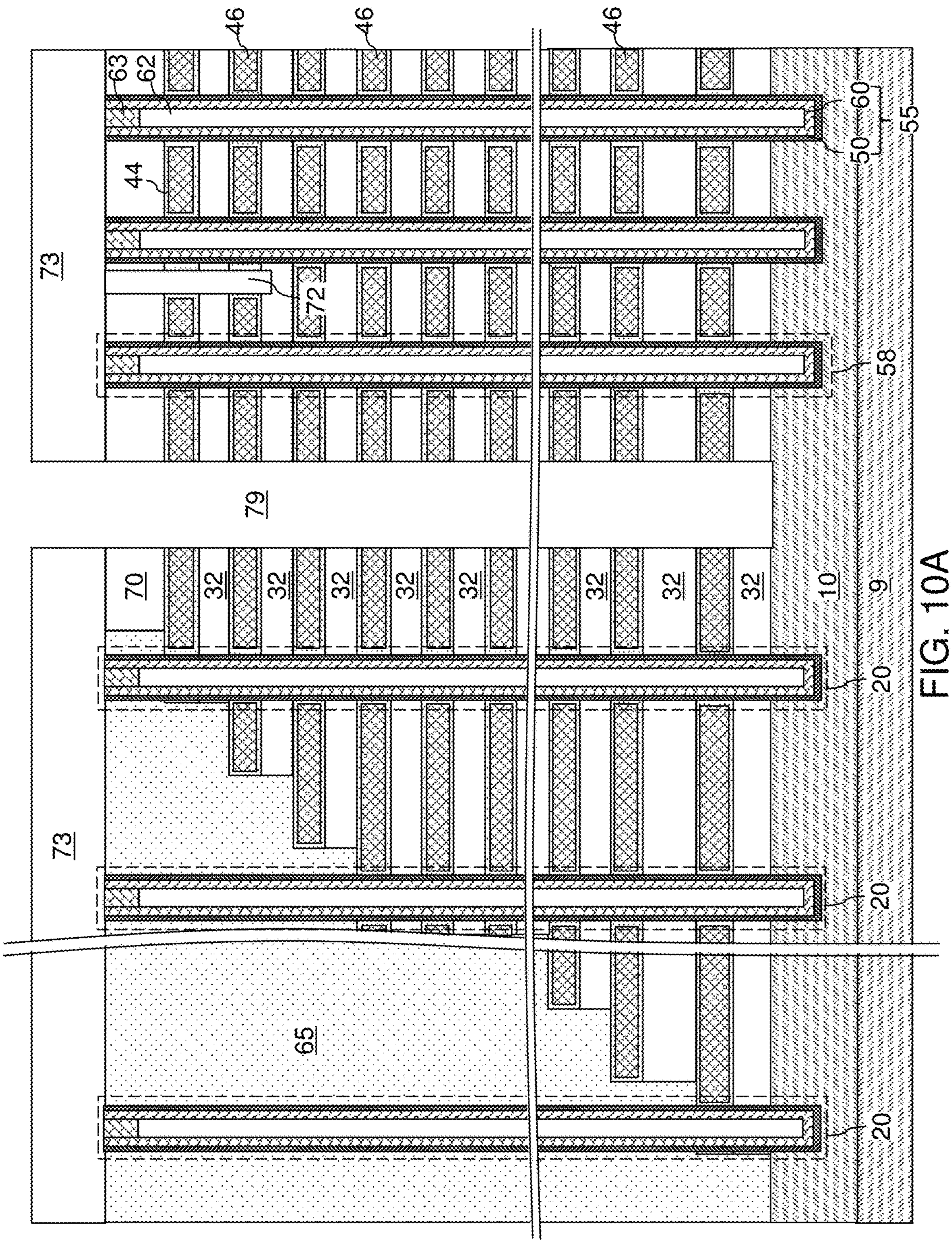
FIG. 10A is a schematic vertical cross-sectional view of the exemplary structure after removal of a deposited conductive material from within the backside trench according to the first embodiment of the present disclosure.
Figure 10B:
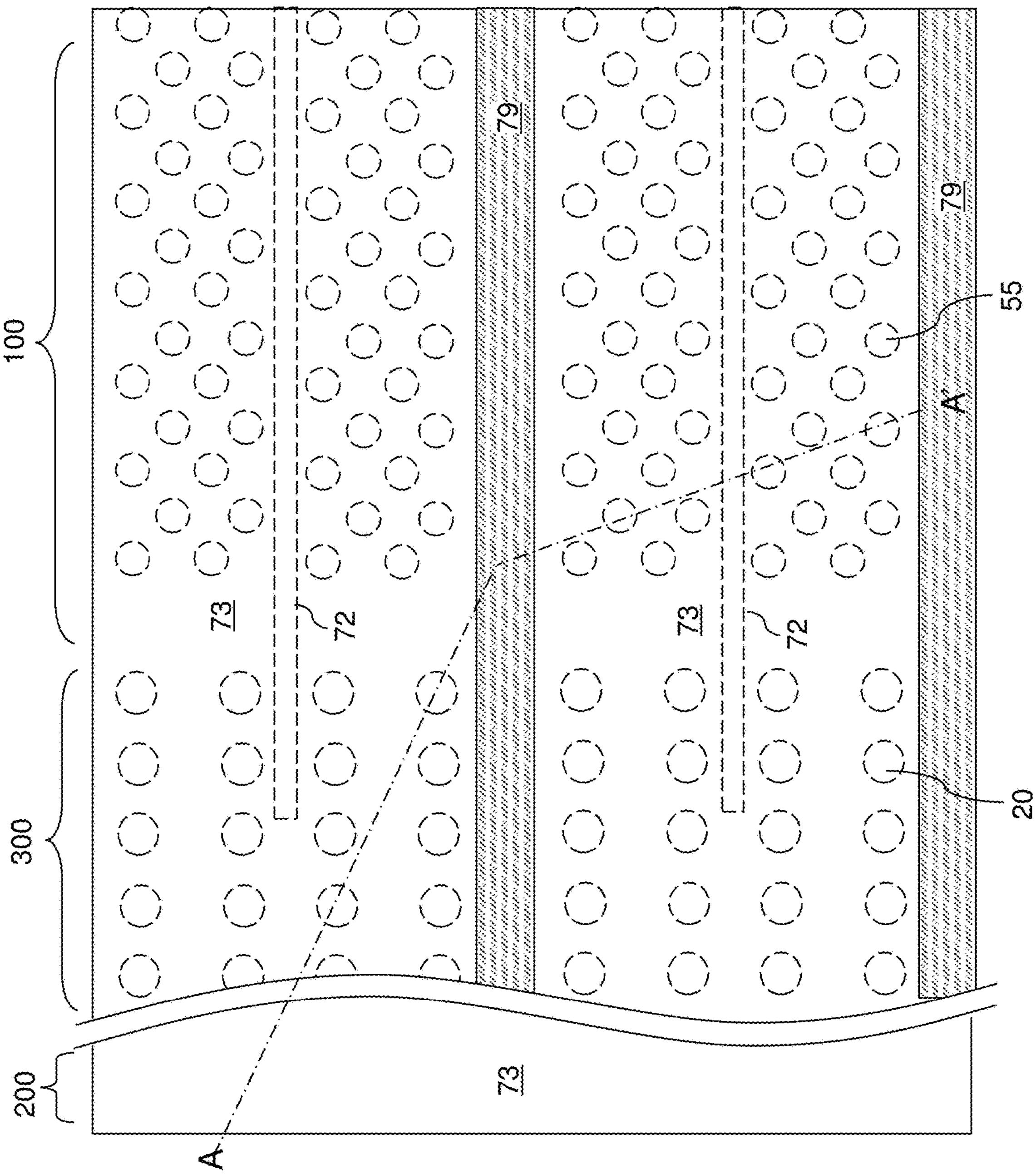
FIG. 10B is a partial see-through top-down view of the exemplary structure of FIG. 10A. The vertical plane A-A' is the plane of the schematic vertical cross-sectional view of FIG. 10A.

Referring to FIGS. 10A and 10B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. A backside cavity 79' is present within each backside trench 79.

Figure 11:
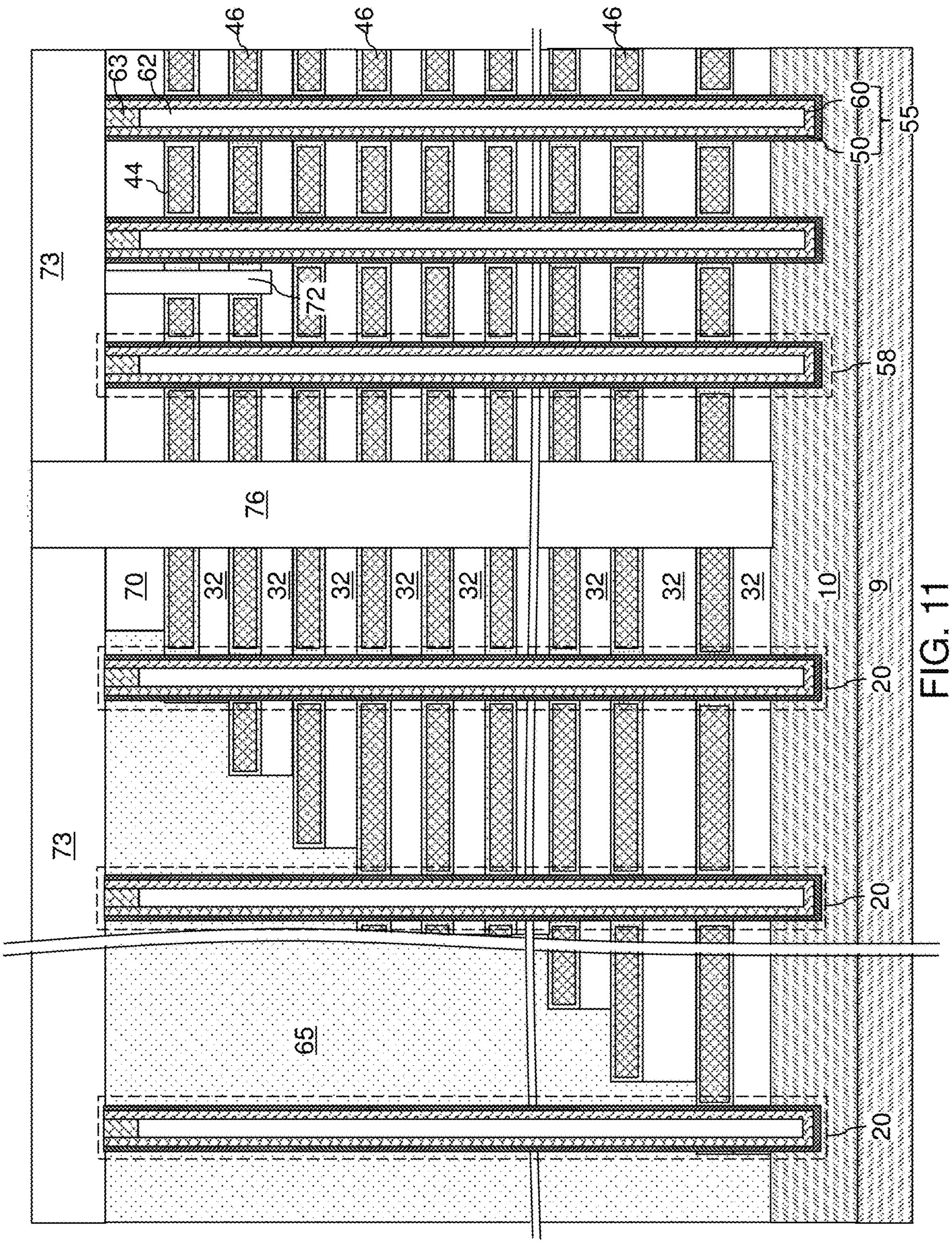
FIG. 11 is a schematic vertical cross-sectional view of the exemplary structure after formation of insulating wall structures according to the first embodiment of the present disclosure.

Referring to FIG. 11, a dielectric wall structure 76 can be formed within each backside cavity 79' by depositing at least one dielectric material in the remaining unfilled volume (i.e., the backside cavity 79') of the backside trench 79. The at least one dielectric material can include silicon oxide, silicon nitride, a dielectric metal oxide, an organosilicate glass, or a combination thereof. In one embodiment, the insulating material layer can include silicon oxide. The at least one dielectric material can be deposited, for example, by low pressure chemical vapor deposition (LPCVD) or atomic layer deposition (ALD). Optionally, the at least one dielectric material can be planarized using the contact level dielectric layer 73 as a stopping layer. If chemical mechanical planarization (CMP) process is used, the contact level dielectric layer 73 can be used as a CMP stopping layer. Each remaining continuous portion of the at least one conductive material in the backside trenches 79 constitutes a dielectric wall structure 76. The dielectric wall structures 76 can be formed between each neighboring pair of alternating stacks (32, 46) of insulating layers 32 and electrically conductive layers.

Figure 12A:
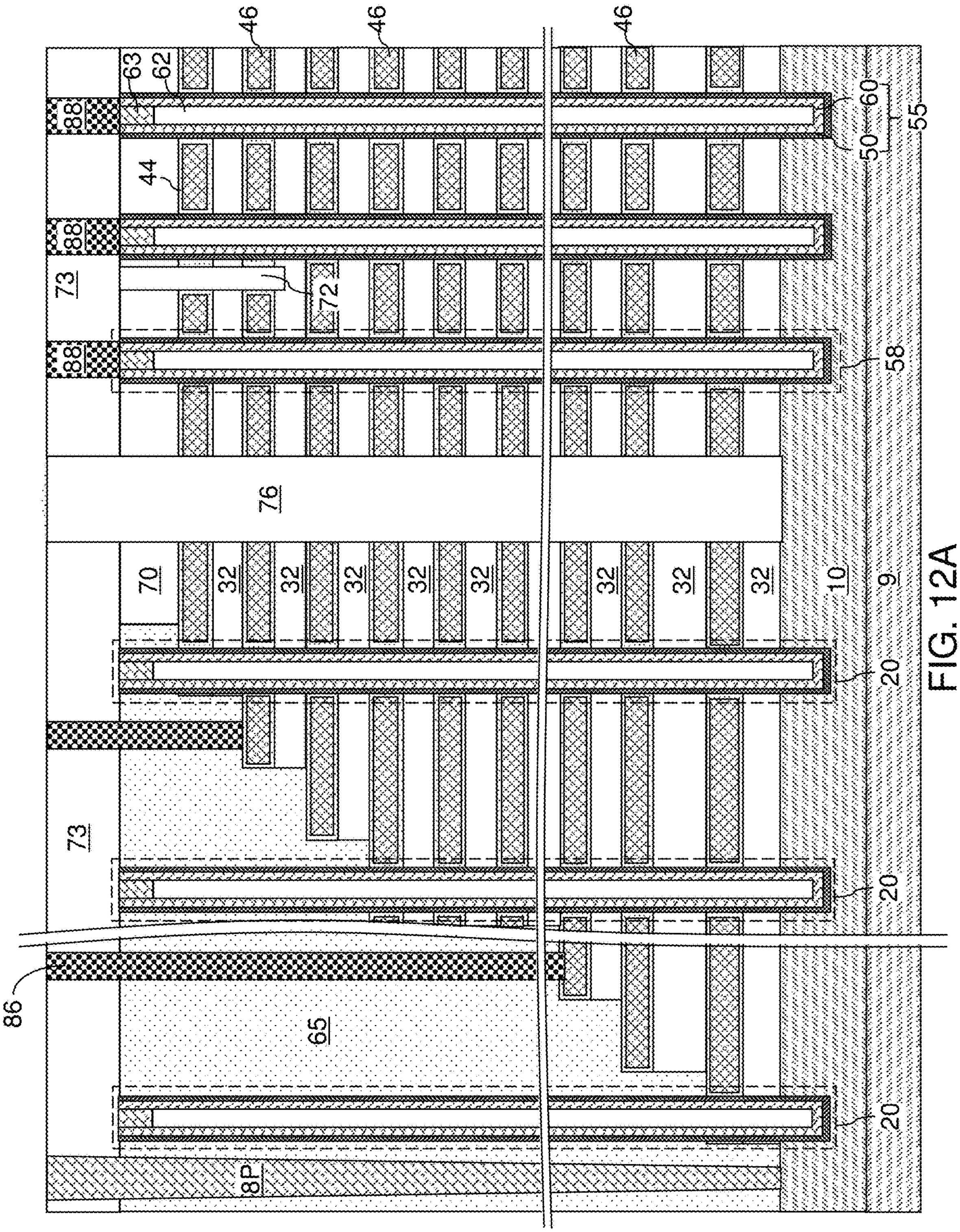
FIG. 12A is a schematic vertical cross-sectional view of the exemplary structure after formation of contact via structures according to the first embodiment of the present disclosure.
Figure 12B:
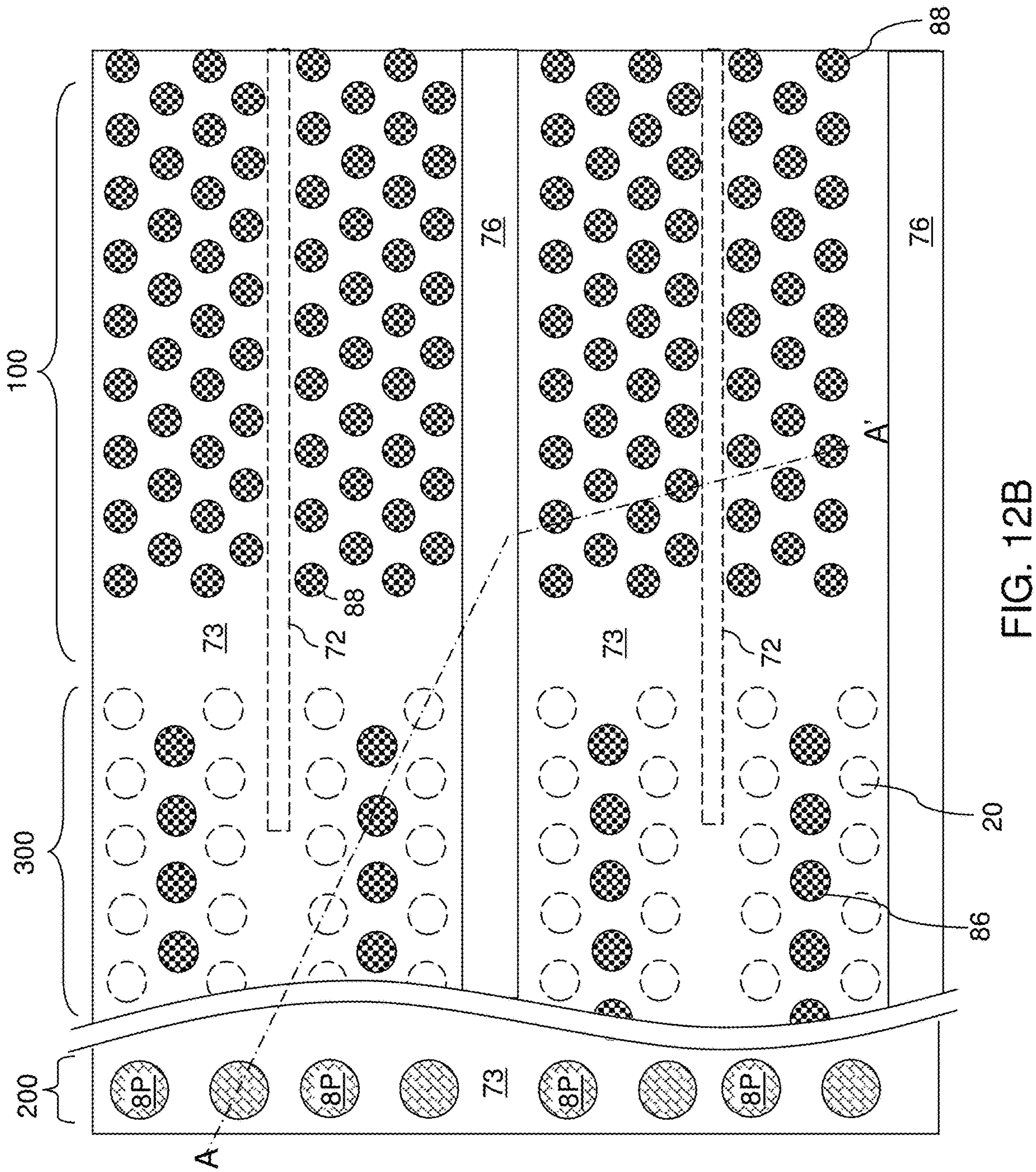
FIG. 12B is a top-down view of the exemplary structure of FIG. 12A. The vertical plane A-A' is the plane of the schematic vertical cross-sectional view of FIG. 12A.

Referring to FIGS. 12A and 12B, additional contact via structures (88, 86, 8P) can be formed through the contact level dielectric layer 73, and optionally through the stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the stepped dielectric material portion 65. Pass-through via structures 8P can be formed through the stepped dielectric material portion 65 to the semiconductor material layer 10.

Figure 13A:
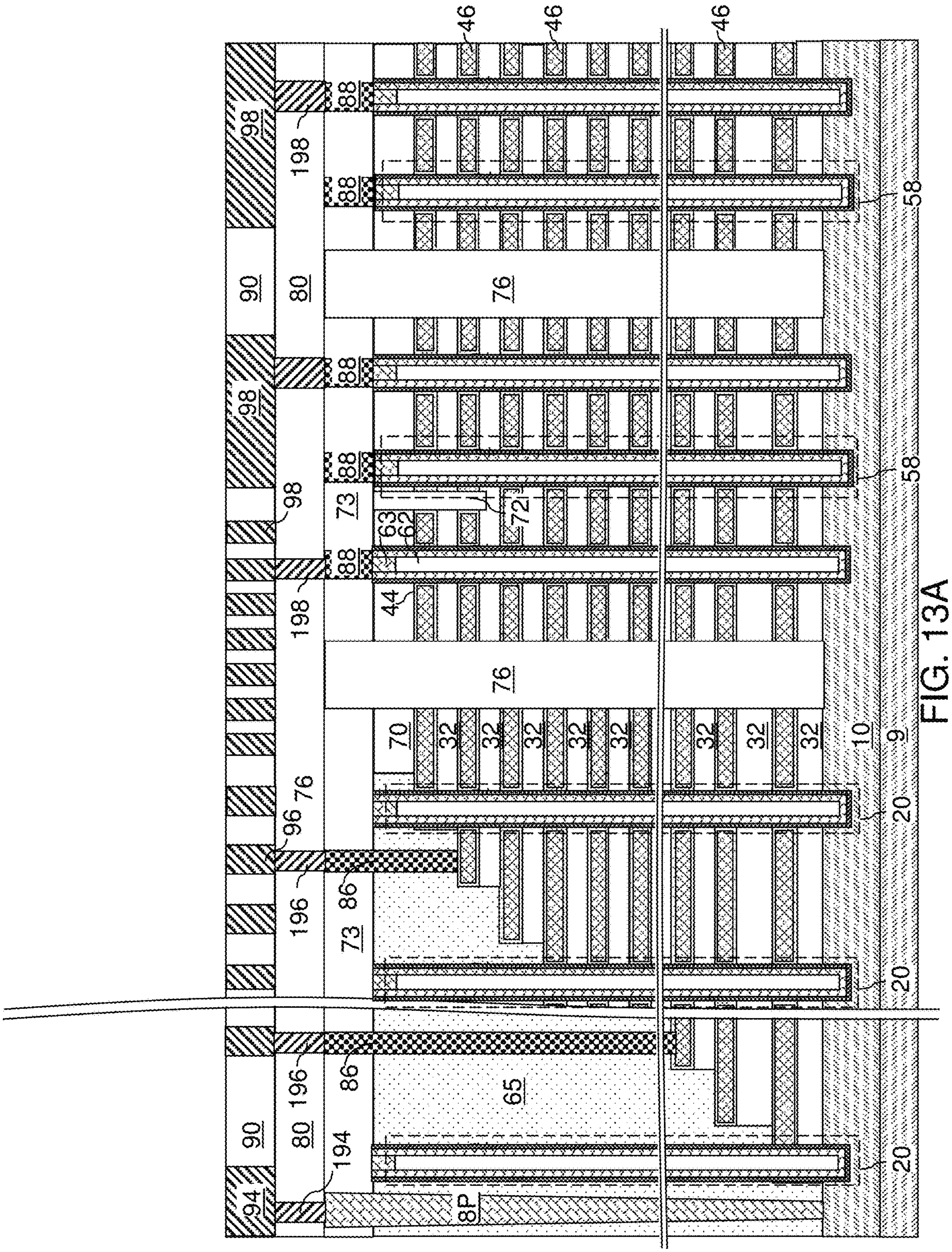
FIG. 13A is a schematic vertical cross-sectional view of the exemplary structure after formation of first via level metal interconnect structures and first line level metal interconnect structures according to the first embodiment of the present disclosure.
Figure 13B:
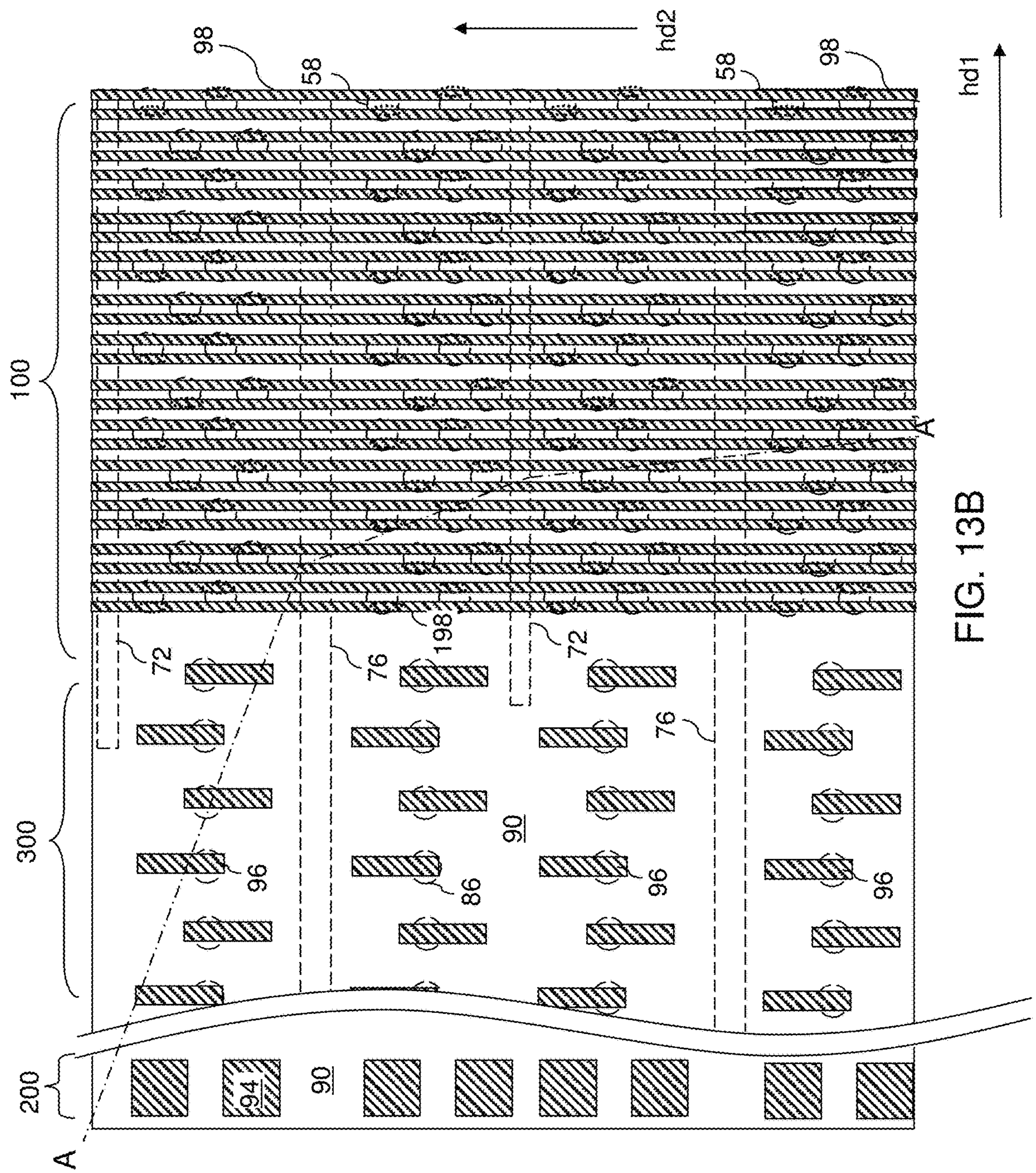
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Figure 14:
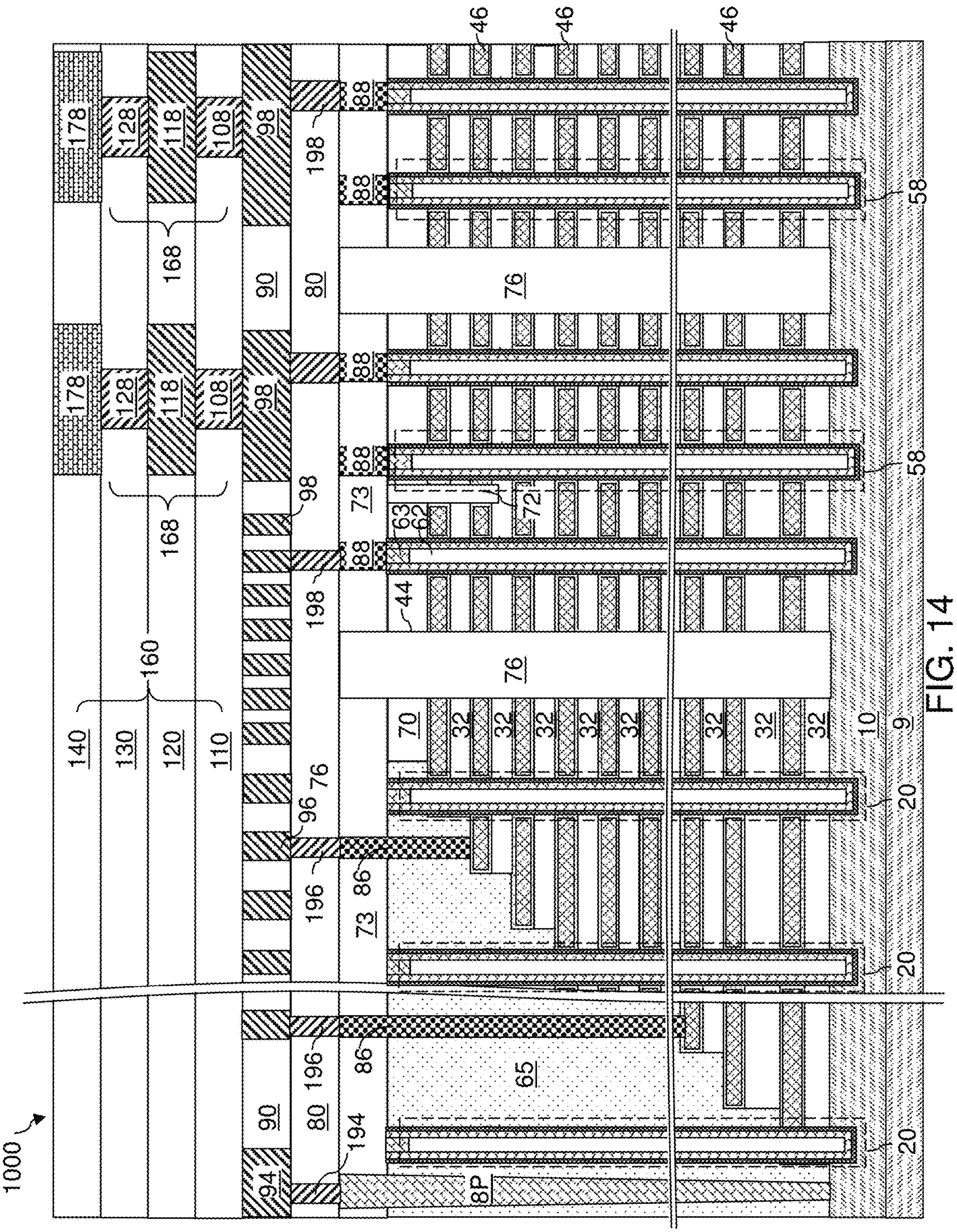
FIG. 14 is a schematic vertical cross-sectional view of the exemplary structure that forms a first semiconductor die after formation of additional metal interconnect structures according to the first embodiment of the present disclosure.

Referring to FIG. 14, a memory die 1000 is provided by performing additional processing steps on the exemplary structure of FIGS. 13A and 13B. Specifically, additional metal interconnect structures 168 included in additional interconnect level dielectric layers 160 are formed. In an illustrative example, the additional interconnect level dielectric layers 160 can include a via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and first bonding structures 178 (such as metallic pad structures) included in the metallic pad structure level dielectric layer 140. While the present disclosure is described using an example in which the additional interconnect level dielectric layers 160 include the first via level dielectric layer 110, the second line level dielectric layer 120, the second via level dielectric layer 130, and the metallic pad structure level dielectric layer 140, embodiments are expressly contemplated herein in which the additional interconnect level dielectric layers 160 include a different number and/or different combinations of dielectric material layers. The memory die 1000 includes a three-dimensional array of memory elements. Electrical connection paths can be provided by each combination of a first bonding structure 178 and a set of metal interconnect structures {(194, 94, 108, 118, 128), (196, 96, 108, 118, 128), or (198, 98, 108, 118, 128)}.

Figure 15:
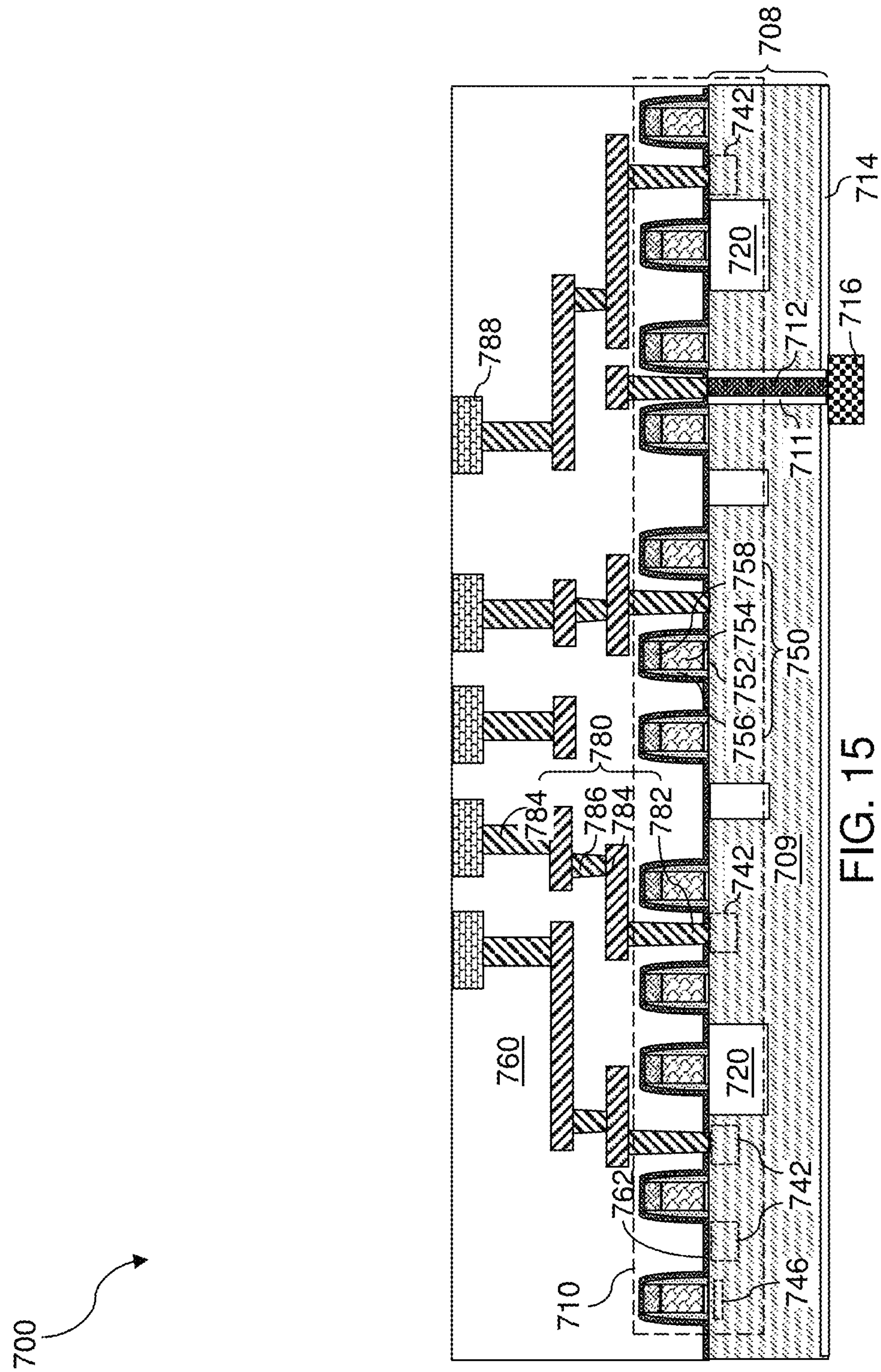
FIG. 15 is a schematic vertical cross-sectional view of a second semiconductor die according to the first embodiment of the present disclosure.

Referring to FIG. 15, a second semiconductor die can be provided, which can be a logic die 700 including various semiconductor devices 710. The semiconductor devices 710 includes a peripheral circuitry for operation of the three-dimensional memory arrays in the memory die 1000. The peripheral circuitry can include a word line driver that drives the electrically conductive layers 46 within the memory die 1000, a bit line driver that drives the bit lines 98 in the memory die 1000, a word line decoder circuitry that decodes the addresses for the electrically conductive layers 46, a bit line decoder circuitry that decodes the addresses for the bit lines 98, a sense amplifier circuitry that senses the states of memory elements within the memory stack structures 55 in the memory die 1000, a power supply/distribution circuitry that provides power to the memory die 1000, a data buffer and/or latch, and/or any other semiconductor circuitry that can be used to operate the array of memory stack structures 55 in the memory die 1000. The logic die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and second bonding structures 788 (such as metallic pad structures) that may be configured to function as bonding pads.

The logic die 700 can include a backside insulating layer 714 located on the backside surface of the logic die substrate 708. Laterally-insulated through-substrate via structures (711, 712) can be formed through the logic die substrate 708 to provide electrical contact to various input nodes and output nodes of the periphery circuitry. Each laterally-insulated through-substrate via structure (711, 712) includes a through-substrate conductive via structure 712 and a tubular insulating liner 711 that laterally surrounds the through-substrate conductive via structure 712. Backside bonding pads 716 can be formed on surface portions of the laterally-insulated through-substrate via structures (711, 712). Generally, a semiconductor die is provided, which includes semiconductor devices 710 located on a semiconductor substrate (such as the substrate semiconductor layer 709). The second bonding structures 788 overlie, and are electrically connected to, the semiconductor devices 710, and laterally-insulated through-substrate via structures (711, 712) can extend through the semiconductor substrate.

Figure 16:
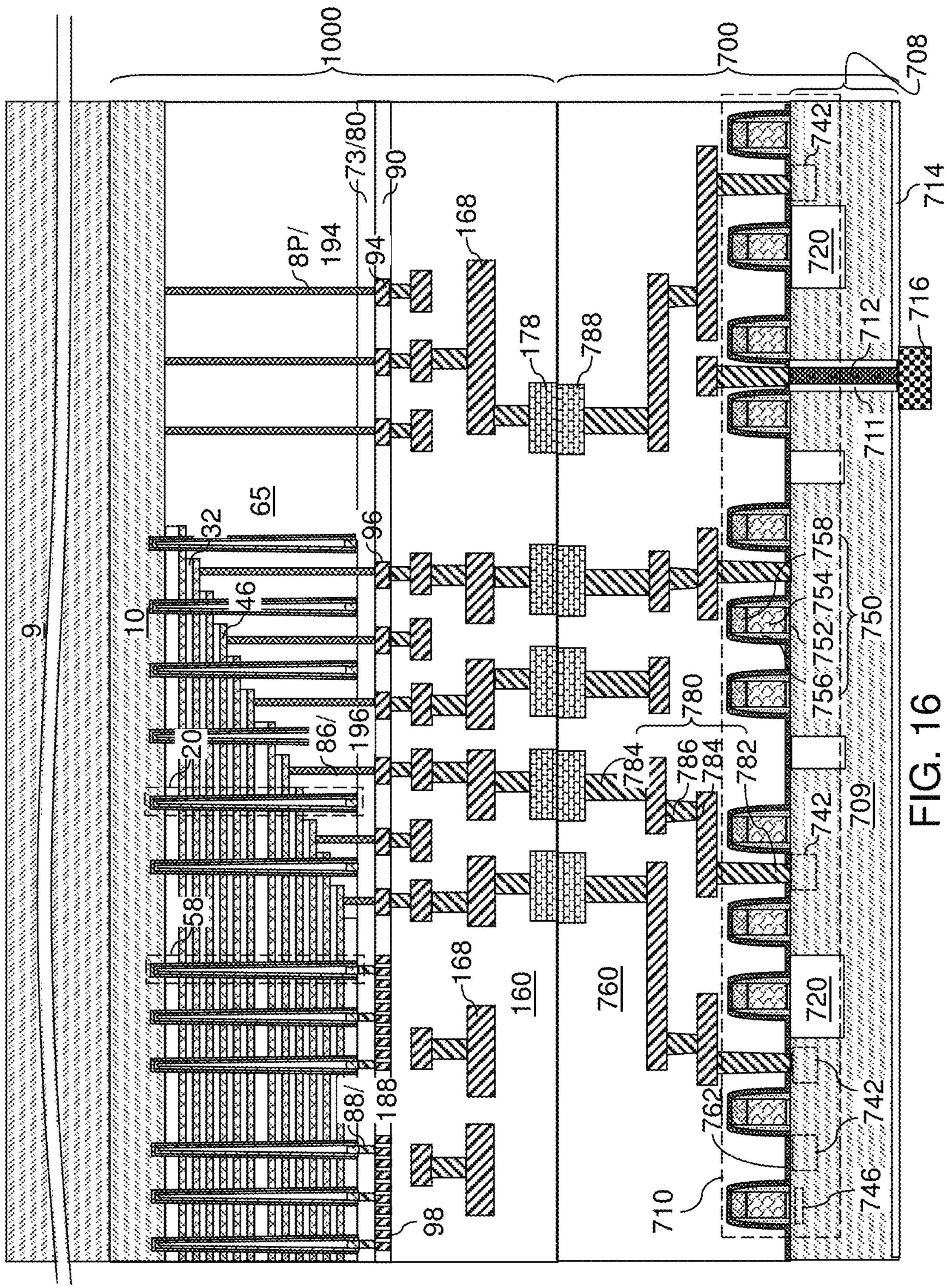
FIG. 16 is a schematic vertical cross-sectional view of a bonded assembly of the first semiconductor die and the second semiconductor die according to the first embodiment of the present disclosure.

Referring to FIG. 16, the memory die 1000 and the logic die 700 are positioned such that the second bonding structures 788 of the logic die 700 face the first bonding structures 178 of the memory die 1000. In one embodiment, the memory die 1000 and the logic die 700 can be designed such that the pattern of the second bonding structures 788 of the logic die 700 is the mirror pattern of the pattern of the first bonding structures 178 of the memory die 1000. The memory die 1000 and the logic die 700 can be bonded to each other by metal-to-metal bonding. Alternatively, an array of solder material portions may be used to bond the memory die 1000 and the logic die 700 through the array of solder material portions (such as solder balls).

In the case of metal-to-metal bonding, facing pairs of a first bonding structure 178 of the memory die 1000 and a second bonding structure 788 of the logic die 700 can brought to direct contact with each other, and can be subjected to an elevated temperature to induce material diffusion across the interfaces between adjoined pairs of metallic pad structures (178, 788). The interdiffusion of the metallic material can induce bonding between each adjoined pairs of metallic pad structures (178, 788). In addition, the logic-side dielectric layers 760 and the interconnect level dielectric layers 160 can include a dielectric material (such as a silicate glass material) that can be bonded to each other. In this case, physically exposed surfaces of the logic-side dielectric layers 760 and the interconnect level dielectric layers 160 can be brought to direct contact with each other and can be subjected to thermal annealing to provide additional bonding.

In case an array of solder material portions is used to provide bonding between the memory die 1000 and the logic die 700, a solder material portion (such as a solder ball) can be applied to each of the first bonding structures 178 of the memory die 1000, and/or to each of the second bonding structures 788 of the logic die 700. The memory die 1000 and the logic die 700 can be bonded to each other through an array of solder material portions by reflowing the solder material portions while each solder material portion is contacted by a respective pair of a first bonding structure 178 of the memory die 1000 and a second bonding structure 788 of the logic die 700.

Generally, a logic die 700 can be bonded to a memory die 1000. The memory die 1000 comprises an array of memory stack structures 55, and the logic die 700 comprises a complementary metal oxide semiconductor (CMOS) circuit that includes a peripheral circuitry electrically coupled to nodes of the array of memory stack structures 55 through a subset of metal interconnect structures 168 included within the memory die 1000. The memory die 1000 includes the semiconductor material layer 10, and is attached to the carrier substrate 9.

Figure 17:
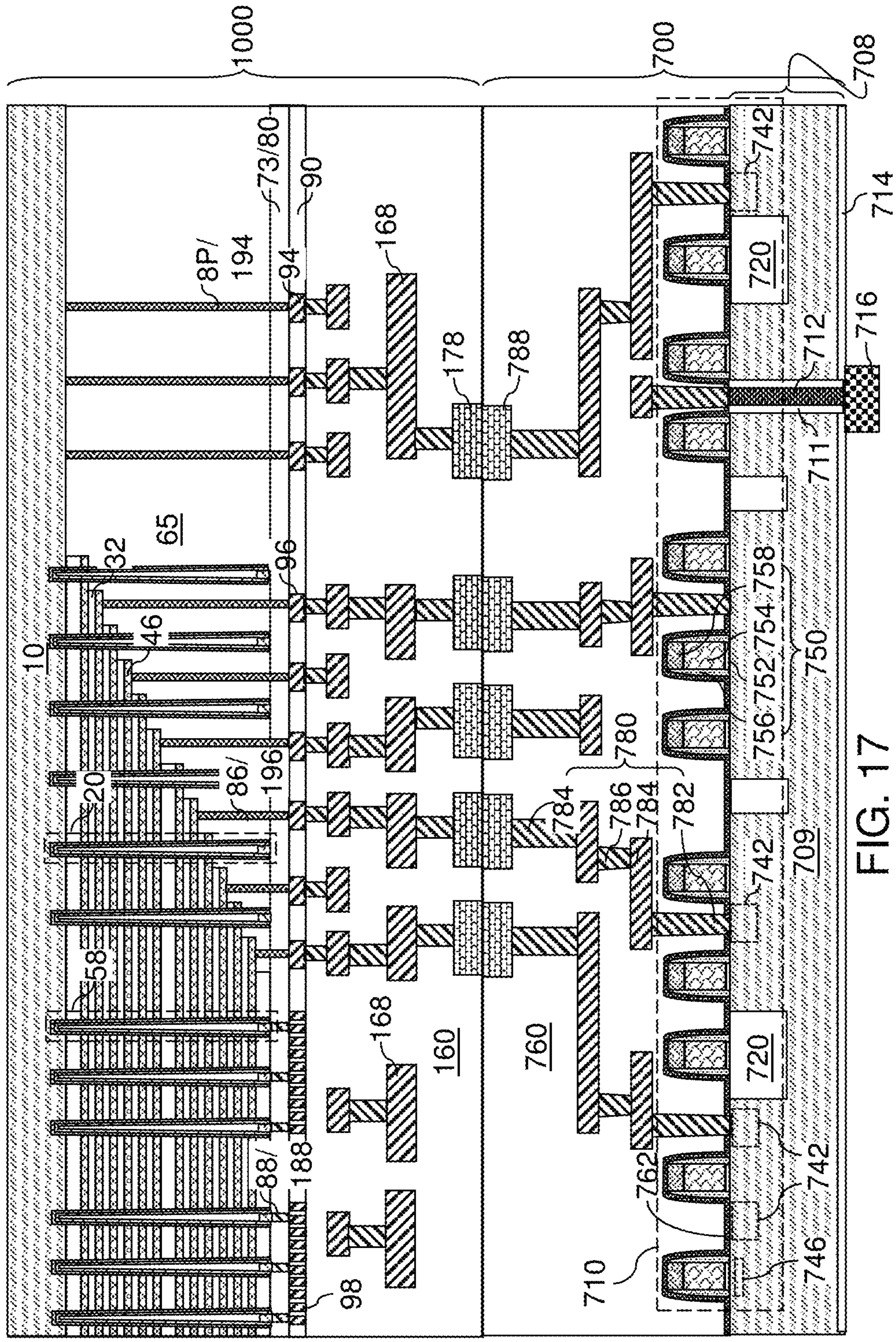
FIG. 17 is a schematic vertical cross-sectional view of the bonded assembly after removal of a distal portion of the carrier substrate according to the first embodiment of the present disclosure.

Referring to FIG. 17, the carrier substrate 9 can be removed from above the semiconductor material layer 10. For example, a backside grinding process can be performed to remove the carrier substrate 9 in case the carrier substrate 9 includes a bulk portion of a semiconductor wafer. In case the carrier substrate 9 includes a different material than the semiconductor material layer 10, a suitable separation method may be used to detach the carrier substrate 9 from the semiconductor material layer 10. In one embodiment, the carrier substrate 9 may be attached to the semiconductor material layer 10 through a sacrificial separation material layer that is isotropically etched (for example, in a wet etch process) to induce separation of the carrier substrate 9 from the semiconductor material layer 10. In one embodiment, the sacrificial separation material layer can include silicon nitride, and removal of the sacrificial separation material layer can be performed by a wet etch process using hot phosphoric acid. A backside surface of the semiconductor material layer 10 can be physically exposed upon removal of the carrier substrate 9.

Figure 18:
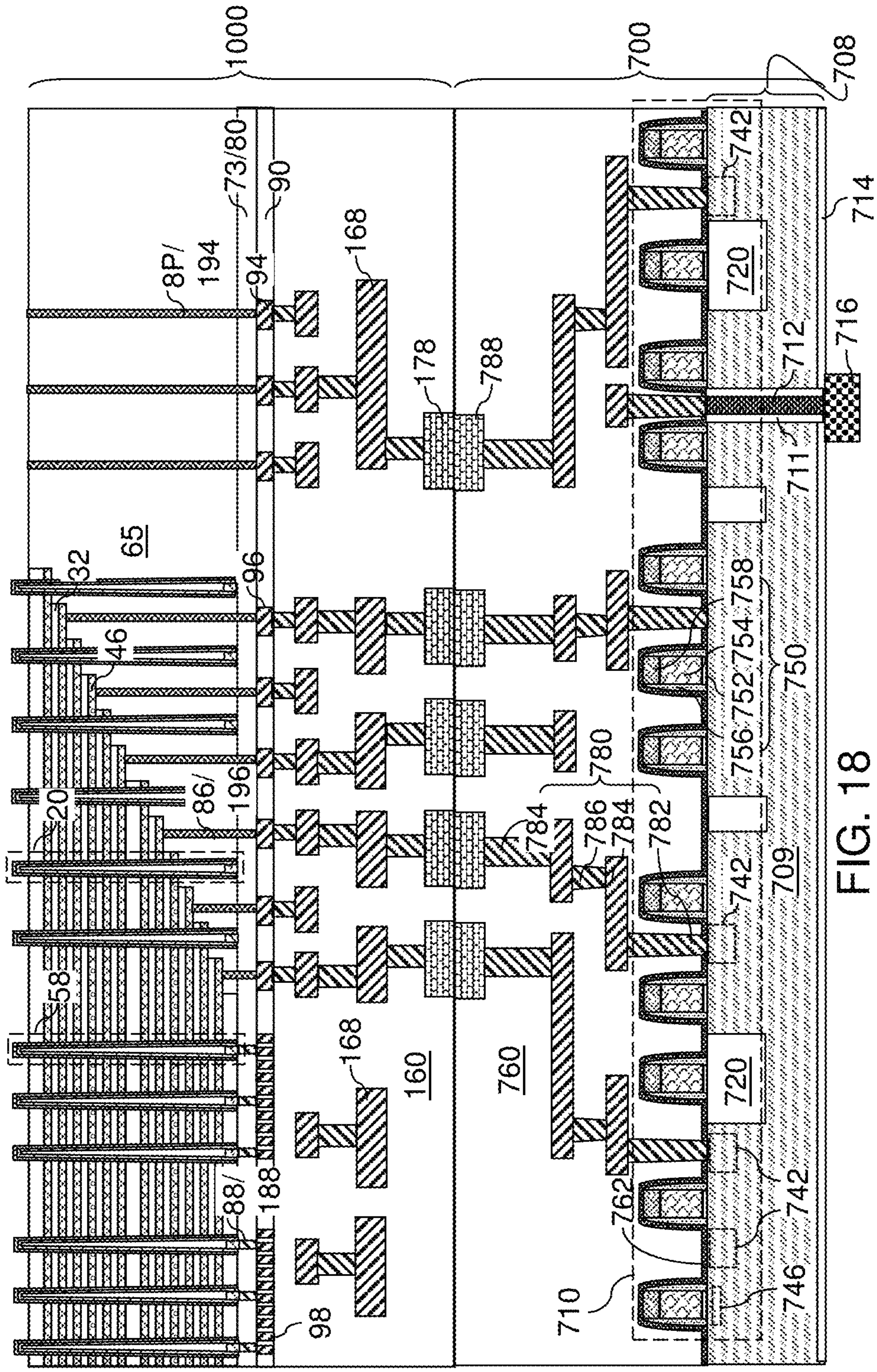
FIG. 18 is a schematic vertical cross-sectional view of the bonded assembly after removal of a proximal portion of the carrier substrate according to the first embodiment of the present disclosure.
Figure 19B:
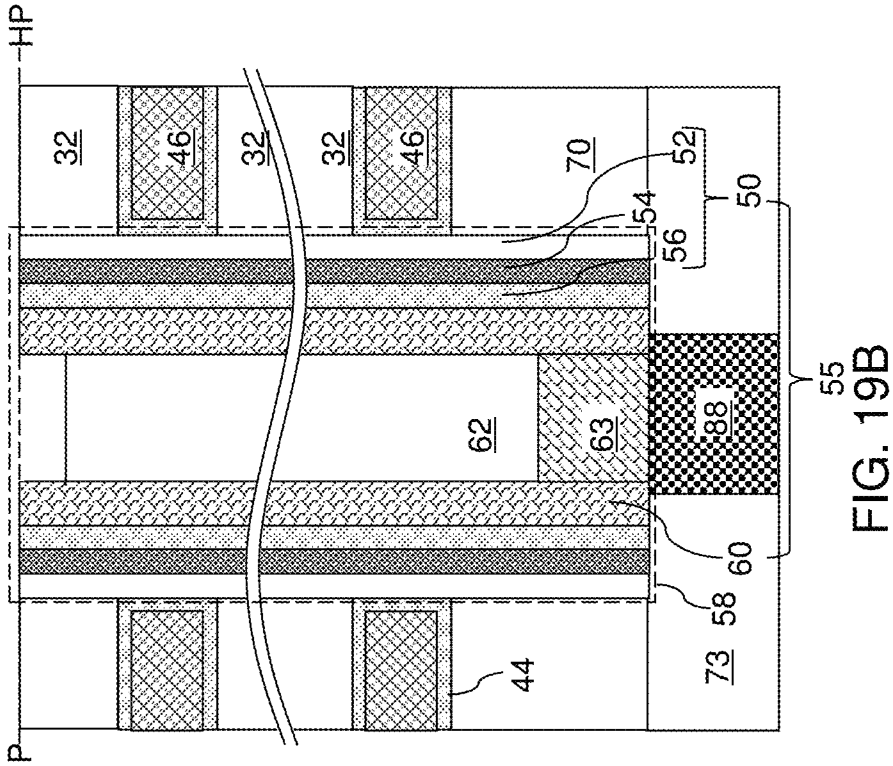
FIGS. 19A-19C are sequential vertical cross-sectional views of a first configuration for a memory opening fill structure during various processing steps up to deposition of a doped semiconductor material layer according to the first embodiment of the present disclosure.
Figure 19A:
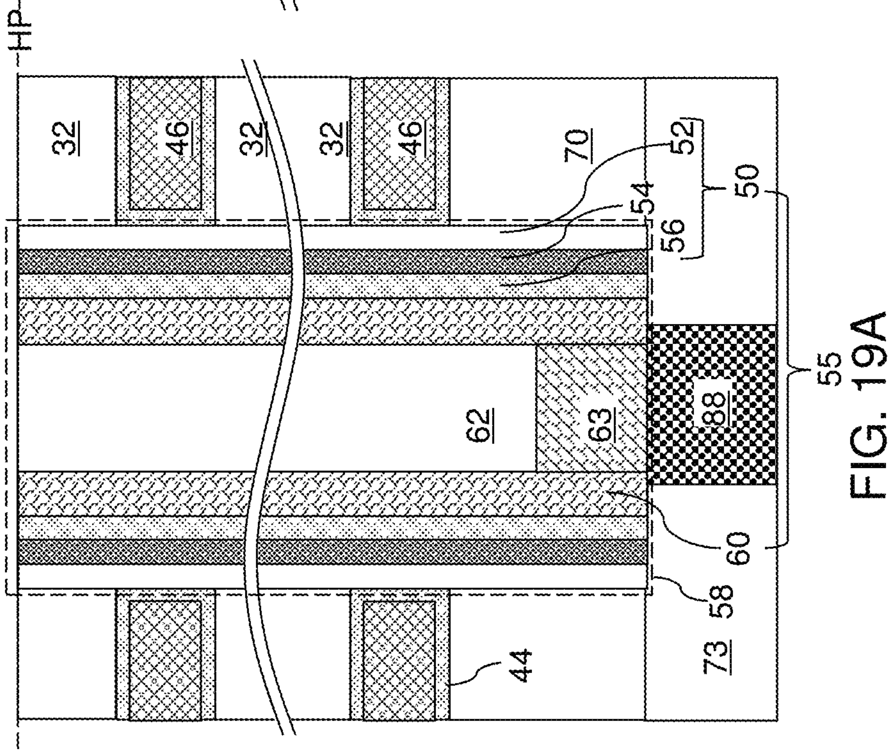

Referring to FIGS. 18 and 19A, the semiconductor material layer 10 can be removed. In one embodiment, removal of the semiconductor material layer 10 may be performed by chemical mechanical planarization (CMP) using the most distal one of the insulating layers 32 and the stepped dielectric material portion 65 as stopping structures. A distal end of each of the vertical semiconductor channels 60 is physically exposed upon removal of the semiconductor material layer 10. A planar surface of a most distal one of the insulating layers 32 (i.e., the bottommost insulating layer 32 formed directly on the semiconductor material layer 10 at the processing steps of FIG. 2) within the alternating stack (32, 46) is physically exposed upon removal of the semiconductor material layer 10. A planar surface of the stepped dielectric material portion 65 is physically exposed upon removal of the semiconductor material layer 10. Portions of the memory stack structures 55 that protrude through a horizontal plane HP including the planar surface of the most distal one of the insulating layers 32 are removed during the CMP process.

Referring to FIG. 19B, physically exposed surfaces of the dielectric cores 62 can be vertically recessed selective to the semiconductor material of the vertical semiconductor channels 60. An isotropic etch process that etches the material of the dielectric cores 62 selective to the semiconductor material of the vertical semiconductor channels 60 can be performed to vertically recess the dielectric cores 62. For example, a wet etch using dilute hydrofluoric acid can be used to vertically recess the distal planar surfaces of the dielectric cores 62 selective to the annular distal surfaces of the vertical semiconductor channels 60 that are located within the horizontal plane HP that includes the annular distal surfaces of the vertical semiconductor channels 60. Vertical recessing of the dielectric cores 62 increases the area of the physically exposed surfaces of the vertical semiconductor channels 60, thereby lowering contact resistance between the vertical semiconductor channels 60 and a source layer to be subsequently formed thereupon. In one embodiment, the dielectric cores 62 can include a dielectric material having a greater etch rate than the dielectric material of the insulating layers 32. For example, the dielectric cores 62 can include borosilicate glass, borophosphosilicate glass, or organosilicate glass, and the insulating layers 32 can include densified undoped silicate glass. In one embodiment, the physically exposed surface of the insulating layer 32 (which is most distal from the interface between the memory die 1000 and the logic die 700, and is most proximal to a source layer to be subsequently formed) may be collaterally recessed during recessing of the physically exposed planar surfaces of the dielectric cores 62. Distal surfaces of the pass-through via structures 8P can be physically exposed.

Figure 19C:
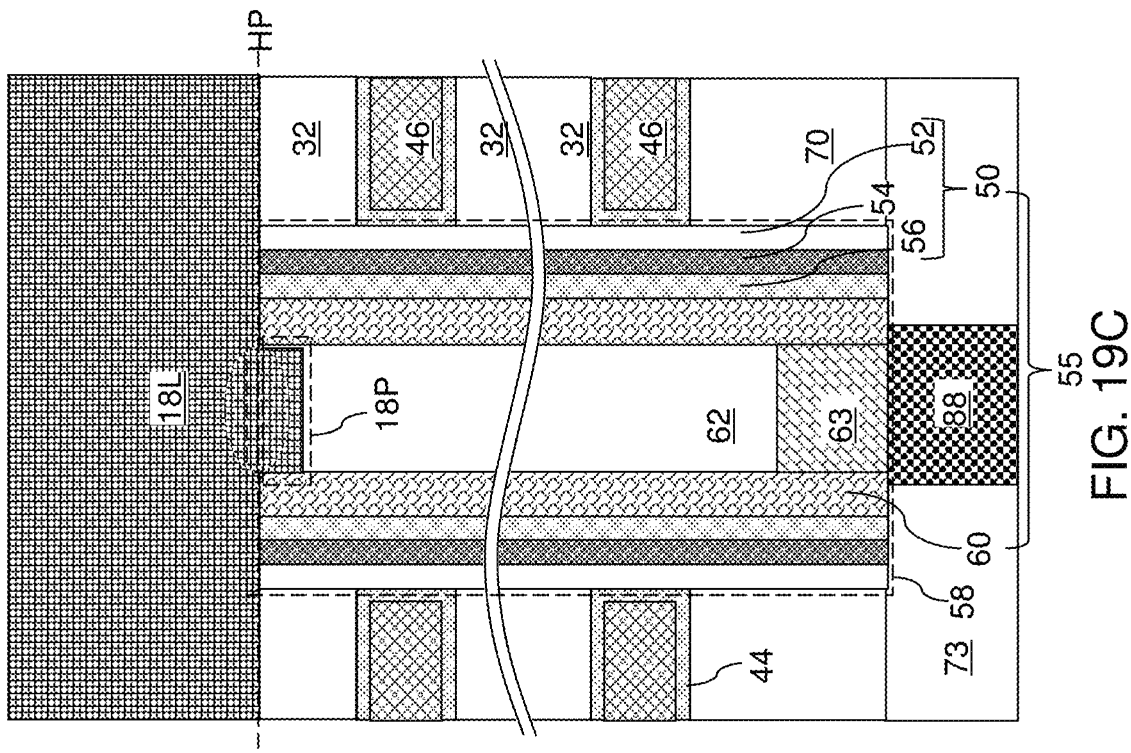
Figure 20:
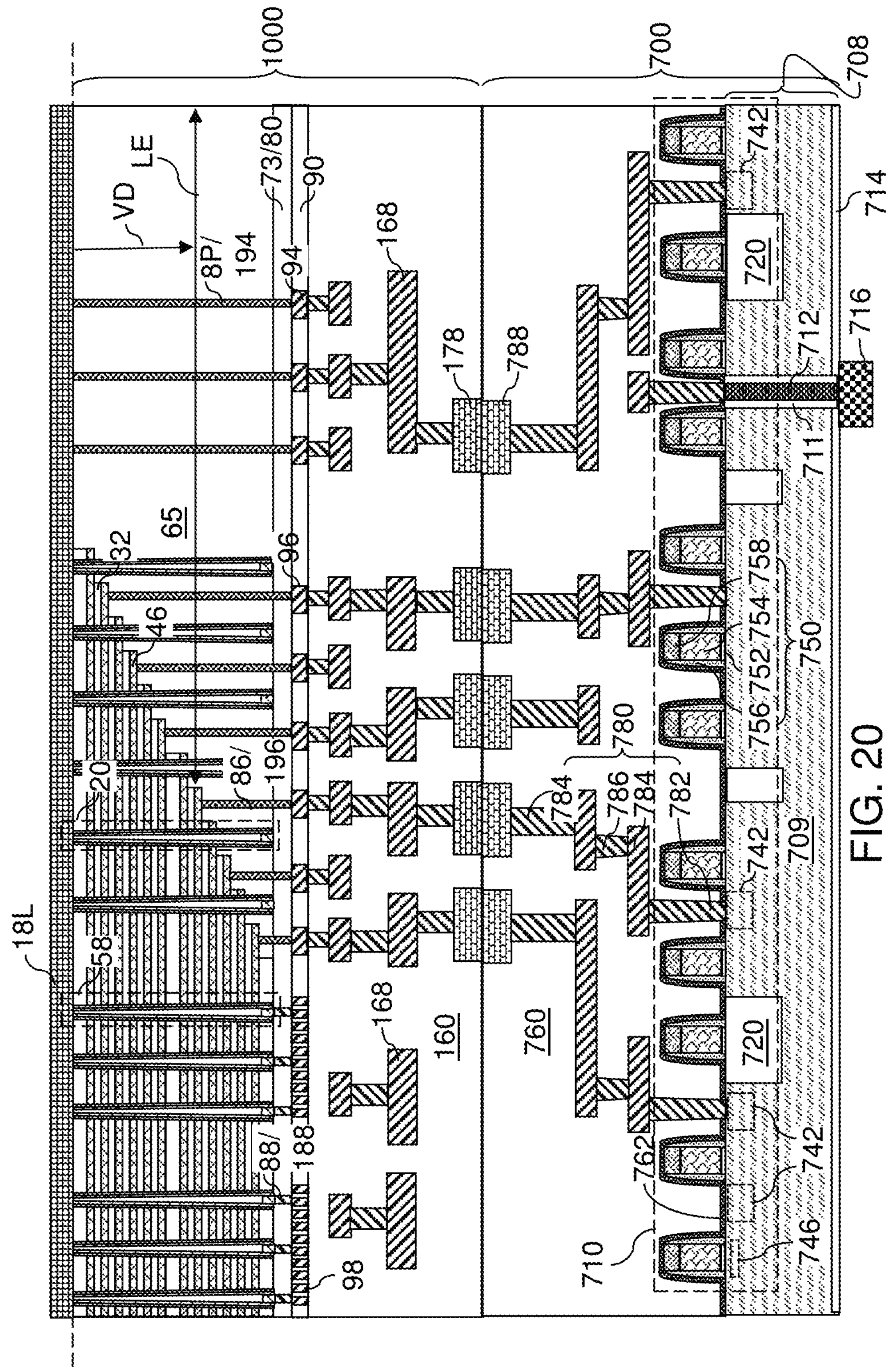
FIG. 20 is a vertical cross-sectional view of the bonded assembly after deposition of a doped semiconductor material layer according to the first embodiment of the present disclosure.

Referring to FIGS. 19C and 20, a doped semiconductor material layer 18L can be deposited directly on the physically exposed surfaces of the vertical semiconductor channels 60, the planar surface of the physically exposed one of the insulating layers 32, and on the physically exposed planar surface of the stepped dielectric material portion 65. The doped semiconductor material layer 18L can include a conductive semiconductor material (i.e., a heavily doped semiconductor material) having a doping of the second conductivity type, i.e., the opposite of the first conductivity type. Thus, the doped semiconductor material layer 18L can include a doped semiconductor material having a conductivity greater than $1.0\times10^5$ S/cm. The thickness of the doped semiconductor material layer 18L can be in a range from 100 nm to 1,000 nm, although lesser and greater thicknesses can also be used. Vertically protruding portions 18P of the doped semiconductor material layer 18L vertically protrude across the horizontal plane including the annular top surfaces of the vertical semiconductor channels 60 toward a respective one of the dielectric cores 62, and contacts the respective one of the dielectric cores 62.

Figure 21:
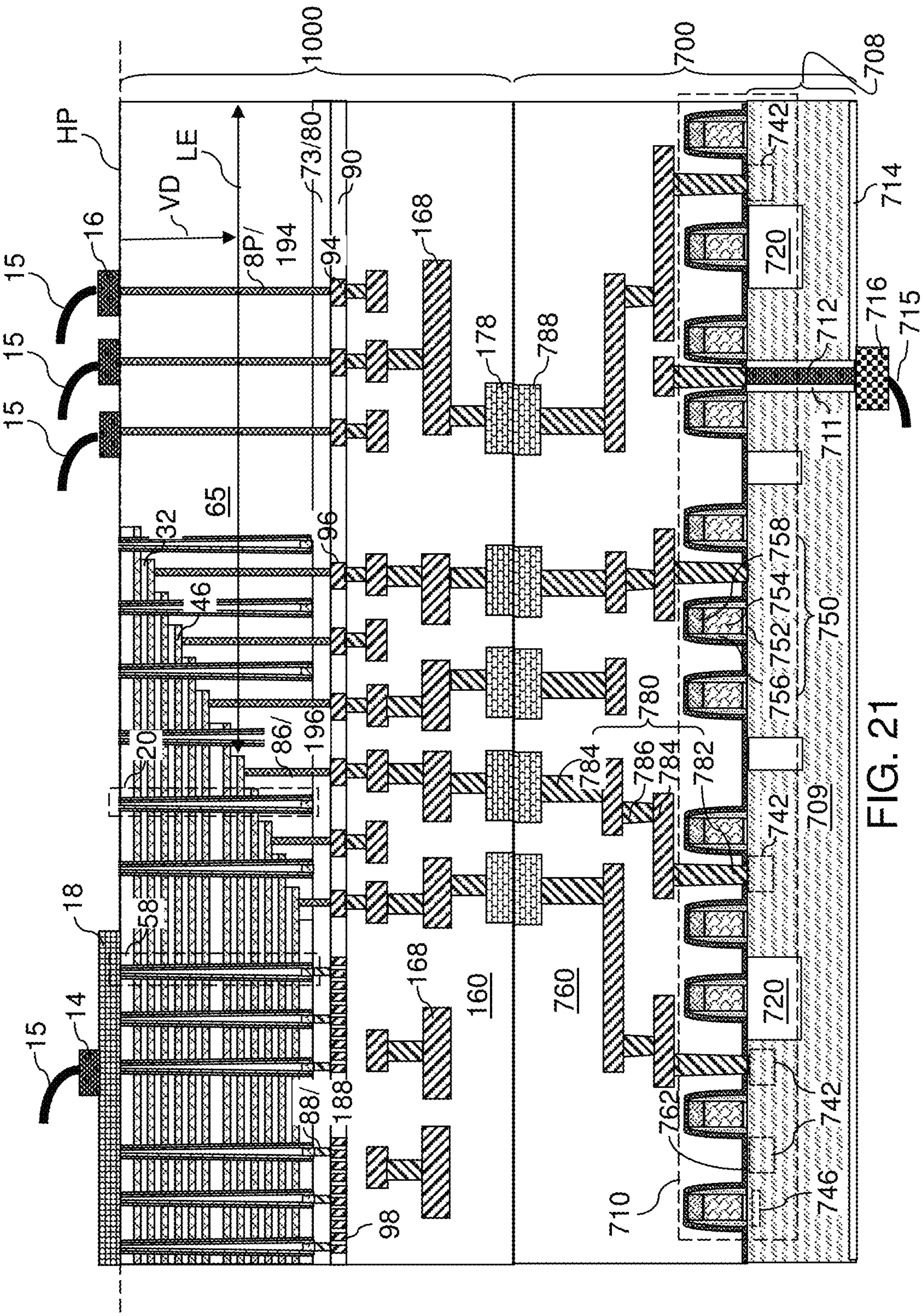
FIG. 21 is a vertical cross-sectional view of the bonded assembly after patterning the doped semiconductor material layer into a source layer and after formation of various bonding pads and attachment of bonding wires according to the first embodiment of the present disclosure.

Referring to FIG. 21, the doped semiconductor material layer 18L can be patterned into a source layer 18, for example, by a combination of lithographic methods and an etch process. A lithographically patterned photoresist layer can cover only the portion of the doped semiconductor material layer 18L located within the memory array region. An etch process can be used to remove portions of the doped semiconductor material layer 18L that are not covered by the patterned photoresist layer. The photoresist layer can be removed, for example, by ashing. The source layer 18 is formed directly on the distal end of each of the vertical semiconductor channels 60 within the memory opening fill structures 58, and does not contact any of the vertical semiconductor channels 60 within the support pillar structures 20. The lateral extent of the source layer 18 can be confined within the areas of the memory regions 100. The source layer 18 includes a doped semiconductor material having a conductivity greater than $1.0\times10^5$ S/cm. Optionally, a dielectric passivation layer (not shown) may be formed over the alternating stack (32, 46), the stepped dielectric material portion 65, and the source layer 18.

Various bonding pads (14, 16) can be formed on the source layer 18 and the pass-through via structures 8P. The bonding pads (14, 16) can include at least one source bonding pad 14 formed directly on the back side of the source layer 18, and backside bonding pads 16 formed directly on distal surfaces of the pass-through via structures 8P. Bonding wires 15 can be bonded to a respective one of the bonding pads (14, 16). A backside bonding wire 715 can be bonded to each backside bonding pad 716.

Figure 22B:
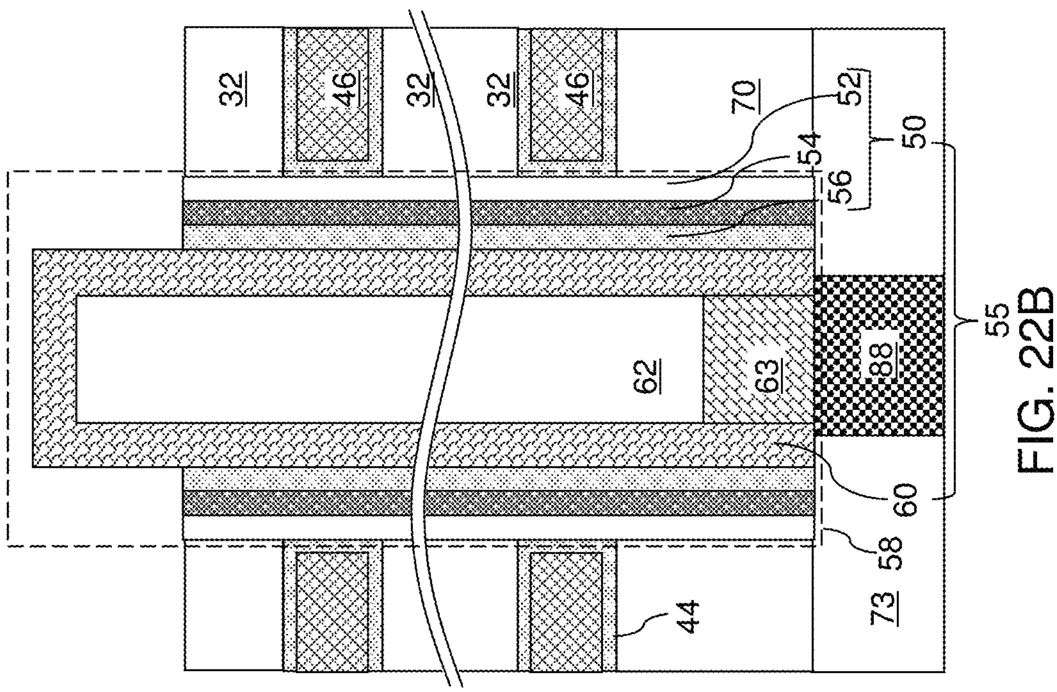
FIGS. 22A-22C are sequential vertical cross-sectional views of a second configuration for a memory opening fill structure during various processing steps up to deposition of a doped semiconductor material layer according to an embodiment of the present disclosure.
Figure 22A:
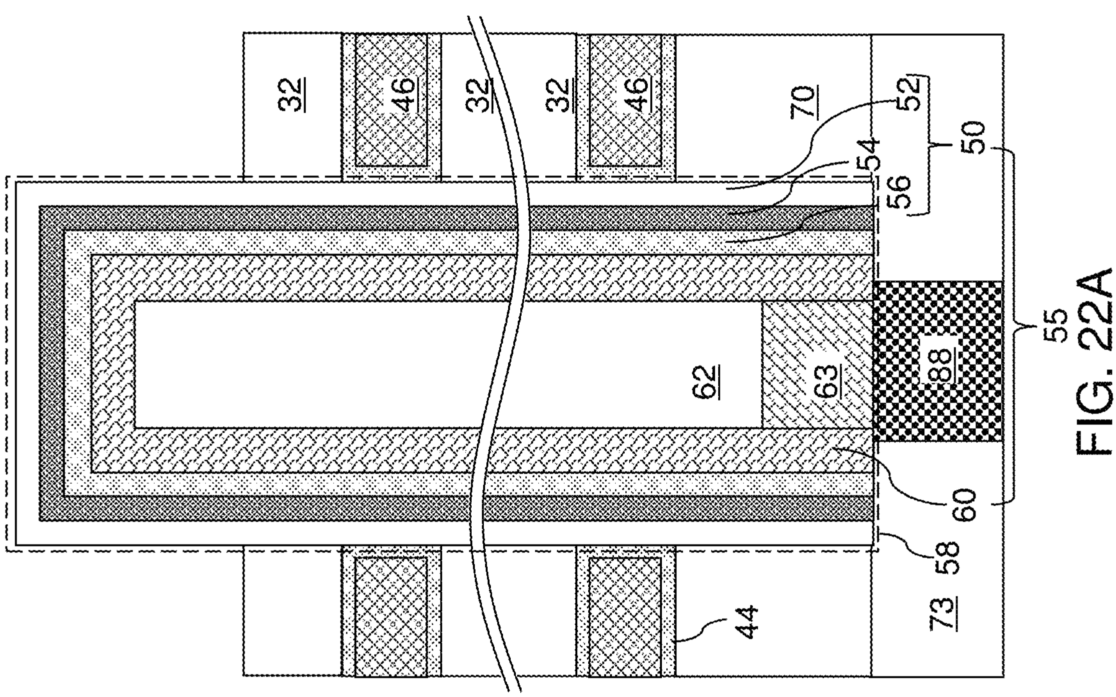
Figure 22C:
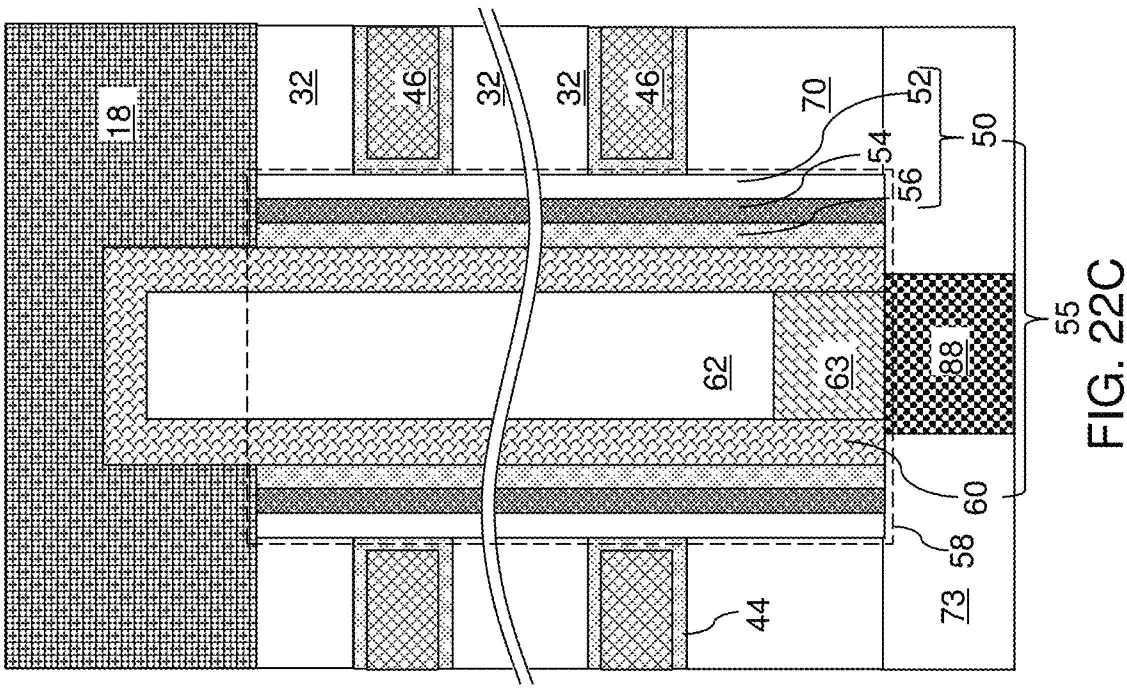

FIGS. 22A-22C illustrate an alternative configuration for a memory opening fill structure during formation of a source layer 18, which may be used in lieu of the processing steps of FIGS. 19A-19C, 20, and 21.

Referring to FIG. 22A, the semiconductor material layer 10 can be removed by a recess etch process, which can include a wet etch process or a dry etch process. In this case, removal of the semiconductor material layer 10 can be selective to the materials of the insulating layers 32, the stepped dielectric material portion 65, and the memory films 50. For example, a wet etch process using KOH or NaOH can be used to remove the semiconductor material layer 10. A distal planar surface of an insulating layer 32 of the alternating stack (32, 46), a planar distal surface of the stepped dielectric material portion 65, and distal outer surfaces of the memory films 50 can be physically exposed upon removal of the semiconductor material layer 10. The memory films 50 can function as etch stop material portions during removal of the semiconductor material layer 10. In one embodiment, the vertical semiconductor channels 60 can be covered by cap portions of the memory films 50 at the distal side of the bonded assembly over the physically exposed surface of the most distal one of the insulating layers 32. The memory films 50 may be substantially intact, or may be partially damaged, for example, by thinning of the outer layer(s) (such as the blocking dielectric layers 52 and/or the charge storage layers 54).

Referring to FIG. 22B, a series of isotropic etch processes can be performed to remove the physically exposed portions of the memory films 50. A surface of a distal portion of each vertical semiconductor channel 60 can be physically exposed after the series of isotropic etch processes. An outer sidewall of each vertical semiconductor channel 60 can vertically protrude outward from the horizontal plane including the physically exposed surface of an insulating layer 32.

Referring to FIG. 22C, the processing steps of FIGS. 19C, 20, and 21 can be performed to form a source layer 18 that contacts outer sidewalls of the vertical semiconductor channels within the memory opening fill structures 58.

The source layer 18 according to various embodiments of the present disclosure provides electrical contact to each distal end of the vertical semiconductor channels 60 without using any replacement of materials through narrow trenches. Further, the source layer 18 can contact inner sidewalls or outer sidewalls of the distal ends of the vertical semiconductor channels 60, thereby providing low contact resistance between the vertical semiconductor channels 60 and the source layer 18. Thus, reduction in process complexity and enhancement of electrical contact between the vertical semiconductor channels 60 and the source layer 18 can be achieved by the methods and structures of various embodiments of the present disclosure.

Figure 23A:
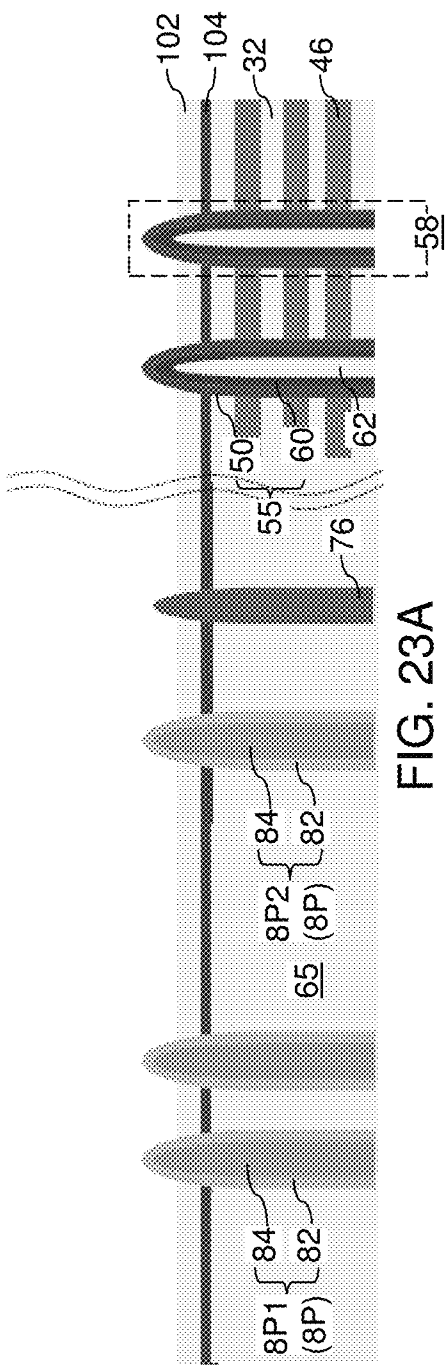
FIGS. 23A-23O are sequential vertical cross-sectional view of a first alternative configuration of a bonded assembly during various processing steps up to formation of backside bonding pads according to a second embodiment of the present disclosure.
Figure 23B:
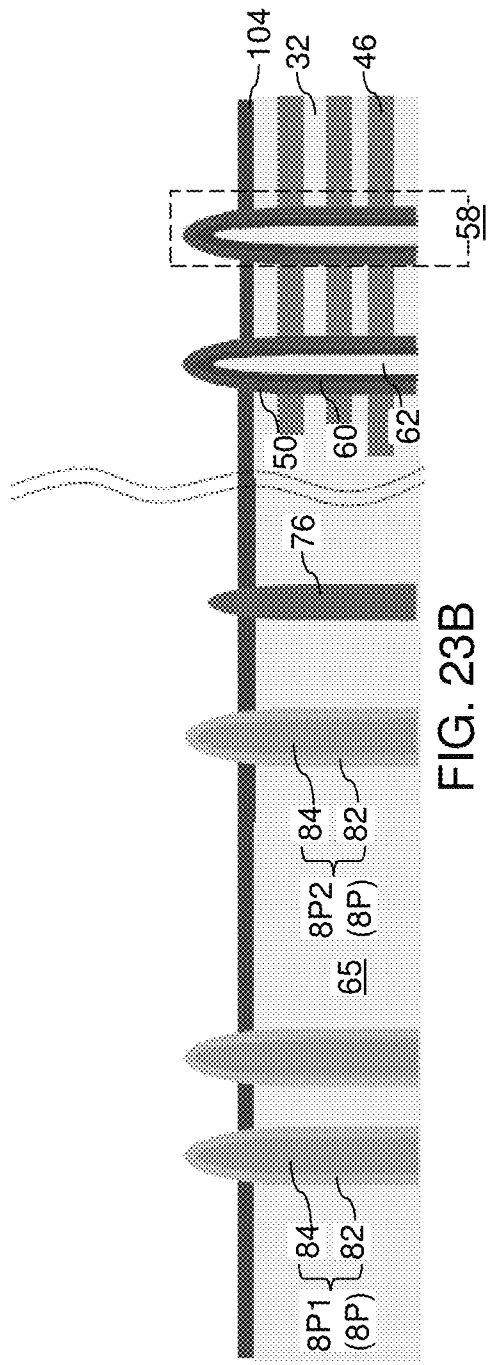
FIGS. 23P and 23Q illustrate other embodiments of the first alternative configuration of the bonded assembly of FIG. 23O.
Figure 23C:
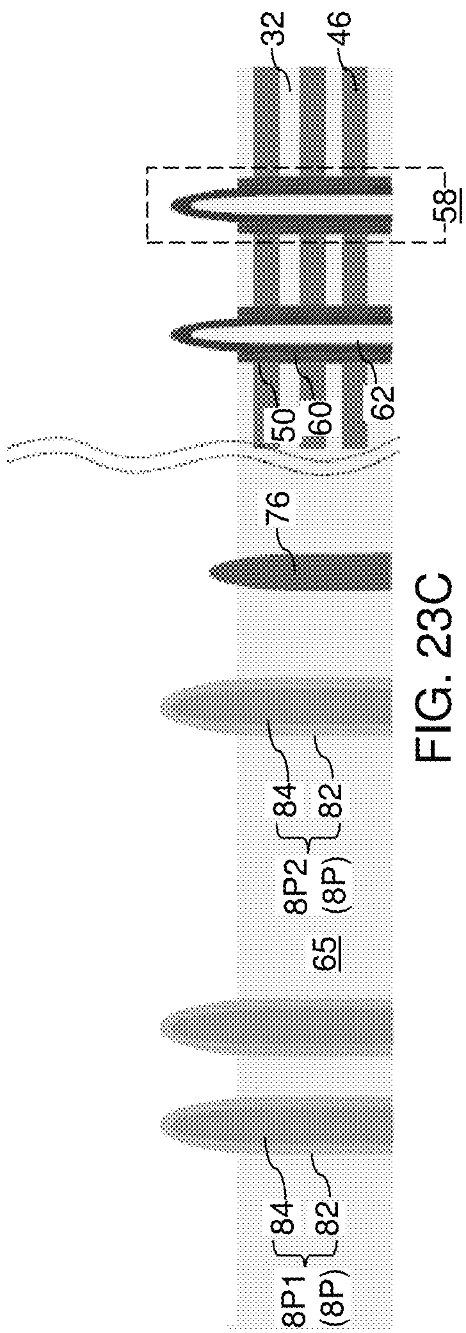
Figure 23D:
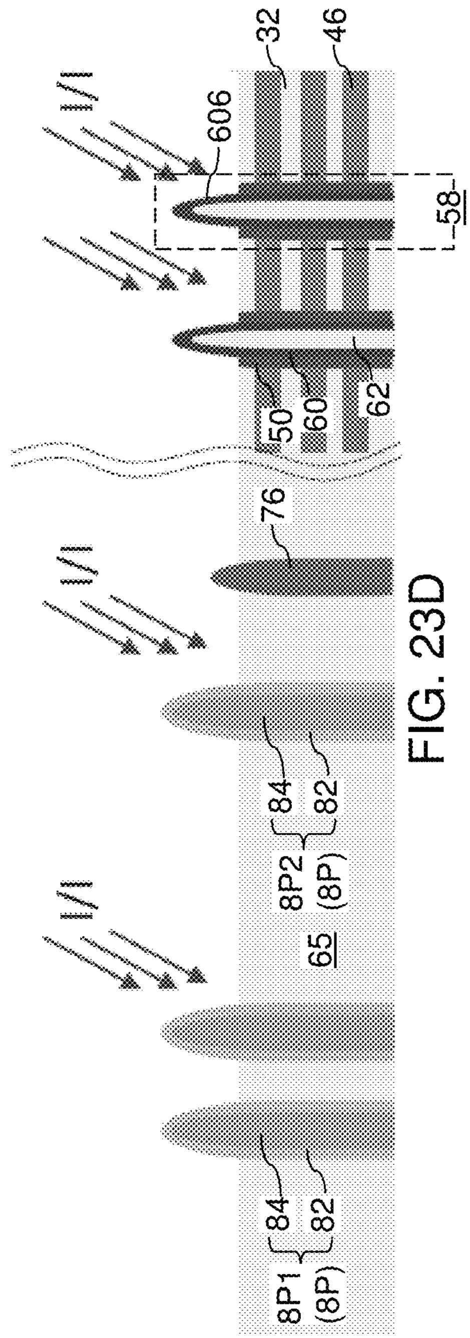
Figure 23E:
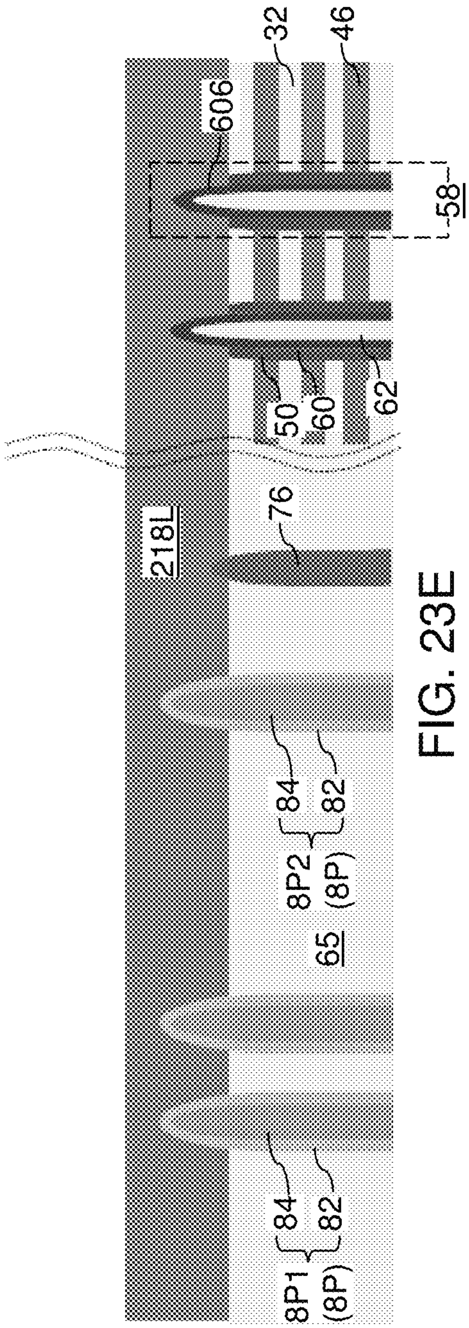
Figure 23F:
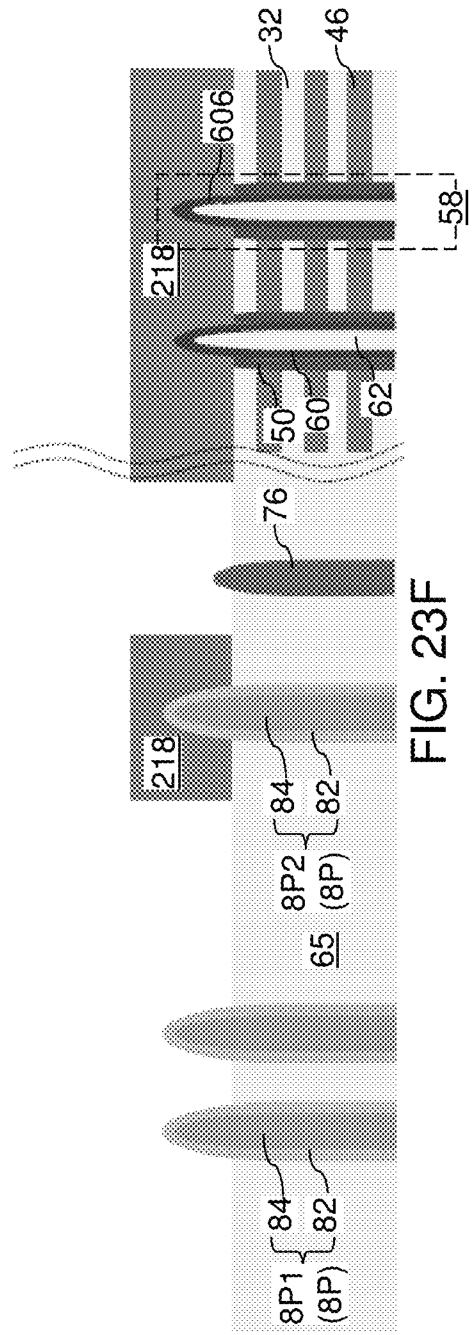
Figure 23G:
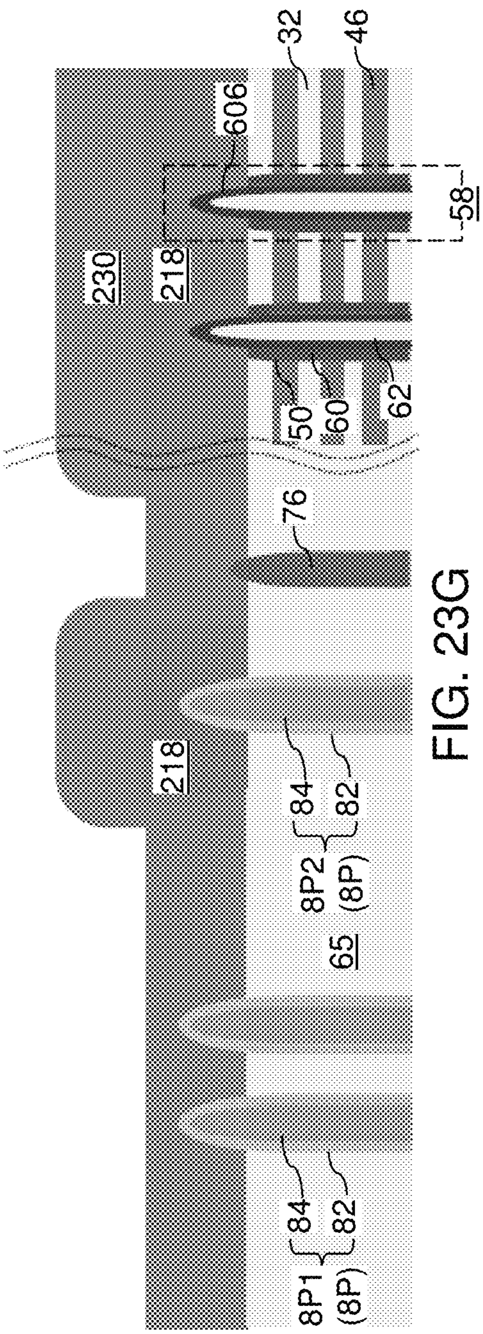
Figure 23H:
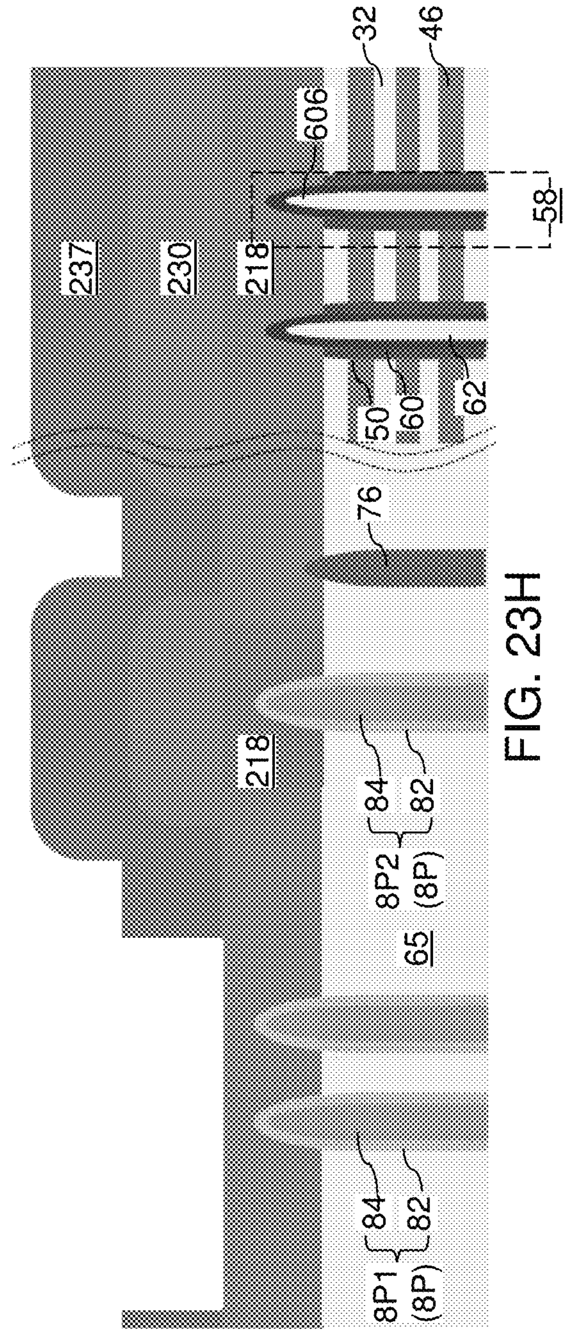
Figure 23I:
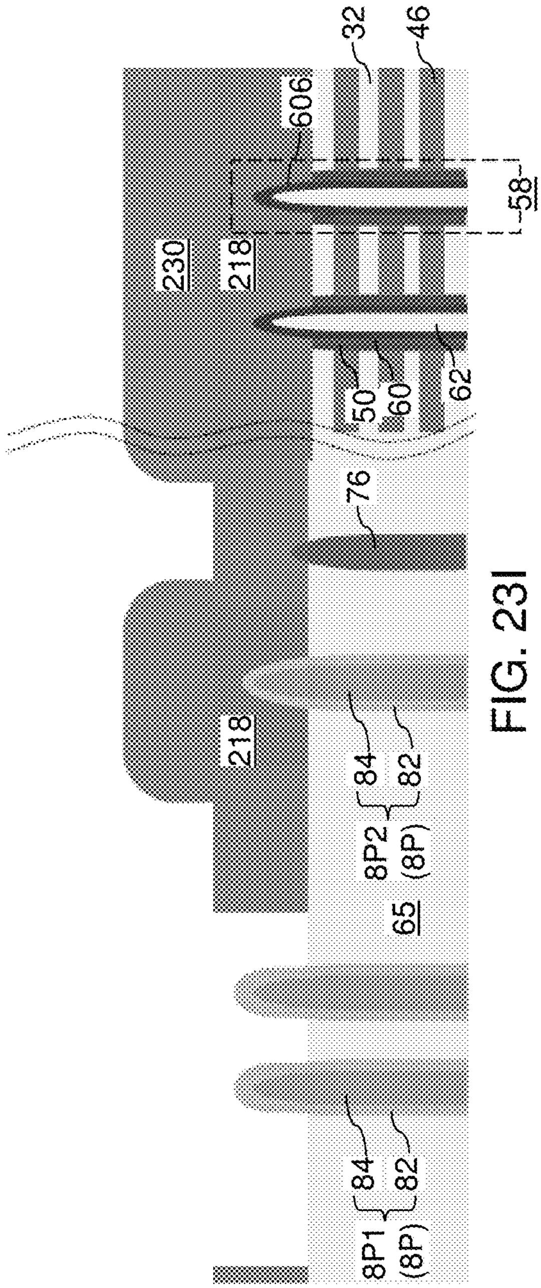
Figure 23J:
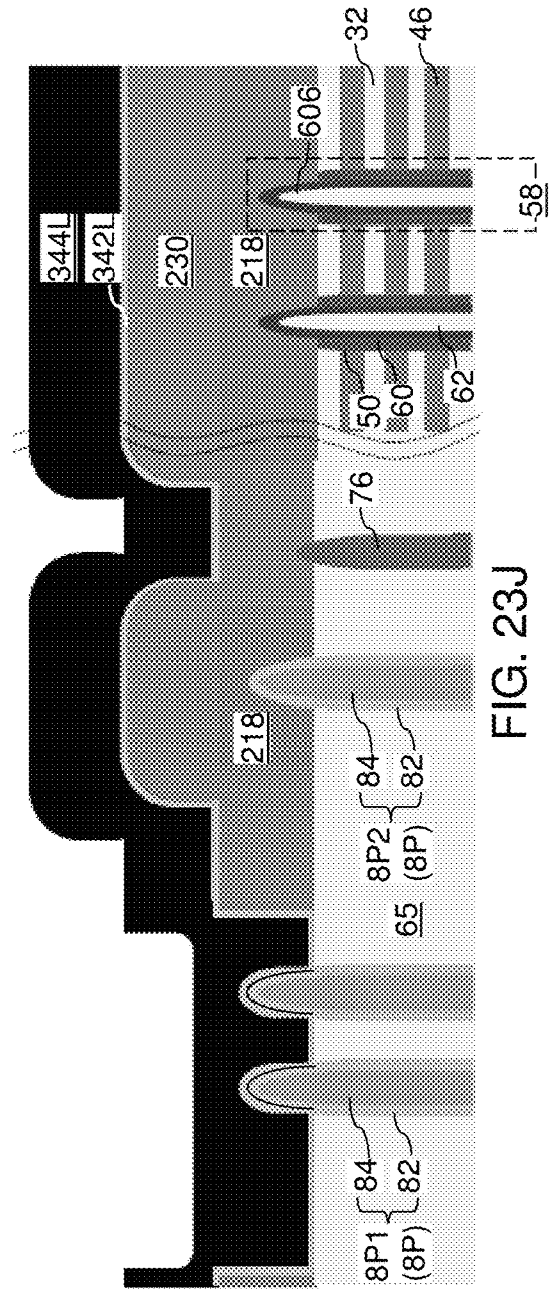
Figure 23K:
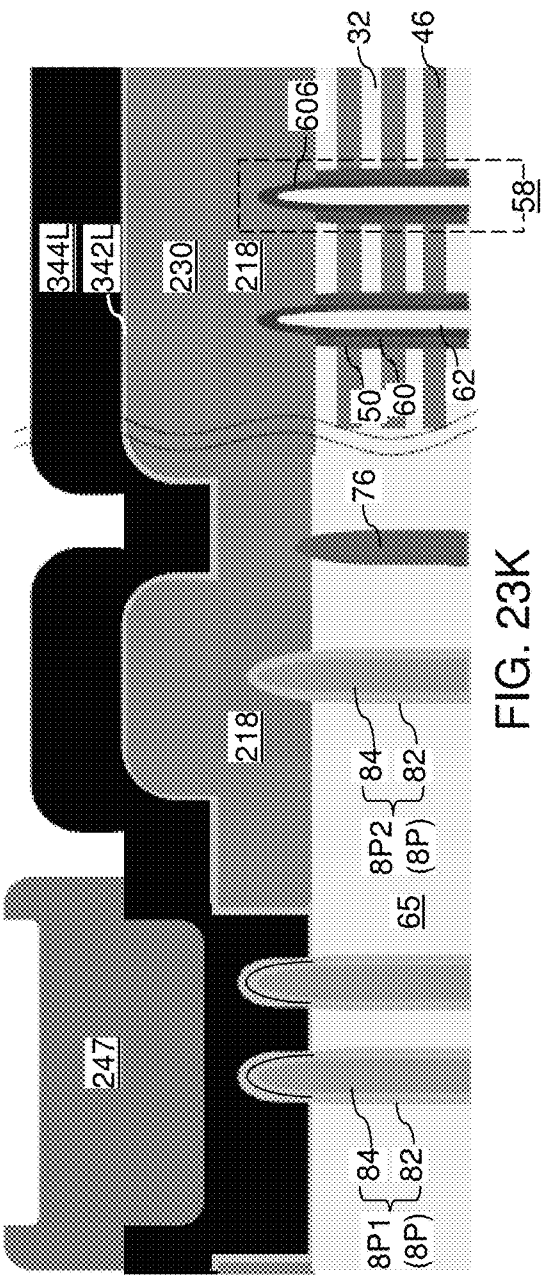
Figure 23L:
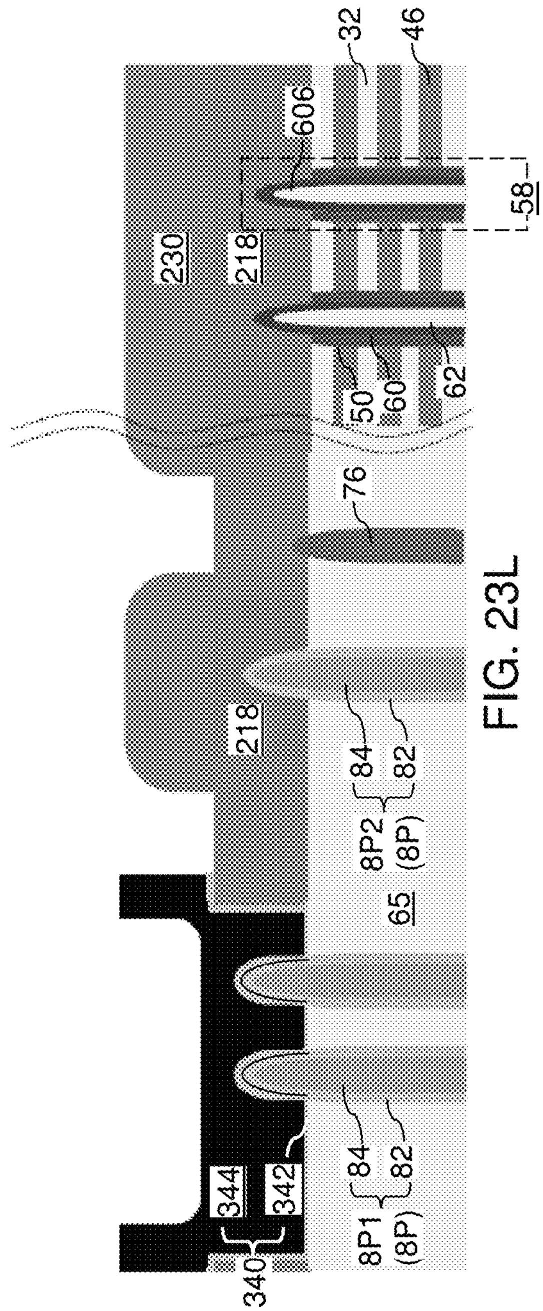
Figure 23M:
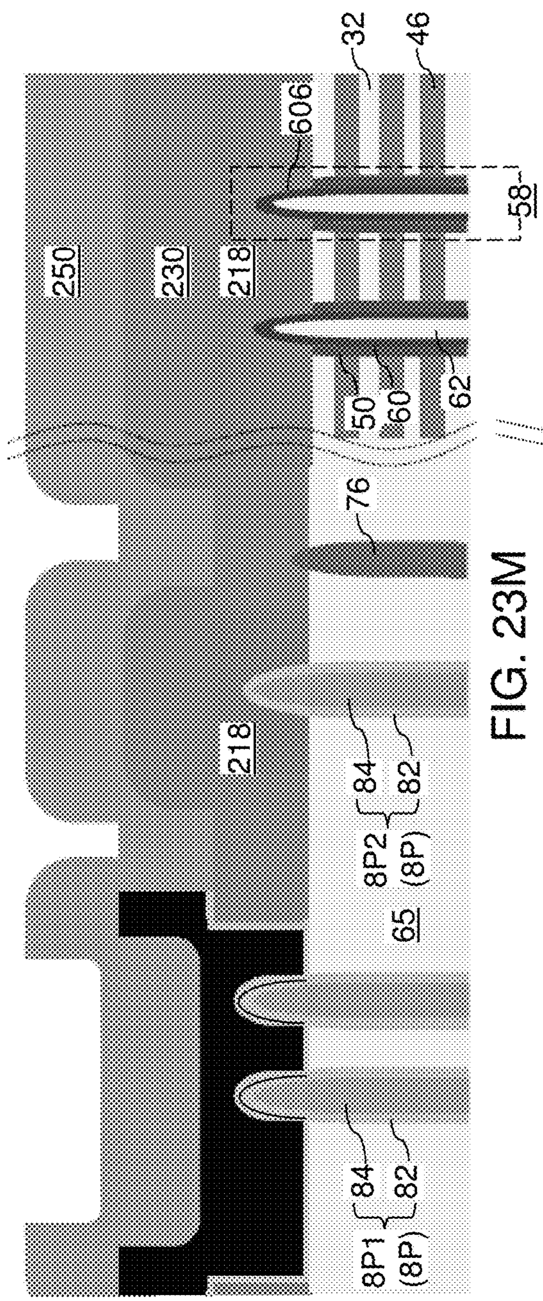
Figure 23N:
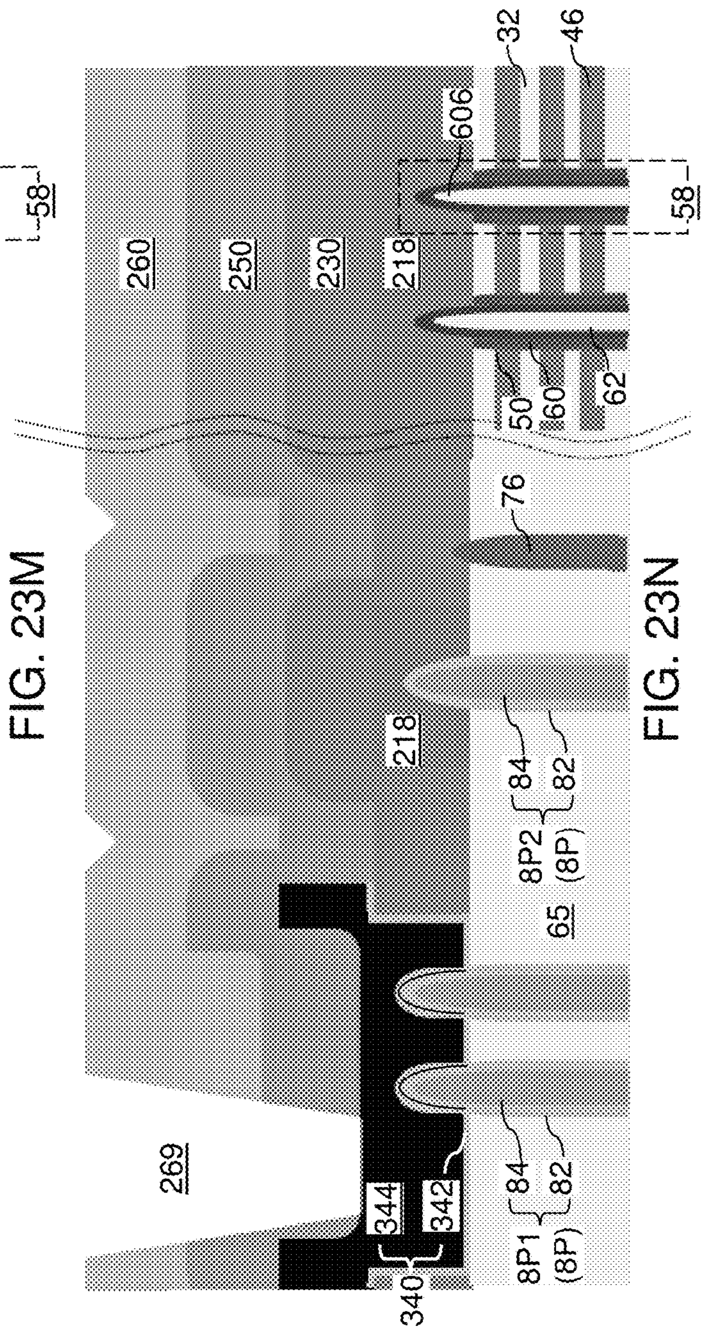
Figure 23O:
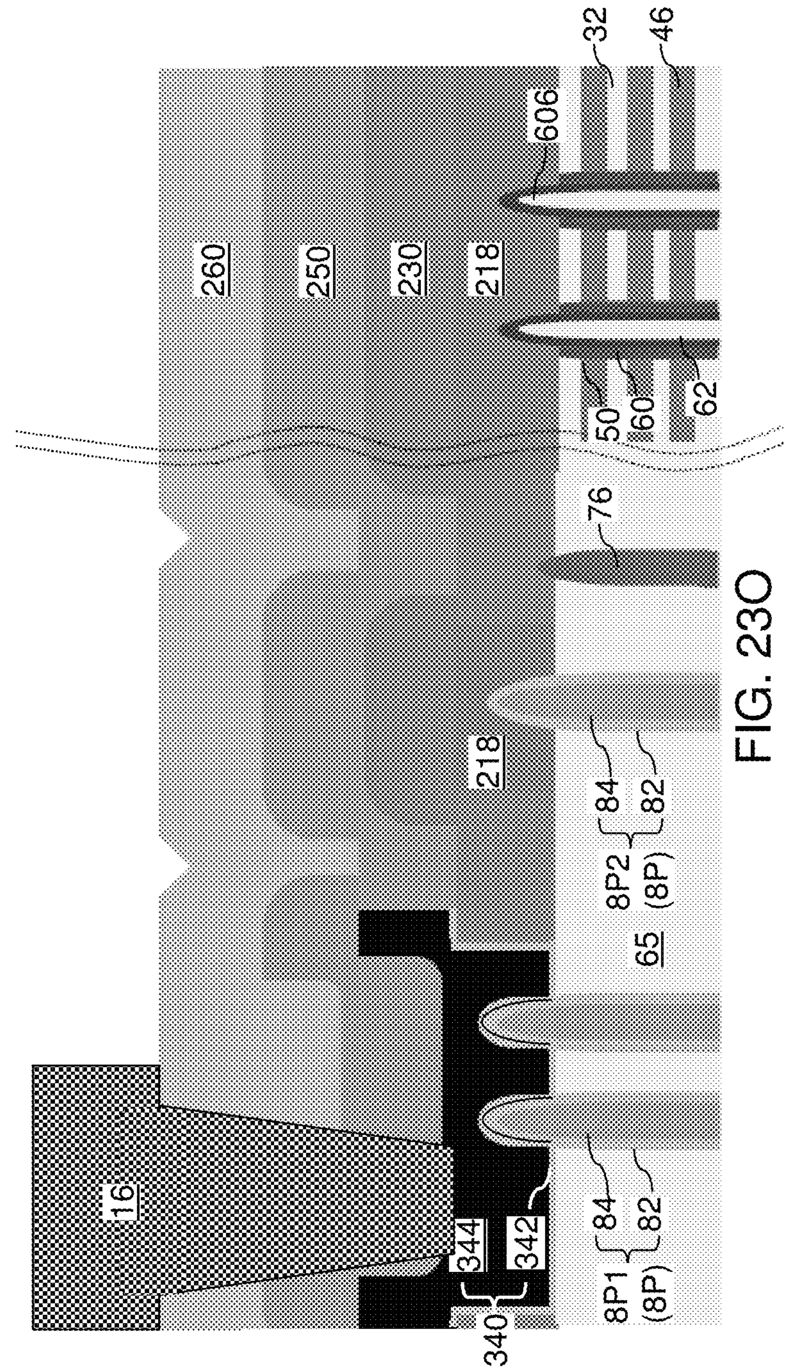

FIGS. 23A-23O are sequential vertical cross-sectional view of a first alternative configuration of a bonded assembly (700, 1000) during various processing steps up to formation of backside bonding pads 16 according to a second embodiment of the present disclosure.

Referring to FIG. 23A, a portion of a bonded assembly (700, 1000) is illustrated at a processing step that corresponds to the processing step of FIG. 18. The first alternative configuration of the bonded assembly (700, 1000) illustrated in FIG. 23A can be derived from the bonded assembly (700, 1000) of FIG. 18 by modifying the memory die 1000. Specifically, the memory die 1000 can be modified to add a vertical stack of a sacrificial silicon oxide liner 102 and a sacrificial silicon nitride liner 104 between the semiconductor material layer 10 and the alternating stack of insulating layers 32 and electrically conductive layers 46. Specifically, the sacrificial silicon oxide liner 102 can be formed directly on the top surface of the semiconductor material layer 10 of FIG. 1, and the sacrificial silicon nitride liner 104 can be formed directly on the top surface of the sacrificial silicon oxide liner 102. The alternating stack of insulating layers 32 and sacrificial material layers 42 illustrated in FIG. 2 can be formed on a top surface of the sacrificial silicon nitride liner 104. The thickness of the sacrificial silicon oxide liner 102 can be in a range from 3 nm to 60 nm, such as from 6 nm to 30 nm. The thickness of the sacrificial silicon nitride liner 104 can be in a range from 3 nm to 60 nm, such as from 6 nm to 30 nm. While the present disclosure is described employing an embodiment in which a sacrificial silicon oxide liner 102 and a sacrificial silicon nitride liner 104 are present, embodiments are expressly contemplated in which the sacrificial silicon oxide liner 102 and/or the sacrificial silicon nitride liner 104 are omitted.

Generally, a memory die 1000 includes a carrier substrate 9. The carrier substrate 9 may be a commercially available semiconductor substrate (such as a silicon wafer) on which a semiconductor material layer 10 is provided. The semiconductor material layer 10 may be formed on the carrier substrate 9, or may be an upper portion of the carrier substrate 9 in case the carrier substrate 9 is a semiconductor substrate. The memory die 1000 comprises memory stack structures 55 that vertically extend through an alternating stack of insulating layers 32 and electrically conductive layers 46, a dielectric material portion 65 that contacts sidewalls of the alternating stack (32 46), and a pass-through via structure 8P that vertically extends through the dielectric material portion 65. Each of the memory stack structures 55 comprises a respective vertical semiconductor channel 60 and a respective memory film 50. In one embodiment, the pass-through via structure 8P can have a vertical extent that is greater than the vertical thickness of the alternating stack (32, 46), and can vertically extend through the dielectric material portion 65. The memory die 1000 can comprise first bonding structures 178 electrically connected to the memory stack structures 55 and the electrically conductive layers 46.

A logic die 700 comprising semiconductor devices 710 and second bonding structures 788 is provided. The second bonding structures 788 are electrically connected to the semiconductor devices 710. In one embodiment, the semiconductor devices 710 in the logic die 700 comprises a peripheral circuitry configured to operate memory elements in the memory stack structures 55 and to drive the electrically conductive layers 46. The logic die 700 can be attached to the memory die 1000 by bonding the second bonding structures 788 to the first bonding structures 178 while the carrier substrate 9 is attached to the memory die 1000. A semiconductor structure (i.e., a bonded assembly) is provided, which comprises the memory die 1000 bonded to the logic die 700. The carrier substrate 9 can be detached from the memory die 1000 after the logic die 700 is attached to the memory die 1000.

Subsequently, the semiconductor material layer 10 can be removed selective to the material of the sacrificial silicon oxide liner 102. For example, a wet etch process employing a KOH solution, a hot trimethyl-2 hydroxyethyl ammonium hydroxide ("hot TMY") solution, and/or a tetramethyl ammonium hydroxide (TMAH) solution may be employed to remove the semiconductor material layer 10 selective to the sacrificial silicon oxide liner 102 in case the semiconductor material layer 10 includes silicon. The structure illustrated in FIG. 23A can be thus provided. In this case, removal of the semiconductor material layer 10 can be selective to the dielectric materials of the memory films 50. Thus, portions of the memory films 50 that are embedded in the semiconductor material layer 10 prior to removal of the semiconductor material layer 10 are not removed by the etch process that removes the semiconductor material layer.

In some embodiments, end portions of the dielectric wall structures 76 can be embedded in the semiconductor material layer 10 prior to removal of the semiconductor material layer 10. The etch process that removes the semiconductor material layer 10 can be selective to the dielectric wall structures 76.

The pass-through via structures 8P can include pad-connection pass-through via structures 8P1 that are employed to provide electrical connection to bonding pads to be subsequently formed. Further, the pass-through via structures 8P can include source-connection pass-through via structures 8P2 that are employed to provide electrical connection to a buried source layer to be subsequently formed. Each of the pad-connection pass-through via structures 8P1 and the source-connection pass-through via structures 8P2 can include a metallic barrier layer 82 including a conductive metallic barrier material (such as TiN, TaN, and/or WN, or a combination of a TiN layer and a titanium layer) and a conductive via fill material portion 84 including a conductive via fill material (such as W, Cu, Mo, Ru, Co, and/or a heavily doped semiconductor material). A distal end of each pass-through via structure 8P can be physically exposed after removing the carrier substrate 9 and the semiconductor material layer 10. As used herein, an end of a structure that is proximal to a bonding interface between the memory die 1000 and the logic die 700 is referred to as a proximal end, and an end of a structure that is distal from the bonding interface between the memory die 1000 and the logic die 700 is referred to as a distal end.

Referring to FIG. 23B, the sacrificial silicon oxide liner 102 can be removed by performing an isotropic etch employing dilute hydrofluoric acid. In case the outermost layer of each memory film 50 includes a blocking dielectric layer 52 containing silicon oxide, the portion of each blocking dielectric layer 52 that protrudes from the physically exposed surface of the sacrificial silicon nitride liner 104 can be collaterally etched during removal of the sacrificial silicon oxide liner 102.

Referring to FIG. 23C, the sacrificial silicon nitride liner 104 can be removed by performing an isotropic etch employing hot phosphoric acid. In case the charge storage layer 54 of each memory film 50 includes silicon nitride, the portion of each charge storage layer 54 that protrudes from the physically exposed surface planar surface of an insulating layer 32 (which is most distal from the bonding interface between the memory die 1000 and the logic die 700) can be collaterally etched during removal of the sacrificial silicon nitride liner 104. Subsequently, an additional selective etch process (e.g., chemical dry etch, "CDE") can be performed to isotropically etch the physically exposed portions of the tunneling dielectric layers 56. Thus, physically exposed portions of the memory films 50 are removed, and outer sidewalls of the vertical semiconductor channels 60 are physically exposed. A distal end of each of the vertical semiconductor channels 60 is physically exposed.

After physical exposure of the distal surfaces of the vertical semiconductor channels 60, the distal surfaces of the memory films 50 may be located within the horizontal plane including the physically exposed horizontal surface of the most distal insulating layer 32 of the alternating stack of the insulating layers 32 and the electrically conductive layers 46, or may be recessed toward the bonding interface between the memory die 1000 and the logic die 700 relative to the physically exposed horizontal surface of the most distal insulating layer 32 of the alternating stack (32, 46). The recess depth may be in a range from 0 nm to 60 nm, such as from 0 nm to 30 nm.

Referring to FIG. 23D, dopants of the second conductivity type can be optionally implanted into physically exposed portions of the vertical semiconductor channels 60 by performing an ion implantation process (represented by I/I"). The physically exposed region of the distal portion of each vertical semiconductor channel 60 can be converted into a doped semiconductor region having a doping of the second conductivity type, which is herein referred to as a source cap region 606. A p-n junction can be formed at each interface between a source cap region 606 and an adjoining vertical semiconductor channel 60.

Referring to FIG. 23E, a first conductive material can be deposited on the physically exposed surfaces of the distal side (i.e., the backside) of the memory die 1000. For example, a continuous doped semiconductor material layer 218L can be deposited on the physically exposed surfaces of the source cap regions 606, the pad-connection pass-through via structures 8P1, and the source-connection pass-through via structures 8P2. The continuous doped semiconductor material layer 218L has a doping of the second conductivity type, which is the same conductivity type as the conductivity type of the source cap regions 606. In one embodiment, the continuous doped semiconductor material layer 218L can include doped polysilicon including dopants of the second conductivity type at an atomic concentration in a range from $1.0\times10^{19}/cm^3$ to $2.0\times10^{21}/cm^3$, although lesser and greater dopant concentrations can also be employed. The thickness of the continuous doped semiconductor material layer 218L over a planar surface of the dielectric material portion 65 may be in a range from 50 nm to 600 nm, such as from 100 nm to 300 nm, although lesser and greater thicknesses can also be employed.

In one embodiment, the continuous doped semiconductor material layer 218L may be formed by depositing an amorphous silicon layer. The amorphous silicon layer may be doped in-situ during deposition, or it may be undoped as deposited and then doped by ion implantation after deposition. The amorphous silicon layer is converted to a polysilicon layer after deposition by crystallization using any suitable crystallization annealing process, such as laser annealing, flash lamp annealing, sufficiently long forming gas ambient annealing, spike annealing, etc. In another embodiment, the continuous doped semiconductor material layer 218L may be formed by depositing a polysilicon layer. The polysilicon layer may be doped in-situ during deposition, or it may be undoped as deposited and then doped by ion implantation after deposition. If the continuous doped semiconductor material layer 218L is doped by ion implantation, then the implanted ions may be activated by any suitable dopant activation annealing process, such as laser annealing, flash lamp annealing, sufficiently long forming gas ambient annealing, spike annealing, etc.

Referring to FIG. 23F, a photoresist layer (not shown) can be applied over the continuous doped semiconductor material layer 218L, and can be lithographically patterned to cover multiple discrete areas. In one embodiment, the photoresist layer can continuously cover each set of memory opening fill structures 58 and a respective one of the source-connection pass-through via structures 8P2 configured to electrically bias the vertical semiconductor channels 60 within the set of memory opening fill structures 58. In one embodiment, the photoresist layer does not cover the pad-connection pass-through via structures 8P1 or the dielectric wall structures 76.

An etch process can be performed employing the photoresist layer as an etch mask layer. The etch process may include an anisotropic etch process or an isotropic etch process. The etch process etches unmasked portions of the continuous doped semiconductor material layer 218L. The patterned portions of the continuous doped semiconductor material layer 218L include at least one doped semiconductor material layer 218. Each doped semiconductor material layer 218 functions as a source layer that electrically connects a respective set of source cap regions 606 to a respective source-connection pass-through via structures 8P2. Alternatively, in case the processing steps of FIG. 23D are not performed and the source cap regions 606 are not formed, each doped semiconductor material layer 218 functions as a source layer that electrically connects a respective set of distal end portions of the vertical semiconductor channels 60 to a respective source-connection pass-through via structures 8P2. Generally, a source layer comprising the doped semiconductor material layer 218 can be formed by depositing a doped semiconductor material on the distal end of each of the vertical semiconductor channels 60 and by patterning the doped semiconductor material.

Generally, a source layer, such as the doped semiconductor material layer 218, comprising a first conductive material that is formed directly on the semiconductor material of the distal end of each of the vertical semiconductor channels 60, which may comprise the source cap regions 606 upon implantation of dopants of the second conductivity type. The first conductive material can be patterned to form a first conductive material layer, such as the doped semiconductor material layer 218, contacting the semiconductor material of the distal end of each of the vertical semiconductor channels 60. The vertical semiconductor channels 60 can comprise a semiconductor material having a doping of a first conductivity type, and the first conductive material can comprise a doped semiconductor material having a doping of a second conductivity type that is an opposite of the first conductivity type.

In one embodiment, interfaces between the semiconductor material of the vertical semiconductor channels 60 and the source layer (comprising the doped semiconductor material layer 218) protrude from the horizontal plane including the horizontal interface between the source layer and the alternating stack (32, 46) along a vertical direction that points away from the interface between the logic die 700 and the memory die 1000. For example, the interfaces between the source cap regions 606 and the source layer (comprising the doped semiconductor material layer 218) can be more distal from the bonding interface between the logic die 700 and the memory die 1000 than the horizontal plane including the horizontal interface between the source layer and the alternating stack (32, 46).

The source layer (comprising the doped semiconductor material layer 218) is electrically connected to end portions of the vertical semiconductor channels 60 that are distal from an interface between the logic die 700 and the memory die 1000. If the source cap regions 606 are omitted, then the source layer (comprising the doped semiconductor material layer 218) contacts end portions of the vertical semiconductor channels 60 that are distal from an interface between the logic die 700 and the memory die 1000. If the source cap regions 606 are present, then the source layer (comprising the doped semiconductor material layer 218) is electrically connected to end portions of the vertical semiconductor channels 60 that are distal from an interface between the logic die 700 and the memory die 1000 through the source cap regions 606.

In one embodiment, distal surfaces of the memory films 50 are located within a horizontal plane including the horizontal interface between the source layer (comprising the doped semiconductor material layer 218) and the alternating stack of the insulating layers 32 and the electrically conductive layers 46, or are more proximal to the interface between the logic die 700 and the memory die 1000 than the interface between the source layer and the alternating stack (32, 46) is to the interface between the logic die 700 and the memory die 1000.

Referring to FIG. 23G, a backside isolation dielectric layer 230 can be formed over the first conductive material layer (i.e., the source layer comprising the doped semiconductor material layer 218) and over the pass-through via structures 8P (which include the pad-connection pass-through via structures 8P1). For example, the backside isolation dielectric layer 230 can be formed on the distal surface of the doped semiconductor material layer 218 and on the planar distal surface of the dielectric material portion 65. In one embodiment, the backside isolation dielectric layer 230 can include a dielectric material such as undoped silicate glass (e.g., silicon oxide) or a doped silicate glass, and can have a thickness in a range from 100 nm to 2,000 nm, such as from 200 nm to 1,000 nm, although lesser and greater thicknesses can also be employed.

Referring to FIG. 23H, a photoresist layer 237 can be applied over the distal surface of the backside isolation dielectric layer 230, and can be lithographically patterned to form a pattern of discrete openings in areas that overlie the pad-connection pass-through via structures 8P1. In one embodiment, the pad-connection pass-through via structures 8P1 can be arranged as a periodic array of pad-connection pass-through via structures 8P1. The openings in the photoresist layer can overlie a respective subset of the pad-connection pass-through via structures 8P1 that are to be subsequently connected to a same bonding pad. In other words, a plurality of pad-connection pass-through via structures 8P1 may be employed to provide an electrically conductive path to a bonding pad. Alternatively, a single pad-connection pass-through via structure 8P1 may be employed to provide an electrically conductive path to a bonding pad.

Referring to FIG. 23I, an etch process can be performed to remove unmasked portions of the backside isolation dielectric layer 230. An anisotropic etch process or an isotropic etch process can be performed. The etch process can be selective to the materials of the pad-connection pass-through via structures 8P1. An opening can be formed through the backside isolation dielectric layer 230, and a distal surface of each pad-connection pass-through via structure 8P1 is physically exposed. Distal portions of the pad-connection pass-through via structures 8P1 protrude from the horizontal physically exposed surface of the dielectric material portion 65.

Referring to FIG. 23J, a second conductive material can be deposited on the distal surface of the pad-connection pass-through via structures 8P1 through the opening in the backside isolation dielectric layer 230. In one embodiment, the second conductive material can comprise at least one metallic material. In this case, the at least one metallic material can be deposited over the backside isolation dielectric layer 230 and into the openings through the backside isolation dielectric layer 230. The at least one metallic material can include, for example, a pad barrier liner layer 342L including a metallic nitride material such as TiN, TaN, and/or WN and a continuous metallic material layer 344L including a metallic pad material such as copper, aluminum or alloy thereof. The thickness of the pad barrier liner layer 342L may be in a range from 10 nm to 100 nm, and the thickness of the continuous metallic material layer 344L may be in a range from 300 nm to 3,000 nm, although lesser and greater thicknesses can also be employed.

Referring to FIG. 23K, the second conductive material can be patterned by a combination of lithographic patterning process and an etch process. For example, a photoresist layer 247 can be applied over the continuous metallic material layer 344L, and can be lithographically patterned to cover each area of the openings in the backside isolation dielectric layer 230. The photoresist layer 247 can be patterned into discrete photoresist material portions that cover the area of a respective one of the openings through the backside isolation dielectric layer 230.

Referring to FIG. 23L, an etch process can be performed to transfer the pattern of the photoresist layer 247 through the continuous metallic material layer 344L and the pad barrier liner layer 342L. The etch process may include an anisotropic etch process (such as a reactive ion etch process) or an isotropic etch process (such as a wet etch process). Unmasked portions of the continuous metallic material layer 344L and the pad barrier liner layer 342L are removed by the etch process. In one embodiment, a first portion of the second conductive material (which can comprise a metallic material) that overlies the source layer (comprising the doped semiconductor material layer 218) can be removed without removing a second portion of the second conductive material from above the pad-connection pass-through via structures 8P1.

Each remaining portion of the second conductive material contacting a pad-connection pass-through via structure 8P1 comprises a connection pad 340. Each connection pad 340 can comprise a remaining second portion of the second conductive material (which may comprise a metallic material). For example, each contiguous set of remaining material portions from the continuous metallic material layer 344L and the pad barrier liner layer 342L after the etch process comprises a connection pad 340. Each connection pad 340 can include a pad barrier liner 342 (which is a patterned portion of the pad barrier liner layer 342L) and a pad metal portion 344 (which is patterned portion of the continuous metallic material layer 344L). The pad metal portion 344 comprises at least one metallic material portion such as a copper, aluminum or copper-aluminum alloy portion.

Generally, a connection pad 340 comprising the second conductive material that is different from the first conductive material of the source layer (comprising the doped semiconductor material layer 218) can be formed directly on a pad-connection pass-through via structure 8P1 and the dielectric material portion 65. The connection pad 340 is electrically isolated from the source layer (comprising the doped semiconductor material layer 218).

Each connection pad 340 can be formed on the distal end of a respective pass-through via structure 8P such as a respective pad-connection pass-through via structure 8P1. A distal portion of each pad-connection pass-through via structure 8P1 protrudes from a horizontal plane including a horizontal interface between a connection pad 340 and the dielectric material portion 65 along a vertical direction that points away from the interface between the logic die 700 and the memory die 1000, and contacts recessed surfaces of the connection pad 340. Each pad-connection pass-through via structure 8P1 comprises a metallic barrier layer 82 comprising a metallic nitride material and a metallic fill material portion 84 embedded in the metallic barrier layer 82, not contacting the connection pad 340, and spaced from the connection pad 340 by a cap portion of the metallic barrier layer 82 that is contained within the distal portion of the pad-connection pass-through via structure 8P1.

Referring to FIG. 23M, a backside passivation dielectric layer 250 can be formed over the backside isolation dielectric layer 230 and the connection pads 340. The backside passivation dielectric layer 250 includes a dielectric material that can passivate the backside of the memory die 1000, i.e., a dielectric material that can function as a diffusion blocking layer that blocks diffusion of moisture and impurities. In one embodiment, the backside passivation dielectric layer 250 can include silicon nitride that is deposited by plasma-enhanced chemical vapor deposition (PECVD), or a bilayer of silicon oxide and silicon nitride. The thickness of the backside passivation dielectric layer 250 can be in a range from 100 nm to 1,000 nm, although lesser and greater thicknesses can also be employed.

Referring to FIG. 23N, a backside polymer dielectric layer 260 can be formed over the backside passivation dielectric layer 250. Generally, the backside polymer dielectric layer 260 can be a dielectric polymer layer. For example, the backside polymer dielectric layer 260 can be formed by spin-coating and curing photosensitive polyimide. The photosensitive polyimide can be lithographically exposed and developed to form openings over the areas of the connection pads 340. An anisotropic etch process that employs the backside polymer dielectric layer 260 as an etch mask can be performed to etch through unmasked portions of the backside passivation dielectric layer 250. The connection pads 340 may be employed as etch stop structures. Terminal via (TV) cavities 269 can be formed through the backside polymer dielectric layer 260 and the backside passivation dielectric layer 250. Additional terminal via cavities (not shown) may be formed to physically expose a source layer (such as the doped semiconductor material layer 218).

Referring to FIG. 23O, an optional bonding pad 16 is formed in the TV cavity 269 between the bonding wire 15 and the connection pad 340. The bonding pad may be formed by depositing a metallic liner material such as TiN, TaN, and/or WN in the terminal via cavities 269, and subsequently depositing at least one bonding pad material into the TV cavities 269. The at least one bonding pad material may include, for example, a pad metal such as copper or aluminum, and an under bump metallurgy (UBM) material stack for facilitating subsequent attachment of a solder material thereupon. For example, the at least one bonding pad material may include a vertical stack of a copper portion and an under bump metallurgy (UBM) stack portion, or a vertical stack of an aluminum portion and a UBM stack portion. An exemplary UBM stack portion can include, from bottom to top, a Ti/Cu, layer, a Ni layer, and a Cu layer. The at least one bonding pad material and the metallic liner material can be subsequently patterned, for example, by applying and patterning a photoresist layer thereabove, and by transferring the pattern in the photoresist layer through the at least one bonding pad material and the metallic liner material. Various bonding pads 16 can be formed directly on a respective one of the connection pads 340. Additional bonding pads, such as at least one source bonding pad 14 illustrated in FIG. 21, may be formed directly on the distal surface of a source layer (such as the doped semiconductor material layer 218). Bonding wires 15 can be bonded to a respective one of the bonding pads (14, 16) as illustrated in FIG. 21. A backside bonding wire 715 can be bonded to each backside bonding pad 716.

Generally, at least one backside dielectric layer (230, 250, 260) can be formed over the source layer (such as the doped semiconductor material layer 218). Each backside bonding pad 16 can be formed over a distal surface of the at least one backside dielectric layer (230, 250, 260). Each backside bonding pad 16 can comprise a via portion that extends through the at least one backside dielectric layer (230, 250, 260). The at least one backside dielectric layer (230, 250, 260) can include a backside polymer dielectric layer 260 that contacts the metallic material portion of a connection pad 340, and extends over the source layer (such as the doped semiconductor material layer 218). In one embodiment, the at least one backside dielectric layer (230, 250, 260) can comprise a stack of a silicon oxide layer (such as the backside isolation dielectric layer 230), a silicon nitride layer (such as the backside passivation dielectric layer 250), and a dielectric polymer layer (such as the backside polymer dielectric layer 260). At least a subset of the backside bonding pads 16 can be formed through the at least one backside dielectric layer (230, 250, 260) on a distal surface of a respective connection pad 340.

At least one backside bonding pad 16 can be electrically connected to a pass-through via structure 8P, and can be electrically isolated from the source layer (such as the doped semiconductor material layer 218). The at least one backside bonding pad 16 can be formed over the dielectric material portion 65, and can have an areal overlap with the dielectric material portion 65 in a plan view. Each connection pad 340 can contact a distal surface of a respective pass-through via structure 8P (such as a respective pad-connection pass-through via structure 8P1), and can contact a proximal surface of a respective backside bonding pad 16.

A source layer (comprising the doped semiconductor material layer 218) comprises a first conductive material, and is electrically connected to end portions of the vertical semiconductor channels 60 that are distal from an interface between the logic die 700 and the memory die 1000. A pass-through via structure (such as a pad-connection pass-through via structure 8P1) has a vertical extent that is greater than a vertical thickness of the alternating stack (32, 46), and vertically extends through the dielectric material portion 65. A connection pad 340 comprises a second conductive material that is different from the first conductive material, contacts a distal surface of the pass-through via structure, and is electrically isolated from the source layer.

In one embodiment, the vertical semiconductor channels 60 comprise a semiconductor material having a doping of a first conductivity type, and the source layer (comprising the doped semiconductor material layer 218) comprises a doped semiconductor material having a doping of a second conductivity type that is an opposite of the first conductivity type. In one embodiment, source cap regions 606 including a doped semiconductor material portion having a doping of the second conductivity type can be located directly on an end portion of a respective one of the vertical semiconductor channels 60. The source layer contacts each of the source cap regions 606.

In one embodiment, the second conductive material can comprise a metallic material. In one embodiment, the connection pad 340 can comprise a pad barrier liner 342 comprising a metallic barrier material and contacting a distal horizontal surface of the dielectric material portion 65, and a pad metal portion 344 comprising the metallic material and contacting the pad barrier liner 342. In one embodiment, the pass-through via structure (such as a pad-connection pass-through via structure 8P1) comprises a metallic barrier layer 82 in contact with the pad barrier liner 342 and a sidewall of the dielectric material portion 65, and a metallic fill material portion 84 that is spaced from the connection pad 340 and from the dielectric material portion 65 by the metallic barrier layer 82. In one embodiment, a distal portion of the metallic barrier layer 82 protrudes from a horizontal interface between the dielectric material portion 65 and the connection pad 340 and into the connection pad 340, and is laterally surrounded by the connection pad 340. A backside bonding pad 16 can be located over the dielectric material portion 65, can contact a distal surface of the connection pad 340, and can be electrically isolated from the source layer (comprising the doped semiconductor material layer 218).

Figure 23P:
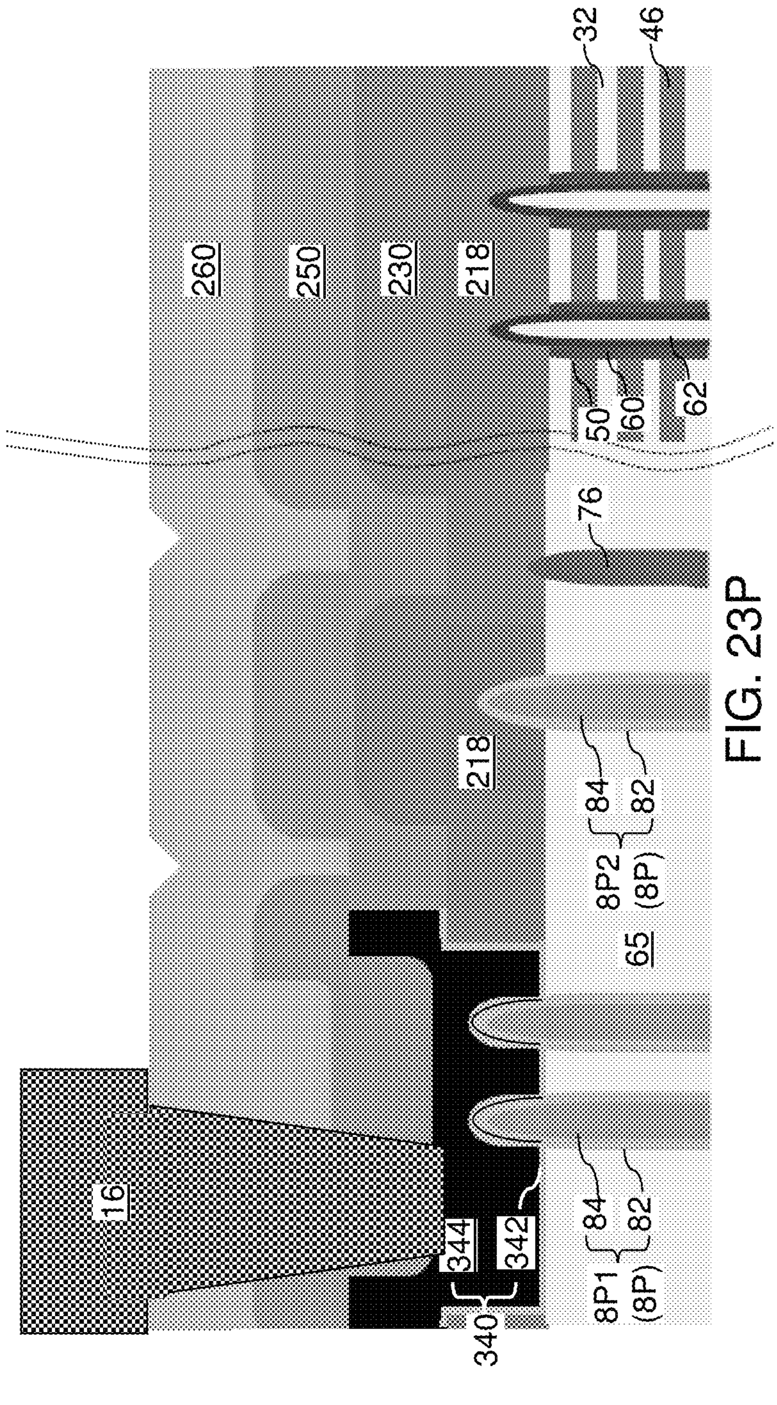

Referring to FIG. 23P, another embodiment of the first alternative configuration of the bonded assembly is illustrated, which can be derived from the bonded assembly of FIG. 23O by omitting the ion implantation process that forms the source cap regions 606. In this case, the doped semiconductor material layer 218 directly contacts end portions of the vertical semiconductor channels 60. The doped semiconductor material layer 218 is a source layer that functions as a common source for all vertical NAND strings including the vertical semiconductor channels 60.

Figure 23Q:
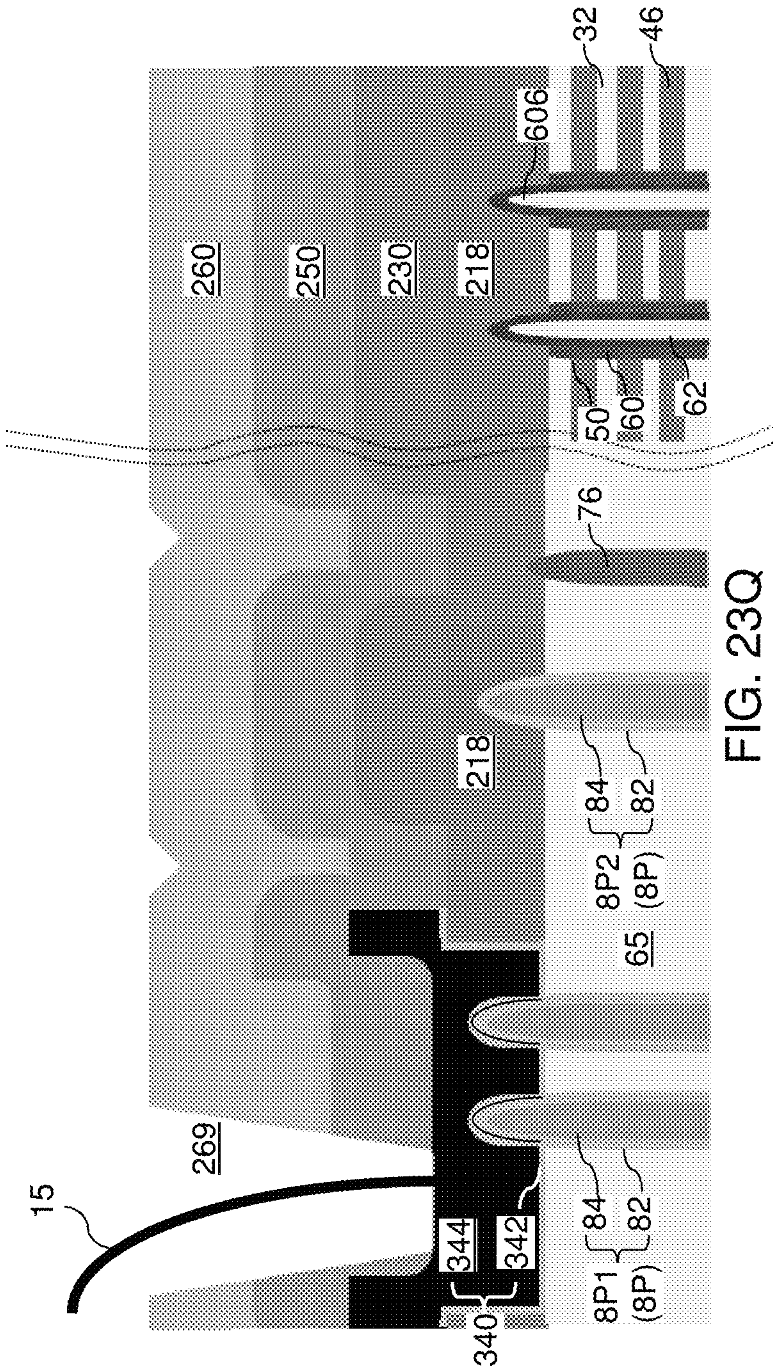

Referring to FIG. 23Q, another embodiment of the first alternative configuration of the bonded assembly is illustrated, which can be derived from the bonded assembly of FIG. 23O by omitting the bonding pad 16. In this embodiment, the bonding wire 15 is deposited into the TV cavity 269 to directly physically contact the connection pad 340.

FIGS. 24A-24I are sequential vertical cross-sectional view of a second alternative configuration of a bonded assembly (700, 1000) during various processing steps up to formation of backside bonding pads 16 according to a third embodiment of the present disclosure.

Figure 24A:
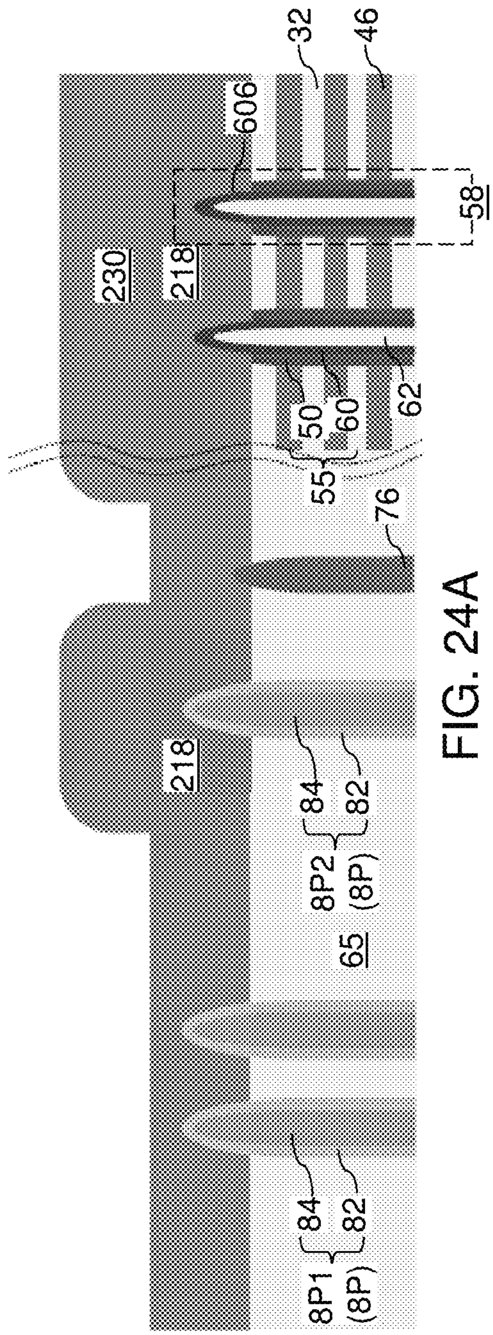
FIGS. 24A-24I are sequential vertical cross-sectional view of a second alternative configuration of a bonded assembly during various processing steps up to formation of backside bonding pads according to a third embodiment of the present disclosure.

Referring to FIG. 24A, the second alternative configuration of the bonded assembly (700, 1000) can the same as the first alternative configuration of the bonded assembly (700, 1000) illustrated in FIG. 23G.

Figure 24B:
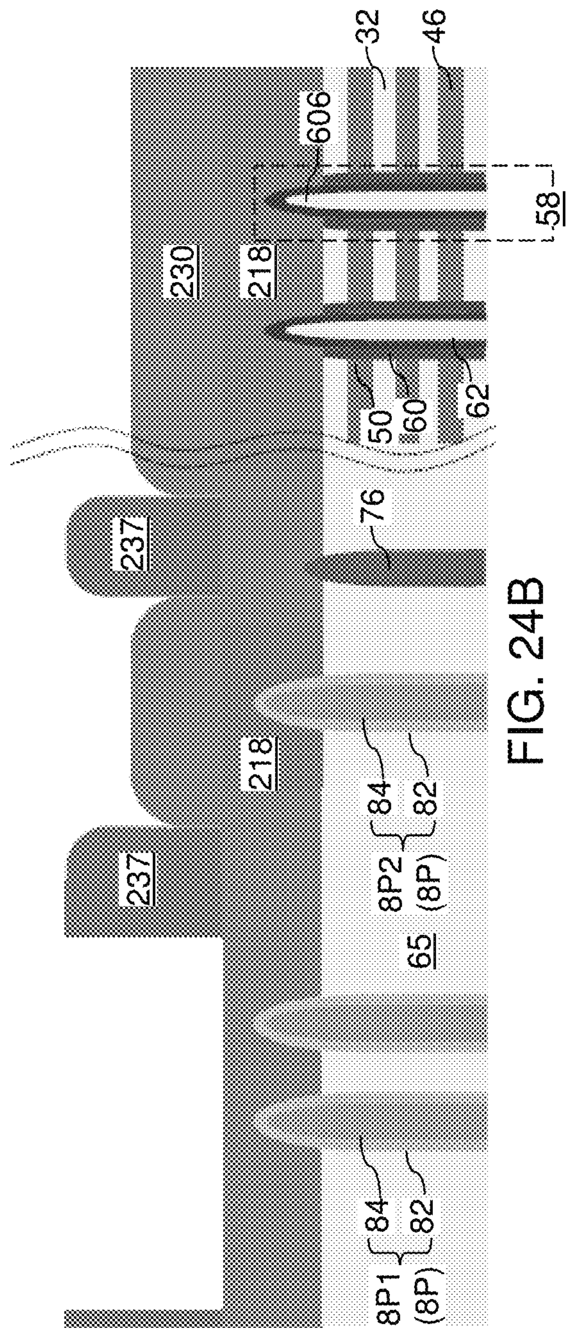

Referring to FIG. 24B, a photoresist layer 237 can be applied over the distal surface of the backside isolation dielectric layer 230, and can be lithographically patterned to remove the photoresist material from above the areas of the doped semiconductor material layer 218 and from above the areas of around the pad-connection pass-through via structures 8P1. The patterned portions of the photoresist layer 237 can overlie portions of the backside isolation dielectric layer 230 located around, or between, the doped semiconductor material layer 218 and do not overlie areas in which connection pads are to be subsequently formed. In one embodiment, the pad-connection pass-through via structures 8P1 can be arranged as a periodic array of pad-connection pass-through via structures 8P1. In this case, the openings in the photoresist layer can overlie a respective subset of the pad-connection pass-through via structures 8P1 that are to be subsequently connected to a same bonding pad. In other words, a plurality of pad-connection pass-through via structures 8P1 may be employed to provide an electrically conductive path to a bonding pad. Alternatively, a single pad-connection pass-through via structure 8P1 may be employed to provide an electrically conductive path to a bonding pad.

Figure 24C:
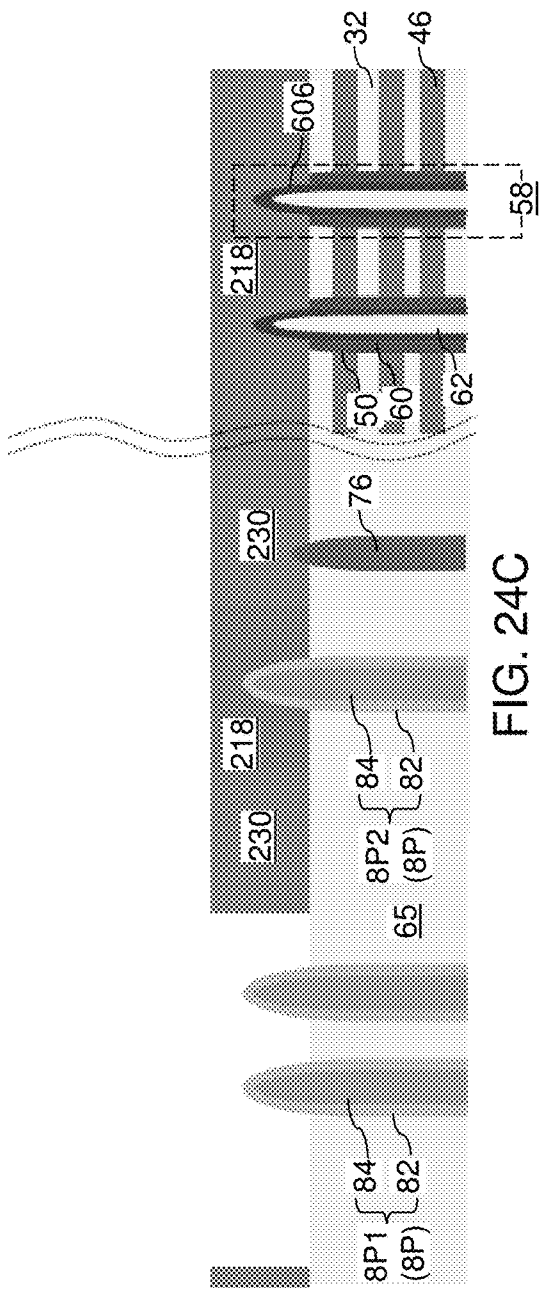

Referring to FIG. 24C, an etch process can be performed to remove unmasked portions of the backside isolation dielectric layer 230. An anisotropic etch process or an isotropic etch process can be performed. The etch process can be selective to the materials of the pad-connection pass-through via structures 8P1. An opening is formed through the backside isolation dielectric layer 230 such that a distal surface of each pad-connection pass-through via structure 8P1 is physically exposed. A distal surface (i.e., a backside surface) of a first material layer (such as the doped semiconductor material layer 218) can be physically exposed after patterning the backside isolation dielectric layer 230.

Distal portions of the pad-connection pass-through via structures 8P1 protrude from the horizontal physically exposed surface of the dielectric material portion 65. Remaining portions of the backside isolation dielectric layer 230 cover gaps between portions of the doped semiconductor material layer 218. The combination of the doped semiconductor material layer 218 and the backside isolation dielectric layer 230 covers the entire backside surface of the memory die 1000 other than the areas in which connection pads are to be subsequently formed, which include areas in which the pad-connection pass-through via structures 8P1 are located.

Figure 24D:
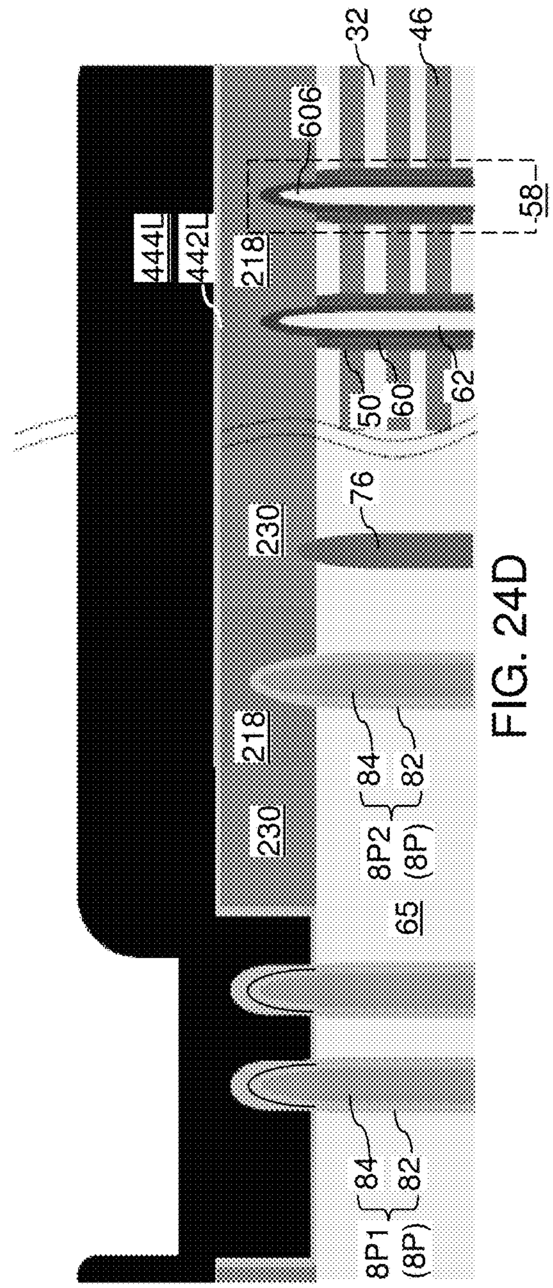

Referring to FIG. 24D, a second conductive material, such as at least one metallic material, can be deposited over the backside isolation dielectric layer 230 and into the openings through the backside isolation dielectric layer 230. The second conductive material can include, for example, a metallic barrier liner layer 442L including a metallic nitride material such as TiN, TaN, and/or WN or a Ti/TiN bilayer, and a continuous metallic material layer 444L including a metallic material such as copper, aluminum or alloy thereof. The thickness of the metallic barrier liner layer 442L may be in a range from 10 nm to 100 nm, and the thickness of the continuous metallic material layer 444L may be in a range from 300 nm to 3,000 nm, although lesser and greater thicknesses can also be employed. The metallic barrier liner layer 442L can be deposited directly on the distal surface of the doped semiconductor material layer 218 and directly on the protruding surfaces of the metallic barrier layer 82 of the pad-connection pass-through via structures 8P1.

Figure 24E:
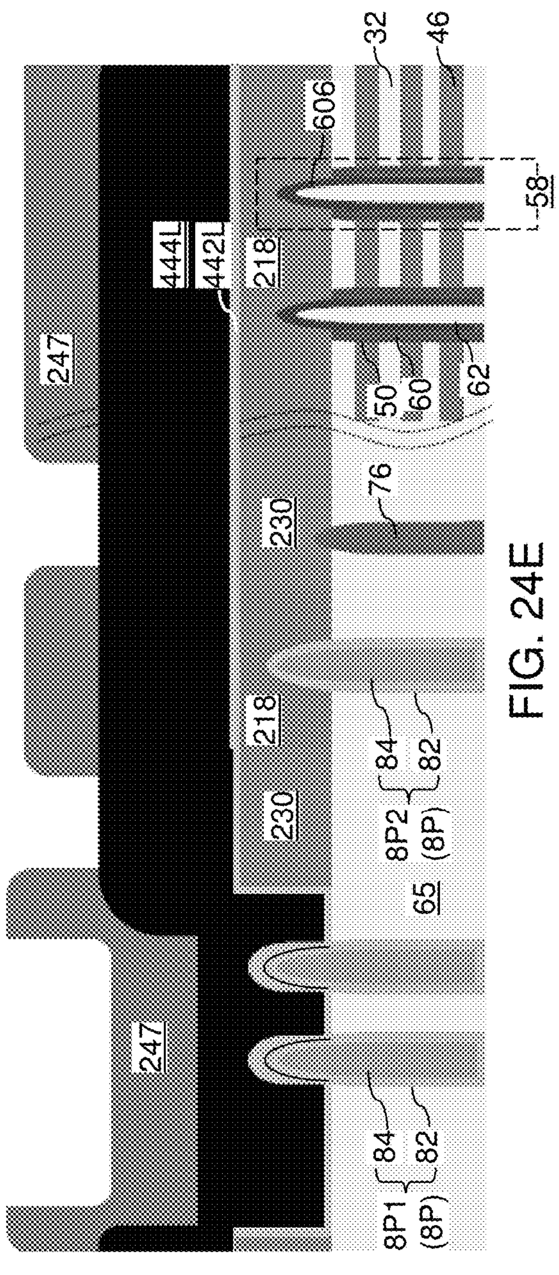

Referring to FIG. 24E, a photoresist layer 247 can be applied over the continuous metallic material layer 444L, and can be lithographically patterned to cover each area of the openings in the backside isolation dielectric layer 230. Thus, the patterned photoresist layer 247 covers the areas of the doped semiconductor material layer 218, the areas of pad-connection pass-through via structures 8P1, and the areas around the pad-connection pass-through via structures 8P1 in which the metallic barrier liner layer 442L contacts the dielectric material portion 65. The patterned portions of the photoresist layer 247 include discrete photoresist material portions that cover a respective area in which a respective connection pad is to be subsequently formed.

Figure 24F:
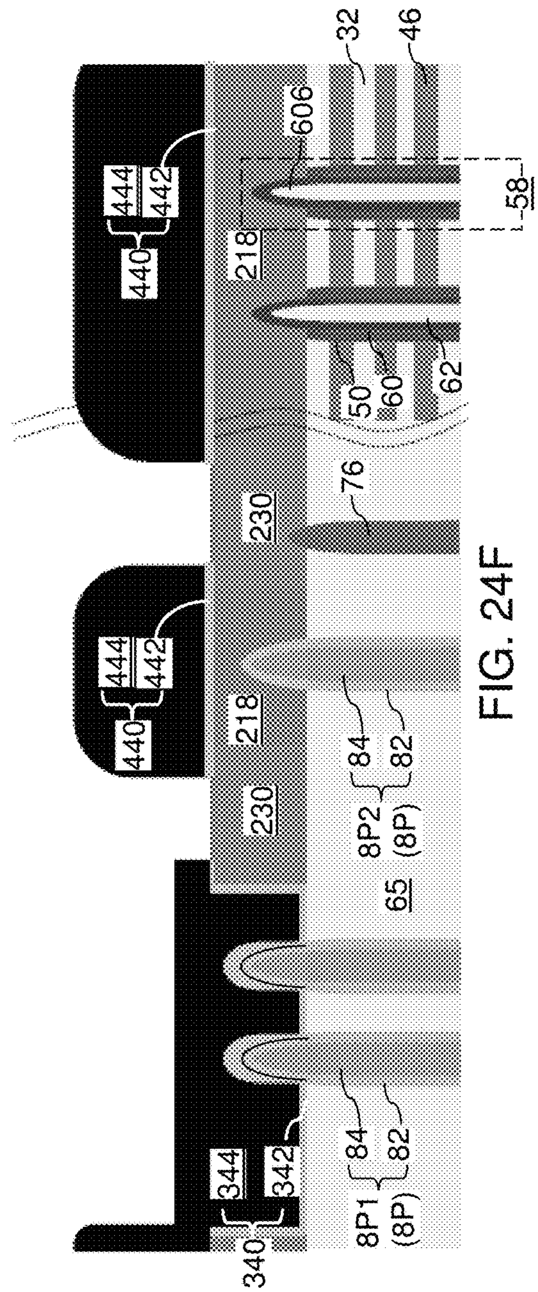

Referring to FIG. 24F, an etch process can be performed to transfer the pattern of the photoresist layer 247 through the continuous metallic material layer 444L and the metallic barrier liner layer 442L. The etch process may include an anisotropic etch process (such as a reactive ion etch process) and/or an isotropic etch process (such as a wet etch process). Unmasked portions of the continuous metallic material layer 444L and the metallic barrier liner layer 442L are removed by the etch process. The second conductive material, which can include the at least one metallic material, can be patterned to provide a first portion of the at least one metallic material that overlies the source layer (comprising the doped semiconductor material layer 218) and a second portion of the at least one metallic material located over the pad-connection pass-through via structures 8P1. The portion of the at least one metallic material can be incorporated into the source layer.

Each contiguous set of remaining material portions from the continuous metallic material layer 444L and the metallic barrier liner layer 442L that overlie, and are electrically connected to, a respective set of at least one pad-connection pass-through via structure 8P1 after the etch process comprises a connection pad 340. Each connection pad 340 can include a pad barrier liner 342 (which is a patterned portion of the pad barrier liner layer 442L) and a pad metal portion 344 (which is patterned portion of the continuous metallic material layer 444L). The pad metal portion 344 comprises at least one metallic material portion such as a copper, aluminum or alloy thereof portion.

Each contiguous set of remaining material portions from the continuous metallic material layer 444L and the metallic barrier liner layer 442L that overlie, and are electrically connected to, a doped semiconductor material layer 218 after the etch process comprises a metallic source layer 440. Each metallic source layer 440 can include a source barrier liner 442 (which is a patterned portion of the metallic barrier liner layer 442L) and a metallic material layer 444 (which is patterned portion of the continuous metallic material layer 444L). The metallic material layer 444 comprises at least one metallic material portion such as a copper, aluminum or alloy thereof portion.

Each connection pad 340 can be formed on the distal end of a respective pass-through via structure 8P such as a respective pad-connection pass-through via structure 8P1. A distal portion of each pad-connection pass-through via structure 8P1 protrudes from a horizontal plane including a horizontal interface between a connection pad 340 and the dielectric material portion 65 along a vertical direction that points away from the interface between the logic die 700 and the memory die 1000, and contacts recessed surfaces of the connection pad 340. Each pad-connection pass-through via structure 8P1 comprises a metallic barrier layer 82 comprising a metallic nitride material and a metallic fill material portion 84 embedded in the metallic barrier layer 82, not contacting the connection pad 340, and spaced from the connection pad 340 by a cap portion of the metallic barrier layer 82 that is contained within the distal portion of the pad-connection pass-through via structure 8P1.

Figure 24G:
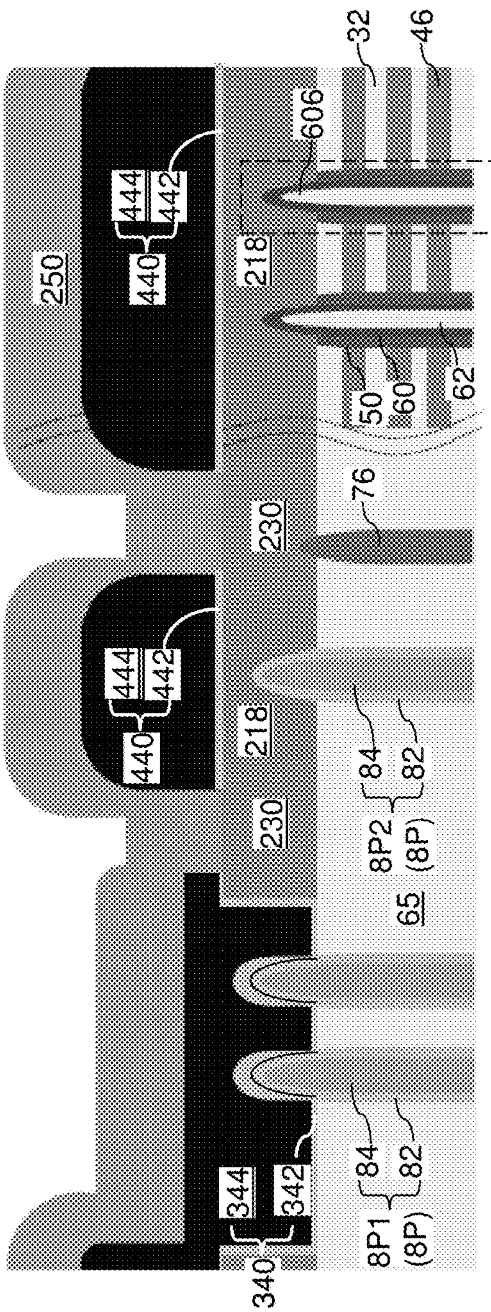

Referring to FIG. 24G, a backside passivation dielectric layer 250 can be formed over the backside isolation dielectric layer 230, the connection pads 340, and the metallic source layer 440. The backside passivation dielectric layer 250 includes a dielectric material that can passivate the backside of the memory die 1000, i.e., a dielectric material that can function as a diffusion blocking layer that blocks diffusion of moisture and impurities. In one embodiment, the backside passivation dielectric layer 250 can include silicon nitride that is deposited by plasma-enhanced chemical vapor deposition (PECVD) or a silicon oxide/silicon nitride bilayer. The thickness of the backside passivation dielectric layer 250 can be in a range from 100 nm to 1,000 nm, although lesser and greater thicknesses can also be employed.

Figure 24H:
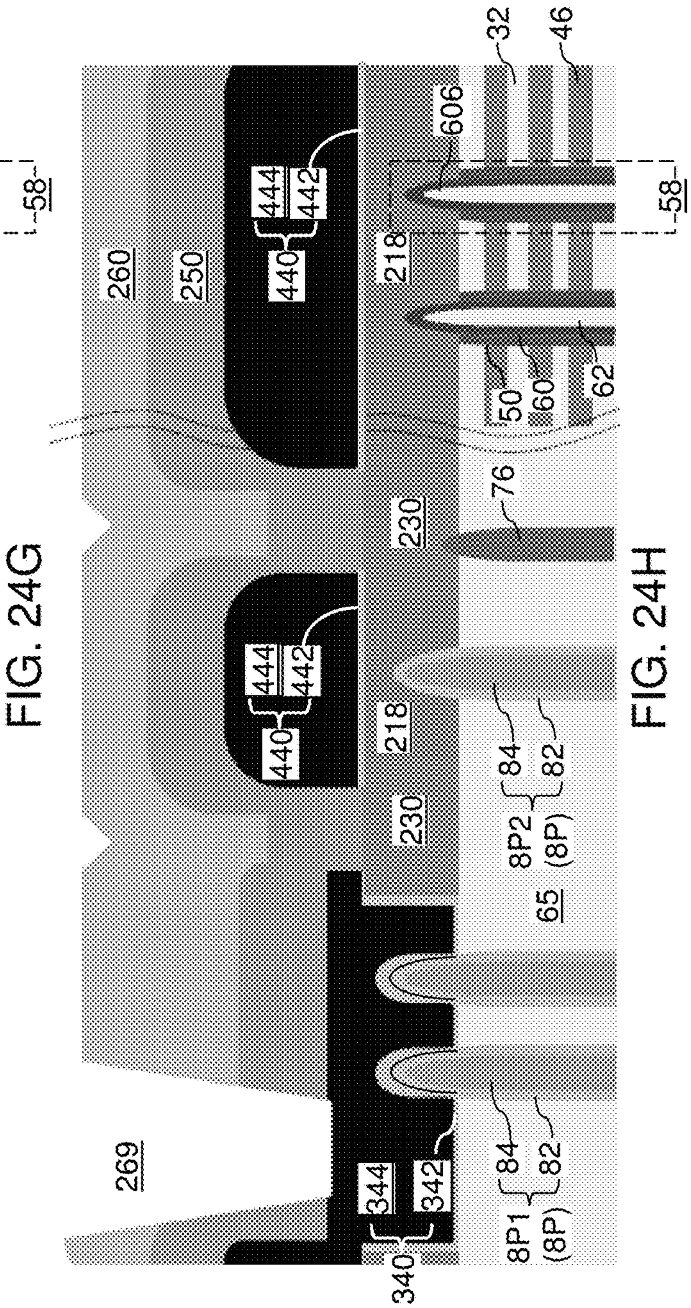

Referring to FIG. 24H, a backside polymer dielectric layer 260 can be formed over the backside passivation dielectric layer 250. Generally, the backside polymer dielectric layer 260 can be a dielectric polymer layer. For example, the backside polymer dielectric layer 260 can be formed by spin-coating and curing photosensitive polyimide. The photosensitive polyimide can be lithographically exposed and developed to form openings over the areas of the connection pads 340. An anisotropic etch process that employs the backside polymer dielectric layer 260 as an etch mask can be performed to etch through unmasked portions of the backside passivation dielectric layer 250. The connection pads 340 may be employed as etch stop structures. Terminal via (TV) cavities 269 can be formed through the backside polymer dielectric layer 260 and the backside passivation dielectric layer 250. Additional terminal via cavities (not shown) may be formed to physically expose a source layer (such as the metallic source layer 440).

Figure 24I:
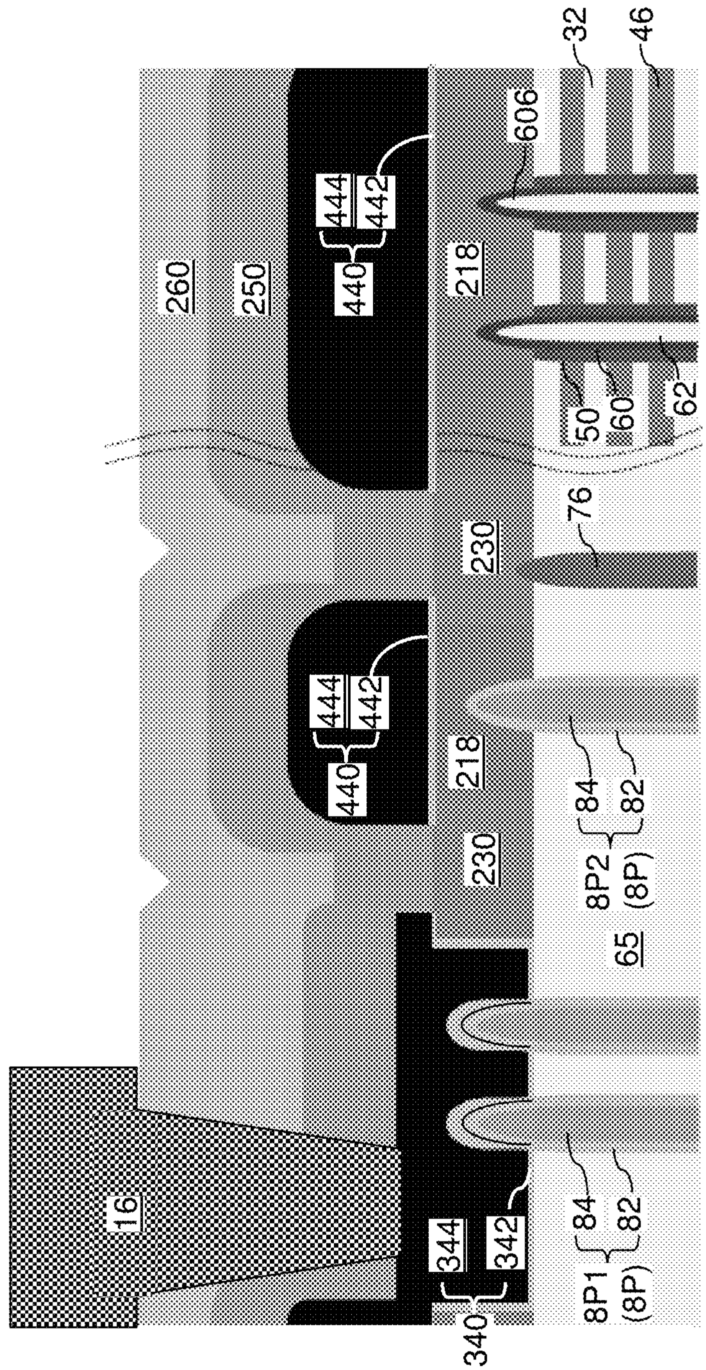

Referring to FIG. 24I, a metallic liner material such as TiN, TaN, and/or WN can be deposited in the terminal via cavities 269, and at least one bonding pad material can be subsequently deposited. The at least one bonding pad material may include, for example, a pad metal such as copper, aluminum or alloy thereof, and an under bump metallurgy (UBM) material stack for facilitating subsequent attachment of a solder material thereupon. For example, the at least one bonding pad material may include a vertical stack of a copper portion and an under bump metallurgy (UBM) stack portion, or a vertical stack of an aluminum portion and a UBM stack portion. An exemplary UBM stack portion can include, from bottom to top, a Ti/Cu, layer, a Ni layer, and a Cu layer.

The at least one bonding pad material and the metallic liner material can be subsequently patterned, for example, by applying and patterning a photoresist layer thereabove, and by transferring the pattern in the photoresist layer through the at least one bonding pad material and the metallic liner material. Various bonding pads 16 can be formed directly on a respective one of the connection pads 340. Additional bonding pads, such as at least one source bonding pad 14 illustrated in FIG. 21, may be formed directly on the distal surface of a source layer (such as the doped semiconductor material layer 218). Bonding wires 15 can be bonded to a respective one of the bonding pads (14, 16) as illustrated in FIG. 21. A backside bonding wire 715 can be bonded to each backside bonding pad 716. Alternatively, the bonding pad 16 may be omitted, and the bonding wire 15 is deposited into the TV cavity 269 to directly physically contact the connection pad 340, similar to the configuration shown in FIG. 23Q.

Generally, at least one backside dielectric layer (230, 250, 260) can be formed over the source layer (such as the doped semiconductor material layer 218 and the metallic source layer 240). Each backside bonding pad 16 can be formed over a distal surface of the at least one backside dielectric layer (230, 250, 260). Each backside bonding pad 16 can comprise a via portion that extends through the at least one backside dielectric layer (230, 250, 260). The at least one backside dielectric layer (230, 250, 260) can include a backside polymer dielectric layer 260 that contacts the metallic material portion of a connection pad 340, and extends over the source layer (such as the doped semiconductor material layer 218). In one embodiment, the at least one backside dielectric layer (230, 250, 260) can comprise a stack of a silicon oxide layer (such as the backside isolation dielectric layer 230), a silicon nitride layer (such as the backside passivation dielectric layer 250), and a dielectric polymer layer (such as the backside polymer dielectric layer 260). At least a subset of the backside bonding pads 16 can be formed through the at least one backside dielectric layer (230, 250, 260) on a distal surface of a respective connection pad 340.

At least one backside bonding pad 16 can be electrically connected to a pass-through via structure 8P, and can be electrically isolated from the source layer (such as the doped semiconductor material layer 218). The at least one backside bonding pad 16 can be formed over the dielectric material portion 65, and can have an areal overlap with the dielectric material portion 65 in a plan view. Each connection pad 340 can contact a distal surface of a respective pass-through via structure 8P (such as a respective pad-connection pass-through via structure 8P1), and can contact a proximal surface of a respective backside bonding pad 16.

In one embodiment, a source layer (218, 440) can comprise a first conductive material (comprising the doped semiconductor material layer 218) and can be electrically connected to end portions of the vertical semiconductor channels 60 that are distal from an interface between the logic die 700 and the memory die 1000. A pass-through via structure (such as a pad-connection pass-through via structure 8P1) can have a vertical extent that is greater than a vertical thickness of the alternating stack (32, 46), and can vertically extend through the dielectric material portion 65. The source layer (218, 440) can further comprise a metallic source layer 440 including a second conductive material, which can comprise at least one metallic material. The second conductive material is different from the first conductive material. A connection pad 340 can comprise the second conductive material, and can contact a distal surface of the pass-through via structure (such as a pad-connection pass-through via structure 8P1), and can be electrically isolated from the source layer (218, 440).

In one embodiment, the vertical semiconductor channels 60 comprise a semiconductor material having a doping of a first conductivity type, and the source layer (comprising the doped semiconductor material layer 218) comprises a doped semiconductor material having a doping of a second conductivity type that is an opposite of the first conductivity type. In one embodiment, source cap regions 606 including a doped semiconductor material portion having a doping of the second conductivity type can be located directly on an end portion of a respective one of the vertical semiconductor channels 60. The source layer (218, 440) contacts each of the source cap regions 606.

In one embodiment, the second conductive material can comprise a metallic material. In one embodiment, the connection pad 340 can comprise a pad barrier liner 342 comprising a metallic barrier material and contacting a distal horizontal surface of the dielectric material portion 65, and a pad metal portion 344 comprising the metallic material and contacting the pad barrier liner 342. In one embodiment, the pass-through via structure (such as a pad-connection pass-through via structure 8P1) comprises a metallic barrier layer 82 in contact with the pad barrier liner 342 and a sidewall of the dielectric material portion 65, and a metallic fill material portion 84 that is spaced from the connection pad 340 and from the dielectric material portion 65 by the metallic barrier layer 82. In one embodiment, a distal portion of the metallic barrier layer 82 protrudes from a horizontal interface between the dielectric material portion 65 and the connection pad 340 and into the connection pad 340, and is laterally surrounded by the connection pad 340. A backside bonding pad 16 can be located over the dielectric material portion 65, can contact a distal surface of the connection pad 340, and can be electrically isolated from the source layer (comprising the doped semiconductor material layer 218).

Figure 24J:
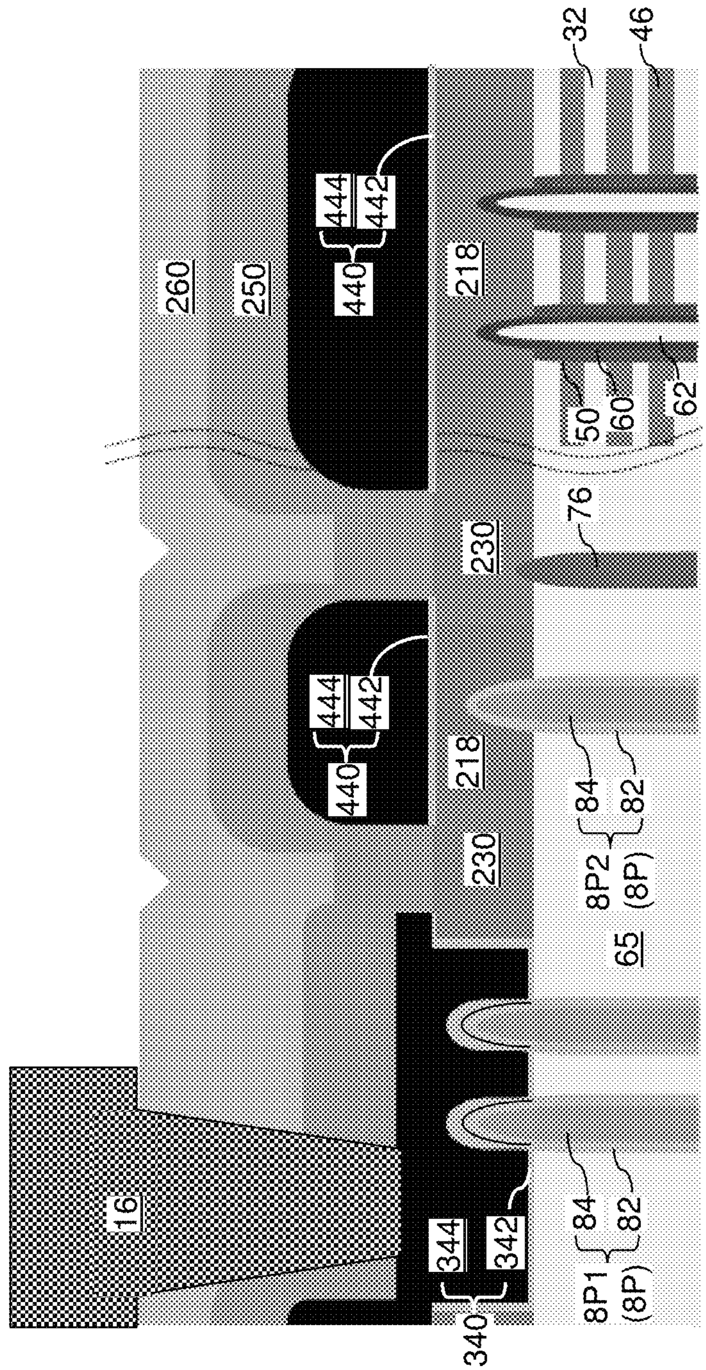
FIG. 24J illustrates another embodiment of the second alternative configuration of the bonded assembly of FIG. 24I.

Referring to FIG. 24J, another embodiment of the second alternative configuration of the bonded assembly is illustrated, which can be derived from the bonded assembly of FIG. 24I by omitting the ion implantation process that forms the source cap regions 606. In this case, the doped semiconductor material layer 218 directly contacts end portions of the vertical semiconductor channels 60. The doped semiconductor material layer 218 is part of the source layer that functions as a common source for all vertical NAND strings including the vertical semiconductor channels 60.

FIGS. 25A-25G are sequential vertical cross-sectional view of a third alternative configuration of a bonded assembly (700, 1000) during various processing steps up to formation of backside bonding pads 16 according to a fourth embodiment of the present disclosure.

Figure 25A:
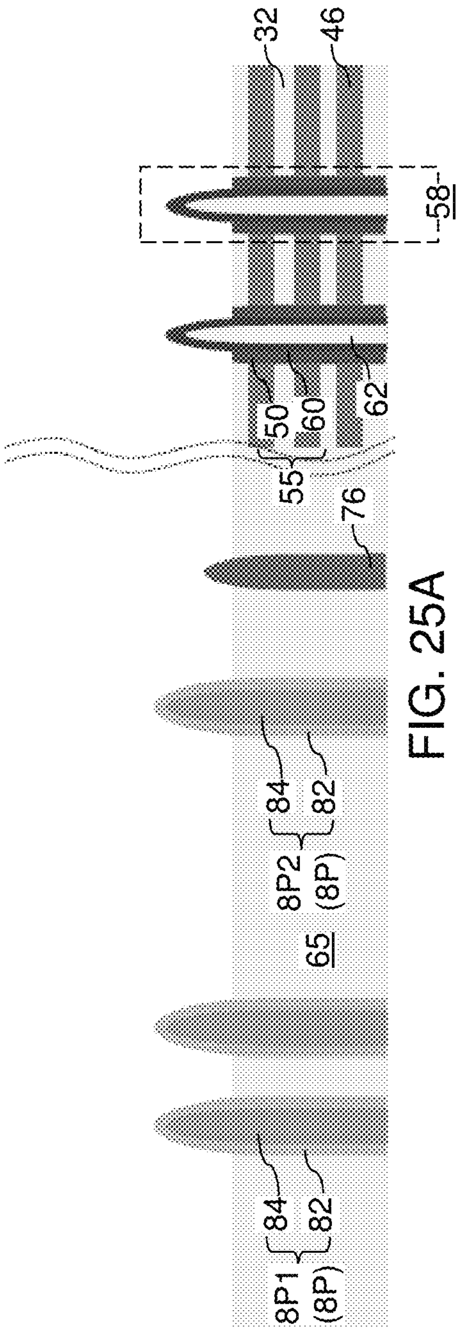
FIGS. 25A-25G are sequential vertical cross-sectional view of a third alternative configuration of a bonded assembly during various processing steps up to formation of backside bonding pads according to a fourth embodiment of the present disclosure.

Referring to FIG. 25A, the second alternative configuration of a bonded assembly (700, 1000) can be the same as the first alternative configuration of the bonded assembly at the processing steps of FIG. 23C. A distal end of each of the vertical semiconductor channels 60 and a distal end of each pass-through via structure 8P are physically exposed.

Figure 25B:
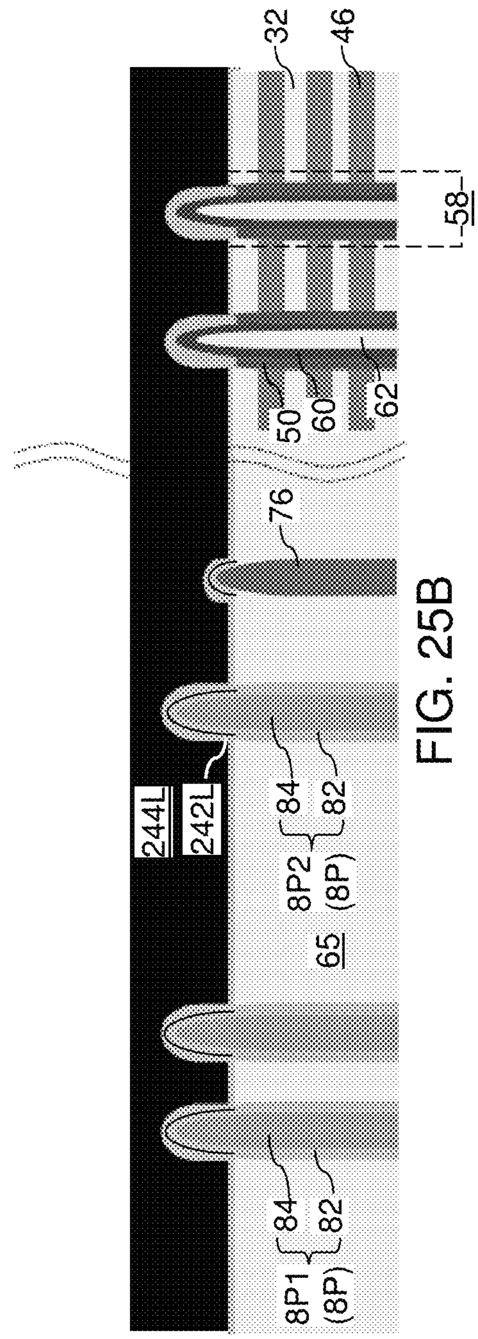

Referring to FIG. 25B, at least one conductive material can be simultaneously directly on the material of the distal end of each of the vertical semiconductor channels 60 and directly on the distal end of each pass-through via structure 8P. For example, the at least one conductive material comprises a layer stack including a metallic barrier liner layer 242L and a continuous metallic material layer 244L. In this case, the metallic barrier liner layer 242L and the continuous metallic material layer 244L can be deposited over the physically exposed surfaces of the vertical semiconductor channels 60 and the pass-through via structures 8P. The metallic barrier liner layer 242L includes a metallic barrier material such as TiN, TaN, and/or WN, or a Ti/TiN bilayer. The metallic barrier liner layer 242L can be deposited by physical vapor deposition or chemical vapor deposition, and can have a thickness in a range from 3 nm to 60 nm, such as from 6 nm to 30 nm, although lesser and greater thicknesses can also be employed. The continuous metallic material layer 244L includes an elemental metal or an intermetallic alloy such as Al, Cu, W, Mo, Ru, Co, and/or alloys thereof. The continuous metallic material layer 244L can be deposited by physical vapor deposition and/or by electroplating, and can have a thickness in a range from 200 nm to 1,000 nm, although lesser and greater thicknesses can also be employed.

Figure 25C:
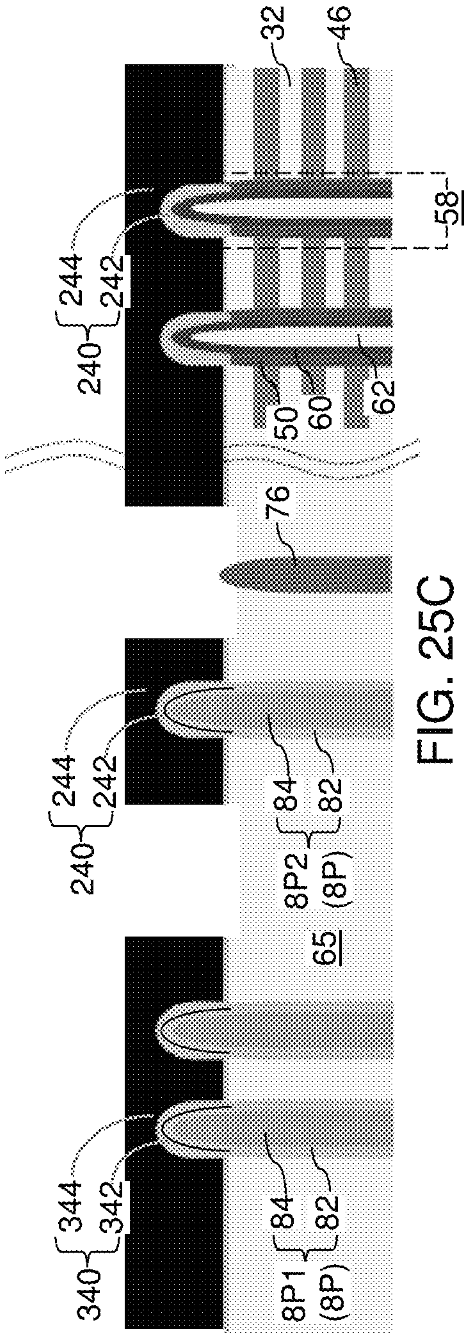

Referring to FIG. 25C, the at least one conductive material can be patterned into multiple discrete portions. For example, a photoresist layer (not shown) can be applied over the continuous metallic material layer 244L, and can be lithographically patterned to cover multiple discrete areas. In one embodiment, a patterned portion of the photoresist layer can continuously cover a set of memory opening fill structures 58 and a respective one of the source-connection pass-through via structures 8P2 configured to electrically bias the vertical semiconductor channels 60 within the set of memory opening fill structures 58. In one embodiment, the patterned photoresist layer includes discrete photoresist material portions that cover a respective subset of the pad-connection pass-through via structures 8P1.

An etch process can be performed employing the photoresist layer as an etch mask layer. The etch process may include an anisotropic etch process or an isotropic etch process. A source layer comprising a first portion of the at least one conductive material is formed on the distal end of each of the vertical semiconductor channels 60. A connection pad 340 comprising a second portion of the at least one conductive material is formed on a pass-through via structure (such as a pad-connection pass-through via structure 8P1). The connection pad 340 is electrically isolated from the source layer.

Specifically, the etch process etches unmasked portions of the continuous metallic material layer 244L and the metallic barrier liner layer 242L. The patterned portions of the continuous metallic material layer 244L include at least one metallic material layer 244 that covers a respective set of memory opening fill structures 58 and continuously extends over at least one source-connection pass-through via structure 8P2, and a pad metal portion 344 that covers at least one the pad-connection pass-through via structure 8P1. The patterned portion of the metallic barrier liner layer 242L includes at least one source barrier liner 242 that contacts a respective set of memory opening fill structures 58 and at least one source-connection pass-through via structure 8P2, and a pad barrier liner 342 that contacts at least one pad-connection pass-through via structure 8P1. Each contiguous combination of a metallic material layer 244 and a source barrier liner 242 constitutes a metallic source layer 240. Each contiguous combination of a pad metal portion 344 and a pad barrier liner 342 constitutes a connection pad 340. The metallic source layer 240 functions as a source layer that electrically connects a respective set of vertical semiconductor channels 60 to the at least one source-connection pass-through via structure 8P2.

Generally, a source layer comprising a metallic source layer 240 can be formed by depositing at least one metallic material on the distal end of each of the vertical semiconductor channels 60 and by patterning the at least one metallic material. In one embodiment, interfaces between the semiconductor material of the vertical semiconductor channels 60 and the source layer (comprising the metallic source layer 240) protrude from the horizontal plane including the horizontal interface between the source layer and the alternating stack (32, 46) along a vertical direction that points away from the interface between the logic die 700 and the memory die 1000. For example, the interfaces between the vertical semiconductor channels 60 and the source layer (comprising the metallic source layer 240) can be more distal from the bonding interface between the logic die 700 and the memory die 1000 than the horizontal plane including the horizontal interface between the source layer and the alternating stack (32, 46).

The source layer (comprising the metallic source layer 240) is electrically connected to and contacts end portions of the vertical semiconductor channels 60 that are distal from an interface between the logic die 700 and the memory die 1000. In one embodiment, distal surfaces of the memory films 50 are located within a horizontal plane including the horizontal interface between the source layer (comprising the metallic source layer 240) and the alternating stack of the insulating layers 32 and the electrically conductive layers 46, or are more proximal to the interface between the logic die 700 and the memory die 1000 than the interface between the source layer and the alternating stack (32, 46) is to the interface between the logic die 700 and the memory die 1000.

Figure 25D:
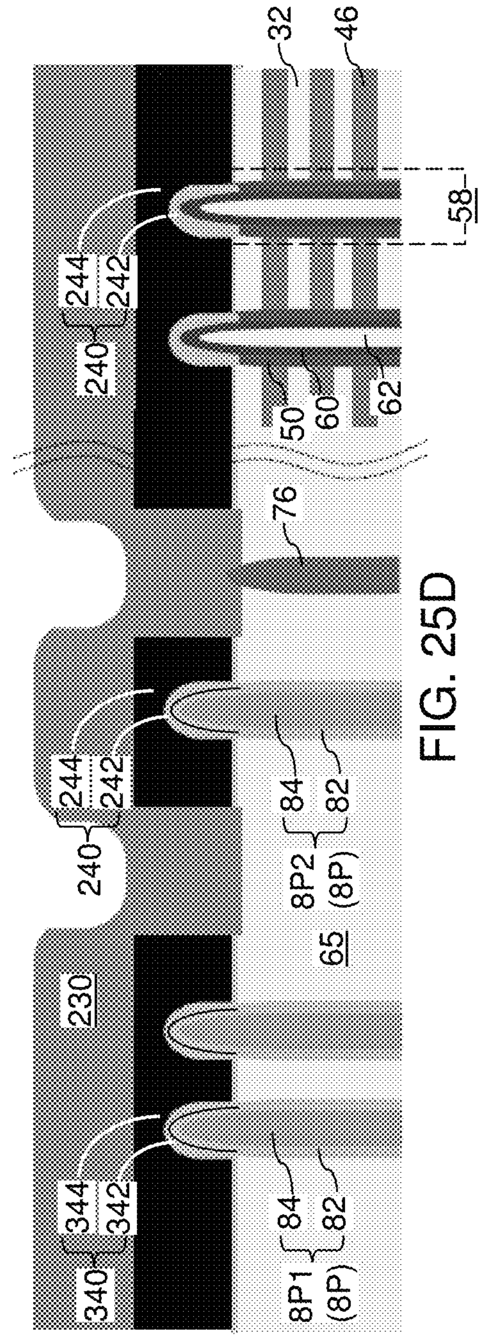

Referring to FIG. 25D, a backside isolation dielectric layer 230 can be formed on the distal surface of the metallic source layer 240, on the distal surface of each connection pad 340, and on the planar distal surface of the dielectric material portion 65. In one embodiment, the backside isolation dielectric layer 230 can include a dielectric material such as undoped silicate glass or a doped silicate glass, and can have a thickness in a range from 100 nm to 2,000 nm, such as from 200 nm to 1,000 nm, although lesser and greater thicknesses can also be employed.

Figure 25E:
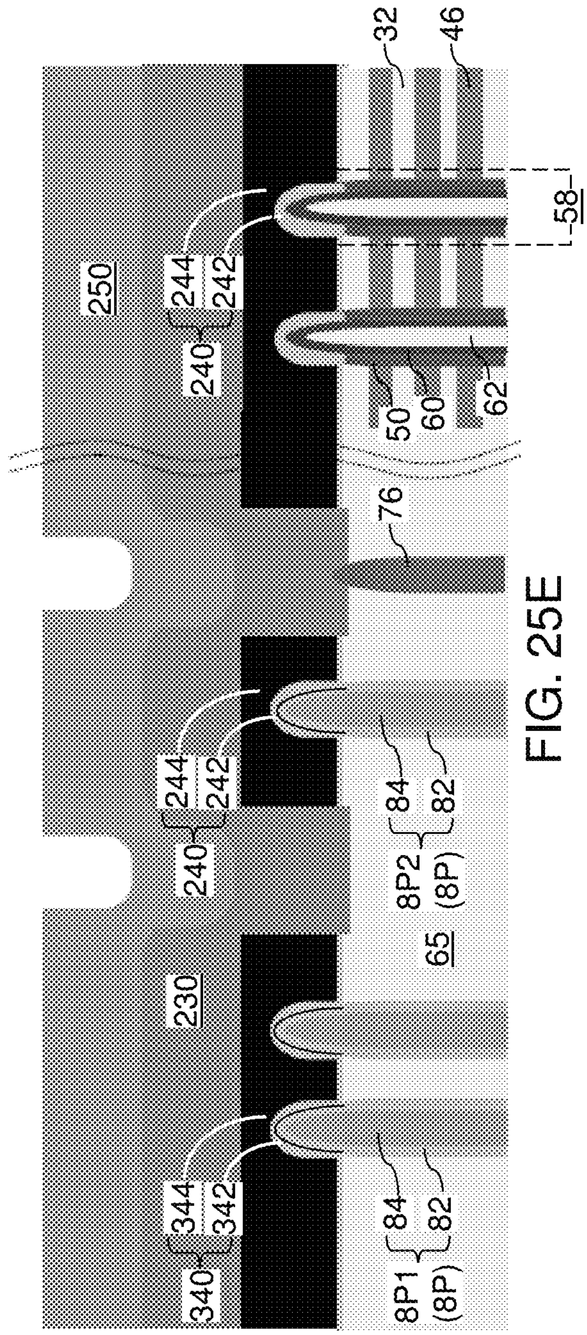

Referring to FIG. 25E, a backside passivation dielectric layer 250 can be formed over the backside isolation dielectric layer 230. The backside passivation dielectric layer 250 includes a dielectric material that can passivate the backside of the memory die 1000, i.e., a dielectric material that can function as a diffusion blocking layer that blocks diffusion of moisture and impurities. In one embodiment, the backside passivation dielectric layer 250 can include silicon nitride that is deposited by plasma-enhanced chemical vapor deposition (PECVD) or a silicon oxide/silicon nitride bilayer. The thickness of the backside passivation dielectric layer 250 can be in a range from 100 nm to 1,000 nm, although lesser and greater thicknesses can also be employed.

Figure 25F:
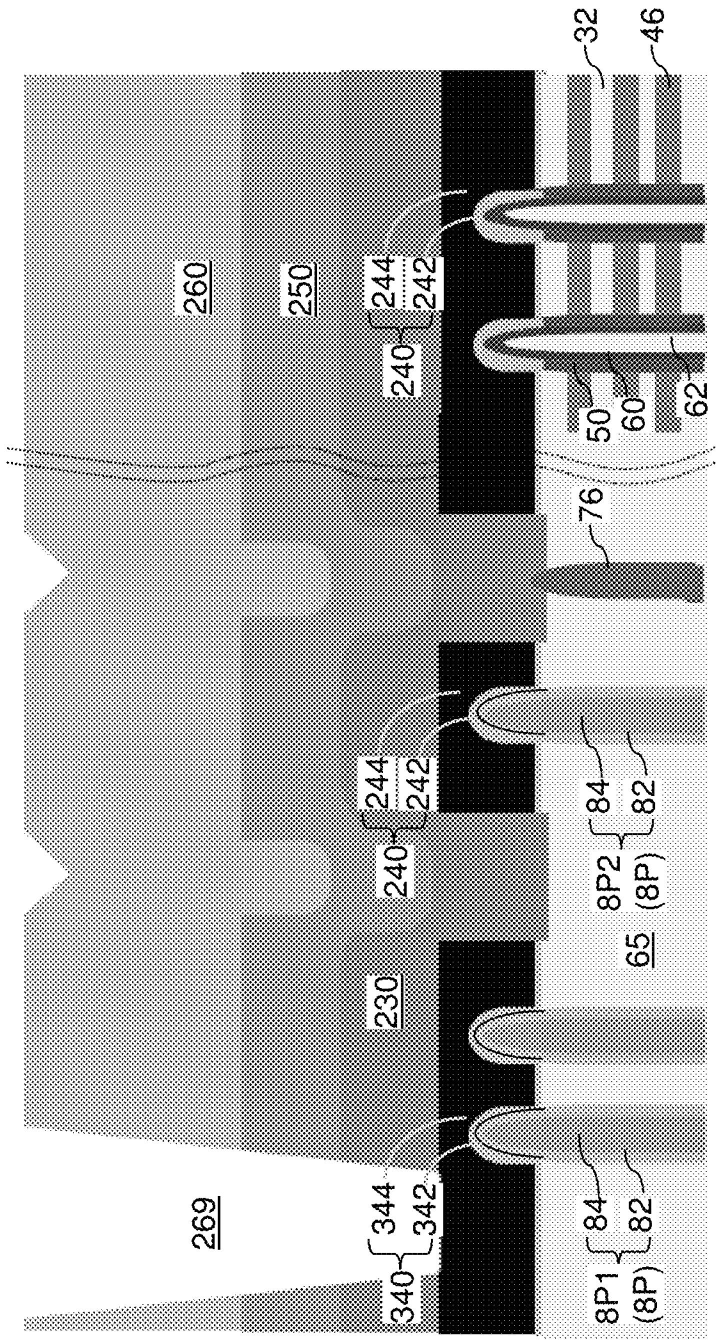

Referring to FIG. 25F, a backside polymer dielectric layer 260 can be formed over the backside passivation dielectric layer 250. Generally, the backside polymer dielectric layer 260 can be a dielectric polymer layer. For example, the backside polymer dielectric layer 260 can be formed by spin-coating and curing photosensitive polyimide. The photosensitive polyimide can be lithographically exposed and developed to form openings over the areas of the connection pads 340. An anisotropic etch process that employs the backside polymer dielectric layer 260 as an etch mask can be performed to etch through unmasked portions of the backside passivation dielectric layer 250 and the backside isolation dielectric layer 230. The connection pads 340 may be employed as etch stop structures. Terminal via (TV) cavities 269 can be formed through the backside polymer dielectric layer 260 and the backside passivation dielectric layer 250. Additional terminal via cavities (not shown) may be formed to physically expose a source layer (such as the metallic source layer 240).

Figure 25G:
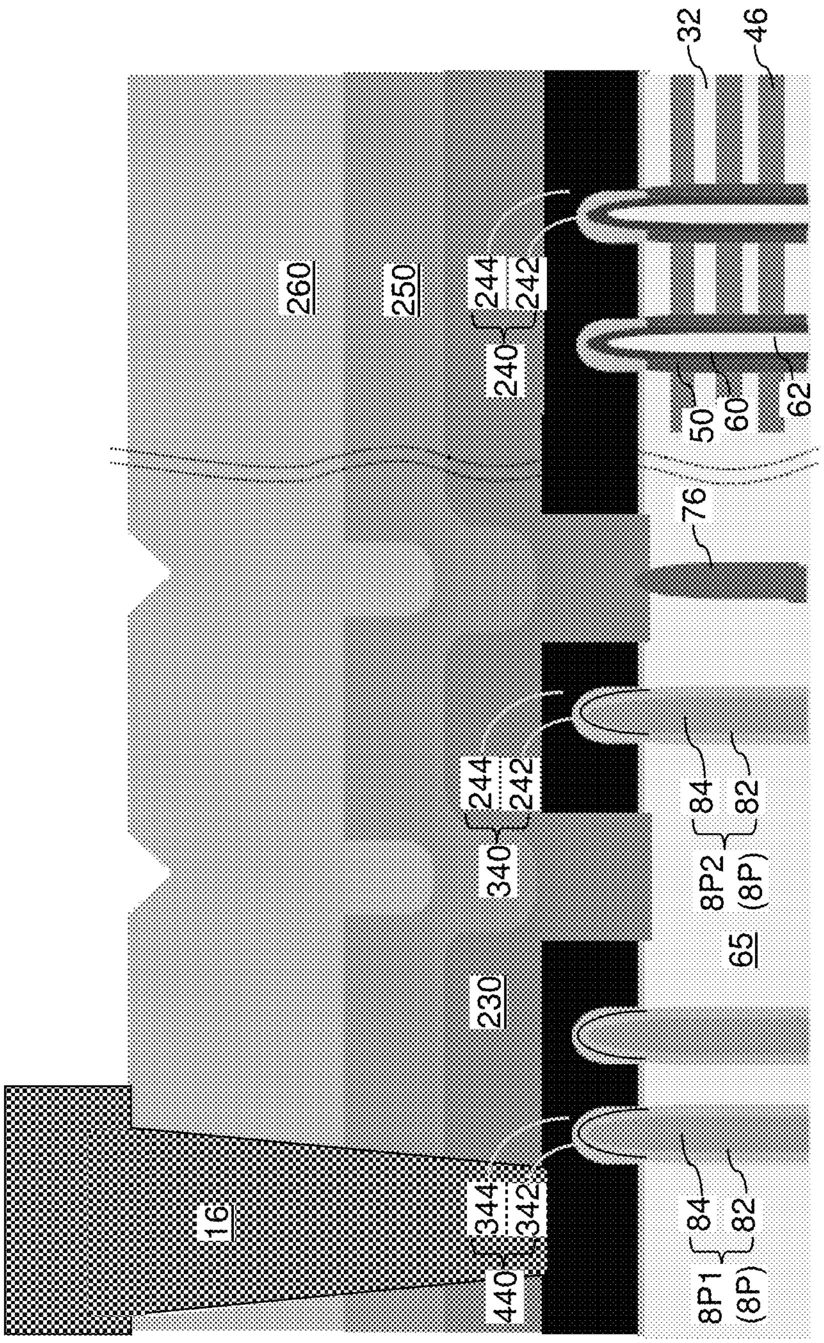

Referring to FIG. 25G, a metallic liner material such as TiN, TaN, and/or WN can be deposited in the terminal via cavities 269, and at least one bonding pad material can be subsequently deposited. The at least one bonding pad material may include, for example, a pad metal such as copper, aluminum or alloy thereof, and an under bump metallurgy (UBM) material stack for facilitating subsequent attachment of a solder material thereupon. For example, the at least one bonding pad material may include a vertical stack of a copper portion and an under bump metallurgy (UBM) stack portion, or a vertical stack of an aluminum portion and a UBM stack portion. An exemplary UBM stack portion can include, from bottom to top, a Ti/Cu, layer, a Ni layer, and a Cu layer.

The at least one bonding pad material and the metallic liner material can be subsequently patterned, for example, by applying and patterning a photoresist layer thereabove, and by transferring the pattern in the photoresist layer through the at least one bonding pad material and the metallic liner material. Various bonding pads 16 can be formed directly on a respective one of the connection pads 340. Additional bonding pads, such as at least one source bonding pad 14 illustrated in FIG. 21, may be formed directly on the distal surface of a source layer (such as the metallic source layer 240). Bonding wires 15 can be bonded to a respective one of the bonding pads (14, 16) as illustrated in FIG. 21. A backside bonding wire 715 can be bonded to each backside bonding pad 716. Alternatively, the bonding pad 16 may be omitted, and the bonding wire 15 is deposited into the TV cavity 269 to directly physically contact the connection pad 340, similar to the configuration shown in FIG. 23Q.

Generally, at least one backside dielectric layer (230, 250, 260) can be formed over the source layer (such as the metallic source layer 240). Each backside bonding pad 16 can be formed over a distal surface of the at least one backside dielectric layer (230, 250, 260). Each backside bonding pad 16 can comprise a via portion that extends through the at least one backside dielectric layer (230, 250, 260). The at least one backside dielectric layer (230, 250, 260) can include a backside polymer dielectric layer 260 that contacts the metallic material portion of a connection pad 340, and extends over the source layer (such as the metallic source layer 240). In one embodiment, the at least one backside dielectric layer (230, 250, 260) can comprise a stack of a silicon oxide layer (such as the backside isolation dielectric layer 230), a silicon nitride layer (such as the backside passivation dielectric layer 250), and a dielectric polymer layer (such as the backside polymer dielectric layer 260). At least a subset of the backside bonding pads 16 can be formed through the at least one backside dielectric layer (230, 250, 260) on a distal surface of a respective connection pad 340.

At least one backside bonding pad 16 can be electrically connected to a pass-through via structure 8P, and can be electrically isolated from the source layer (such as the metallic source layer 240). The at least one backside bonding pad 16 can be formed over the dielectric material portion 65, and can have an areal overlap with the dielectric material portion 65 in a plan view. Each connection pad 340 can contact a distal surface of a respective pass-through via structure 8P (such as a respective pad-connection pass-through via structure 8P1), and can contact a proximal surface of a respective backside bonding pad 16.

In one embodiment, a source layer (comprising the metallic source layer 240) comprises a first portion of a conductive material, and is electrically connected to end portions of the vertical semiconductor channels 60 that are distal from an interface between the logic die 700 and the memory die 1000. A pass-through via structure (such as a pad-connection pass-through via structure 8P1) has a vertical extent that is greater than a vertical thickness of the alternating stack (32, 46), and vertically extends through the dielectric material portion 65. A connection pad comprises a second portion of the conductive material, contacts a distal surface of the pass-through via structure such as the pad-connection pass-through via structure 8P1), and is electrically isolated from the source layer (comprising the metallic source layer 240).

In one embodiment, the conductive material comprises a metallic material. In one embodiment, the source layer (comprising the metallic source layer 240) contacts a distal horizontal surface of the alternating stack (32, 46), and the connection pad 340 contacts a distal horizontal surface of the dielectric material portion 65. In one embodiment, the source layer (comprising the metallic source layer 240) comprises a layer stack of a source barrier liner 242 contacting the distal horizontal surface of the alternating stack (32, 46) and a metallic material layer 244 comprising the first portion of the metallic material and overlying the source barrier liner 242. The connection pad 340 comprises a layer stack of a pad barrier liner 342 contacting the distal horizontal surface of the dielectric material portion 65 and a pad metal portion 344 comprising the second portion of the metallic material. In one embodiment, source barrier liner 242 and the pad barrier liner 342 have a same material composition and a same thickness.

FIGS. 26A-26G are sequential vertical cross-sectional view of a fourth alternative configuration of a bonded assembly during various processing steps up to formation of backside bonding pads according to a fifth embodiment of the present disclosure.

Figure 26A:
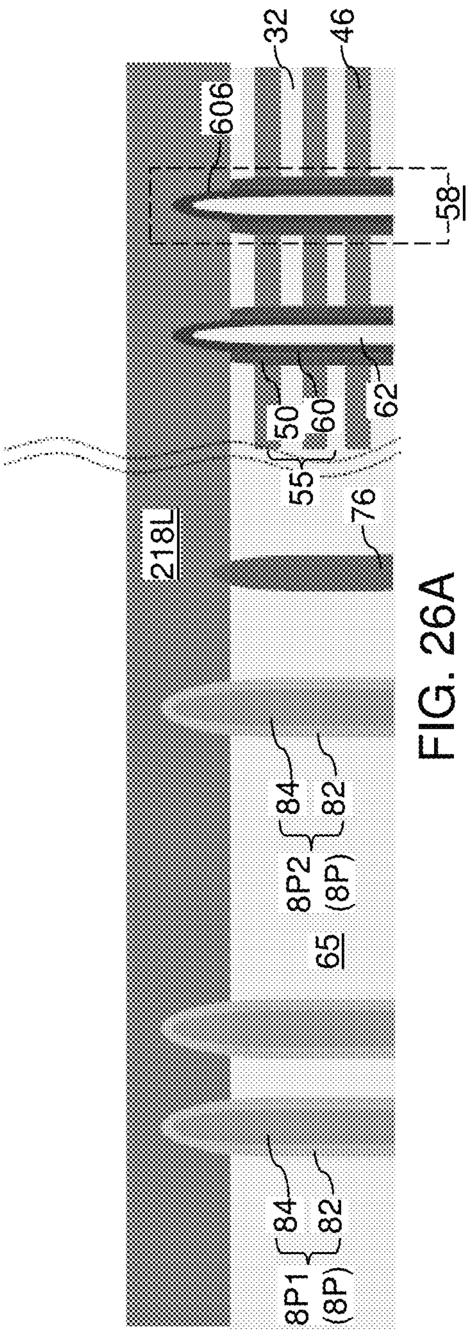
FIGS. 26A-26G are sequential vertical cross-sectional view of a fourth alternative configuration of a bonded assembly during various processing steps up to formation of backside bonding pads according to a fifth embodiment of the present disclosure.

Referring to FIG. 26A, the fourth alternative configuration of the bonded assembly (700, 1000) can the same as the first alternative configuration of the bonded assembly (700, 1000) illustrated in FIG. 23E. In this case, dopants of the second conductivity type can be optionally implanted into the material of the distal end of each of the vertical semiconductor channels 60 to form source cap regions 606 having a doping of the second conductivity type. Generally, a conductive material can be simultaneously directly on the material of the distal end of each of the vertical semiconductor channels (which may include the source cap regions 606 if the source cap regions 606 are formed, or may include end portions of the vertical semiconductor channels 60) and directly on the distal end of the pass-through via structures 8P. In this case, the vertical semiconductor channels 60 comprise a semiconductor material having a doping of a first conductivity type, and the conductive material comprises a continuous doped semiconductor material layer 218L having a doping of a second conductivity type that is an opposite of the first conductivity type.

Figure 26B:
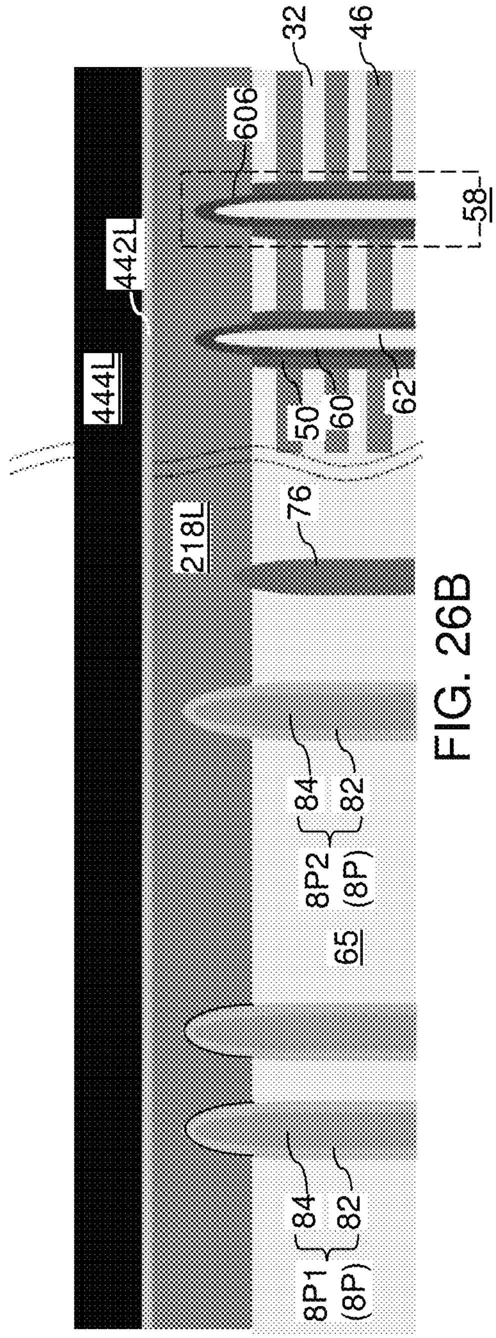

Referring to FIG. 26B, at least one metallic material can be deposited on the distal surface of the continuous doped semiconductor material layer 218L. For example, a layer stack including a metallic barrier liner layer 442L and a continuous metallic material layer 444L directly on a distal surface of the continuous doped semiconductor material layer 219L. The at least one metallic material can include, for example, a metallic barrier liner layer 442L including a metallic nitride material such as TiN, TaN, and/or WN, or a Ti/TiN bilayer and a continuous metallic material layer 444L including a metallic material such as copper, aluminum or alloy thereof. The thickness of the metallic barrier liner layer 442L may be in a range from 10 nm to 100 nm, and the thickness of the continuous metallic material layer 444L may be in a range from 300 nm to 3,000 nm, although lesser and greater thicknesses can also be employed. The metallic barrier liner layer 442L does not directly contact the pad-connection pass-through via structures 8P1 or the source cap regions 606 (or the vertical semiconductor channels 60).

Figure 26C:
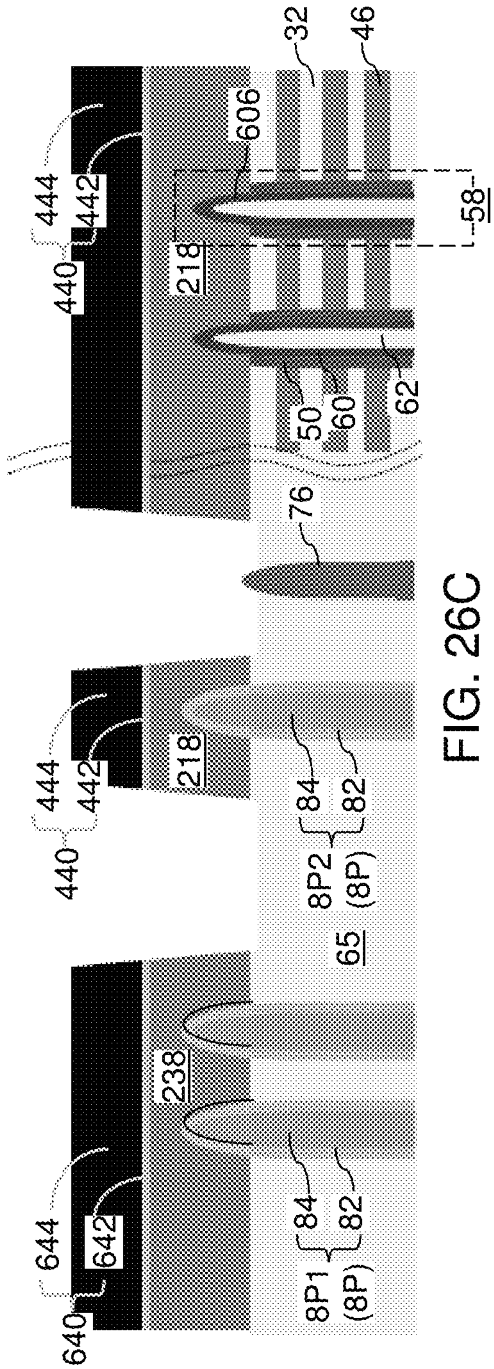

Referring to FIG. 26C, a photoresist layer (not shown) can be applied over the continuous metallic material layer 444L, and can be lithographically patterned to form openings in areas outside of the memory opening fill structures 58, the source-connection pass-through via structures 8P2, and the pad-connection pass-through via structure 8P1. Patterned portions of the photoresist layer include a continuous photoresist material portion that extends over the areas of the memory opening fill structures 58 and the source-connection pass-through via structures 8P2, and discrete photoresist material portions that cover a respective set of at least one pad-connection pass-through via structure 8P1.

An etch process can be performed to transfer the pattern in the photoresist layer though the stack of the continuous metallic material layer 444L, the metallic barrier liner layer 442L, and the continuous doped semiconductor material layer 218L. The etch process may include an anisotropic etch process (such as a reactive ion etch process) or an isotropic etch process (such as a wet etch process). Unmasked portions of the continuous metallic material layer 444L, the metallic barrier liner layer 442L, and the continuous doped semiconductor material layer 218L are removed by the etch process.

Generally, the layer stack of the metallic barrier liner layer 442L and the continuous metallic material layer 444L and the underlying conductive material of the continuous doped semiconductor material layer 218L can be patterned employing a same etch mask. A source layer (218, 440) is formed, which comprises a first remaining portion of the layer stack (442L, 444L) and a first remaining portion of the continuous doped semiconductor material layer 218L. A connection pad (238, 640) is formed, which comprises a second remaining portion of the layer stack (442L, 444L) and a second remaining portion of the continuous doped semiconductor material layer 218L. Generally, the layer stack (442L, 444L) and the continuous doped semiconductor material layer 218L can be patterned into multiple discrete portions. The source layer (218, 440) can be formed on the distal end of each of the vertical semiconductor channels 60. The connection pad (238, 640) can be formed on a pass-through via structure (such as a pad-connection pass-through via structure 8P1), and can be electrically isolated from the source layer (218, 440).

Specifically, a patterned portion of the continuous doped semiconductor material layer 218L that contacts and/or is electrically connected to, distal ends of the vertical semiconductor channels 60 and the source-connection pass-through via structures 8P2 comprises a doped semiconductor material layer 218, which is a semiconductor source layer. Each contiguous set of remaining material portions from the continuous metallic material layer 444L and the metallic barrier liner layer 442L that overlie, and are electrically connected to a doped semiconductor material layer 218 after the etch process comprises a metallic source layer 440. Each metallic source layer 440 can include a source barrier liner 442 (which is a patterned portion of the metallic barrier liner layer 442L) and a metallic material layer 444 (which is patterned portion of the continuous metallic material layer 444L). The metallic material layer 444 comprises at least one metallic material portion such as a copper, aluminum or alloy thereof portion. The stack of the doped semiconductor material layer 218 and the metallic source layer 440 constitutes a source layer (218, 440).

Each patterned portion of the continuous doped semiconductor material layer 218L that contacts a respective set of at least one pad-connection pass-through via structure 8P1 comprises a semiconductor connection pad 238. Each contiguous set of remaining material portions from the continuous metallic material layer 444L and the metallic barrier liner layer 442L that overlie, and are electrically connected to a respective set of at least one pad-connection pass-through via structure 8P1 through a respective semiconductor connection pad 238 after the etch process comprises a metallic connection pad 640. Each metallic connection pad 640 can include a pad barrier liner 642 (which is a patterned portion of the metallic barrier liner layer 442L) and a pad metal portion 644 (which is patterned portion of the continuous metallic material layer 444L). The pad metal portion 644 comprises at least one metallic material portion such as a copper, aluminum or alloy thereof portion. Each vertical stack of a semiconductor connection pad 238 and a metallic connection pad 640 constitutes a composite connection pad (238, 640). In one embodiment, sidewalls of each semiconductor connection pad 238 can be vertically coincident with sidewalls of an overlying metallic connection pad 640.

Each composite connection pad (238, 640) is a connection pad that is formed on the distal end of a respective pass-through via structure 8P such as a respective pad-connection pass-through via structure 8P1. A distal portion of each pad-connection pass-through via structure 8P1 protrudes from a horizontal plane including a horizontal interface between a connection pad 640 and the dielectric material portion 65 along a vertical direction that points away from the interface between the logic die 700 and the memory die 1000, and contacts recessed surfaces of the composite connection pad (238, 640). Each pad-connection pass-through via structure 8P1 comprises a metallic barrier layer 82 comprising a metallic nitride material and a metallic fill material portion 84 embedded in the metallic barrier layer 82, not contacting the composite connection pad (238, 640), and spaced from the composite connection pad (238, 640) by a cap portion of the metallic barrier layer 82 that is contained within the distal portion of the pad-connection pass-through via structure 8P1.

Figure 26D:
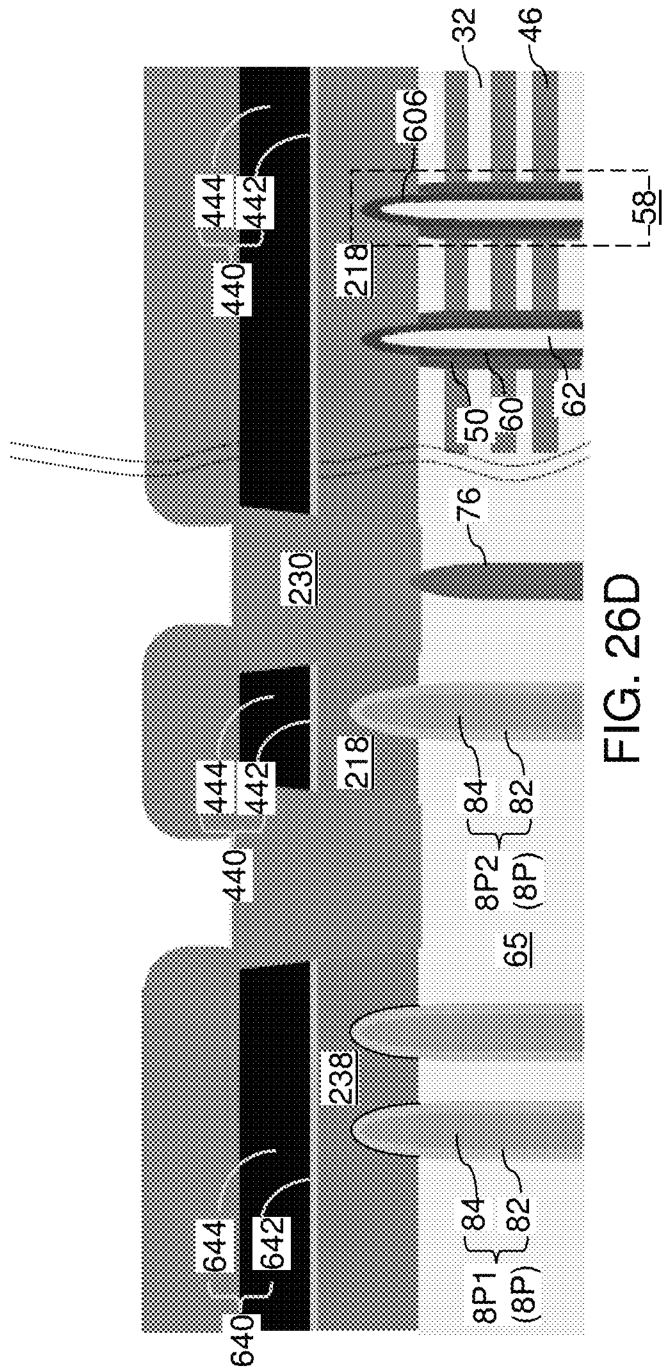

Referring to FIG. 26D, a backside isolation dielectric layer 230 can be formed on the distal surface of the metallic source layer, on the distal surfaces of the composite connection pads (238, 640), and on physically exposed distal surface of the dielectric material portion 65. In one embodiment, the backside isolation dielectric layer 230 can include a dielectric material such as undoped silicate glass or a doped silicate glass, and can have a thickness in a range from 100 nm to 2,000 nm, such as from 200 nm to 1,000 nm, although lesser and greater thicknesses can also be employed.

Figure 26E:
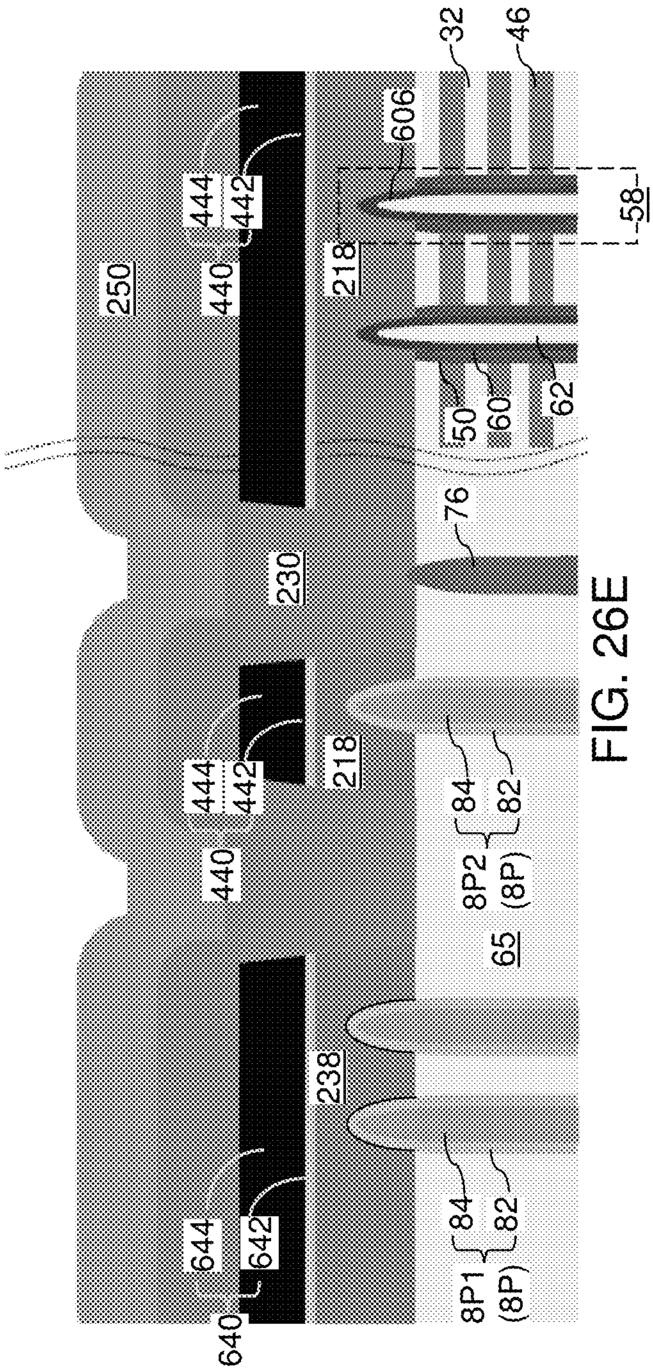

Referring to FIG. 26E, a backside passivation dielectric layer 250 can be formed over the backside isolation dielectric layer 230. The backside passivation dielectric layer 250 includes a dielectric material that can passivate the backside of the memory die 1000, i.e., a dielectric material that can function as a diffusion blocking layer that blocks diffusion of moisture and impurities. In one embodiment, the backside passivation dielectric layer 250 can include silicon nitride that is deposited by plasma-enhanced chemical vapor deposition (PECVD) or a silicon oxide/silicon nitride bilayer. The thickness of the backside passivation dielectric layer 250 can be in a range from 100 nm to 1,000 nm, although lesser and greater thicknesses can also be employed.

Figure 26F:
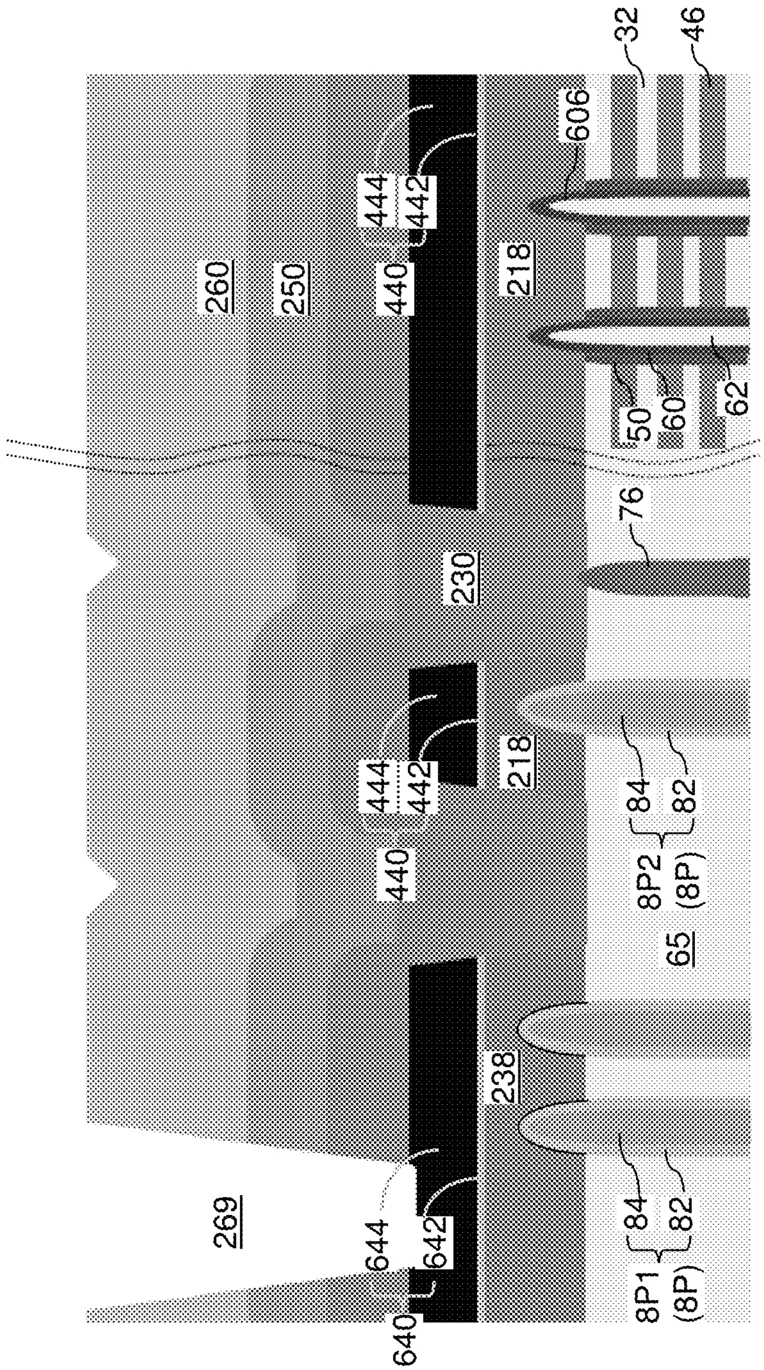

Referring to FIG. 26F, a backside polymer dielectric layer 260 can be formed over the backside passivation dielectric layer 250. Generally, the backside polymer dielectric layer 260 can be a dielectric polymer layer. For example, the backside polymer dielectric layer 260 can be formed by spin-coating and curing photosensitive polyimide. The photosensitive polyimide can be lithographically exposed and developed to form openings over the areas of the connection pads 640. An anisotropic etch process that employs the backside polymer dielectric layer 260 as an etch mask can be performed to etch through unmasked portions of the backside passivation dielectric layer 250 and the backside isolation dielectric layer 230. The connection pads 640 may be employed as etch stop structures. Terminal via (TV) cavities 269 can be formed through the backside polymer dielectric layer 260, the backside passivation dielectric layer 250, and the backside isolation dielectric layer 230. Additional terminal via cavities (not shown) may be formed to physically expose a source layer (such as the metallic source layer 440).

Figure 26G:
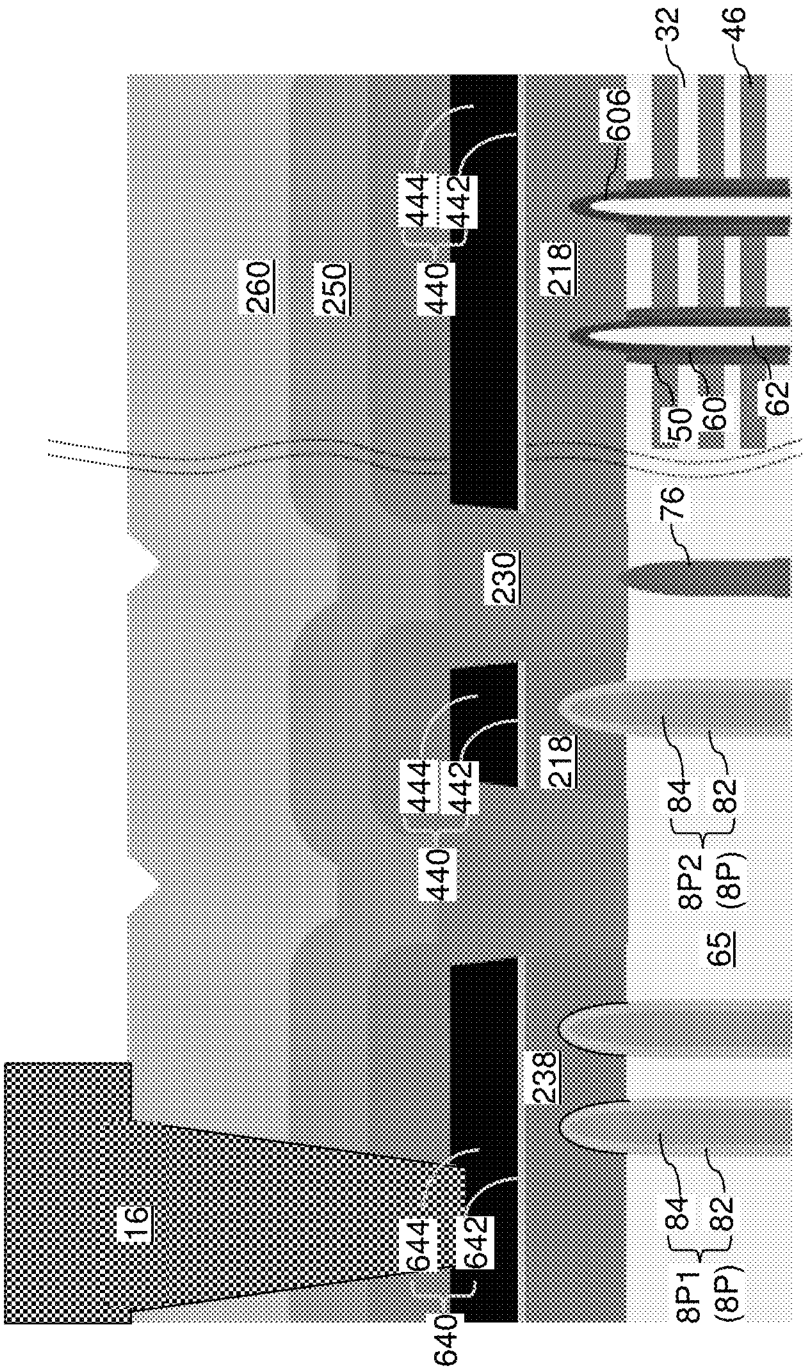

Referring to FIG. 26G, a metallic liner material such as TiN, TaN, and/or WN can be deposited in the terminal via cavities 269, and at least one bonding pad material can be subsequently deposited. The at least one bonding pad material may include, for example, a pad metal such as copper, aluminum or alloy thereof, and an under bump metallurgy (UBM) material stack for facilitating subsequent attachment of a solder material thereupon. For example, the at least one bonding pad material may include a vertical stack of a copper portion and an under bump metallurgy (UBM) stack portion, or a vertical stack of an aluminum portion and a UBM stack portion. An exemplary UBM stack portion can include, from bottom to top, a Ti/Cu, layer, a Ni layer, and a Cu layer.

The at least one bonding pad material and the metallic liner material can be subsequently patterned, for example, by applying and patterning a photoresist layer thereabove, and by transferring the pattern in the photoresist layer through the at least one bonding pad material and the metallic liner material. Various bonding pads 16 can be formed directly on a respective one of the connection pads 640. Additional bonding pads, such as at least one source bonding pad 14 illustrated in FIG. 21, may be formed directly on the distal surface of a source layer (such as the doped semiconductor material layer 218). Bonding wires 15 can be bonded to a respective one of the bonding pads (14, 16) as illustrated in FIG. 21. A backside bonding wire 715 can be bonded to each backside bonding pad 716. Alternatively, the bonding pad 16 may be omitted, and the bonding wire 15 is deposited into the TV cavity 269 to directly physically contact the connection pad 340, similar to the configuration shown in FIG. 23Q.

Generally, at least one backside dielectric layer (230, 250, 260) can be formed over the source layer (such as the doped semiconductor material layer 218 and the metallic source layer 640). Each backside bonding pad 16 can be formed over a distal surface of the at least one backside dielectric layer (230, 250, 260). Each backside bonding pad 16 can comprise a via portion that extends through the at least one backside dielectric layer (230, 250, 260). The at least one backside dielectric layer (230, 250, 260) can include a backside polymer dielectric layer 260 that contacts the metallic material portion of a composite connection pad (238, 640), and extends over the source layer (such as the doped semiconductor material layer 218 and the metallic source layer 640). In one embodiment, the at least one backside dielectric layer (230, 250, 260) can comprise a stack of a silicon oxide layer (such as the backside isolation dielectric layer 230), a silicon nitride layer (such as the backside passivation dielectric layer 250), and a dielectric polymer layer (such as the backside polymer dielectric layer 260). At least a subset of the backside bonding pads 16 can be formed through the at least one backside dielectric layer (230, 250, 260) on a distal surface of a respective composite connection pad (238, 640).

At least one backside bonding pad 16 can be electrically connected to a pass-through via structure 8P, and can be electrically isolated from the source layer (such as the doped semiconductor material layer 218 and the metallic source layer 640). The at least one backside bonding pad 16 can be formed over the dielectric material portion 65, and can have an areal overlap with the dielectric material portion 65 in a plan view. Each composite connection pad (238, 640) can contact a distal surface of a respective pass-through via structure 8P (such as a respective pad-connection pass-through via structure 8P1), and can contact a proximal surface of a respective backside bonding pad 16.

In one embodiment, the source layer (218, 440) comprising a first portion of a conductive material (such as the doped semiconductor material layer 218) that is electrically connected to end portions of the vertical semiconductor channels 60 that are distal from an interface between the logic die 700 and the memory die 1000. A pass-through via structure (such as a pad-connection pass-through via structure 8P1) can have a vertical extent that is greater than a vertical thickness of the alternating stack (32, 46), and can vertically extend through the dielectric material portion 65. A connection pad (238, 640) can comprise a second portion of the conductive material (comprising the semiconductor connection pad 238), can contact a distal surface of the pass-through via structure (such as the pad-connection pass-through via structure 8P1), and can be electrically isolated from the source layer (218, 440).

In one embodiment, the source layer (218, 440) contacts a distal horizontal surface of the alternating stack (32, 46), and the connection pad (238, 640) contacts a distal horizontal surface of the dielectric material portion 65.

In one embodiment, the conductive material comprises a doped semiconductor material. In one embodiment, the vertical semiconductor channels 60 have a doping of a first conductivity type, and the conductive material comprises a doped semiconductor material having a doping of a second conductivity type that is an opposite of the first conductivity type. In one embodiment, the first portion of the conductive material (comprising the doped semiconductor material layer 218) contacts a distal horizontal surface of the alternating stack (32, 46), and the second portion of the conductive material (comprising the semiconductor connection pad 238) contacts a distal horizontal surface of the dielectric material portion 65.

In one embodiment, the source layer (218, 440) can comprise a layer stack of a source barrier liner 442 contacting a distal surface of the first portion of the conductive material (comprising the doped semiconductor material layer 218) and a metallic material layer 444 comprising the first portion of the metallic material and overlying the source barrier liner 442. The connection pad (238, 640) comprises a layer stack of a pad barrier liner 642 contacting a distal surface of second portion of the conductive material (comprising the semiconductor connection pad 238) and a pad metal portion 644 comprising the second portion of the metallic material. In one embodiment, the source barrier liner 442 and the pad barrier liner 642 have a same material composition and a same thickness.

In one embodiment, the pass-through via structure (such as the pad-connection pass-through via structure 8P1) comprises a metallic barrier layer 82 in contact with the second portion of the conductive material and a sidewall of the dielectric material portion 65, and a metallic fill material portion 84 that is spaced from the connection pad (238, 640) and from the dielectric material portion 65 by the metallic barrier layer 82.

Figure 26H:
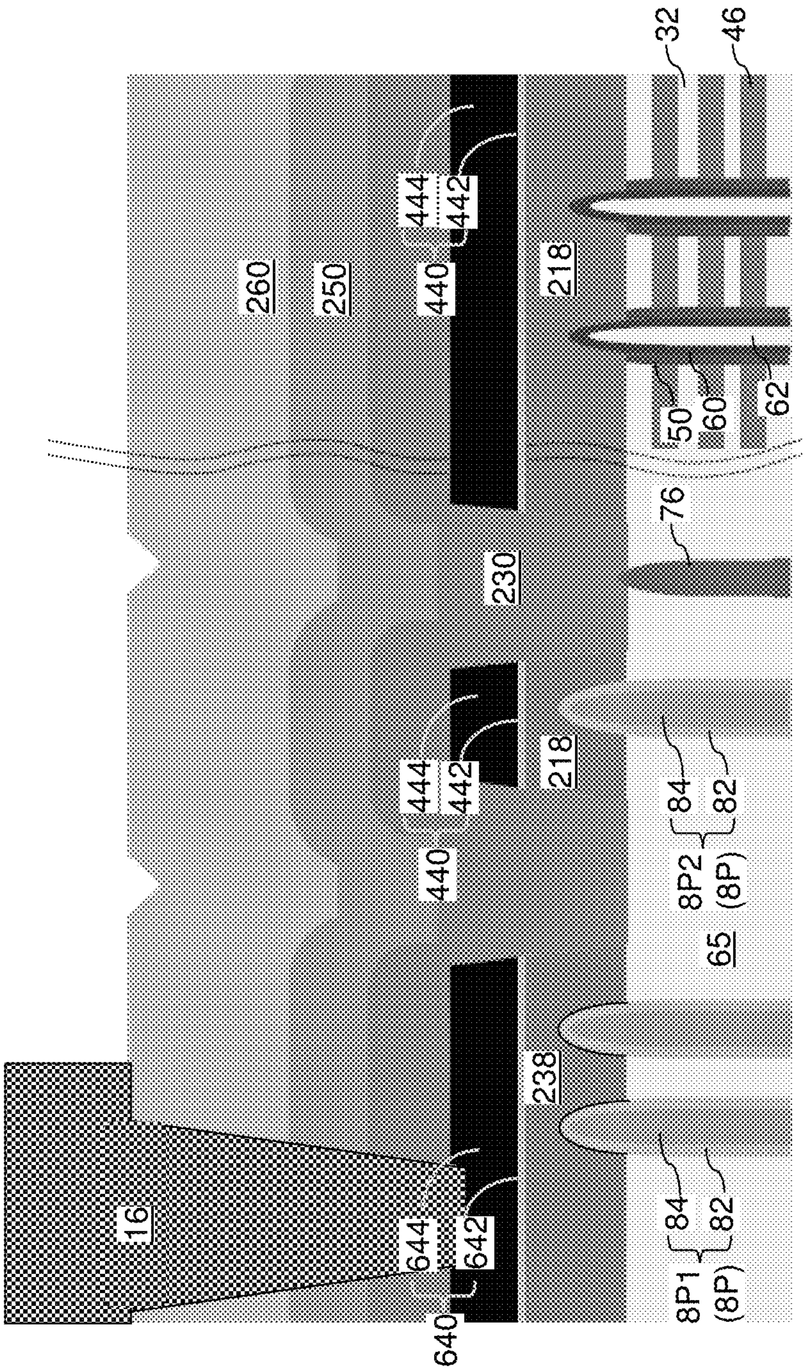
FIG. 26H illustrates another embodiment of the fourth alternative configuration of the bonded assembly of FIG. 26G.

Referring to FIG. 26H, another embodiment of the third alternative configuration of the bonded assembly is illustrated, which can be derived from the bonded assembly of FIG. 26G by omitting the ion implantation process that forms the source cap regions 606. In this case, the doped semiconductor material layer 218 directly contacts end portions of the vertical semiconductor channels 60. The doped semiconductor material layer 218 comprises a portion of a source layer that functions as a common source for all vertical NAND strings including the vertical semiconductor channels 60.

The various embodiments of the present disclosure can be employed to provide a bonded assembly of a memory die 1000 and a logic die 700 including backside bonding pads 16 and a source layer {218, 240, (218, 440)} that laterally connects distal end portions of vertical semiconductor channels 60 of memory stack structures 55 and source-connection pass-through via structures 8P2. Pad connection pass-through via structures 8P1 provide vertical electrical connection through the memory level of the memory die 1000 to the backside bonding pads 16.

The various embodiments of the present disclosure may provide any one or more of the following advantages. The contact resistance may be reduced between the semiconductor channel 60 and the source line by increasing the semiconductor channel surface area above the dielectric material portion 65. Dopant profile of in the end of the semiconductor channel is controllable by ion implantation shown in FIG. 23D. Plane separation may be accomplished by silicon oxide deposition while forming the source region. The memory cells may be erased either GIDL or well erase method, which increases erasing flexibility. The pad area aspect ratio may be improved to improve step coverage at pad area. Finally, the step height of the polyimide layer 260 may be reduced which leads to reduced polyimide thickness.

Figure 27A:
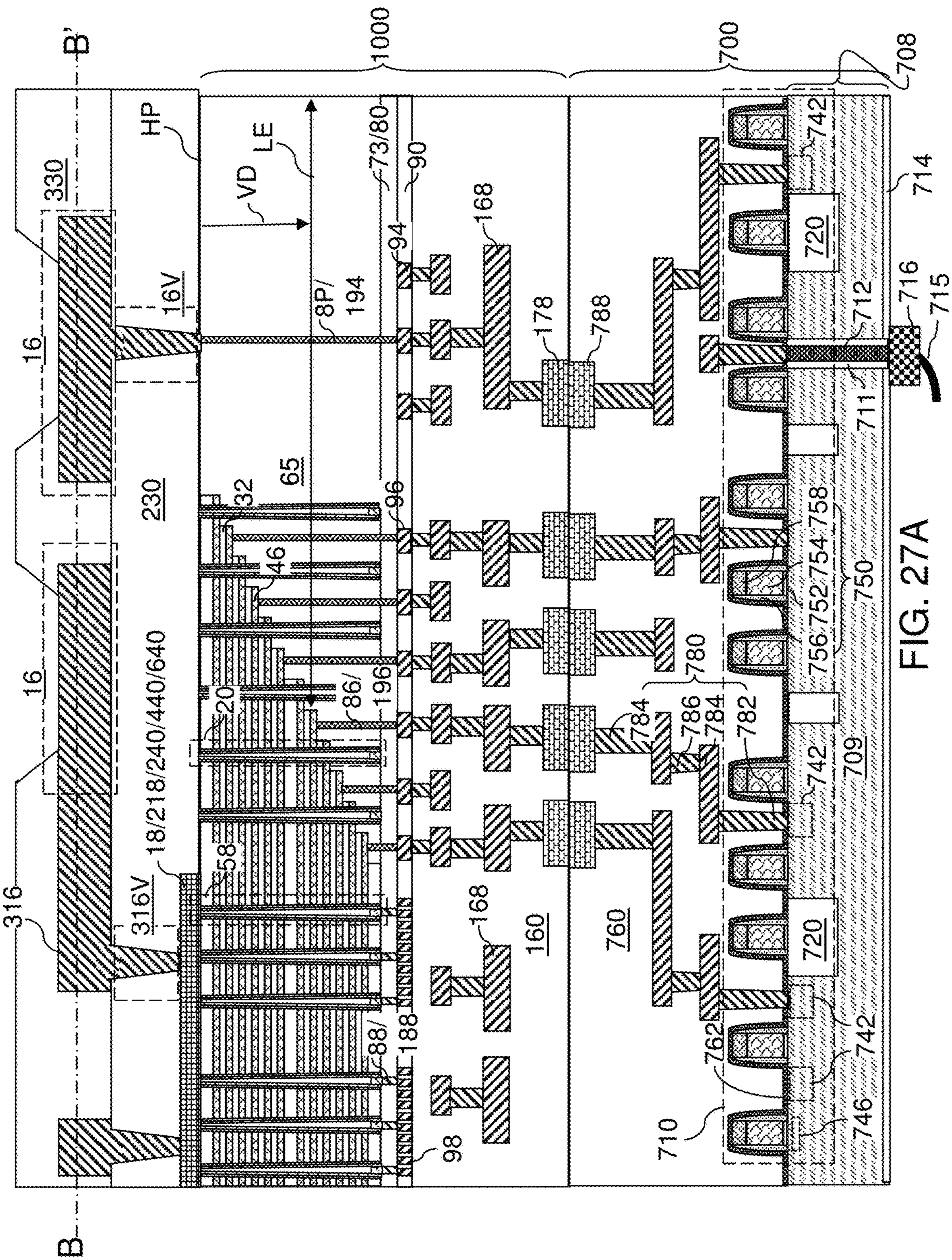
FIG. 27A is a vertical cross-sectional view of a fifth alternative configuration of an exemplary structure according to an embodiment of the present disclosure.
Figure 27B:
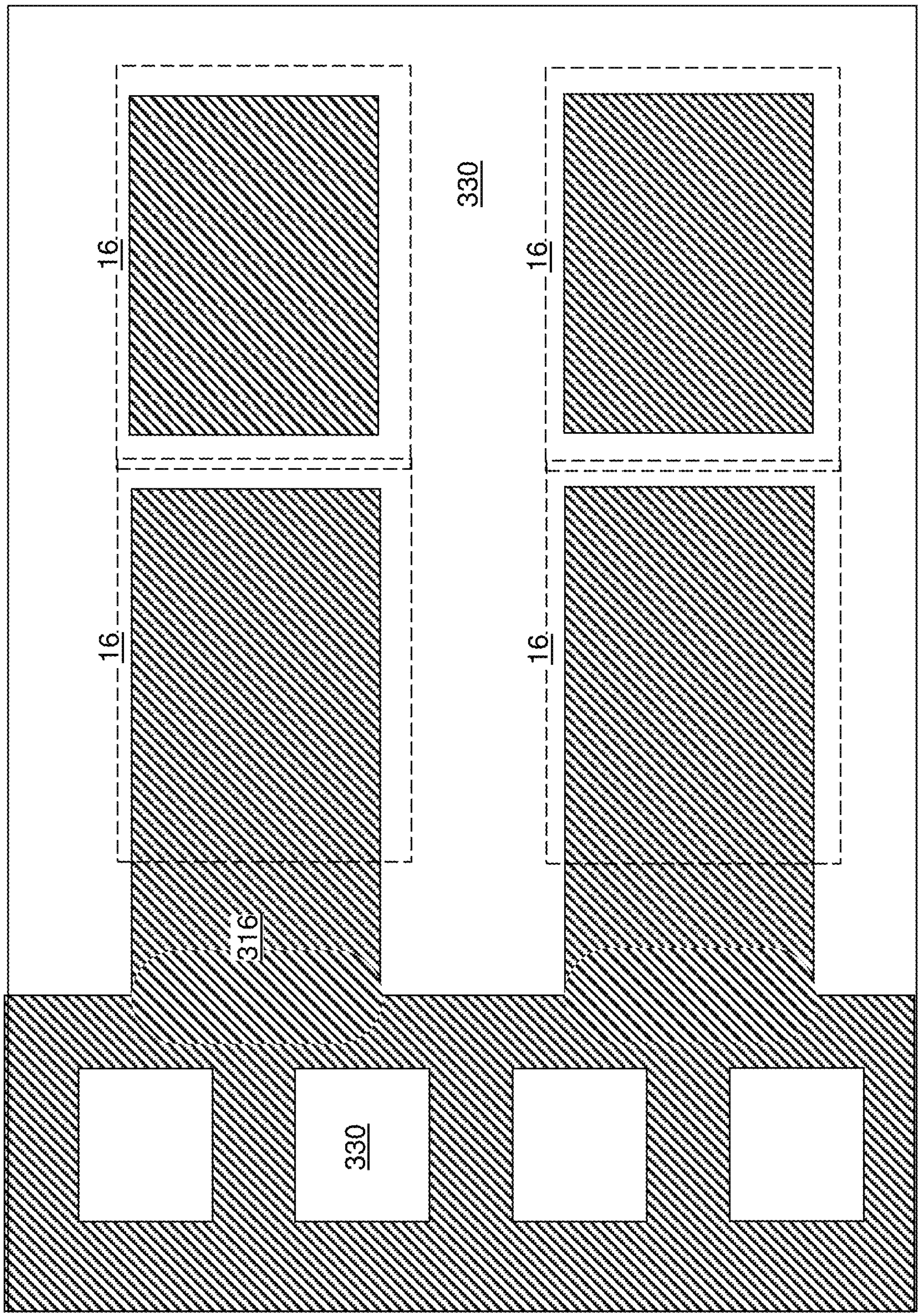
FIG. 27B is a horizontal cross-sectional view of the fifth alternative configuration of the exemplary structure along the horizontal plane B-B' of FIG. 27A.
Figure 27C:
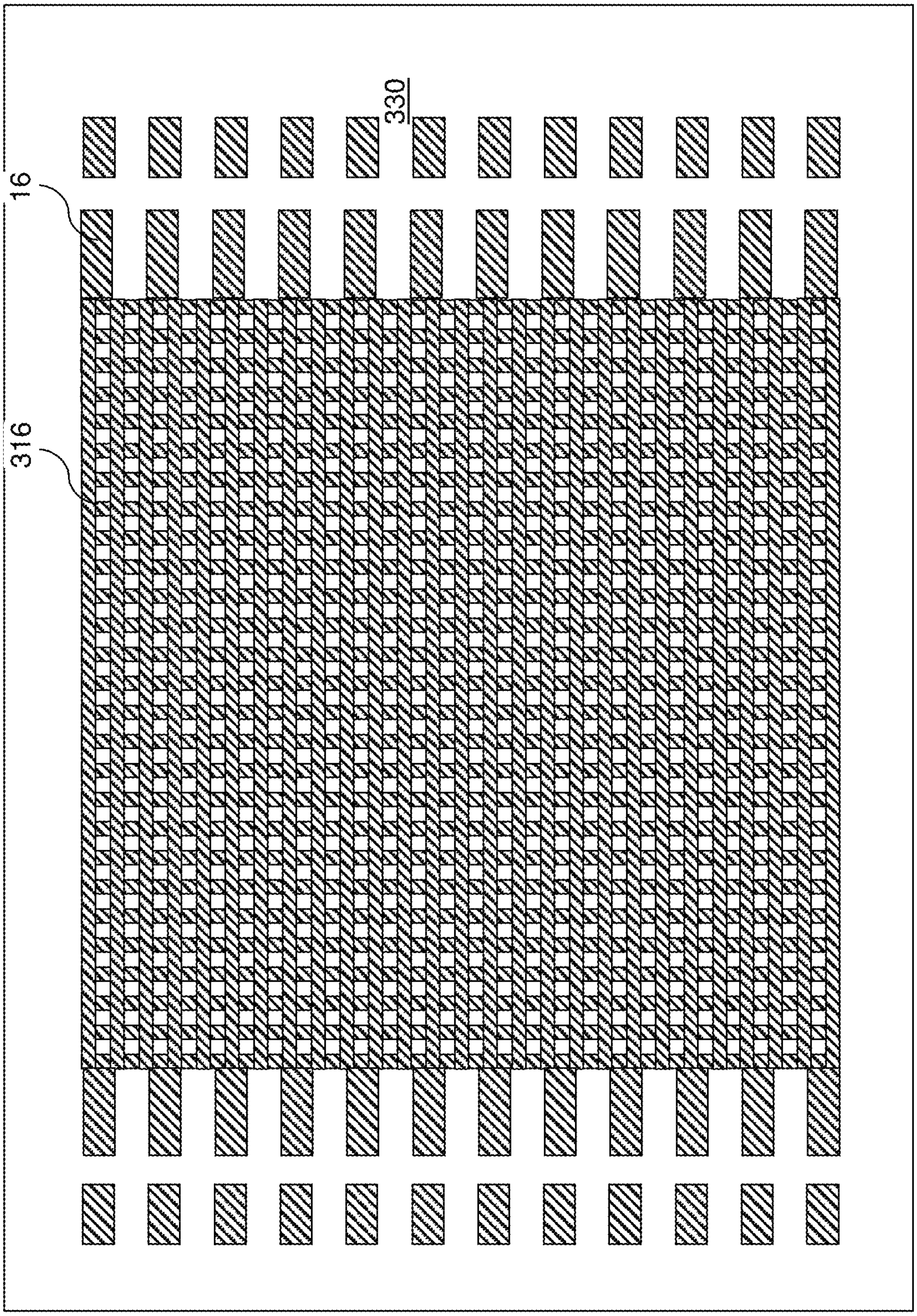
FIG. 27C is a horizontal cross-sectional view of a semiconductor die including the fifth alternative configuration of the exemplary structure of FIGS. 27A and 27B.

Referring to FIGS. 27A-27C, a semiconductor die including a fifth configuration of the exemplary structure may be derived from any of the configurations of the exemplary structure described above by forming a source power supply network (e.g., mesh) over the backside of a source layer. The source layer in the fifth configuration of the exemplary structure may comprise any one of, or any combination of, a source layer 18, a doped semiconductor material layer 218, a source layer 240, a source layer 440, and/or a source layer 640 in embodiments described above.

Generally, a memory die 1000 can be formed over a carrier substrate. The memory die comprises an alternating stack of insulating layers 32 and electrically conductive layers 46, and memory opening fill structures 58 located in the memory openings 49 extending through the alternating stack (32, 46) and comprising a respective vertical semiconductor channel 60 and a respective memory film 50. In one embodiment, the memory die 1000 comprises first bonding structures 178 electrically connected to the vertical semiconductor channels 60 or the electrically conductive layers 46 and embedded in memory-side dielectric material layers 160. A logic die 700 can be provided, which comprises semiconductor devices 710 and second bonding structures 788 that are electrically connected to the semiconductor devices 710 and embedded in logic-side dielectric material layers 760. The logic die 700 can be attached to the memory die 1000 by bonding the second bonding structures 788 to the first bonding structures 178 while the carrier substrate is attached to the memory die 1000. Subsequently, the carrier substrate can be detached from the memory die 1000, i.e., after the logic die 700 is attached to the memory die 1000. In one embodiment, the memory die 1000 comprises a stepped dielectric material portion 65 contacting stepped surfaces of the alternating stack (32, 46) and at least one connection via structure (8P, 194) vertically extending through the stepped dielectric material portion 65.

In some embodiments, the alternating stack of the insulating layers 32 and the electrically conductive layers 46 and the memory opening fill structures 58 may be formed over a semiconductor material layer, and the semiconductor material layer may be removed selective to the alternating stack (32, 46) and the memory opening fill structures 58. Physically exposed portions of the memory films 50 may be subsequently removed, and the source layer (18, 218, 240 440, and/or 640) can be formed on physically exposed end portions of the vertical semiconductor channels 60. Generally, the source layer (18, 218, 240 440, and/or 640) can be formed on the backside surface of the alternating stack (32, 46) in any manner described above.

A backside isolation dielectric layer 230 can be formed on the backside surface of the source layer (18, 218, 240 440, and/or 640). The backside isolation dielectric layer 230 includes a dielectric material such as undoped silicate glass (e.g., silicon oxide) or a doped silicate glass, and can have a thickness in a range from 100 nm to 2,000 nm, such as from 200 nm to 1,000 nm, although lesser and greater thicknesses can also be employed. The backside isolation dielectric layer 230 may be formed by chemical vapor deposition.

Via cavities can be formed through the backside isolation dielectric layer 230. The via cavities vertically extend through the backside isolation dielectric layer 230 to the backside surface of the source layer (18, 218, 240 440, and/or 640). In one embodiment, the via cavities may comprise a two-dimensional periodic array of via cavities underneath which portions of the backside surface of the source layer (18, 218, 240 440, and/or 640) are physically exposed. Additional via cavities can be formed over the at least one connection via structure (8P, 194) vertically extending through the stepped dielectric material portion 65 such that source-side end surfaces of the at least one connection via structure (8P, 194) are physically exposed.

At least one metallic material can be deposited in the via cavities and over a backside surface of the backside isolation dielectric layer 230. The at least one metallic material may include a metallic nitride liner material (such as TiN, TaN, and/or WN) and a metallic fill material (such as copper or tungsten). The at least one metallic material can be patterned, for example, by applying and patterning a photoresist layer over the at least one metallic material, and transferring the pattern in the photoresist layer through the at least one metallic material employing an etch process, which may employ an anisotropic etch process or an isotropic etch process. The photoresist layer can be subsequently removed, for example, by ashing.

Patterned portions of the at least one metallic material comprise a source power supply network 316 and the backside bonding pads 16. The source power supply network 316 includes backside metal interconnect structures located on the backside isolation dielectric layer 230. In one embodiment, the source power supply network 316 comprises a network of metal lines, and metal via structures 316V vertically extending between the network of metal lines and the backside surface of the source layer (18, 218, 240 440, and/or 640). The metal via structures 316V extend through the backside isolation dielectric layer 230 and contact the source layer (18, 218, 240 440, and/or 640) at multiple locations. In one embodiment, the network of metal lines comprises may comprise a rectangular mesh structure. In this case, the network of metal lines may comprise first metal lines laterally extending along a first horizontal direction, and second metal lines laterally extending along a second horizontal direction and adjoined to a respective subset of the first metal lines. The second horizontal direction may be perpendicular to the first horizontal direction.

In one embodiment, additional patterned portions of the at least one metallic material comprise backside bonding pads 16. A first subset of the backside bonding pads 16 can be electrically connected to the source power supply network 316. In one embodiment, the first subset of the backside bonding pads 16 can be located at, and can be attached to, a periphery of the source power supply network 316. A second subset of the backside bonding pads 16 may be formed at a same level as the first subset of the backside bonding pads 16, and may be electrically isolated from the source layer (18, 218, 240 440, and/or 640) and may be electrically connected to a respective one of the at least one connection via structure (8P, 194). Patterned portions of the at least one metallic material may include contact via structures 16V extending through the backside isolation dielectric layer 230 and connected to the second subset of the backside bonding pads 16. In one embodiment, the backside surface of the backside isolation dielectric layer 230 may be planarized, for example, by chemical mechanical planarization, or may be formed as a planar surface by a self-planarizing deposition process such as spin coating. In one embodiment, the backside bonding pads 16 may be vertically spaced from the interface between the memory die 1000 and the logic die 700 by a same distance as the source power supply network 316 is from the interface between the memory die 1000 and the logic die 700.

Alternatively, additional backside isolation dielectric layer(s) (not shown) may be optionally formed over the backside isolation dielectric layer 230, and the backside bonding pads 16 may be formed on, within, and/or above the additional backside isolation dielectric layer(s). In this case, the backside bonding pads may be more proximal from the interface between the memory die 1000 and the logic die 700 than the source power supply network 316 is from the interface between the memory die 1000 and the logic die 700.

In one embodiment, a passivation dielectric layer 330 can be formed over the network of metal lines 316, the backside bonding pads 16, and the backside isolation dielectric layer 230. The passivation dielectric layer 330 includes a passivation dielectric material, i.e., a dielectric material that blocks diffusion of impurities, water vapor, and/or hydrogen atoms. In one embodiment, the passivation dielectric layer 330 may include silicon nitride and/or polyimide, and may have a thickness in a range from 200 nm to 4 microns, although lesser and greater thicknesses may also be employed. Openings can be formed through the passivation dielectric layer 330 within areas of the backside bonding pads 16 to physically expose surfaces of the bonding pads 16. Wire bonding or C4 bonding can be employed to provide external electrical connection to the bonding pads 16.

The source power supply network can provide a source bias voltage across the entirety of the source layer (18, 218, 240 440, and/or 640) with minimal voltage drop and without employing metal interconnect structures embedded in the memory-side dielectric material layers 160. Electrical wiring within the memory-side dielectric material layers 160 can be significantly reduced, and electrical connection between the memory die 1000 and the logic die 700 can be significantly simplified.

Figure 28:
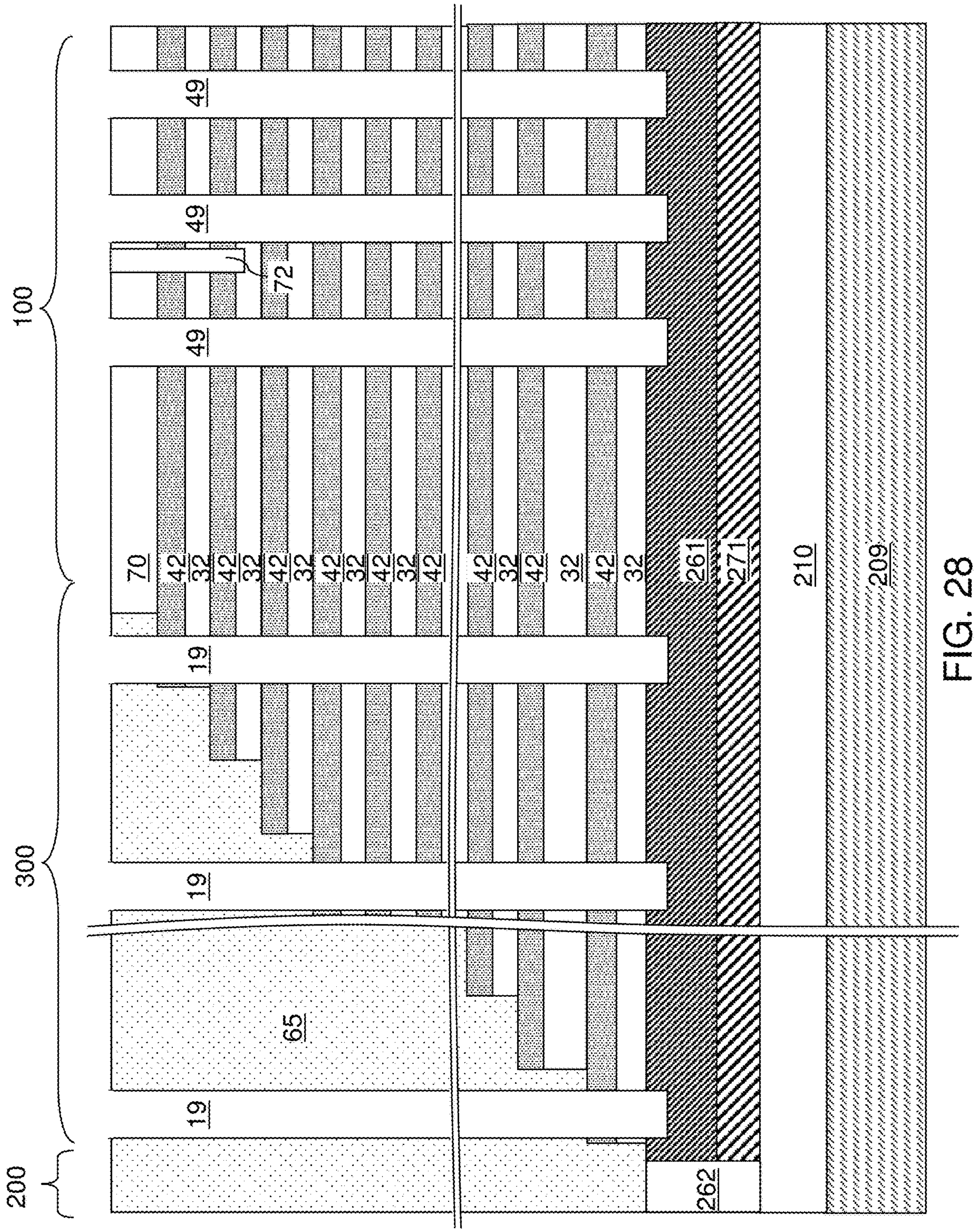
FIG. 28 is a sixth alternative configuration of an exemplary structure after formation of memory openings and support openings according to an embodiment of the present disclosure.

In a sixth embodiment, the source layer is formed prior to removing the carrier substrate of the memory die. The source power supply network (e.g., mesh) is then separately formed on a backside of the source layer after removing the carrier substrate. Referring to FIG. 28, a sixth alternative configuration of an exemplary structure is illustrated after formation of memory openings 49 and support openings 19 according to the sixth embodiment of the present disclosure. The sixth alternative configuration of the exemplary structure illustrated in FIG. 28 can be derived from the exemplary structure illustrated in FIGS. 4A and 4B by employing a substrate including a combination of a carrier substrate 209, a backside isolation dielectric layer 210, an optional metallic source layer 271, and a semiconductor source layer 261 in lieu of a substrate including a substrate semiconductor layer 9 and the semiconductor material layer 10 employed within the exemplary structure of FIGS. 4A and 4B. Specifically, the combination of the carrier substrate 209, a backside isolation dielectric layer 210, an optional metallic source layer 271, and a semiconductor source layer 261 is provided in FIG. 28.

The carrier substrate 209 may be a sacrificial substrate that may be subsequently removed, for example, by grinding, polishing, an anisotropic etch process, an isotropic etch process, a cleaving process, or any other suitable removal method. For example, the carrier substrate 209 may include a commercially available semiconductor wafer. The backside isolation dielectric layer 210 can be formed by deposition of a dielectric material layer (such as a silicon oxide layer), or can be formed by conversion of a surface portion of the carrier substrate 209 (such as oxidation of the top surface portion of the carrier substrate 209). The thickness of the backside isolation dielectric layer 210 may be in a range from 100 nm to 2,000 nm, although lesser and greater thicknesses may also be employed. The metallic source layer 271 can be formed by deposition of at least one metallic material such as W, Mo, Ru, Co, silicides thereof, TiN, TaN, and/or WN. In one embodiment, the top surface of the metallic source layer 271 may include a conductive metallic nitride material such as TiN, TaN, or WN or a metal silicide, such as titanium, tantalum or tungsten silicide.

The semiconductor source layer 261 includes a n-type or p-type doped semiconductor material. In one embodiment, semiconductor source layer 261 can be doped n-type, regardless the type of the doping of the channel to be subsequently formed. In one embodiment, the semiconductor source layer 261 can be a heavily n-type doped (e.g., having n+ doping) polysilicon or amorphous silicon layer. The atomic concentration of the dopants in the semiconductor source layer 261 can be in a range from $5.0\times10^{19}/cm^3$ to $2.0\times10^{21}/cm^3$, although lesser and greater dopant concentrations can also be used. The set of the optional metallic source layer 271 and the semiconductor source layer 261 constitutes a source layer (261, 271). Thus, the source layer (261, 271) includes the semiconductor source layer 261 and optionally includes the metallic source layer 271. Generally, the backside isolation dielectric layer 210 is formed on the carrier substrate 209, and the source layer (261, 271) is formed on the backside isolation dielectric layer 210. The source layer (261, 271) can be patterned, and regions from which the source layer (261, 271) is removed can be filled with a dielectric material to form a source-level insulating layer 262.

Subsequently, the processing steps of FIGS. 2, 3, and 4A and 4B can be performed to provide the sixth configuration of the exemplary structure illustrated in FIG. 28. Each memory opening 49 and each support opening 19 can vertically extend into an upper region of the semiconductor source layer 261.

FIGS. 29A-29H are sequential schematic vertical cross-sectional views of a memory opening within the sixth alternative configuration of the exemplary structure during formation of a memory stack structure, an optional dielectric core, and a drain region therein according to an embodiment of the present disclosure.

Figure 29B:
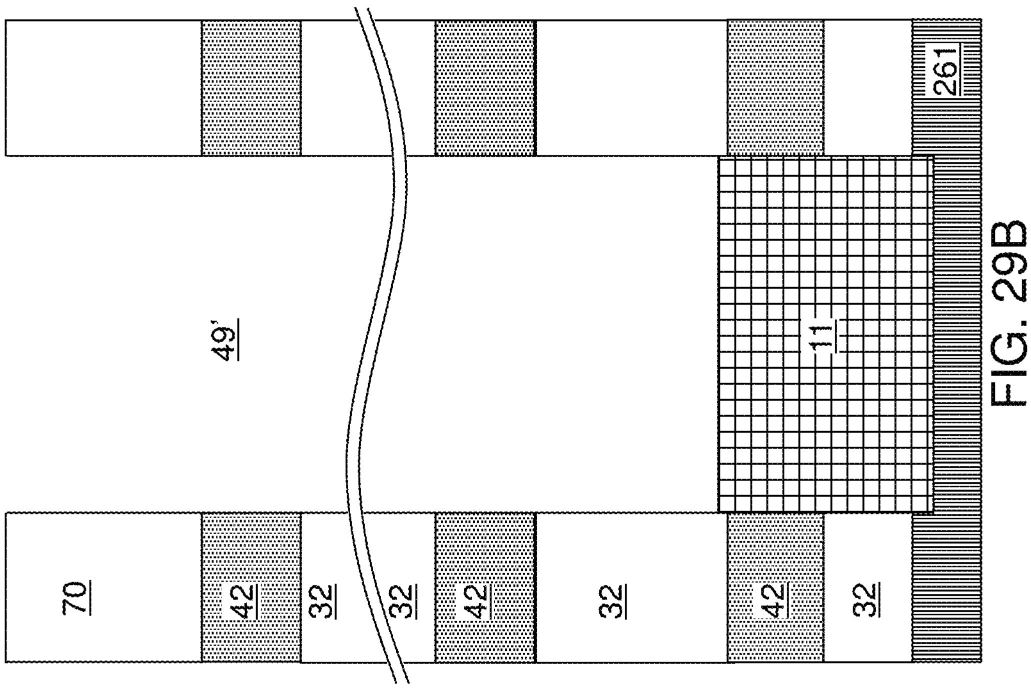
FIGS. 29A-29H are sequential schematic vertical cross-sectional views of a memory opening within the sixth alternative configuration of the exemplary structure during formation of a memory stack structure, an optional dielectric core, and a drain region therein according to an embodiment of the present disclosure.
Figure 29A:
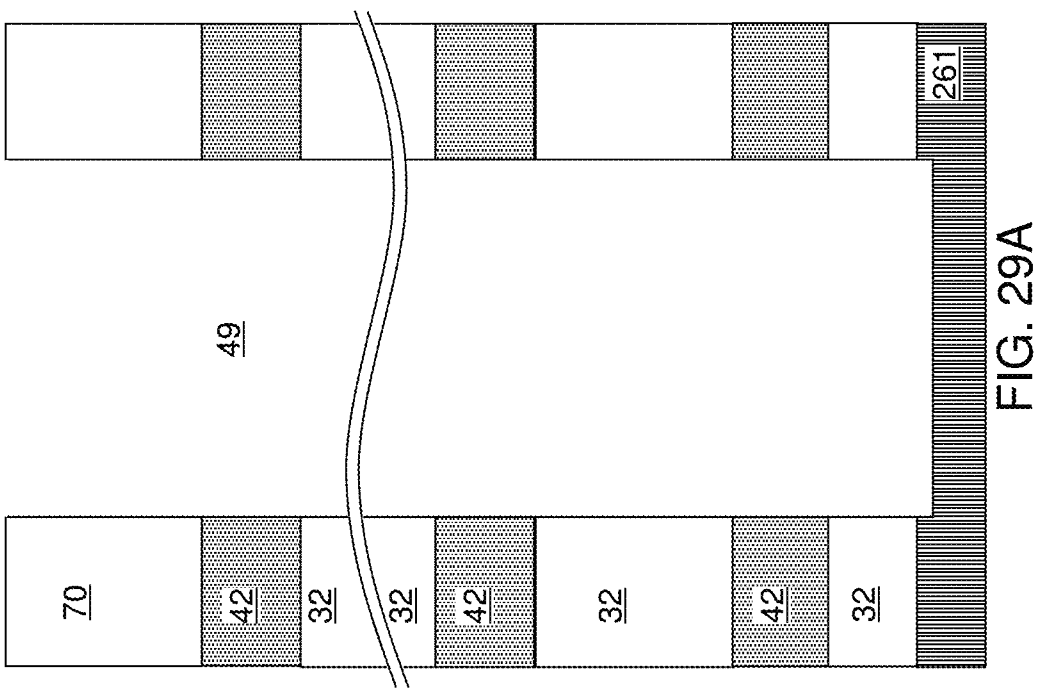

Referring to FIG. 29A, a memory opening within the exemplary structure of FIG. 28 is illustrated.

Referring to FIG. 29B, a pedestal channel portion 11 can be formed at the bottom portion of each memory opening 49 and each support openings 19, for example, by selective epitaxy. In one embodiment, each pedestal channel portion 11 comprises a semiconductor material having a doping of the same or opposite conductivity type (e.g., n-type or p-type doping) from the doping of the semiconductor source layer 261. The pedestal channel portion 11 can be a portion of a transistor channel that extends between the source layer (261, 271) and a drain region to be subsequently formed in an upper portion of the memory opening 49. A memory cavity 49' is present in the unfilled portion of the memory opening 49 above the pedestal channel portion 11.

Figure 29D:
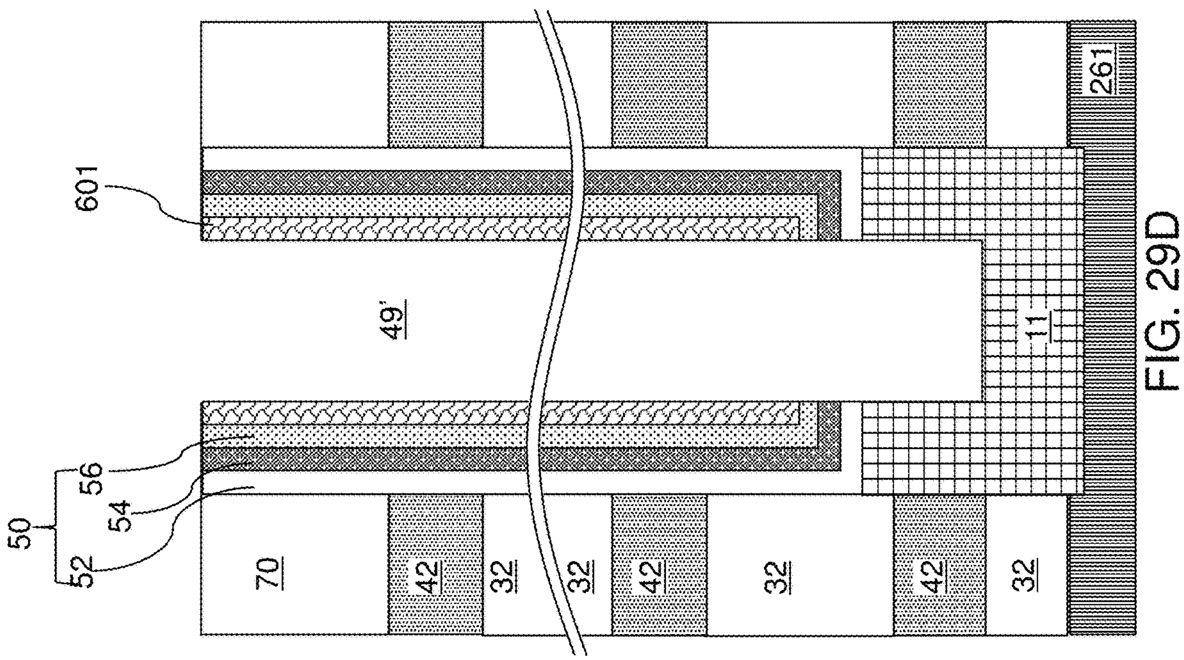
Figure 29C:
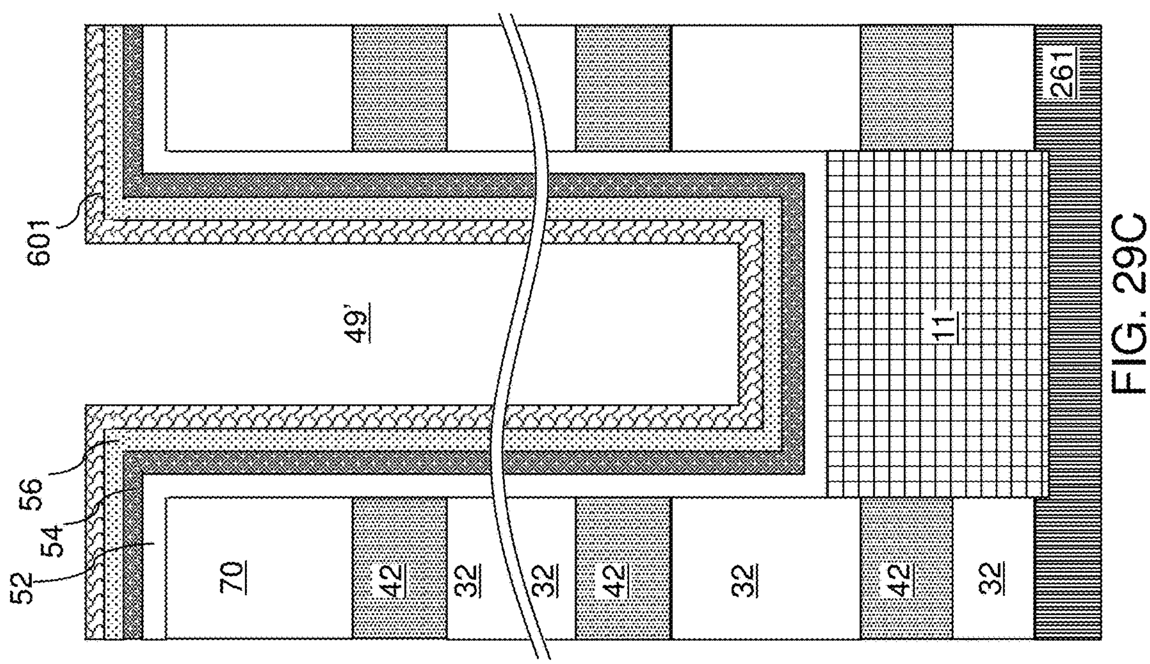

Referring to FIG. 29C, the processing steps of FIG. 5 can be performed to sequentially deposit a blocking dielectric layer 52, a charge storage layer 54, and a tunneling dielectric layer 56.

An optional sacrificial cover material layer 601 can be deposited over the tunneling dielectric layer. The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 29D, the optional sacrificial cover material layer 601, the tunneling dielectric layer 56, the charge storage layer 54, the blocking dielectric layer 52 are sequentially anisotropically etched employing at least one anisotropic etch process. The portions of the sacrificial cover material layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the charge storage layer 54, and the blocking dielectric layer 52 at a bottom of each memory cavity 49' can be removed to form openings in remaining portions thereof. Each of the sacrificial cover material layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 can be physically exposed underneath the opening through the sacrificial cover material layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising portions of the charge storage layer 54) that are insulated from surrounding materials by the blocking dielectric layer 52 and the tunneling dielectric layer 56. In one embodiment, the sacrificial cover material layer 601, the tunneling dielectric layer 56, the charge storage layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601.

Figure 29F:
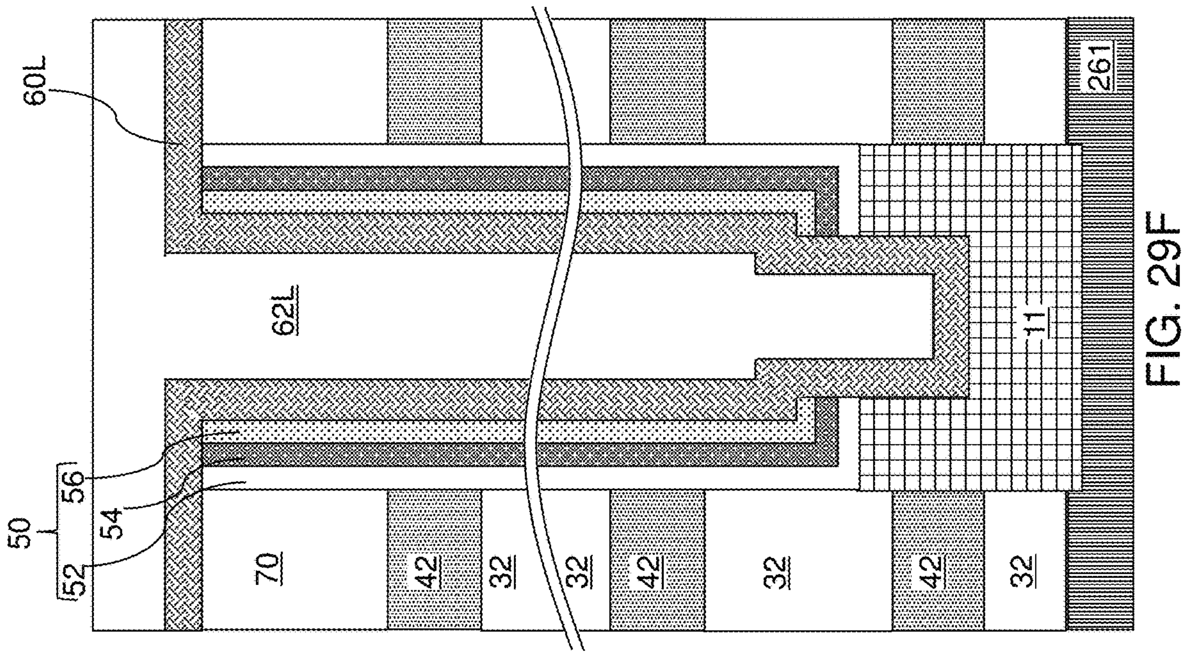
Figure 29E:
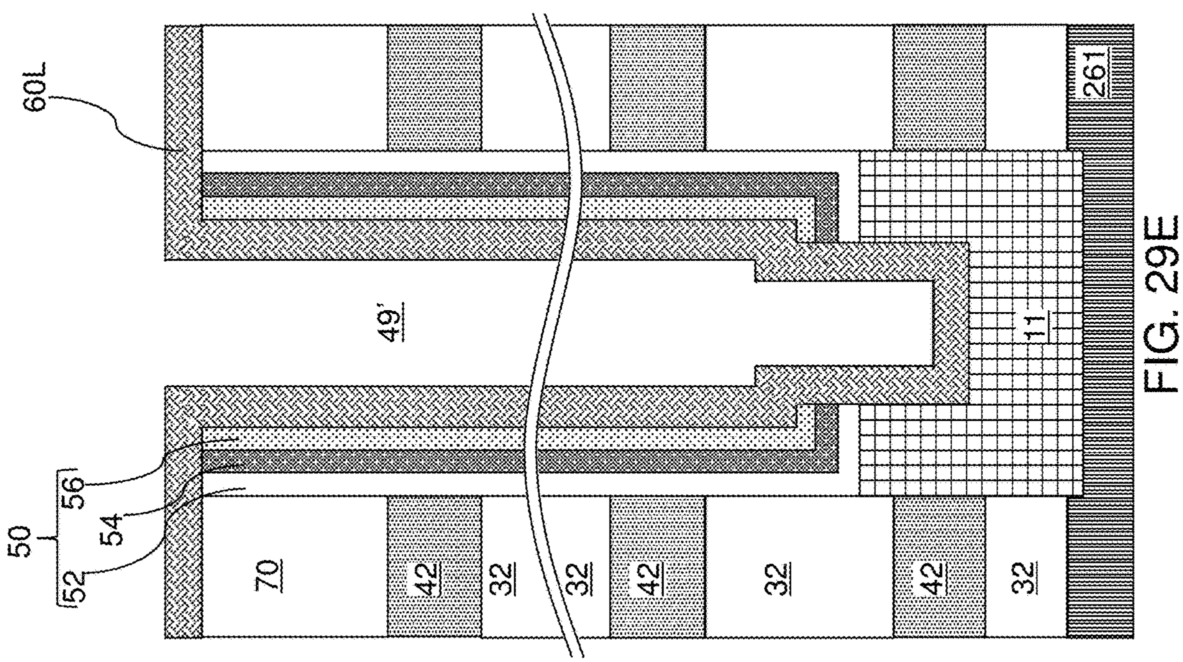

Referring to FIG. 29E, a semiconductor channel layer 60L can be deposited directly on the semiconductor surface of the pedestal channel portion 11, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of the same as the conductivity type of the pedestal channel portions 11 or the semiconductor channel layer 60L may be undoped (e.g., intrinsic). Thus, the semiconductor channel layer can be undoped or be p-type or n-type doped. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 29F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 29H:
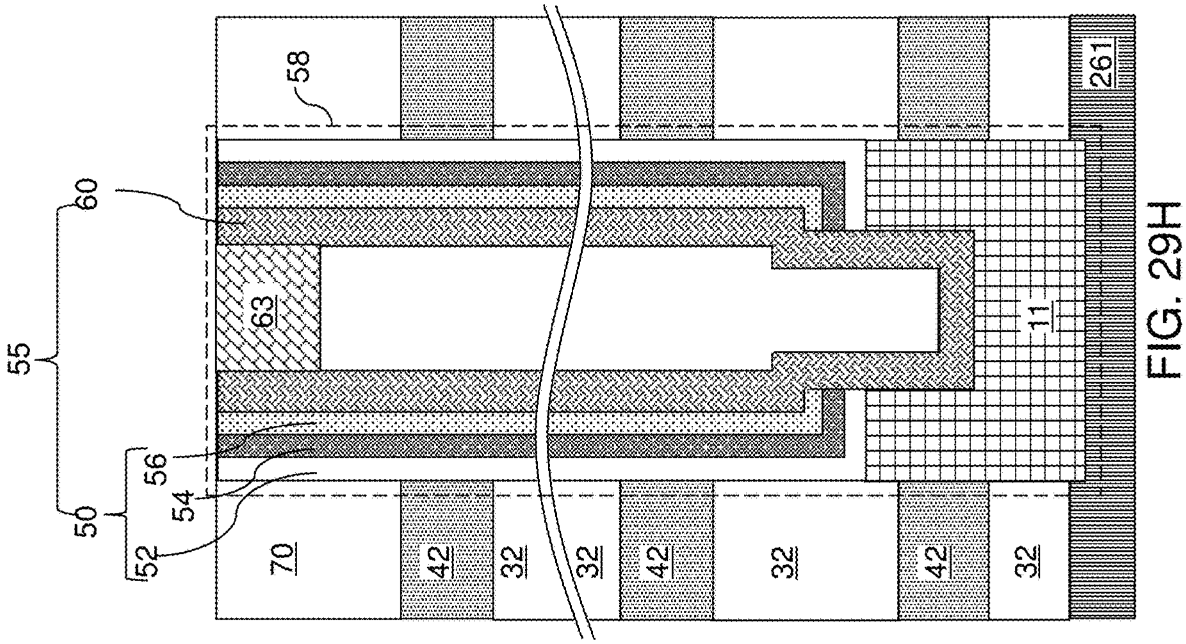
Figure 29G:
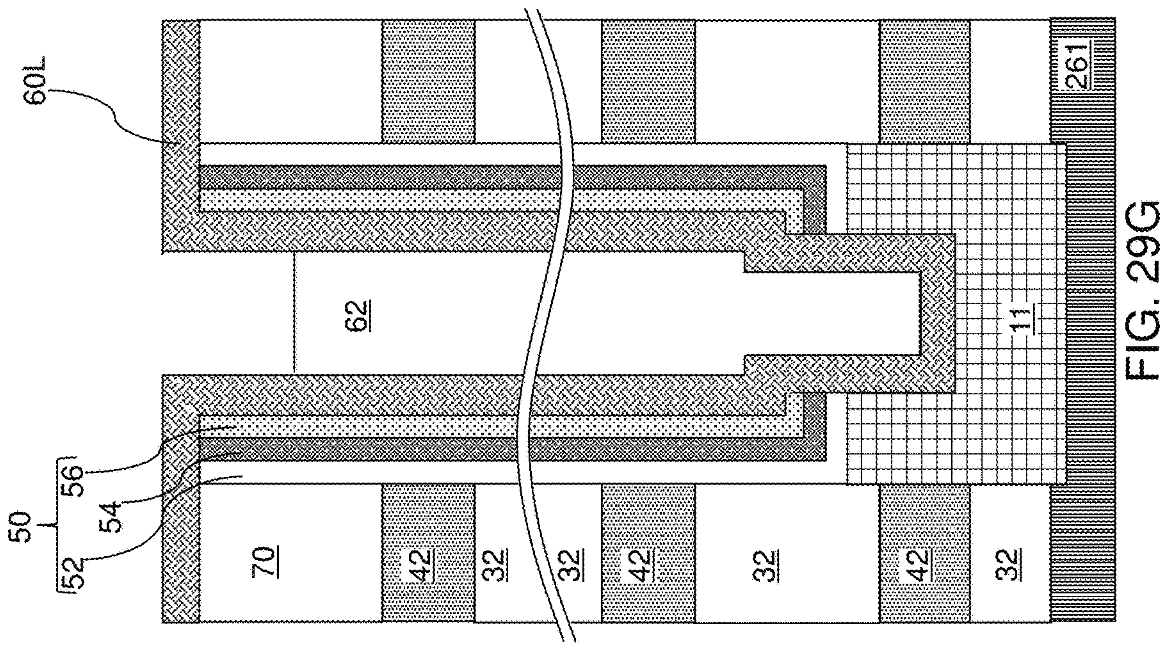

Referring to FIG. 29G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 29H, a doped semiconductor material having a doping of a second conductivity type can be deposited within each recessed region above the dielectric cores 62. The deposited semiconductor material can have a n-type or p-type doping. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor constitutes a drain region 63. Each remaining portion of the semiconductor channel layer 60L constitutes a vertical semiconductor channel 60.

In case the source layer 261 and drain region 63 are both n-type (e.g., n+) doped, then the memory cell generally acts as an n-type field effect transistor, e.g., during read operation, with channel electron conduction. In one embodiment, electron conduction is preferable since electrons have a higher mobility than holes. In one embodiment, source and drain doping of the n-type (e.g., n+ type) is preferable since having memory cell acting as an n-type field effect transistor with electron conduction results in higher cell current and hence higher cell performance. In one embodiment, the vertical semiconductor channel 60 may be undoped or p-type doped.

A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Generally, the source layer (261, 271) comprises a doped semiconductor material having a doping of the second conductivity type that is the opposite of the first conductivity type. Forming the memory opening fill structures 58 comprises forming the pedestal channel portions 11 having a doping of the first conductivity type directly on the source layer (261, 271). The vertical semiconductor channels 60 have a doping of the first conductivity type, and are formed directly on the pedestal channel portions 11. Each of the memory opening fill structures 58 comprises a respective pedestal channel portion having a doping of a same conductivity type as the vertical semiconductor channels and contacting the source layer, wherein each of the vertical semiconductor channels 60 is spaced from the source layer (261, 271) by a respective one of the pedestal channel portions 11.

Subsequently, the processing steps of FIGS. 7A-14 can be performed with any needed modifications in view of the presence of the source layer (261, 271) in lieu of the semiconductor material layer 10, to provide a memory die 1000. The processing steps of FIGS. 15 and 16 can be performed to form a bonded assembly of a memory die 1000 and a logic die 700.

Figure 30A:
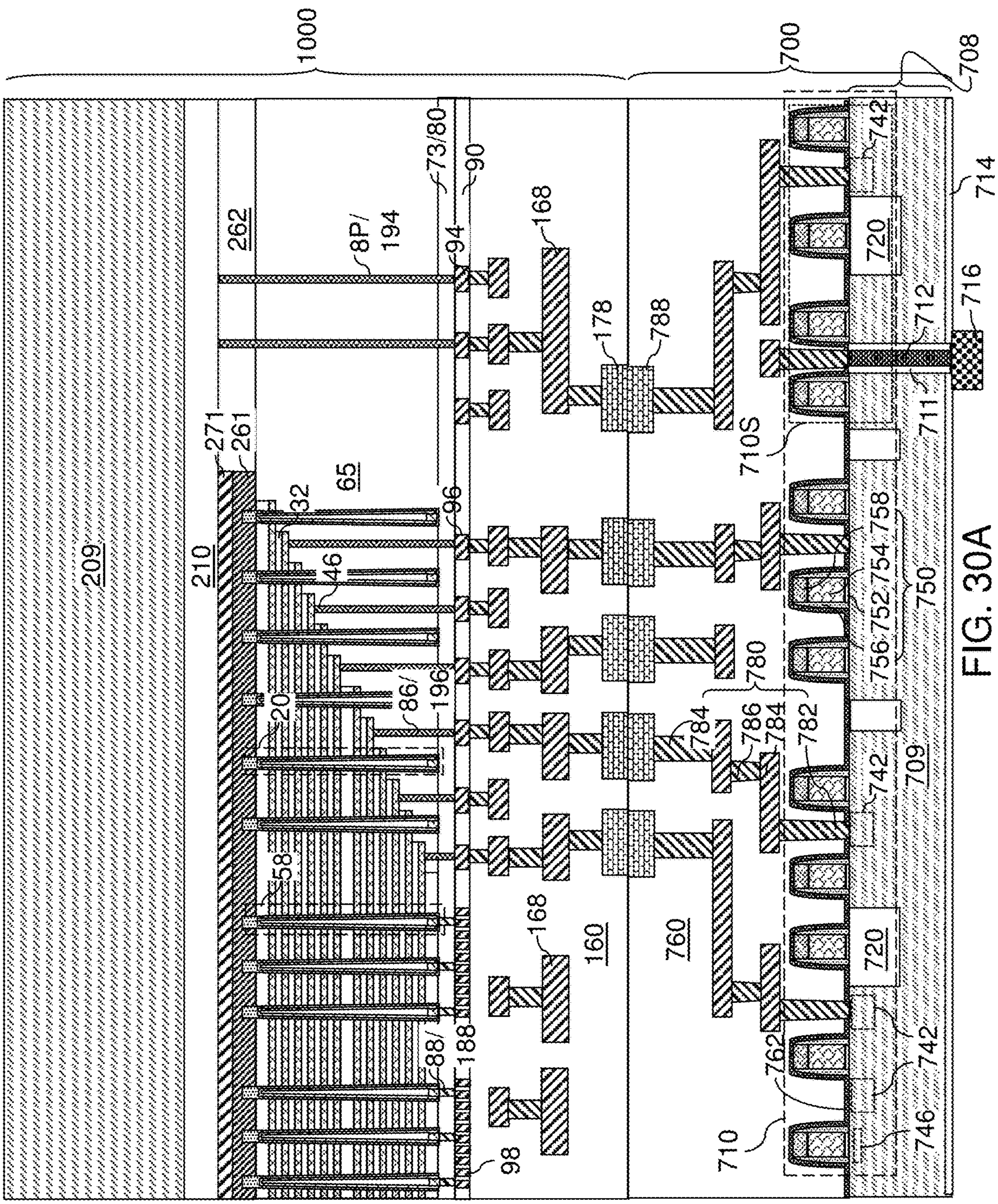
FIGS. 30A-30C are sequential vertical cross-sectional views of the sixth alternative configuration of the exemplary structure during formation of a source power supply mesh and additional backside structures according to an embodiment of the present disclosure.

Referring to FIG. 30A, the sixth alternative configuration of the exemplary structure is illustrated after formation of the bonded assembly of the memory die 1000 and the logic die 700. The logic die 700 includes a peripheral circuitry for operation of the three-dimensional memory arrays in the memory die 1000. In one embodiment, the periphery circuitry includes a source bias circuit 710S configured to generate a source bias voltage to be applied to the source layer (261, 271). Further, the logic die 700 includes logic-side metal interconnect structures 780 and logic-side bonding pads 788. The logic-side bonding pads 788 can be bonded to memory-side bonding pads 178 provided within the memory die 1000.

Figure 30B:
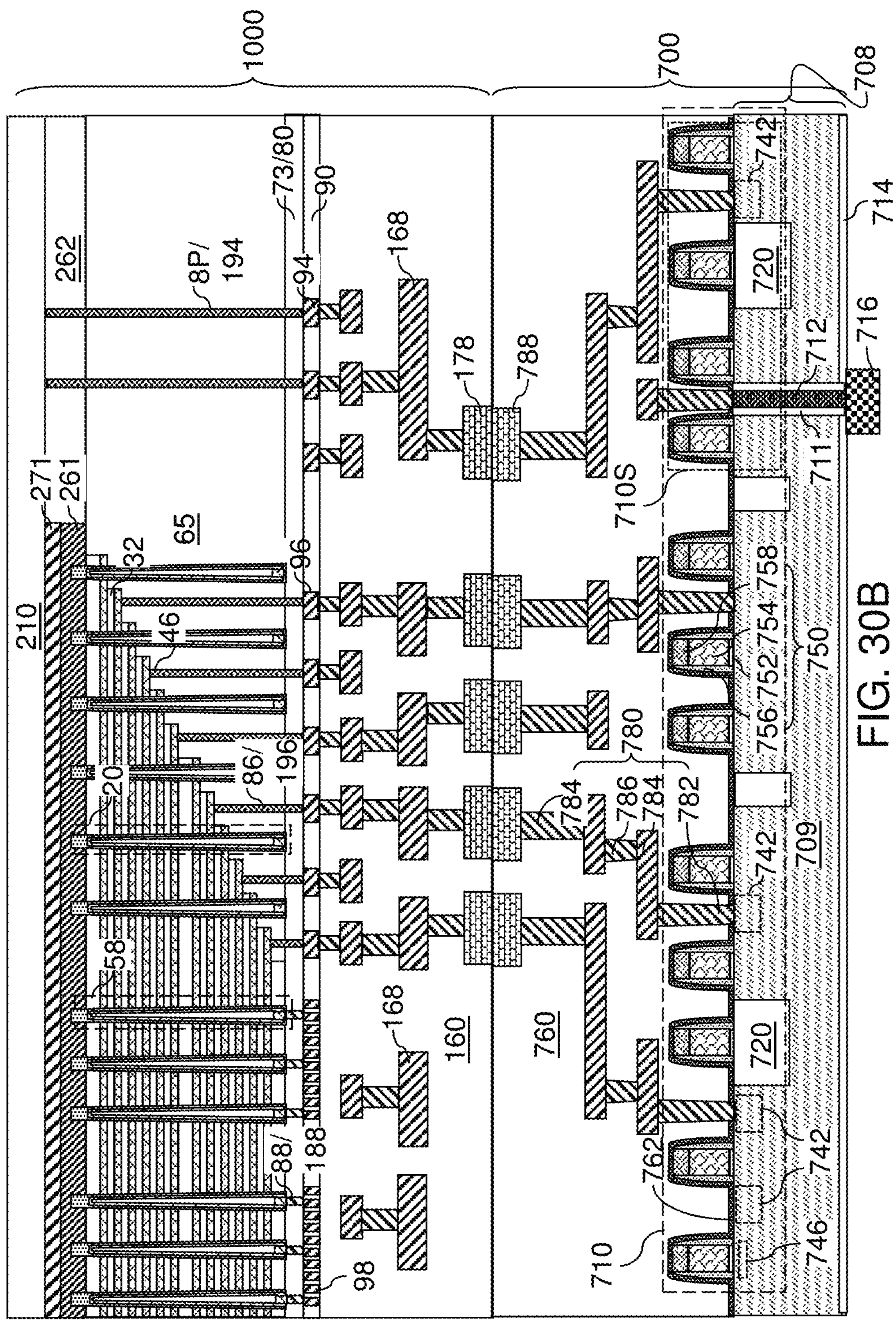

Referring to FIG. 30B, the carrier substrate 209 can be removed selective to the backside isolation dielectric layer 210 by grinding, polishing, anisotropically etching, isotropically etching, and/or cleaving the carrier substrate 209 without removing the backside isolation dielectric layer 210. A distal surface (i.e., the backside surface that is distal from the alternating stack (32, 46)) of the backside isolation dielectric layer 210 can be physically exposed.

Figure 30C:
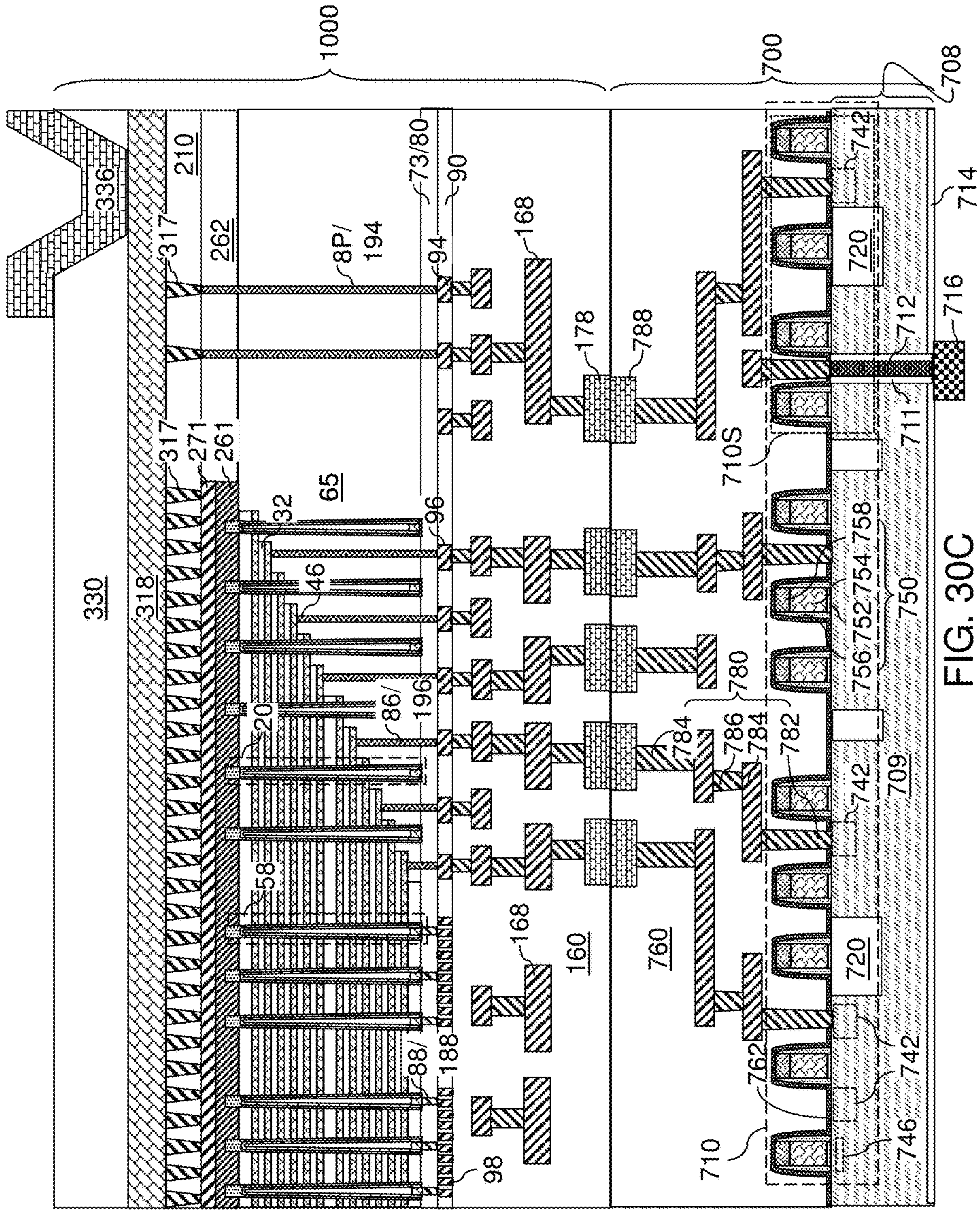

Referring to FIG. 30C, a source power supply mesh (317, 318) can be formed on the backside of the backside isolation dielectric layer 210. In one embodiment, via cavities can be formed through the backside isolation dielectric layer 210, for example, by applying and patterning a photoresist layer on the backside surface of the backside isolation dielectric layer 210, and by transferring a pattern of openings in the photoresist layer through the backside isolation dielectric layer 210 employing an anisotropic etch process.

At least one conductive material can be deposited in the via cavities, and excess portions of the at least one conductive material can be removed from outside the via cavities. The at least one conductive material may include a combination of a metallic liner material (such as TiN, TaN, and/or WN) and a metallic fill material (such as W, Cu, Mo, Ru, Co, etc.). Each remaining portion of the at least one conductive material filling the via cavities constitutes a conductive via structure 317. A first subset of the conductive via structures 317 can be formed on the backside surface of the source layer (261, 271). A second subset of the conductive via structures 317 can be formed on end surfaces of the pass-through via structures 8P.

A source-side electrically conductive layer 318 can be deposited on the backside of the backside isolation dielectric layer 210. The source-side electrically conductive layer 318 can include a metallic material such as Al, TiN, TaN, WN, W, Co, Mo, Ru, etc. The source-side electrically conductive layer 318 can be deposited, for example, by chemical vapor deposition, physical vapor deposition, and/or electroplating. The thickness of the source-side electrically conductive layer 318 can be in a range from 200 nm to 2,000 nm, although lesser and greater thicknesses may also be employed. The source-side electrically conductive layer 318 may be patterned to provide a mesh pattern, and/or may be trimmed to remove portions of the source-side electrically conductive layer 318 from outside the area of the memory array region 100. The combination of the source-side electrically conductive layer 318 and the first subset of the conductive via structures 317 comprises a source power supply mesh (317, 318). The source power supply mesh (317, 318) includes a planar portion of a source-side electrically conductive layer 318 that is located over the backside of the source layer (261, 271). The source power supply mesh (317, 318) can be electrically connected to the source layer (261, 271) using the conductive via structures 317 at multiple locations to provide a source bias voltage with minimum voltage loss across the entire area of the memory array region 100. Generally, an output node of the source bias circuit 710S in the logic die 700 can be electrically connected to the source power supply mesh (317, 318) by a set of conductive structures comprising the logic-side metal interconnect structures 780, the logic-side bonding pads 788, the memory-side bonding pads 178, and the memory-side metal interconnect structures (e.g., 194, 94, 168) that are embedded in the memory die 1000.

A passivation dielectric layer 330 can be formed over the source power supply mesh (317, 318). Optionally, backside contact pads 336 may be formed through the passivation dielectric layer 330 on the backside of the source power supply mesh (317, 318). Alternatively, the backside contact pads 336 are omitted and lateral portions of the source-side electrically conductive layer 318 of the source power supply mesh (317, 318) may function as an input/output backside bonding pads which contact input/output pins of the package, as will be discussed in more detail with respect to FIG. 36B below.

Figure 30D:
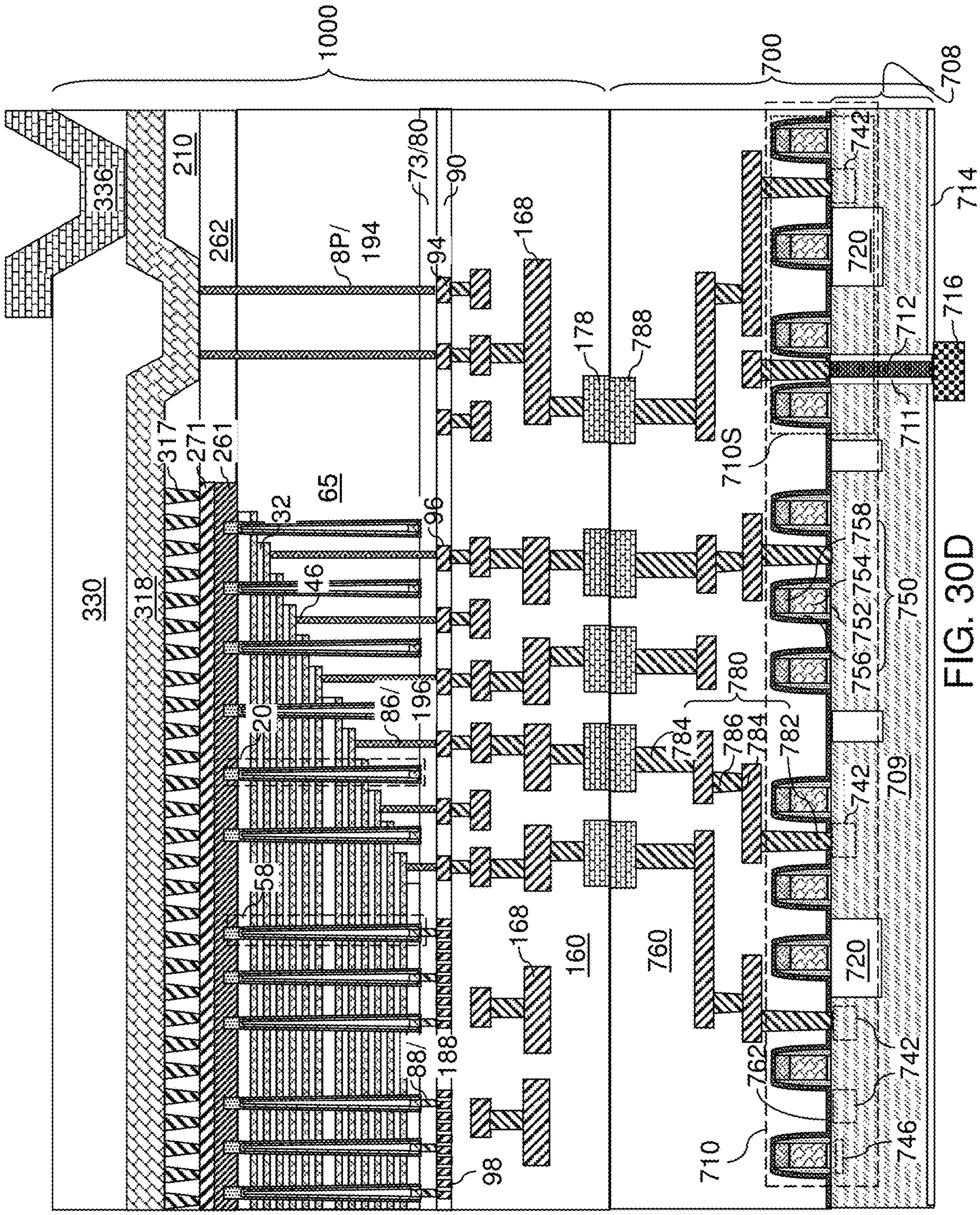
FIGS. 30D and 30E are vertical cross-sectional views of an alternative embodiments of the sixth alternative configuration of the exemplary structure according to an embodiment of the present disclosure.
Figure 30E:
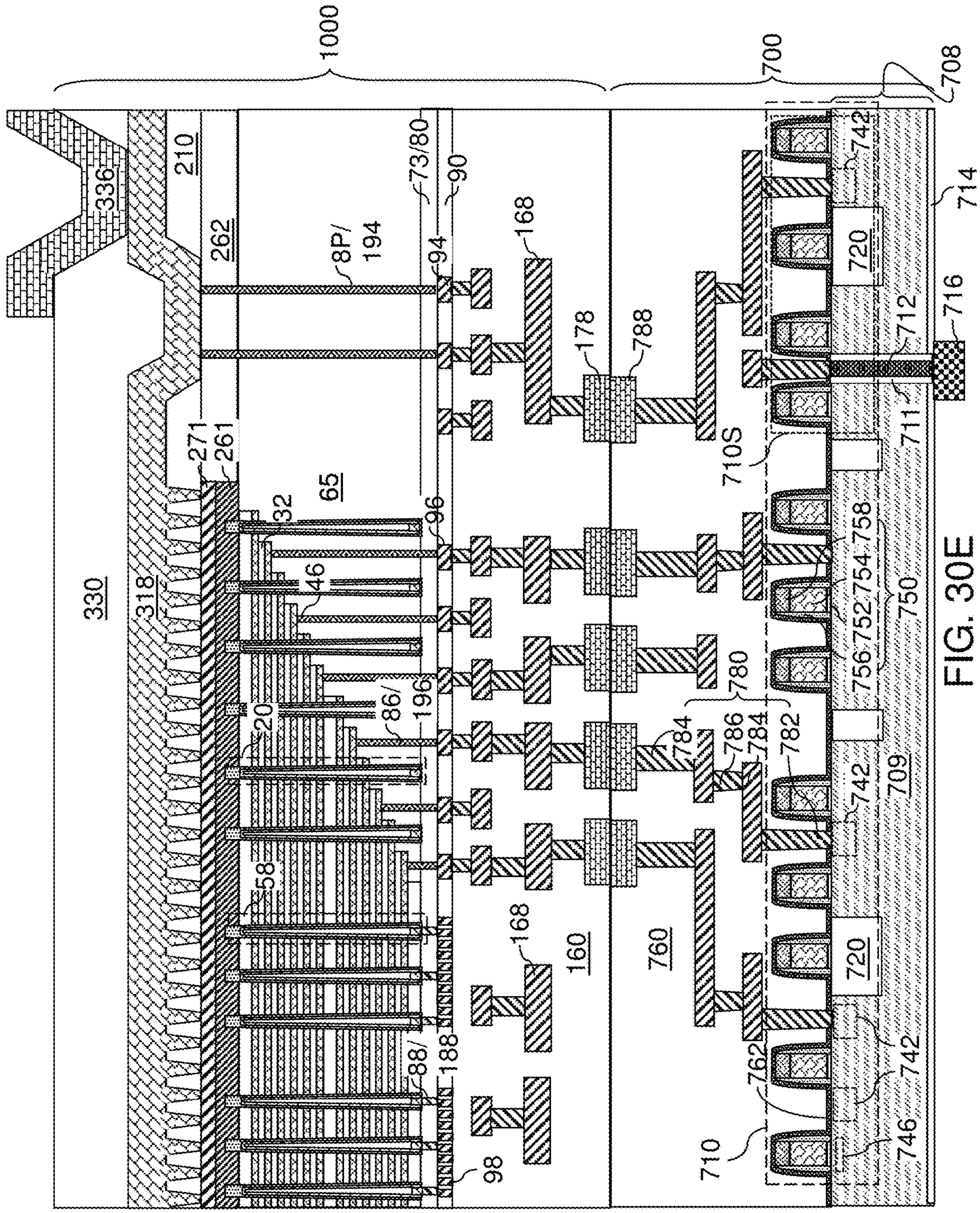

FIGS. 30D and 30E are vertical cross-sectional views of an alternative embodiments of the sixth alternative configuration of the exemplary structure according to an embodiment of the present disclosure.

Referring to FIG. 30D, a recess region can be formed through the backside isolation dielectric layer 210 within an area that overlies the pass-through via structures 8P. In this case, the source-side electrically conductive layer 318 can be formed directly on the end surfaces of the overlies the pass-through via structures (8P, 194).

Referring to FIG. 30E, the via cavities through the backside isolation dielectric layer 210 can be formed with lateral dimensions that are less than twice the thickness of the horizontally-extending portion of the source-side electrically conductive layer 318. In this case, the conductive material of the source-side electrically conductive layer 318 can be formed in the via cavities and on the backside surface of the backside isolation dielectric layer 210. In this case, the source-side electrically conductive layer 318 can include a planar portion (i.e., a horizontally-extending portion) of the source-side electrically conductive layer 318 and via portions that fill the via cavities and contacting the source layer (261, 271).

Generally, the logic die 700 is bonded to the memory die 1000 while the source layer (261, 271) is present on the alternating stack (32, 46). The source power supply mesh (318, 317) is formed after the logic die 700 is bonded to the memory die 1000. Conductive via structures can be formed in the via cavities by depositing a conductive material in the via cavities. The planar portion of the source-side electrically conductive layer 318 may comprise the same metallic material as the conductive via structures, or may comprise a different material that is deposited after formation of the conductive via structures. The source power supply mesh (317, 318) can be formed on the backside isolation dielectric layer 210 after removal of the carrier substrate 209. Additional backside structures such as the passivation dielectric layer 330 and the backside contact pads 336 can be subsequently formed.

FIGS. 31A-31D are sequential schematic vertical cross-sectional views of a memory opening within a seventh alternative configuration of the exemplary structure during formation of a memory stack structure 55, an optional dielectric core 62, and a drain region 63 therein according to a seventh embodiment of the present disclosure. In this embodiment, the pedestal channel portion 11 formation step of FIG. 29B is omitted.

Figure 31B:
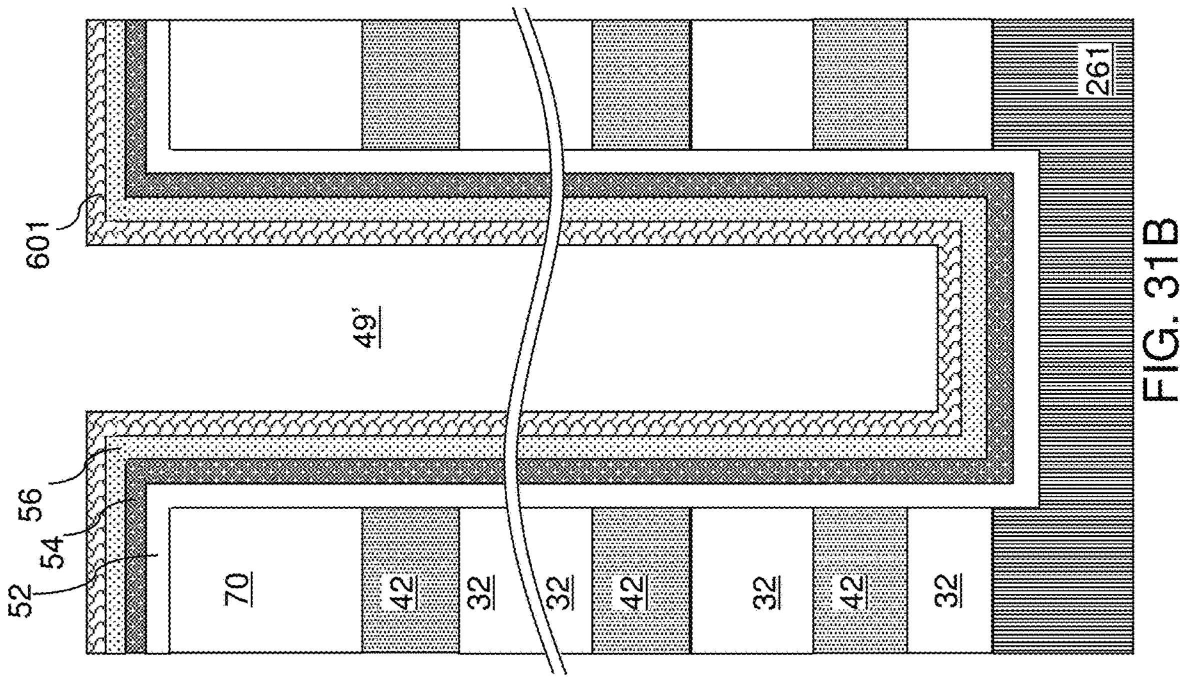
FIGS. 31A-31D are sequential schematic vertical cross-sectional views of a memory opening within a seventh alternative configuration of the exemplary structure during formation of a memory stack structure, an optional dielectric core, and a drain region therein according to an embodiment of the present disclosure.
Figure 31A:
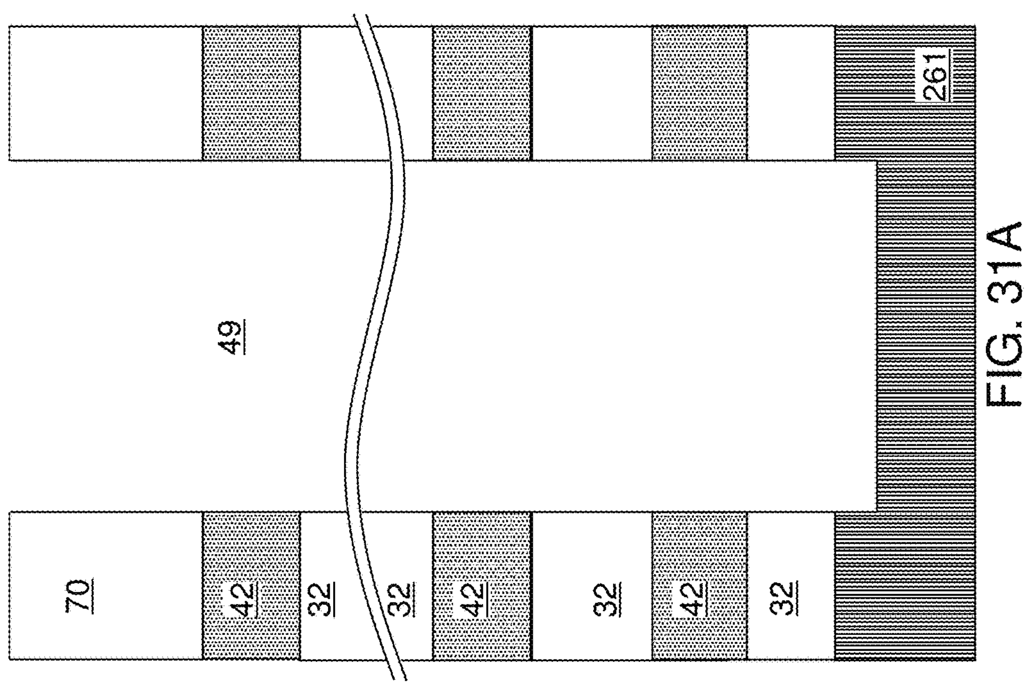

Referring to FIG. 31A, the seventh alternative configuration illustrated in FIG. 31A can be the same as the sixth alternative configuration illustrated in FIG. 29A.

Referring to FIG. 31B, the processing steps of FIG. 29C can be performed to form a blocking dielectric layer 52, a charge storage layer 54, a tunneling dielectric layer 56, and an optional sacrificial cover material layer 601 in each memory opening 49. The blocking dielectric layer 52 can be formed directly on the semiconductor source layer 261.

Figure 31D:
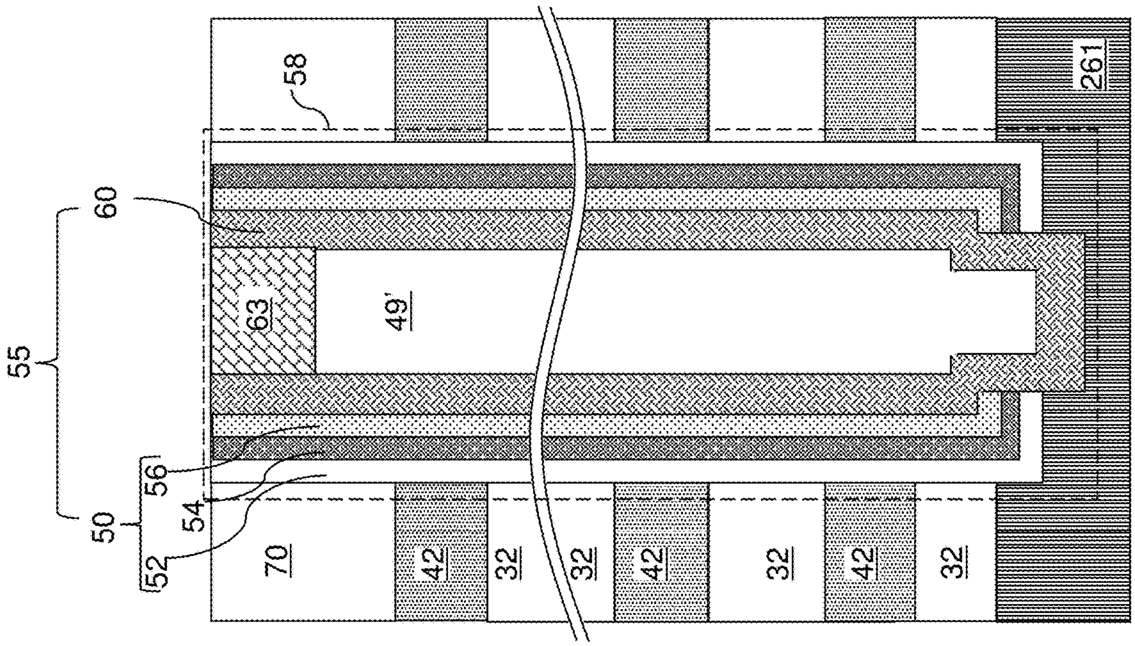
Figure 31C:
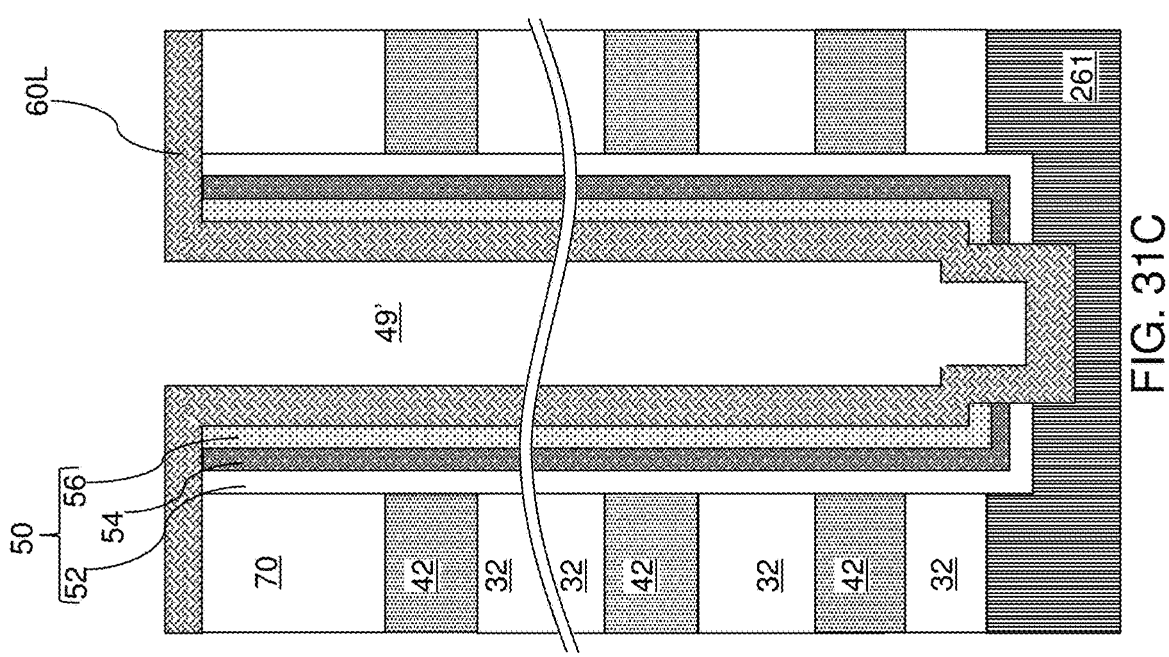

Referring to FIG. 31C, the processing steps of FIGS. 29D and 29E can be performed to form a semiconductor channel layer 60L directly on the semiconductor source layer 261.

Referring to FIG. 31D, the processing steps of FIGS. 29F-29G can be performed to form a memory opening fill structure 58. Each of the memory films 50 comprises a layer stack including a blocking dielectric layer 52, a charge storage layer 54, and a tunneling dielectric layer 56. The blocking dielectric layer 52 comprises a cylindrical portion vertically extending through the alternating stack of insulating layers 32 and electrically conductive layers 46. The cylindrical portion of the blocking dielectric layer 52 within each memory opening fill structure 58 contacts a cylindrical surface of the semiconductor source layer 261. An annular portion of the blocking dielectric layer 52 within each memory opening fill structure 58 contacts a horizontal annular surface of the semiconductor source layer 261.

Figure 31E:
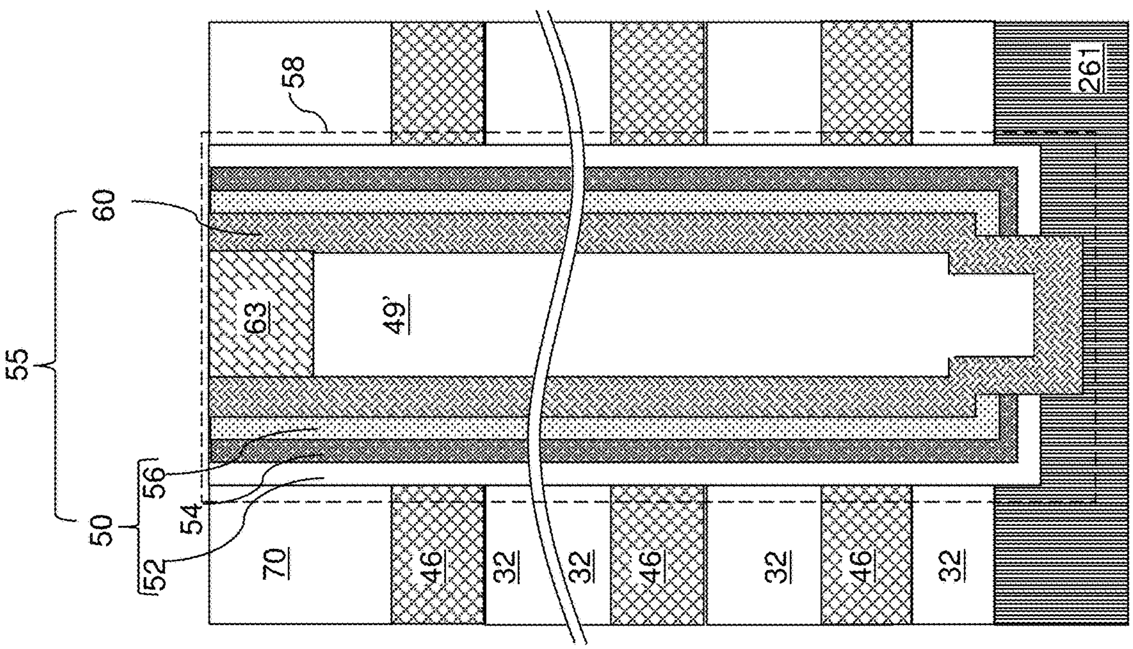
FIG. 31E is a vertical cross-sectional view of a memory opening within the seventh alternative configuration of the exemplary structure according to an embodiment of the present disclosure.

Referring to FIG. 31E, the processing steps of FIGS. 7A-11 can be performed with any needed modifications in view of the presence of the source layer (261, 271) in lieu of the semiconductor material layer 10 to provide form electrically conductive layers 46. The processing steps of FIGS. 12A-14 can be subsequently performed to provide a memory die 1000.

Figure 32A:
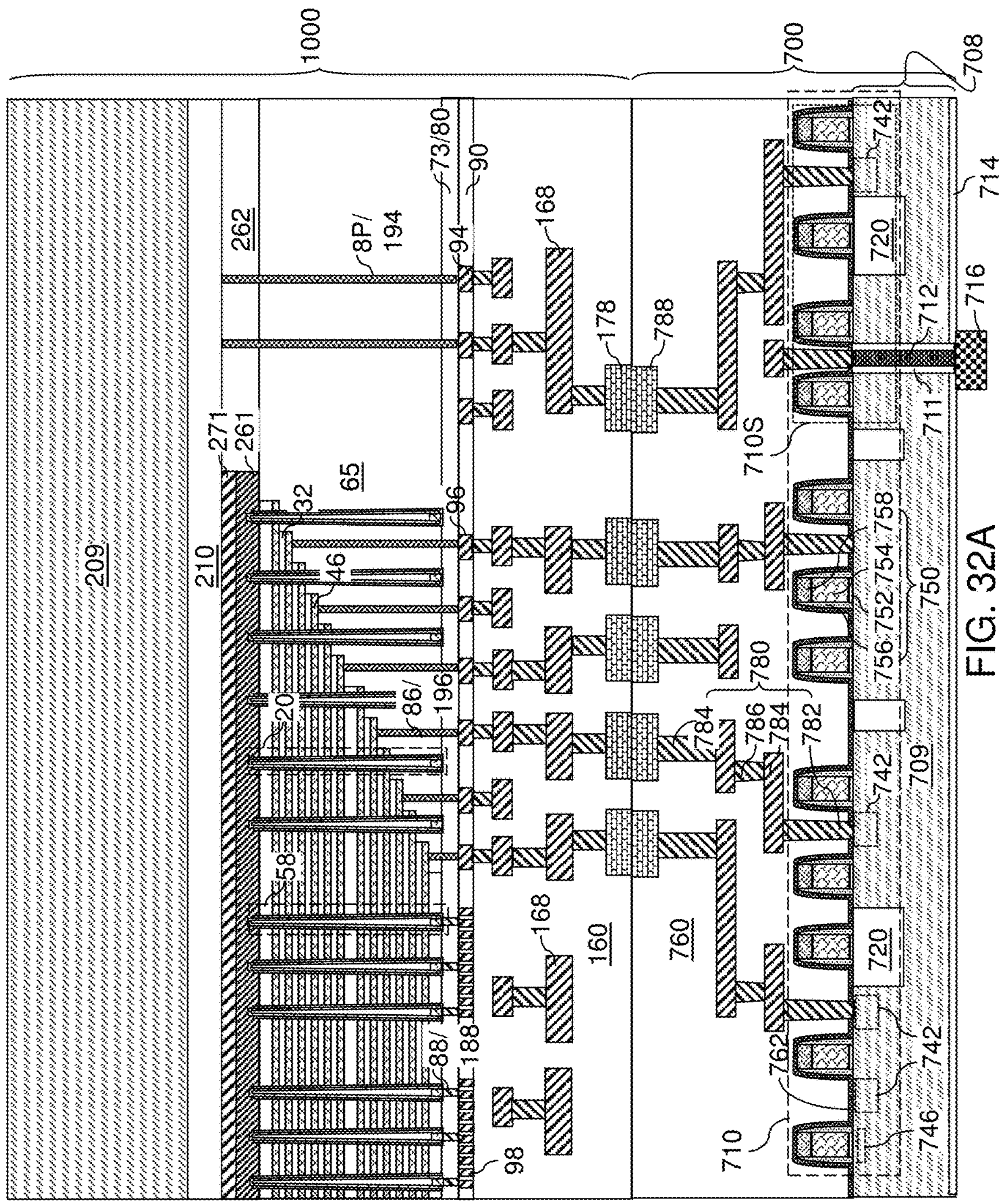
FIGS. 32A and 32B are sequential vertical cross-sectional views of the seventh alternative configuration of the exemplary structure during formation of a source power supply mesh and additional backside structures according to an embodiment of the present disclosure.

Referring to FIG. 32A, the seventh alternative configuration of the exemplary structure is illustrated after formation of the bonded assembly of the memory die 1000 and the logic die 700. The logic die 700 includes a peripheral circuitry for operation of the three-dimensional memory arrays in the memory die 1000. In one embodiment, the periphery circuitry includes a source bias circuit 710S configured to generate a source bias voltage to be applied to the source layer (261, 271). Further, the logic die 700 includes logic-side metal interconnect structures 780 and logic-side bonding pads 788. The logic-side bonding pads 788 can be bonded to memory-side bonding pads 178 provided within the memory die 1000.

Figure 32B:
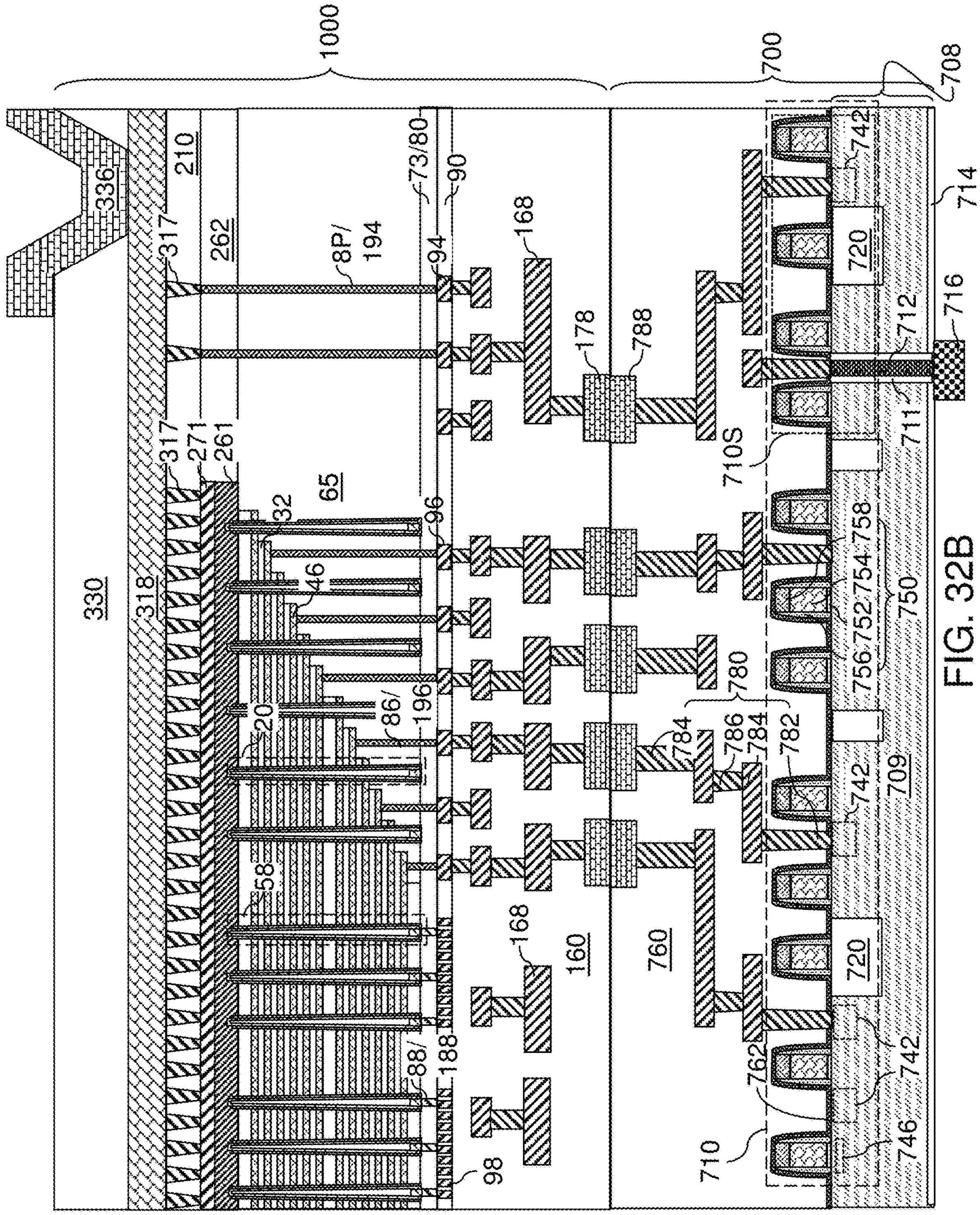

Referring to FIG. 32B, the processing steps of FIGS. 30B and 30C can be performed to remove the carrier substrate 209, and to form a source power supply mesh (317, 318) on the backside of the backside isolation dielectric layer 210. In one embodiment, via cavities can be formed through the backside isolation dielectric layer 210, for example, by applying and patterning a photoresist layer on the backside surface of the backside isolation dielectric layer 210, and by transferring a pattern of openings in the photoresist layer through the backside isolation dielectric layer 210 employing an anisotropic etch process.

At least one conductive material can be deposited in the via cavities, and excess portions of the at least one conductive material can be removed from outside the via cavities. The at least one conductive material may include a combination of a metallic liner material (such as TiN, TaN, and/or WN) and a metallic fill material (such as W, Cu, Mo, Ru, Co, etc.). Each remaining portion of the at least one conductive material filling the via cavities constitutes a conductive via structure 317. A first subset of the conductive via structures 317 can be formed on the backside surface of the source layer (261, 271). A second subset of the conductive via structures 317 can be formed on end surfaces of the pass-through via structures (8P, 194).

A source-side electrically conductive layer 318 can be deposited on the backside of the backside isolation dielectric layer 210. The source-side electrically conductive layer 318 can include a metallic material such as Al, TiN, TaN, WN, W, Co, Mo, Ru, etc. The source-side electrically conductive layer 318 can be deposited, for example, by chemical vapor deposition, physical vapor deposition, and/or electroplating. The thickness of the source-side electrically conductive layer 318 can be in a range from 200 nm to 2,000 nm, although lesser and greater thicknesses may also be employed. The source-side electrically conductive layer 318 may be patterned to provide a mesh pattern, and/or may be trimmed to remove portions of the source-side electrically conductive layer 318 from outside the area of the memory array region 100. The combination of the source-side electrically conductive layer 318 and the first subset of the conductive via structures 317 comprises a source power supply mesh (317, 318). The source power supply mesh (317, 318) includes a planar portion of a source-side electrically conductive layer 318 that is located on the backside of the source layer (261, 271). The source power supply mesh (317, 318) can be electrically connected to the source layer (261, 271) at multiple locations to provide a source bias voltage with minimum voltage loss across the entire area of the memory array region 100. Generally, an output node of the source bias circuit in the logic die 700 can be electrically connected to the source power supply mesh (317, 318) by a set of conductive structures comprising the logic-side metal interconnect structures 780, the logic-side bonding pads 788, the memory-side bonding pads 178, and the memory-side metal interconnect structures that are embedded in the memory die 1000.

A passivation dielectric layer 330 can be formed over the source power supply mesh (317, 318). Optionally, backside contact pads 336 may be formed through the passivation dielectric layer 330 on the backside of the source power supply mesh (317, 318).

Figure 32C:
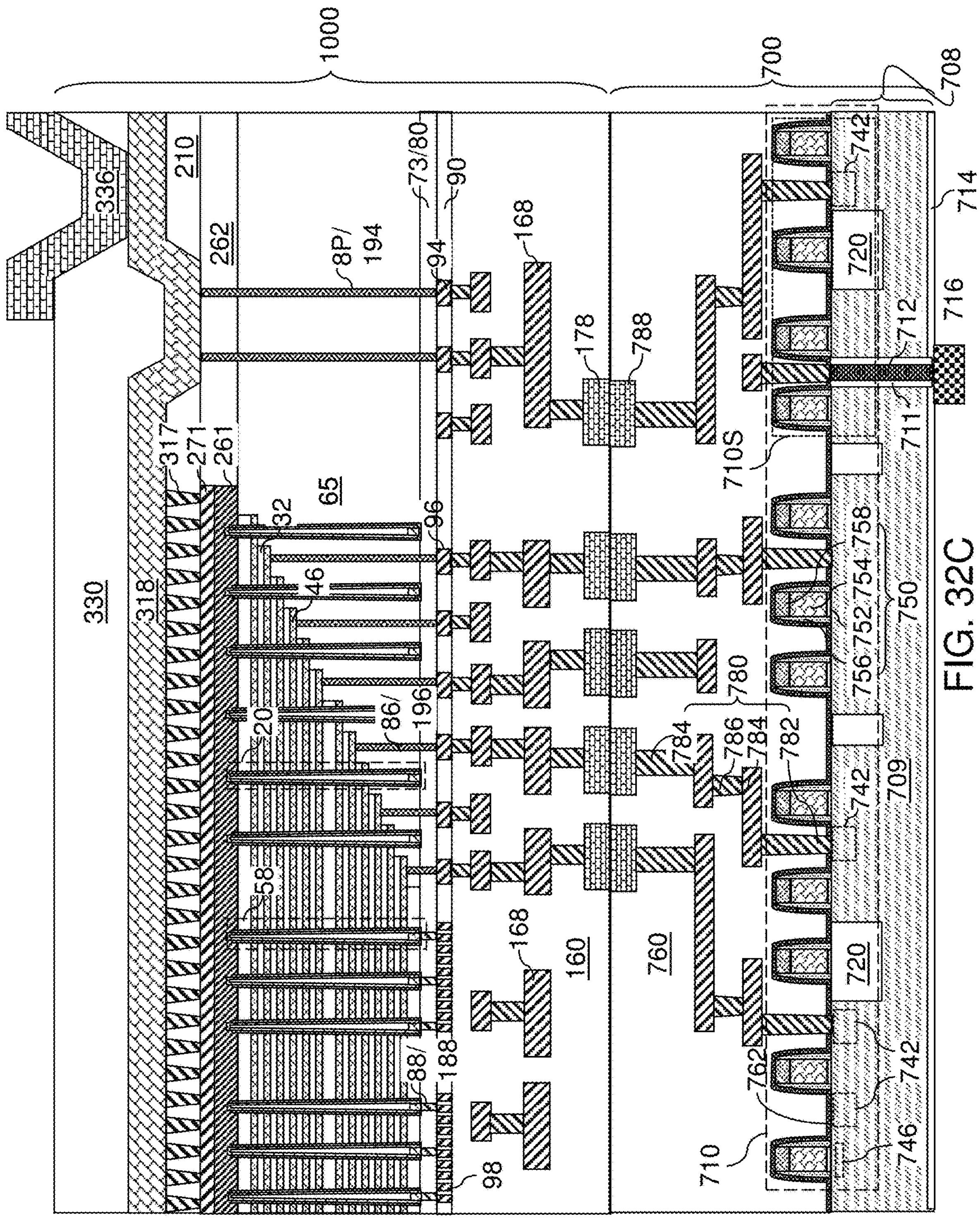
FIGS. 32C and 32D are vertical cross-sectional views of an alternative embodiments of the seventh alternative configuration of the exemplary structure according to an embodiment of the present disclosure.
Figure 32D:
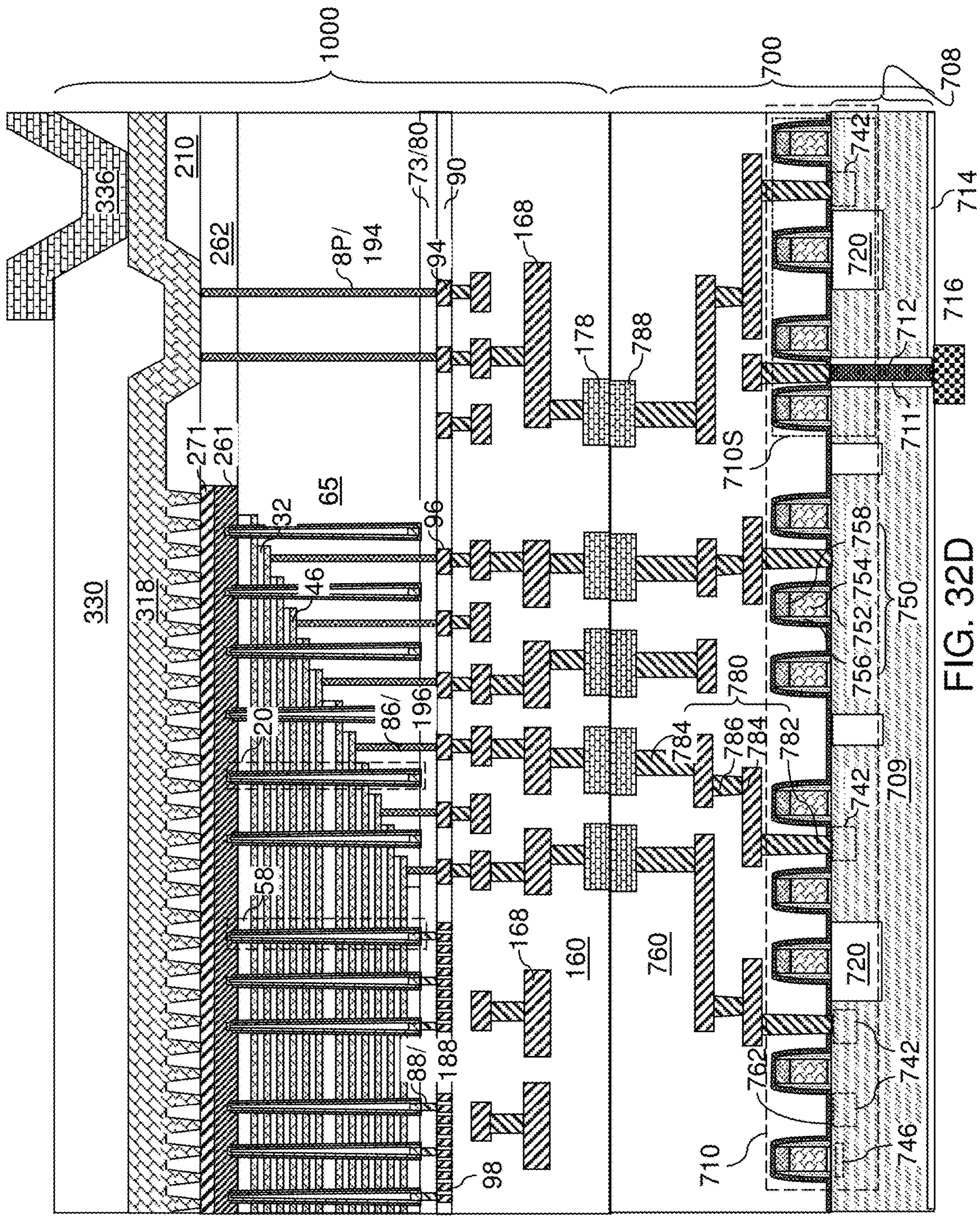

FIGS. 32C and 32D are vertical cross-sectional views of an alternative embodiments of the seventh alternative configuration of the exemplary structure according to the seventh embodiment of the present disclosure.

Referring to FIG. 32C, a recess region can be formed through the backside isolation dielectric layer 210 within an area that overlies the pass-through via structures (8P, 194). In this case, the source-side electrically conductive layer 318 can be formed directly on the end surfaces of the overlies the pass-through via structures (8P, 194).

Referring to FIG. 32D, the via cavities through the backside isolation dielectric layer 210 can be formed with lateral dimensions that are less than twice the thickness of the horizontally-extending portion of the source-side electrically conductive layer 318. In this case, the conductive material of the source-side electrically conductive layer 318 can be formed in the via cavities and on the backside surface of the backside isolation dielectric layer 210. In this case, the source-side electrically conductive layer 318 can include a planar portion (i.e., a horizontally-extending portion) of the source-side electrically conductive layer 318 and via portions that fill the via cavities and contacting the source layer (261, 271).

Figure 33:
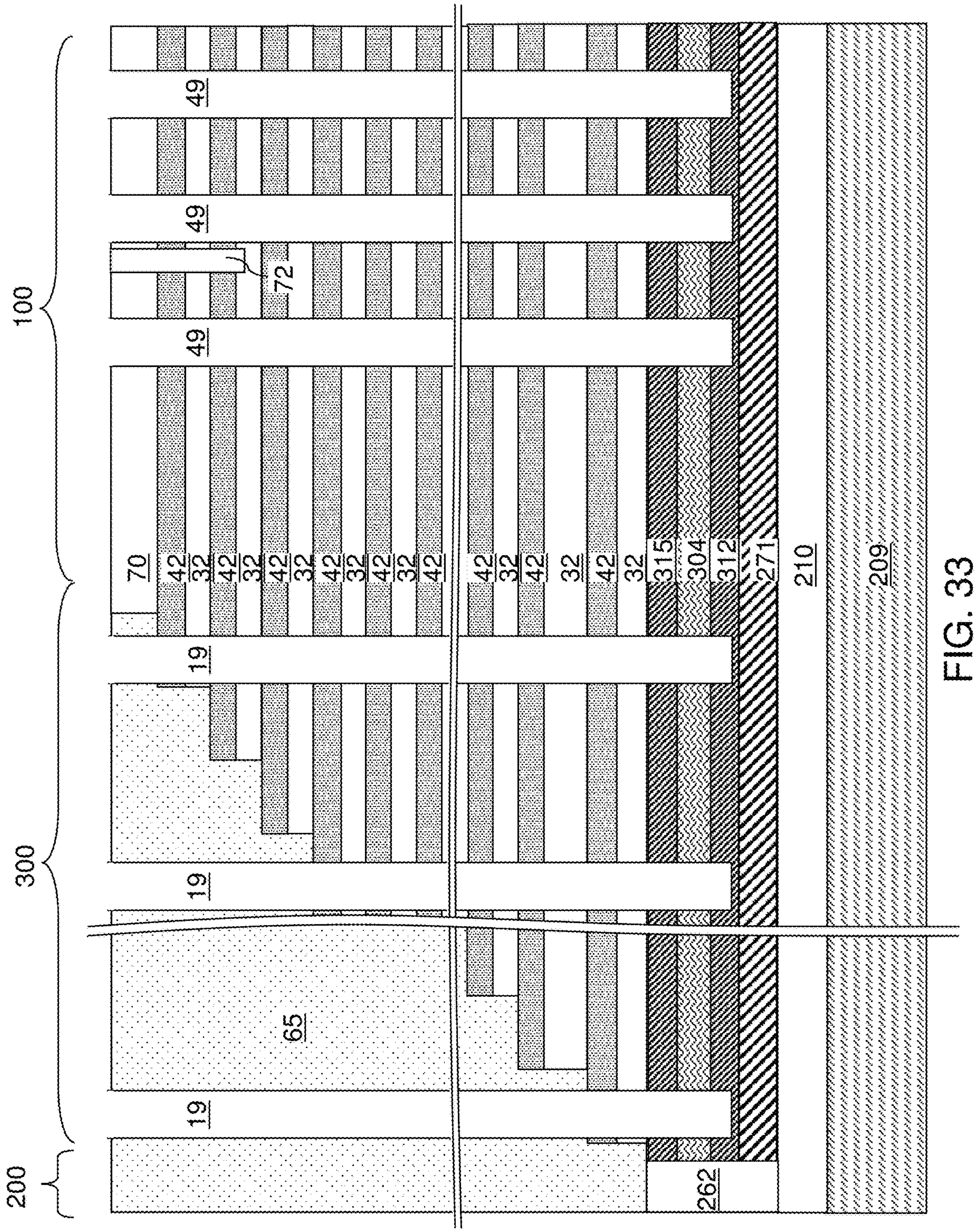
FIG. 33 is an eighth alternative configuration of an exemplary structure after formation of memory openings and support openings according to an embodiment of the present disclosure.

FIG. 33 is an eighth alternative configuration of an exemplary structure after formation of memory openings and support openings according to an eighth embodiment of the present disclosure. The eighth configuration of the exemplary structure can be derived from the sixth alternative configuration of the exemplary structure illustrated in FIG. 28 by employing a layer stack including a distal doped semiconductor layer 312, a source-level sacrificial layer 304, and a proximal doped semiconductor layer 315 in lieu of a semiconductor source layer 271. The distal doped semiconductor layer 312 and the proximal doped semiconductor layer 315 comprise a respective doped semiconductor material having a n-type or p-type doping. N-type doping is preferred. The atomic concentration of dopants in the distal doped semiconductor layer 312 and the proximal doped semiconductor layer 315 can be in a range from $5.0\times10^{19}/cm^3$ to $2.0\times10^{21}/cm^3$, although lesser and greater dopant concentrations can also be used. In one embodiment, the distal doped semiconductor layer 312 and the proximal doped semiconductor layer 315 may include doped polysilicon. The thickness of each of the distal doped semiconductor layer 312 and the proximal doped semiconductor layer 315 can be in a range from 100 nm to 1,000 nm, although lesser and greater thicknesses may also be employed. The source-level sacrificial layer 304 includes a sacrificial material that can be removed selective to the materials of the distal doped semiconductor layer 312 and the proximal doped semiconductor layer 315. For example, the source-level sacrificial layer 304 may include undoped amorphous silicon, undoped polysilicon, a silicon-germanium alloy, germanium, silicon nitride, a silicon-based polymer material, amorphous carbon, diamond-like carbon (DLC), or another sacrificial material that can be removed selective to the materials of the distal doped semiconductor layer 312 and the proximal doped semiconductor layer 315. The thickness of the source-level sacrificial layer 304 may be in a range from 100 nm to 1,000 nm, although lesser and greater thicknesses may also be employed. The distal doped semiconductor layer 312 can contact a top side (i.e., the front side) of the backside isolation dielectric layer 210, and is more distal from an alternating stack of insulating layers 32 and sacrificial material layers 42 to be subsequently formed thereupon than the proximal doped semiconductor layer 315 is from the alternating stack (32, 42). The stack of the optional metallic source layer 271, the distal doped semiconductor layer 312, the source-level sacrificial layer 304, and the proximal doped semiconductor layer 315 constitutes an in-process source layer (271, 312, 304, 315), which is subsequently modified to form a source layer. Subsequently, the processing steps of FIGS. 5B-5F can be performed to form a memory opening fill structure 58 within each memory opening 49 and within each support opening 19.

Generally, the backside isolation dielectric layer 210 can be formed on a carrier substrate 209. The in-process source layer (271, 312, 304, 315) is formed on the backside isolation dielectric layer 210. The in-process source layer (271, 312, 304, 315) comprises the proximal doped semiconductor layer 315 contacting a horizontal surface of an alternating stack of insulating layers 32 and sacrificial material layers 42, a source-level sacrificial layer 304, and a distal doped semiconductor layer 312 contacting the backside isolation dielectric layer 210. An in-process alternating stack of the insulating layers 32 and sacrificial material layers 42 is formed over the layer stack of the in-process source layer (271, 312, 304, 315). The memory openings 49 and the memory opening fill structures 58 are formed through the in-process alternating stack (32, 42).

FIGS. 34A-34G are sequential schematic vertical cross-sectional views of a memory opening within the eighth alternative configuration of the exemplary structure during formation of a backside trench 79, replacement of a source-level sacrificial layer 304 with a source contact semiconductor layer 314, replacement of sacrificial material layers 42 with electrically conductive layers 46, and formation of a backside trench fill structure 176 within each backside trench 79 according to an embodiment of the present disclosure.

Figure 34A:
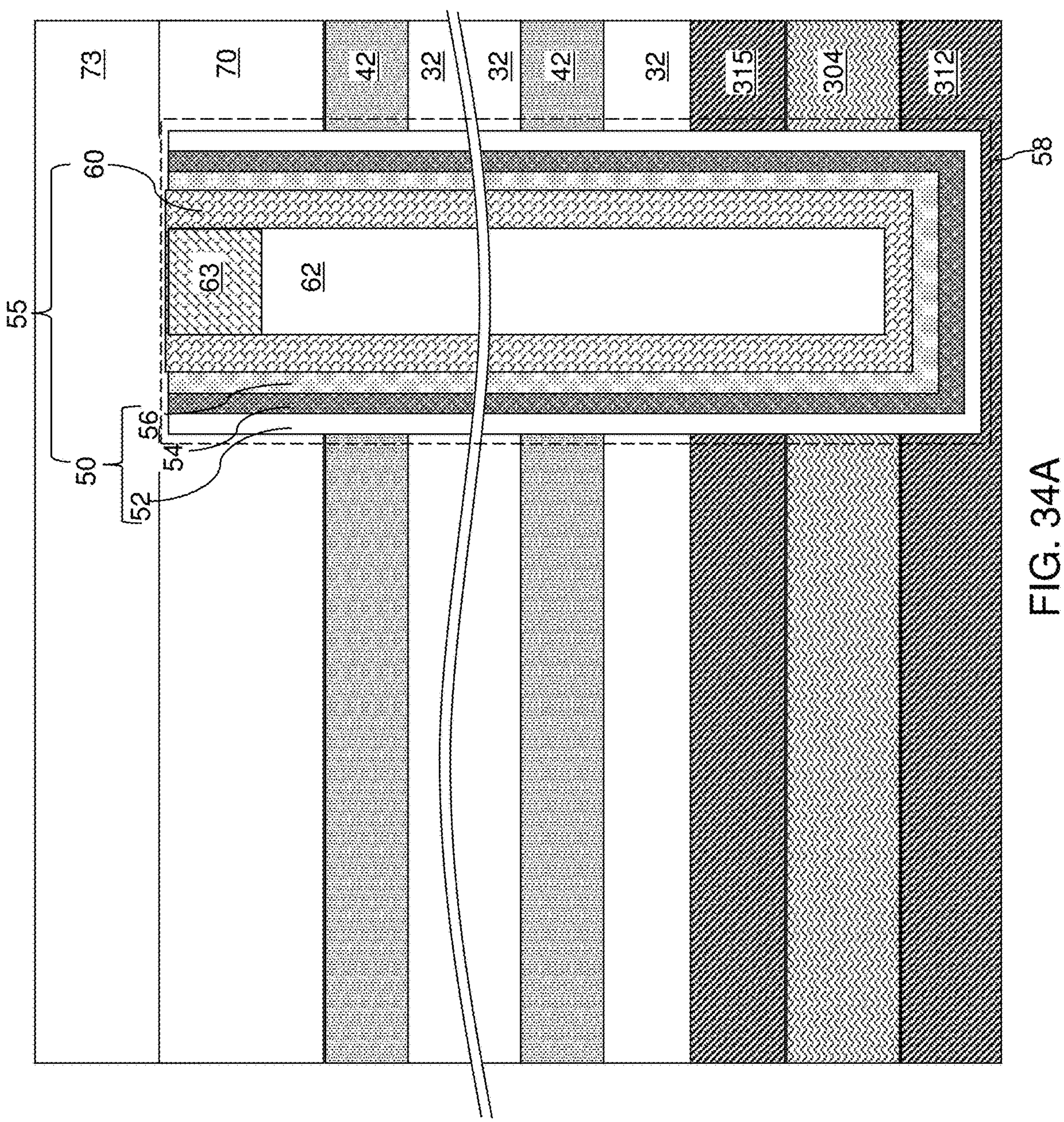
FIGS. 34A-34G are sequential schematic vertical cross-sectional views of a memory opening within the eighth alternative configuration of the exemplary structure during formation of a backside trench, replacement of a source-level sacrificial layer with a source contact semiconductor layer, replacement of sacrificial material layers with electrically conductive layers, and formation of a backside trench fill structure according to an embodiment of the present disclosure.

Referring to FIG. 34A, a contact-level dielectric layer 73 can be formed above the insulating cap layer 70 by performing the processing steps of FIGS. 7A and 7B.

Figure 34B:
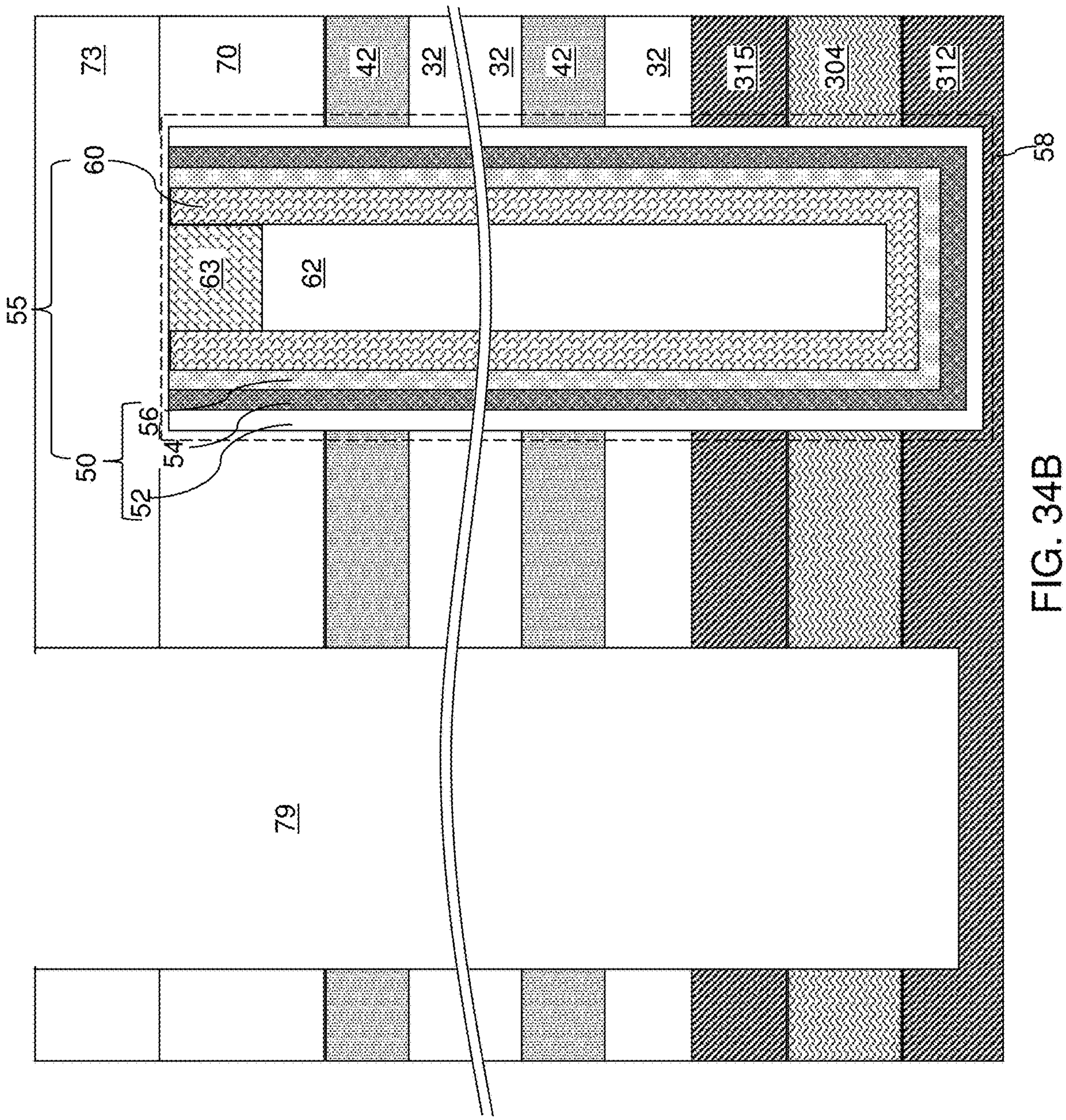

Referring to FIG. 34B, backside trenches 79 can be formed through the contact-level dielectric layer 73 and the alternating stack (32, 42) by performing the processing steps of FIGS. 7A and 7B. The backside trenches 79 can vertically extend downward at least to the source-level sacrificial layer 304.

Figure 34C:
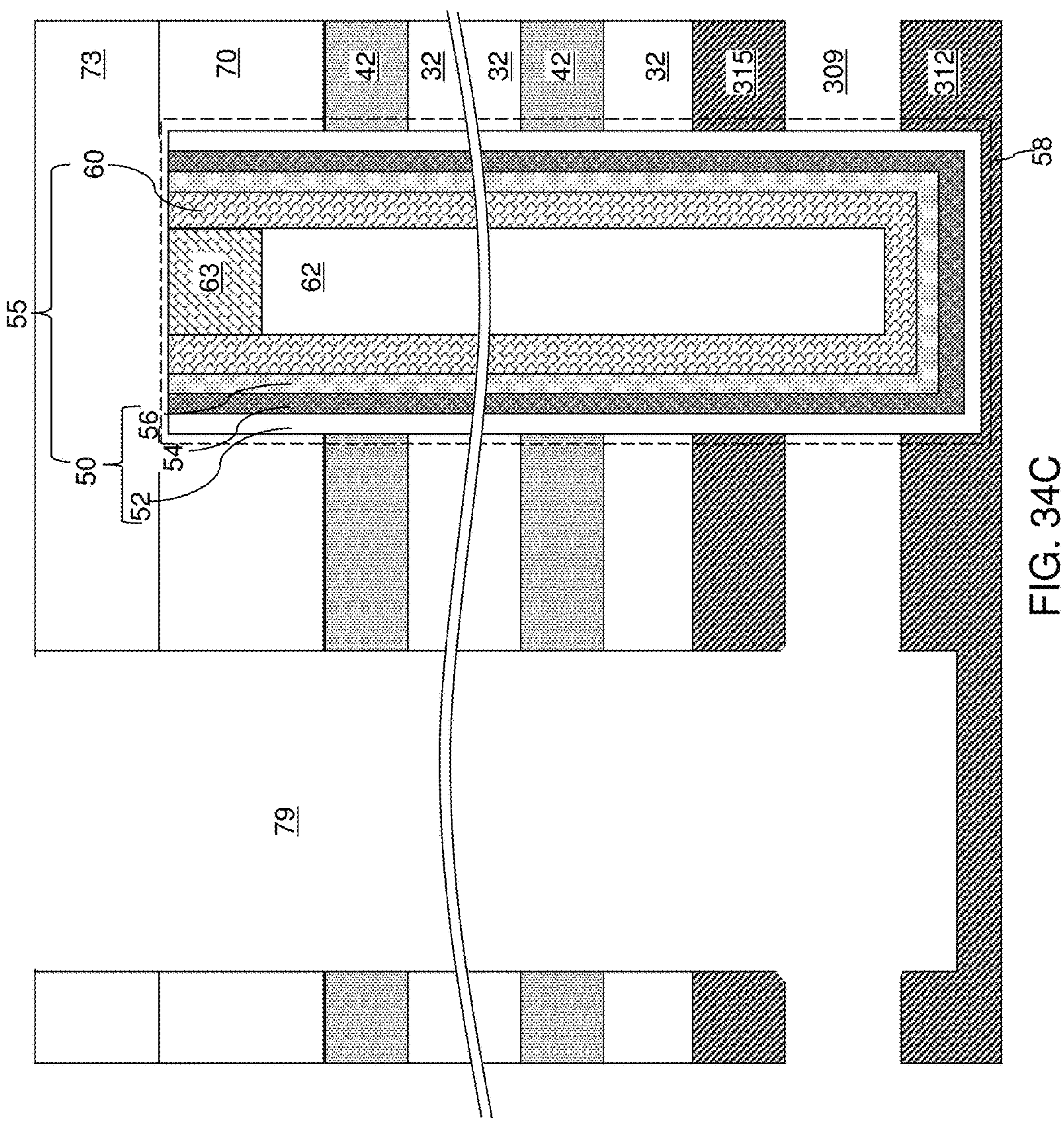

Referring to FIG. 34C, a source cavity 309 can be formed by removing the sacrificial material of the source-level sacrificial layer 304 selective to the materials of the alternating stack (32, 42), the distal doped semiconductor layer 312, and the proximal doped semiconductor layer 315. For example, an isotropic etch process may be employed to remove the material of the source-level sacrificial layer 304 selective to the materials of the alternating stack (32, 42), the distal doped semiconductor layer 312, and the proximal doped semiconductor layer 315.

Figure 34D:
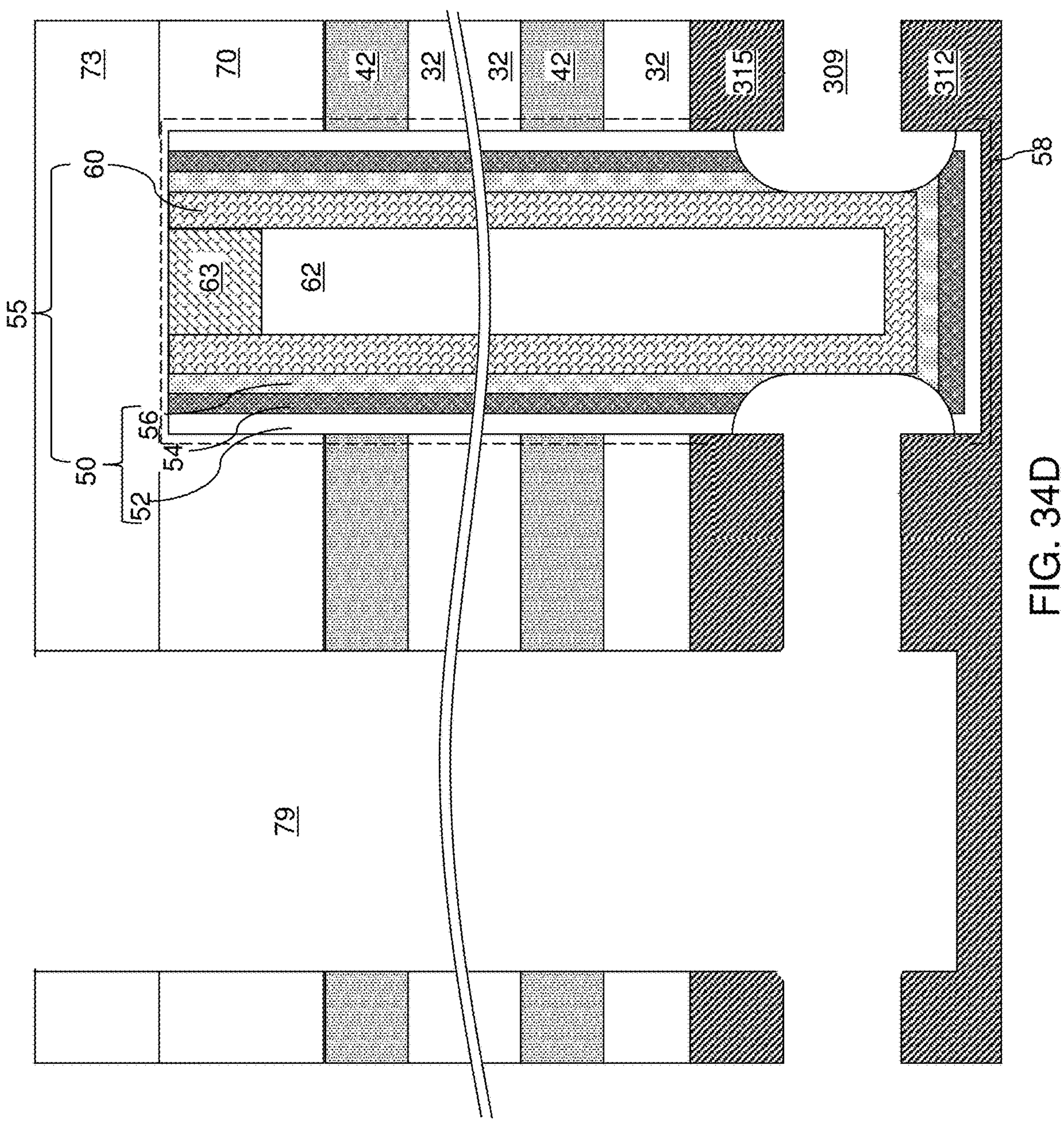

Referring to FIG. 34D, a series of isotropic etch processes may be performed to sequentially etch physically exposed portions of the blocking dielectric layer 52, the charge storage layer 54, and the tunneling dielectric layer 56. Cylindrical portions of outer sidewalls of the vertical semiconductor channels 60 can be physically exposed to the source cavity 309. Thus, each of the vertical semiconductor channels 60 may comprise a respective cylindrical outer surface that is physically exposed to the source cavity 309.

Figure 34E:
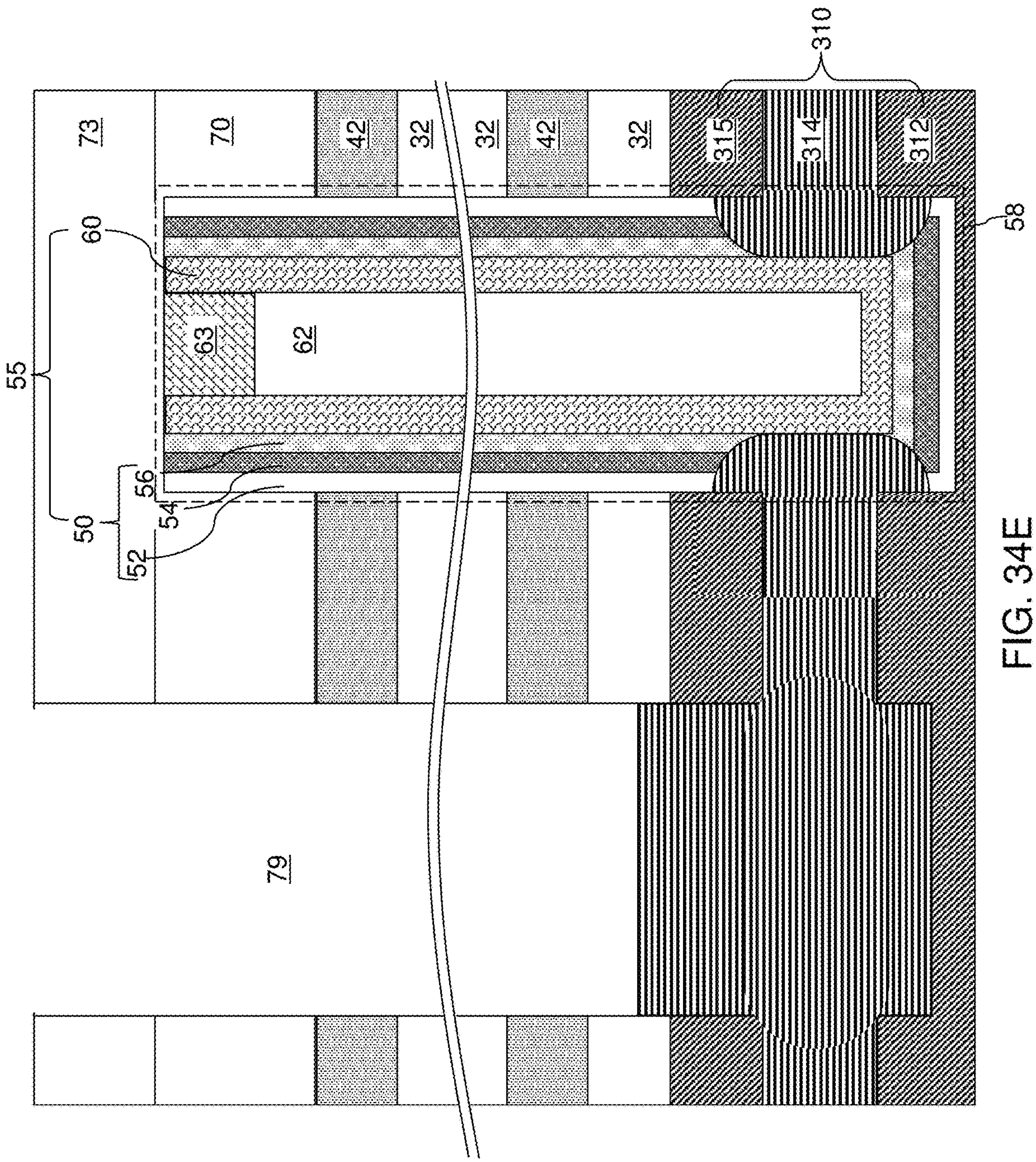

Referring to FIG. 34E, a source contact semiconductor layer 314 can be formed by selectively depositing a doped semiconductor material in the source cavity 309 and at a lower portion of each backside trench 79. The source contact semiconductor layer 314 can be doped n-type or p-type. Preferably, it is doped n-type. For example, a selective semiconductor deposition process in which a semiconductor-containing reactant gas (such as silane or disilane) and a dopant gas (such as phosphine, arsine, or stibine) including dopant atoms that can provide a doping of the desired conductivity type (e.g., n-type) can be flowed into a process chamber containing the exemplary structure concurrently with, or alternately with, flow of an etchant gas (such as HCl) into the process chamber. A source contact semiconductor layer 314 can be formed in the source cavity 309. The stack of the distal doped semiconductor layer 312, the source contact semiconductor layer 314, and the proximal doped semiconductor layer 315 constitutes a semiconductor source layer 310. The source contact semiconductor layer 314 may include dopants at an atomic concentration in a range from $5.0\times10^{19}/cm^3$ to $2.0\times10^{21}/cm^3$, although lesser and greater dopant concentrations can also be used. Thus, the source-level sacrificial layer 304 can be replaced with the source contact semiconductor layer 314.

Figure 34F:
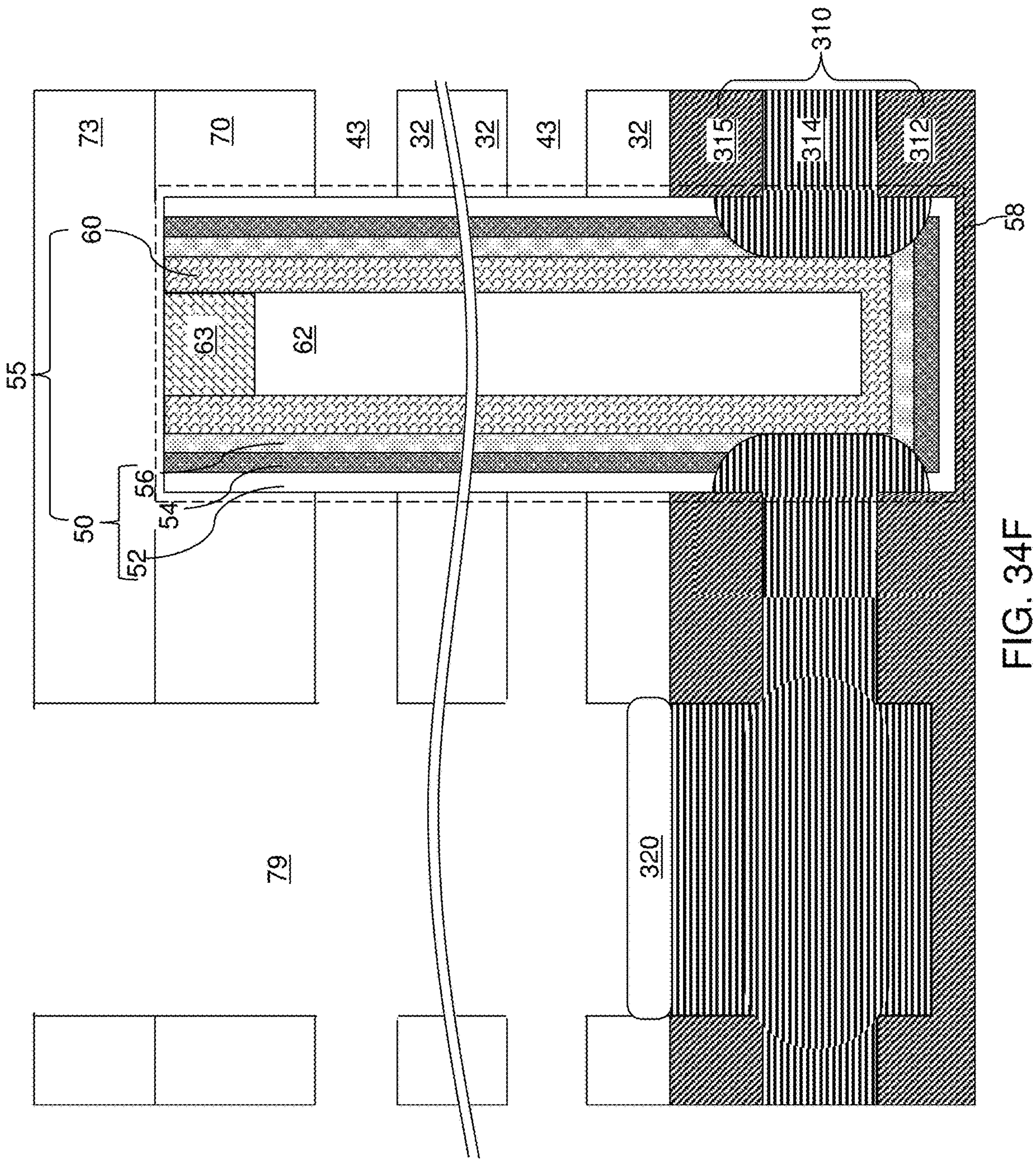

Referring to FIG. 34F, an insulating plate 320 can be formed by oxidizing the physically exposed surface portion of the source contact semiconductor layer 314. In one embodiment, the insulating plate 320 can include silicon oxide. Subsequently, the processing steps of FIG. 8 can be performed to form backside recesses 43. Specifically, the sacrificial material layers 42 may be removed selective to the insulating layers 32 by an isotropic etch process.

Figure 34G:
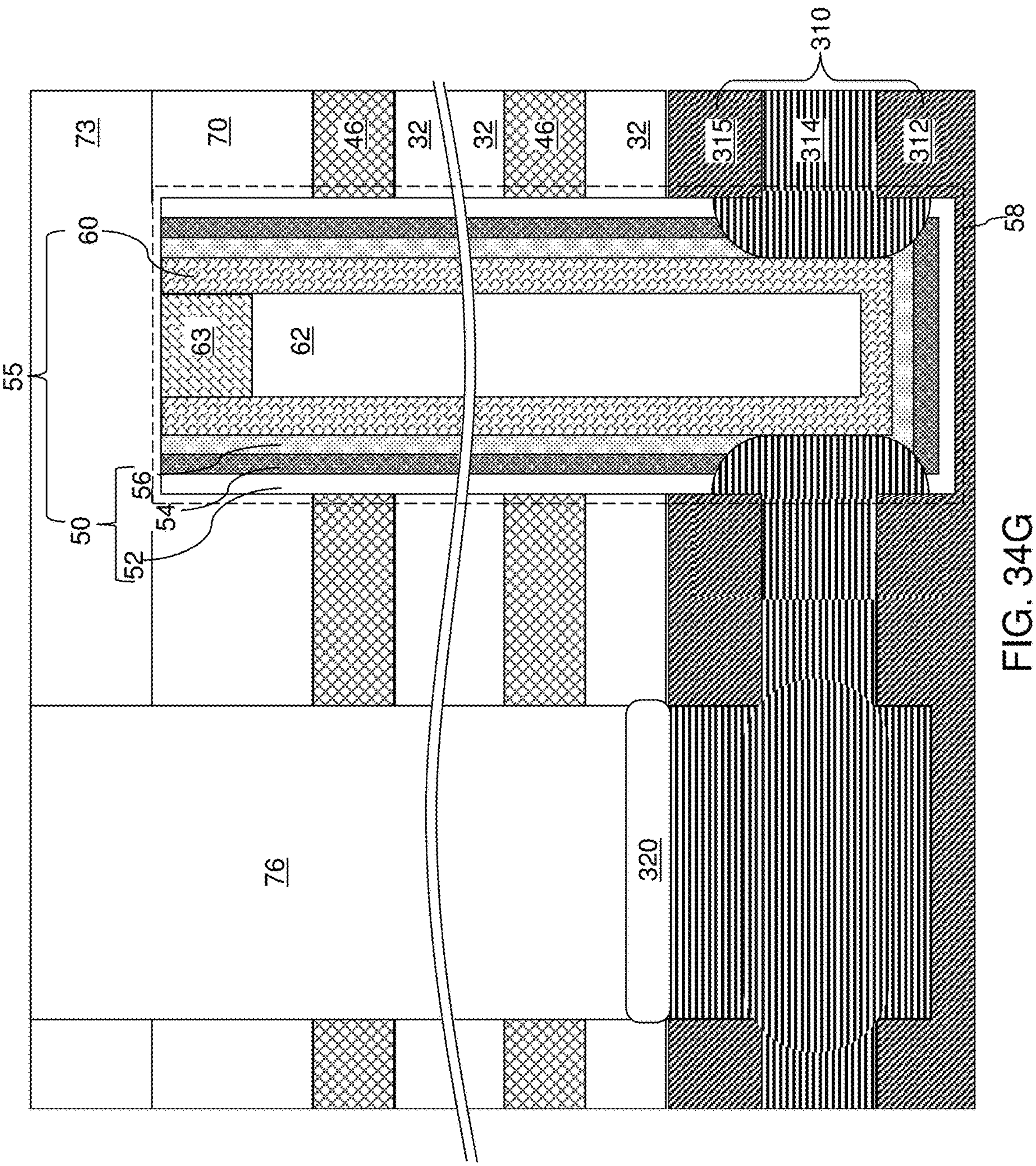

Referring to FIG. 34G, the processing steps of FIGS. 9, 10A and 10B, and 11 can be performed to form electrically conductive layers 46 in the backside recesses 43, and to form dielectric wall structures 76 in the backside recesses 79. Generally, the sacrificial material layers 42 can be replaced with the electrically conductive layers 46. In one embodiment, each of the vertical semiconductor channels 60 comprises a respective cylindrical outer surface that contacts the source layer (271, 310). In one embodiment, the source layer (271, 310) comprises a proximal doped semiconductor layer 315 contacting a horizontal surface of the alternating stack of insulating layers 32 and electrically conductive layers 46, a source contact semiconductor layer 314 contacting the cylindrical outer surfaces of the vertical semiconductor channels 60 and the proximal doped semiconductor layer 315, and a distal doped semiconductor layer 312 contacting the source contact semiconductor layer 314 and vertically spaced from the proximal doped semiconductor layer 315 by the source contact semiconductor layer 314.

In one embodiment, the vertical semiconductor channels 60 have a doping of a first conductivity type, and the proximal doped semiconductor layer 315, the source contact semiconductor layer 314, and the distal doped semiconductor layer 312 have a doping of a second conductivity type that is an opposite of the first conductivity type. In one embodiment, the source contact semiconductor layer 314 has a different material composition than the proximal doped semiconductor layer 315 and the distal doped semiconductor layer 312.

Subsequently, the processing steps of FIGS. 7A-14 can be performed with any needed changes in view of the presence of the source layer (261, 271) in lieu of the semiconductor material layer 10 to provide a memory die 1000. The processing steps of FIGS. 15 and 16 can be performed to form a bonded assembly of a memory die 1000 and a logic die 700

Figure 35A:
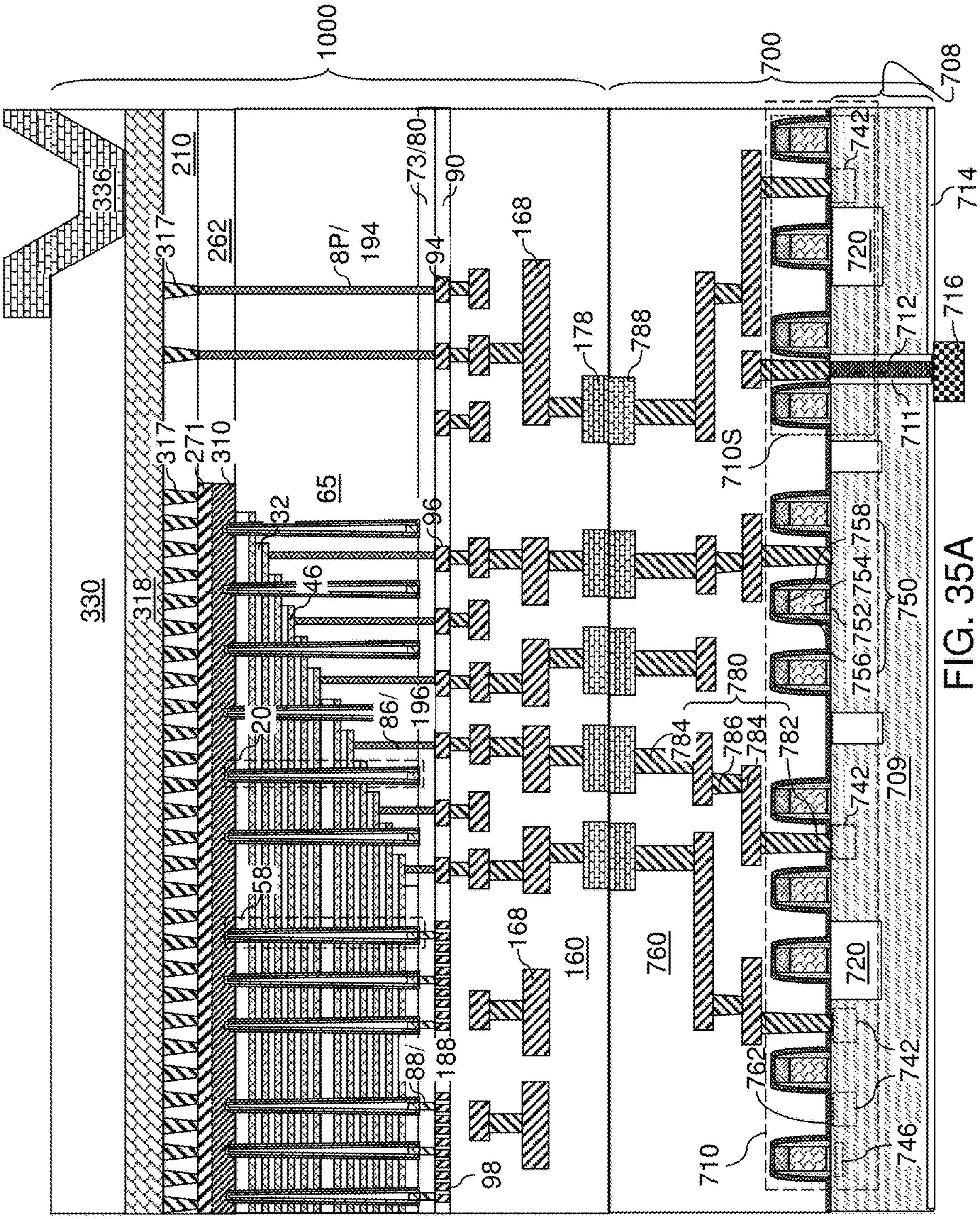
FIGS. 35A-35C are vertical cross-sectional views of embodiments of the eighth alternative configuration of the exemplary structure according to an embodiment of the present disclosure.
Figure 35B:
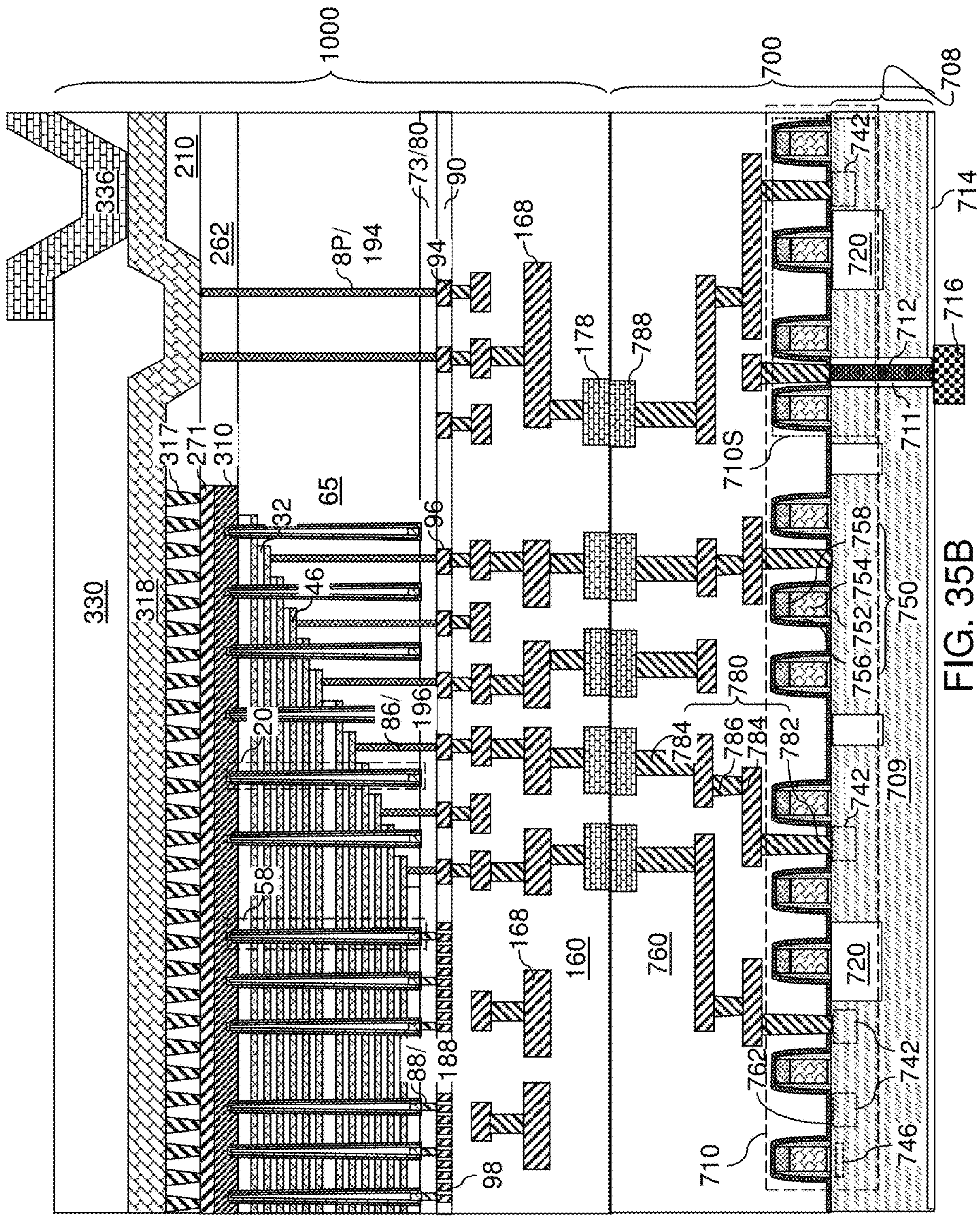
Figure 35C:
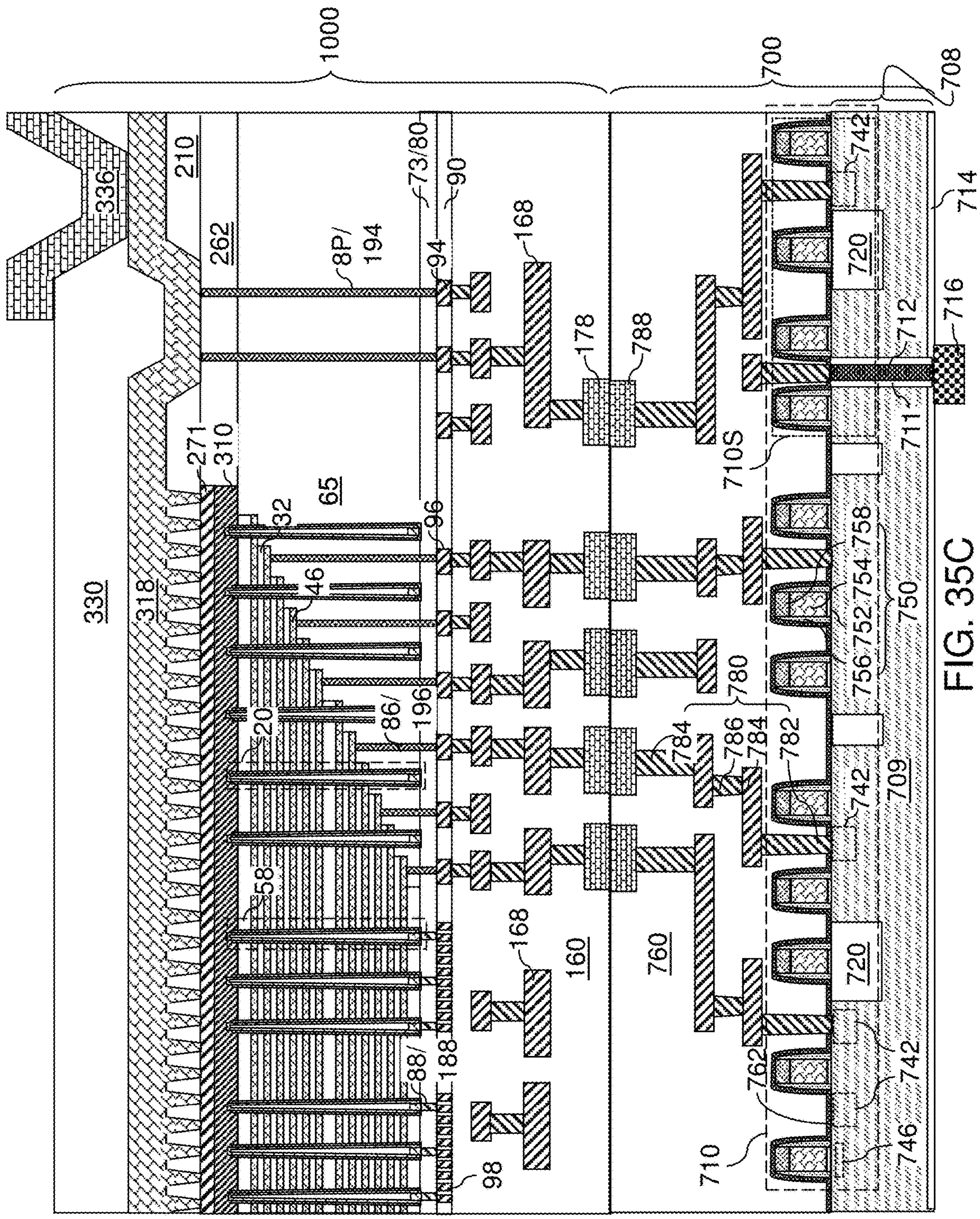

FIGS. 35A-35C are vertical cross-sectional views of embodiments of the eighth alternative configuration of the exemplary structure according to the eighth embodiment of the present disclosure. Generally, the processing steps of FIGS. 30A-30C may be performed to provide the structure illustrated in FIG. 35A. Alternatively, the processing steps of FIG. 30D or 30E can be performed to provide the respective structures illustrated in FIG. 35B or FIG. 35C.

Generally, the memory die 1000 comprises an alternating stack of insulating layers 32 and electrically conductive layers 46 located over a source layer (271, 310), and memory opening fill structures 58 located in memory openings 49 extending through the alternating stack (32, 46) and comprising a respective vertical semiconductor channel 60 and a respective memory film 50.

In one embodiment, the carrier substrate 209 can be removed after formation of the alternating stack (32, 46) and the memory opening fill structures 58, such as after bonding the memory due 1000 with the logic die 700. Via cavities can be formed through the backside isolation dielectric layer 210. Conductive via structures are formed in the via cavities by depositing a conductive material in the via cavities. A source-side electrically conductive layer 318 including a planar portion is formed over the backside isolation dielectric layer 210. The planar portion of the source-side electrically conductive layer 318 may comprises the same metallic material as the conductive via structures, or may comprise a different material that is deposited after formation of the conductive via structures 317. A source power supply mesh (317, 318) can be formed on the backside isolation dielectric layer 210 after removal of the carrier substrate 209.

Generally, the source power supply mesh (317, 318) including a planar portion of the source-side electrically conductive layer (317, 318) can be formed on the backside of the source layer {(271, 261) or (271, 310)}. The source power supply mesh (317, 318) is electrically connected to the source layer {(271, 261) or (271, 310)} at multiple locations. A logic die 700 can be provided, which includes a source bias circuit 710S (within a peripheral circuitry) configured to generate a source bias voltage, logic-side metal interconnect structures 780, and logic-side bonding pads 788. The logic-side bonding pads 788 can be bonded to memory-side bonding pads 178 within the memory die 1000. An output node of the source bias circuit is electrically connected to the source power supply mesh (317, 318) by a set of conductive structures comprising the logic-side metal interconnect structures 780, the logic-side bonding pads 788, and the memory-side bonding pads 178. In one embodiment, the logic die 700 is bonded to the memory die 1000 while the source layer {(271, 261) or (271, 310)} is present on the alternating stack (32, 46), and the source power supply mesh (317, 318) is formed after the logic die 700 is bonded to the memory die 1000.

Figure 36A:
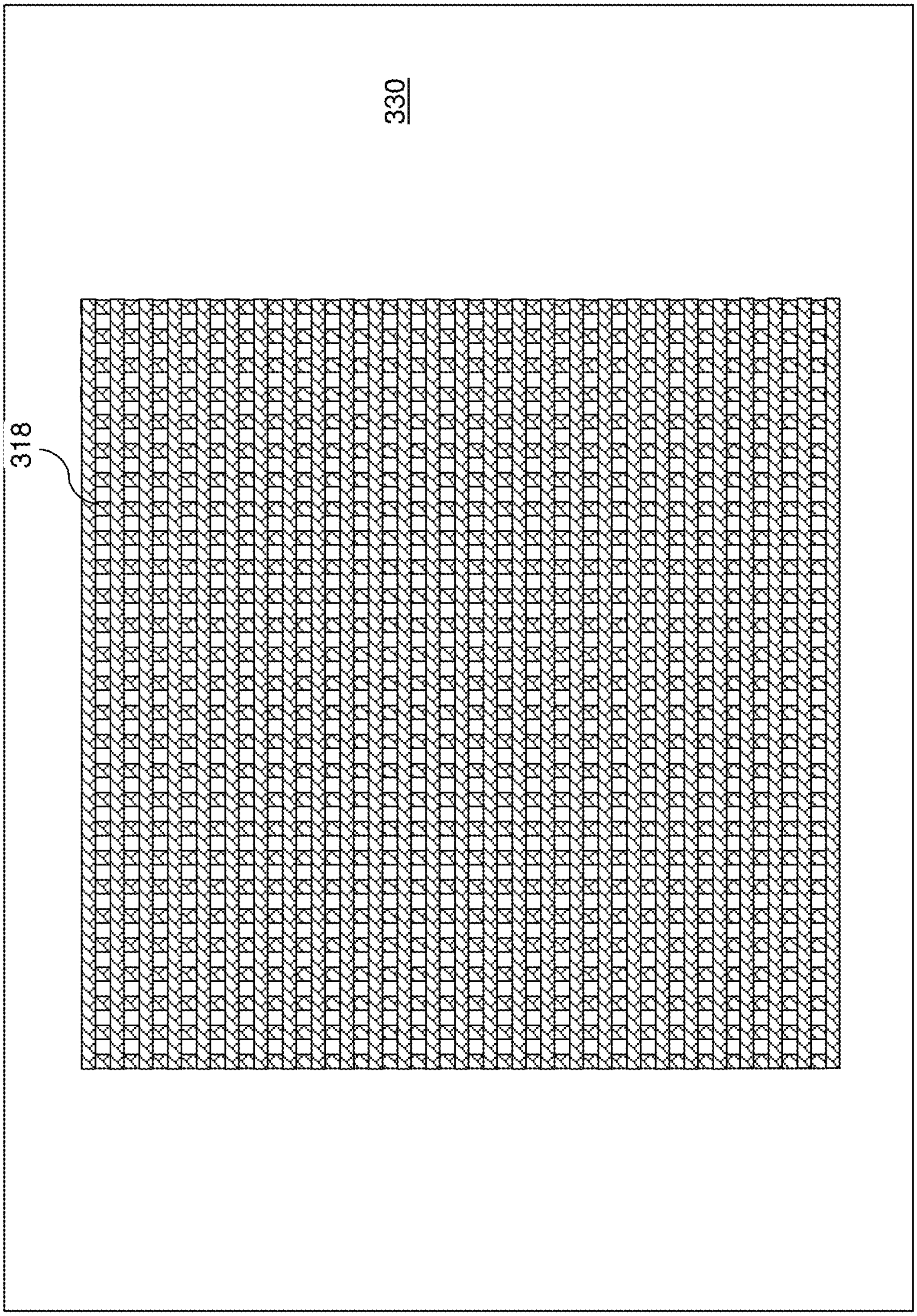
FIGS. 36A and 36B are horizontal cross-sectional views of a planar portion of a source power supply mesh according to embodiments of the present disclosure.
Figure 36B:
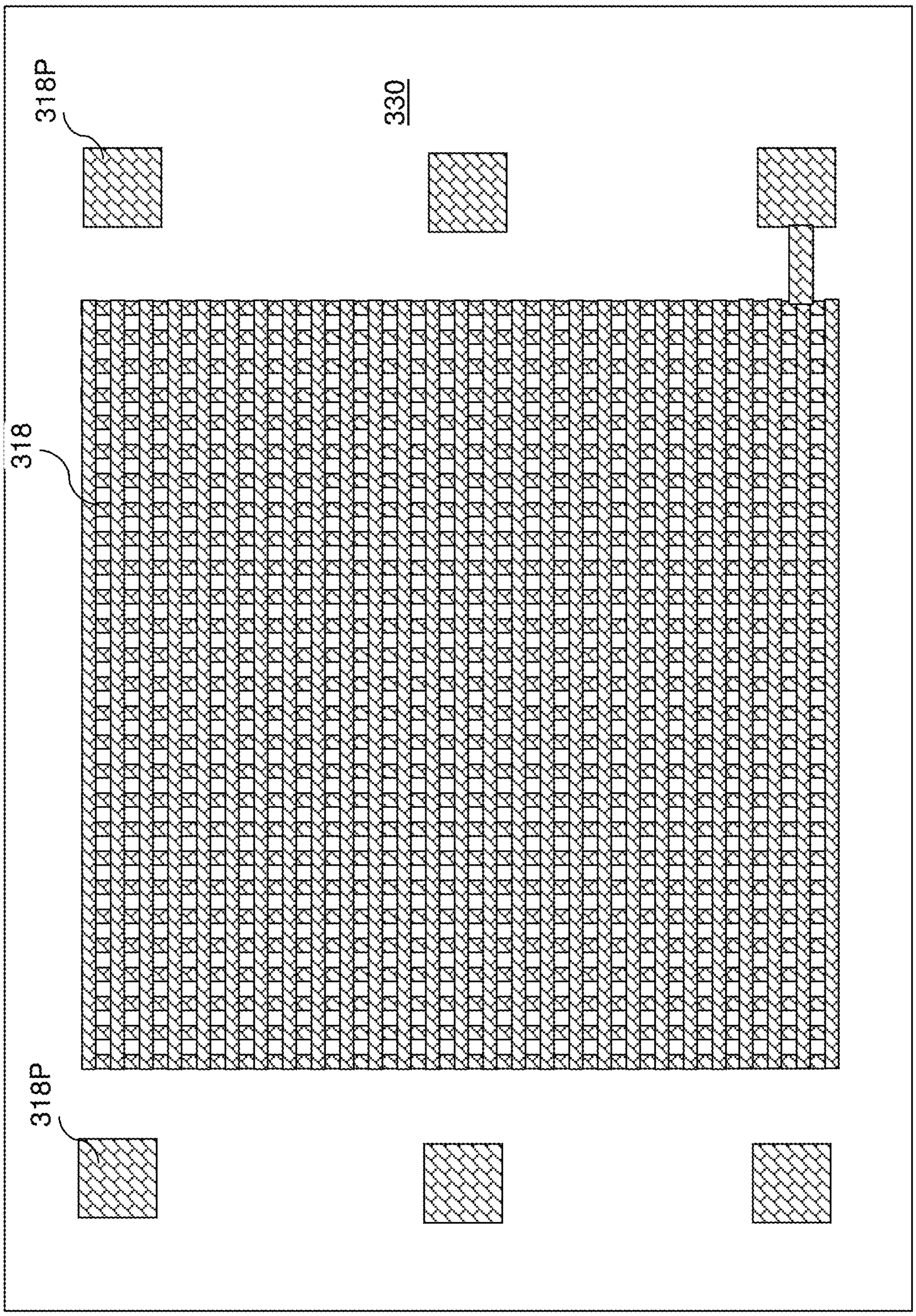

FIGS. 36A and 36B are horizontal cross-sectional views of a planar portion of a source power supply mesh according to an embodiment of the present disclosure. FIG. 36A illustrates a configuration in which the planar portion of the source-side electrically conductive layer 318 comprises a mesh structure containing a two-dimensional array of openings. FIG. 36B illustrates a configuration in which one or more lateral portions of the source-side electrically conductive layer 318 is formed as one or more input/output bonding pads 318P at the same time as the mesh using the same electrically conductive layer(s) as the mesh. The input/output bonding pads 318P are connected to input/output pins for the package (e.g., pins for the control chip, chip power, etc.).

Referring to all drawings and according to various embodiments of the present disclosure, a semiconductor structure comprising a memory die 1000 bonded to a logic die 700 is provided. The memory die 1000 comprises: an alternating stack of insulating layers 32 and electrically conductive layers 46; memory openings extending through the alternating stack (32, 46); memory opening fill structures 58 located in the memory openings 49 and comprising a respective vertical semiconductor channel 60 and a respective memory film 50; a source layer {(271, 261) or (271, 310)} contacting the vertical semiconductor channels 60;

and a backside isolation dielectric layer 210 contacting a backside surface of the source layer {(271, 261) or (271, 310)}; and a source power supply mesh (317, 318) comprising a planar portion of a source-side electrically conductive layer 318 that is located on a backside of the backside isolation dielectric layer 210 and electrically connected to the source layer {(271, 261) or (271, 310)} by conductive material portions that extend through the backside isolation dielectric layer 210.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure comprising a memory die bonded to a logic die, the memory die comprising:

an alternating stack of insulating layers and electrically conductive layers;

memory openings extending through the alternating stack;

memory opening fill structures located in the memory openings and comprising a respective vertical semiconductor channel and a respective memory film;

a source layer contacting the vertical semiconductor channels; and a backside isolation dielectric layer contacting a backside surface of the source layer;

a source power supply mesh comprising a planar portion of a source-side electrically conductive layer that is located on a backside of the backside isolation dielectric layer and electrically connected to the source layer by conductive material portions that extend through the backside isolation dielectric layer.

2. The semiconductor structure of claim 1, wherein each of the vertical semiconductor channels comprises a respective cylindrical outer surface that contacts the source layer.

3. The semiconductor structure of claim 2, wherein the source layer comprises:

a proximal doped semiconductor layer contacting a horizontal surface of the alternating stack;

a source contact semiconductor layer contacting the cylindrical outer surfaces of the vertical semiconductor channels and the proximal doped semiconductor layer; and a distal doped semiconductor layer contacting the source contact semiconductor layer and vertically spaced from the proximal doped semiconductor layer by the source contact semiconductor layer.

4. The semiconductor structure of claim 3, wherein:

the vertical semiconductor channels are undoped or have a p-type or n-type doping; and the proximal doped semiconductor layer, the source contact semiconductor layer, and the distal doped semiconductor layer have n-type doping.

5. The semiconductor structure of claim 3, wherein the source contact semiconductor layer has a different material composition than the proximal doped semiconductor layer and the distal doped semiconductor layer.

6. The semiconductor structure of claim 1, wherein each of the memory opening fill structures comprises a respective pedestal channel portion contacting the source layer, wherein each of the vertical semiconductor channels is spaced from the source layer by a respective one of the pedestal channel portions.

7. The semiconductor structure of claim 1, wherein:

each of the memory films comprises a layer stack including a blocking dielectric layer, a charge storage layer, and a tunneling dielectric layer; and the blocking dielectric layer comprises a cylindrical portion vertically extending through the alternating stack and contacting a cylindrical surface of the source layer, and an annular portion contacting a horizontal annular surface of the source layer.

8. The semiconductor structure of claim 1, further comprising an array of metal via structures contacting a backside surface of the source layer and contacting the planar portion of the source-side electrically conductive layer and comprising a different metallic material than the planar portion of the source-side electrically conductive layer.

9. The semiconductor structure of claim 1, wherein the source-side electrically conductive layer comprises via portions that are adjoined to the planar portion of the source-side electrically conductive layer, vertically extending through the backside isolation dielectric layer, and contacting a backside surface of the source layer.

10. The semiconductor structure of claim 1, wherein the source power supply mesh comprises:

a metal lines that form a mesh; and metal via structures vertically extending between the mesh of metal lines and a backside surface of the source layer.

11. The semiconductor structure of claim 1, further comprising:

a stepped dielectric material portion in contact with stepped surfaces of the alternating stack; and a connection via structure vertically extending through the stepped dielectric material portion and electrically connected to the source power supply mesh.

12. The semiconductor structure of claim 1, wherein:

the logic die comprises a source bias circuit configured to generate a source bias voltage; and the semiconductor structure comprises conductive structures configured to route the source bias voltage to the source power supply mesh, wherein the conductive structures comprises logic-side metal interconnect structures and logic-side bonding pads located in the logic die, and memory-side metal interconnect structures and memory-side bonding pads located in the memory die, and wherein the memory-side bonding pads are bonded to the logic-side bonding pads.

13. The semiconductor structure of claim 1, further comprising input/output backside bonding pads electrically connected to the source power supply mesh, wherein the input/output backside bonding pads are more distal from a horizontal plane including an interface between the alternating stack and the source layer than the source power supply mesh is from the horizontal plane.

14. A method of forming a semiconductor structure, comprising:

forming a memory die, wherein the memory die comprises an alternating stack of insulating layers and electrically conductive layers, memory openings extending through the alternating stack, memory opening fill structures located in memory openings and comprising a respective vertical semiconductor channel and a respective memory film, a source layer contacting the vertical semiconductor channels, and a backside isolation dielectric layer contacting a backside surface of the source layer;

forming a source power supply mesh comprising a planar portion of a source-side electrically conductive layer on a backside of the backside isolation dielectric layer, wherein the source power supply mesh is electrically connected to the source layer by conductive material portions that extend through the backside isolation dielectric layer; and bonding the memory die to a logic die.

15. The method of claim 14, wherein:

the logic die includes a source bias circuit configured to generate a source bias voltage, logic-side metal interconnect structures, and logic-side bonding pads; and the method further comprises bonding the logic-side bonding pads to memory-side bonding pads within the memory die, wherein an output node of the source bias circuit is electrically connected to the source power supply mesh by a set of conductive structures comprising the logic-side metal interconnect structures, the logic-side bonding pads, and the memory-side bonding pads.

16. The method of claim 15, wherein:

the logic die is bonded to the memory die while the source layer is present in the memory die; and the source power supply mesh is formed after the logic die is bonded to the memory die.

17. The method of claim 14, further comprising:

forming the backside isolation dielectric layer on a carrier substrate, wherein the source layer is formed on the backside isolation dielectric layer;

removing the carrier substrate after formation of the source layer, the alternating stack and the memory opening fill structures; and the source power supply mesh is formed on the backside isolation dielectric layer after removing the carrier substrate.

18. The method of claim 17, further comprising:

forming via cavities through the backside isolation dielectric layer; and forming conductive via structures in the via cavities by depositing a conductive material in the via cavities, wherein the planar portion of a source-side electrically conductive layer comprises a same metallic material as the conductive via structures or comprises a different material that is deposited after formation of the conductive via structures.

19. The method of claim 14, further comprising:

forming a layer stack including a distal doped semiconductor layer, a source-level sacrificial layer, and a proximal doped semiconductor layer over a carrier substrate;

forming an in-process alternating stack of the insulating layers and sacrificial material layers over the layer stack, wherein the memory openings and memory opening fill structures are formed through the in-process alternating stack;

replacing the source-level sacrificial layer with an electrically conductive source contact layer; and replacing the sacrificial material layers with the electrically conductive layers.

20. The method of claim 14, wherein:

forming the memory opening fill structures includes forming pedestal channel portions directly on the source layer;

the source layer comprises a n-type doped semiconductor material; and the vertical semiconductor channels are formed directly on the pedestal channel portions.

* * * * *